(12) United States Patent
Ogiwara et al.

(10) Patent No.: US 10,651,398 B2
(45) Date of Patent: May 12, 2020

(54) ORGANIC ELECTROLUMINESCENCE ELEMENT AND ELECTRONIC DEVICE

(71) Applicant: IDEMITSU KOSAN CO., LTD., Chiyoda-ku (JP)

(72) Inventors: Toshinari Ogiwara, Sodegaura (JP); Kei Yoshida, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 441 days.

(21) Appl. No.: 15/501,712

(22) PCT Filed: Aug. 21, 2015

(86) PCT No.: PCT/JP2015/073508
§ 371 (c)(1),
(2) Date: Feb. 3, 2017

(87) PCT Pub. No.: WO2016/031703
PCT Pub. Date: Mar. 3, 2016

(65) Prior Publication Data
US 2017/0229660 A1 Aug. 10, 2017

(30) Foreign Application Priority Data
Aug. 28, 2014 (JP) .................................. 2014-174589

(51) Int. Cl.
*H01L 51/00* (2006.01)
*C09K 11/06* (2006.01)
*C09K 11/02* (2006.01)
*H01L 51/50* (2006.01)
*H01L 51/52* (2006.01)

(52) U.S. Cl.
CPC ........ *H01L 51/0072* (2013.01); *C09K 11/025* (2013.01); *C09K 11/06* (2013.01); *H01L 51/005* (2013.01); *H01L 51/006* (2013.01); *H01L 51/0061* (2013.01); *H01L 51/0067* (2013.01); *H01L 51/0071* (2013.01); *H01L 51/0073* (2013.01); *C09K 2211/1007* (2013.01); *C09K 2211/1011* (2013.01); *C09K 2211/1014* (2013.01); *C09K 2211/1077* (2013.01); *H01L 51/0054* (2013.01); *H01L 51/0058* (2013.01); *H01L 51/504* (2013.01); *H01L 51/5012* (2013.01); *H01L 51/5016* (2013.01); *H01L 51/5056* (2013.01); *H01L 51/5072* (2013.01); *H01L 51/5278* (2013.01); *H01L 2251/5384* (2013.01)

(58) Field of Classification Search
CPC . H01L 51/0072; H01L 51/005; H01L 51/006; H01L 51/5278; H01L 51/0054; H01L 51/0058; H01L 51/5012; H01L 51/5016; H01L 51/504; H01L 2251/5384; H01L 51/5072; H01L 51/0067; H01L 51/0061; H01L 51/5056; H01L 51/5004; H01L 51/0071; H01L 51/0094; H01L 51/008; H01L 1/0074; H01L 2251/552; H01L 51/5028; H01L 51/0073; H01L 2251/5376; C09K 11/025; C09K 11/06; C09K 2211/1007; C09K 2211/1011; C09K 2211/1014; C09K 2211/1077; C09K 2211/1018; C09K 2211/1022; C07D 209/86; C07D 279/22; C07D 265/38; C07D 487/04; C07D 417/10; C07D 241/46; C07D 409/10; C07D 403/10; C07D 401/10; C07D 333/76; C07D 403/12; C07D 307/91; C07D 401/12; C07D 241/48; C07D 219/02; C07D 413/14; C07F 5/027; C07F 7/0812; C07F 7/10; C07F 5/02; H05B 33/20
USPC ........................................................ 428/690
See application file for complete search history.

(56) References Cited

U.S. PATENT DOCUMENTS

| | | | | |
|---|---|---|---|---|
| 9,653,705 B2* | 5/2017 | Uesaka | ............... | H01L 27/3213 |
| 9,660,199 B2* | 5/2017 | Shizu | ................... | C07D 401/10 |
| 10,186,665 B2* | 1/2019 | Kawamura | .......... | C07D 219/06 |
| 2011/0278555 A1 | 11/2011 | Inoue et al. | | |

(Continued)

FOREIGN PATENT DOCUMENTS

| JP | 2004-522276 A | 7/2004 |
|---|---|---|
| JP | 2006-172762 A | 6/2006 |

(Continued)

OTHER PUBLICATIONS

CAS reg. No. 1411910-25-2, Dec. 5, 2012. (Year: 2012).*

(Continued)

*Primary Examiner* — Douglas J McGinty
(74) *Attorney, Agent, or Firm* — Oblon, McClelland, Maier & Neustadt, L.L.P.

(57) ABSTRACT

An organic electroluminescence device includes an anode, a cathode, a first organic layer interposed between the anode and the cathode, a second organic layer interposed between the first organic layer and the cathode, and a bipolar layer interposed between the first organic layer and the second organic layer and having bipolar characteristics, in which at least one of the first organic layer and the second organic layer includes the first compound and the second compound, the first compound exhibits delayed fluorescence, and an energy gap $T_{77K}(M2)$ at 77[K] of the second compound is larger than an energy gap $T_{77K}(M1)$ at 77[K] of the first compound.

26 Claims, 4 Drawing Sheets

(56) References Cited

U.S. PATENT DOCUMENTS

| | | | |
|---|---|---|---|
| 2011/0279020 A1 | 11/2011 | Inoue et al. | |
| 2012/0097998 A1 | 4/2012 | Pieh et al. | |
| 2013/0292664 A1 | 11/2013 | Nishimura et al. | |
| 2015/0280158 A1 | 10/2015 | Ogiwara et al. | |
| 2015/0340623 A1* | 11/2015 | Kawamura | H01L 51/0072 257/40 |
| 2016/0028025 A1* | 1/2016 | Ogiwara | H01L 51/5004 257/40 |
| 2016/0118625 A1* | 4/2016 | Uesaka | H01L 27/3213 257/40 |
| 2016/0133878 A1* | 5/2016 | Uesaka | H01L 27/1225 257/40 |
| 2016/0190478 A1* | 6/2016 | Nakanotani | H01L 51/5012 257/40 |
| 2016/0197287 A1* | 7/2016 | Kawamura | C07D 403/10 257/40 |
| 2016/0248032 A1* | 8/2016 | Seo | H01L 51/504 |
| 2016/0248033 A1* | 8/2016 | Uesaka | H01L 51/504 |
| 2016/0322582 A1* | 11/2016 | Qiu | H01L 51/5012 |
| 2017/0018600 A1* | 1/2017 | Ito | H01L 27/3213 |
| 2017/0062731 A1* | 3/2017 | Ogiwara | C07D 405/14 |
| 2017/0352813 A1* | 12/2017 | Duan | H01L 51/50 |

FOREIGN PATENT DOCUMENTS

| | | | |
|---|---|---|---|
| JP | 2006-172763 A | 6/2006 | |
| JP | 2013-8492 A | 1/2013 | |
| JP | 2014-75249 A | 4/2014 | |
| WO | 03/080760 A1 | 10/2003 | |
| WO | 2004/092111 A1 | 10/2004 | |
| WO | 2005/099313 A1 | 10/2005 | |
| WO | 2005/112518 A1 | 11/2005 | |
| WO | 2008/123178 A1 | 10/2008 | |
| WO | 2011/096506 A1 | 8/2011 | |
| WO | 2011/132683 A1 | 10/2011 | |
| WO | 2011/132684 A1 | 10/2011 | |
| WO | 2012/099241 A1 | 7/2012 | |
| WO | 2012/153780 A1 | 11/2012 | |
| WO | 2013/038650 A1 | 3/2013 | |
| WO | 2013/180241 A1 | 12/2013 | |
| WO | 2014/092083 A1 | 6/2014 | |
| WO | 2014/104346 A1 | 7/2014 | |
| WO | WO-2014104315 A1 * | 7/2014 | C07D 219/06 |
| WO | WO-2016063169 A1 * | 4/2016 | H01L 27/3213 |

OTHER PUBLICATIONS

Search Report for WO 2016/031703. (Year: 2016).*
International Search Report dated Nov. 17, 2015 in PCT/JP2015/073508 filed Aug. 21, 2015.
Chihaya Adachi, Device Physics of Organic Semiconductors, (with English translation), 2012, total pp. 19.
Hiroki Uoyama et al., "Highly efficient organic light-emitting diodes from delayed fluorescence", Nature, vol. 492, Dec. 13, 2012, total pp. 7.

* cited by examiner

ORGANIC ELECTROLUMINESCENCE ELEMENT AND ELECTRONIC DEVICE

TECHNICAL FIELD

The present invention relates to an organic electroluminescence device and an electronic device.

BACKGROUND ART

When a voltage is applied to an organic electroluminescence device (hereinafter referred to as an "organic EL device"), holes are injected from an anode into an emitting layer and electrons are injected from a cathode into the emitting layer. The injected holes and electrons are recombined in the emitting layer to form excitons. Here, according to the electron spin statistics theory, singlet excitons and triplet excitons are generated at a ratio of 25%:75%.

The organic EL device is applied to a display of a mobile phone and a television set. It is desired to further improve luminescence properties such as a luminous efficiency and an emission lifetime of the organic EL device.

For instance, Patent Literatures 1 to 8 each disclose an organic EL device in which a plurality of emitting layers are laminated in order to improve luminescence properties.

CITATION LIST

Patent Literature(s)

Patent Literature 1: JP-A-2004-522276
Patent Literature 2: International Publication No. WO2005/099313
Patent Literature 3: International Publication No. WO2005/112518
Patent Literature 4: JP-A-2006-172762
Patent Literature 5: JP-A-2006-172763
Patent Literature 6: International Publication No. WO2008/123178
Patent Literature 7: JP-A-2013-8492
Patent Literature 8: JP-A-2014-75249

SUMMARY OF THE INVENTION

Problems to be Solved by the Invention

An object of the invention is to provide an organic electroluminescence device capable of improving a luminous efficiency and an electronic device including the organic electroluminescence device.

Means for Solving the Problems

According to an aspect of the invention, an organic electroluminescence device includes: an anode; a cathode; a first organic layer interposed between the anode and the cathode; a second organic layer interposed between the first organic layer and the cathode; and a bipolar layer interposed between the first organic layer and the second organic layer and having bipolar characteristics, in which at least one of the first organic layer and the second organic layer includes the first compound and the second compound, the first compound exhibits delayed fluorescence, and an energy gap $T_{77K}(M2)$ at 77[K] of the second compound is larger than an energy gap $T_{77K}(M1)$ at 77[K] of the first compound.

According to another aspect of the invention, an electronic device including the organic electroluminescence device according to the above aspect of the invention is provided.

According to the above aspects of the invention, an organic electroluminescence device capable of improving a luminous efficiency and an electronic device including the organic electroluminescence device can be provided.

DESCRIPTION OF EMBODIMENT(S)

First Exemplary Embodiment

Arrangement(s) of Organic EL Device

Figure 1:
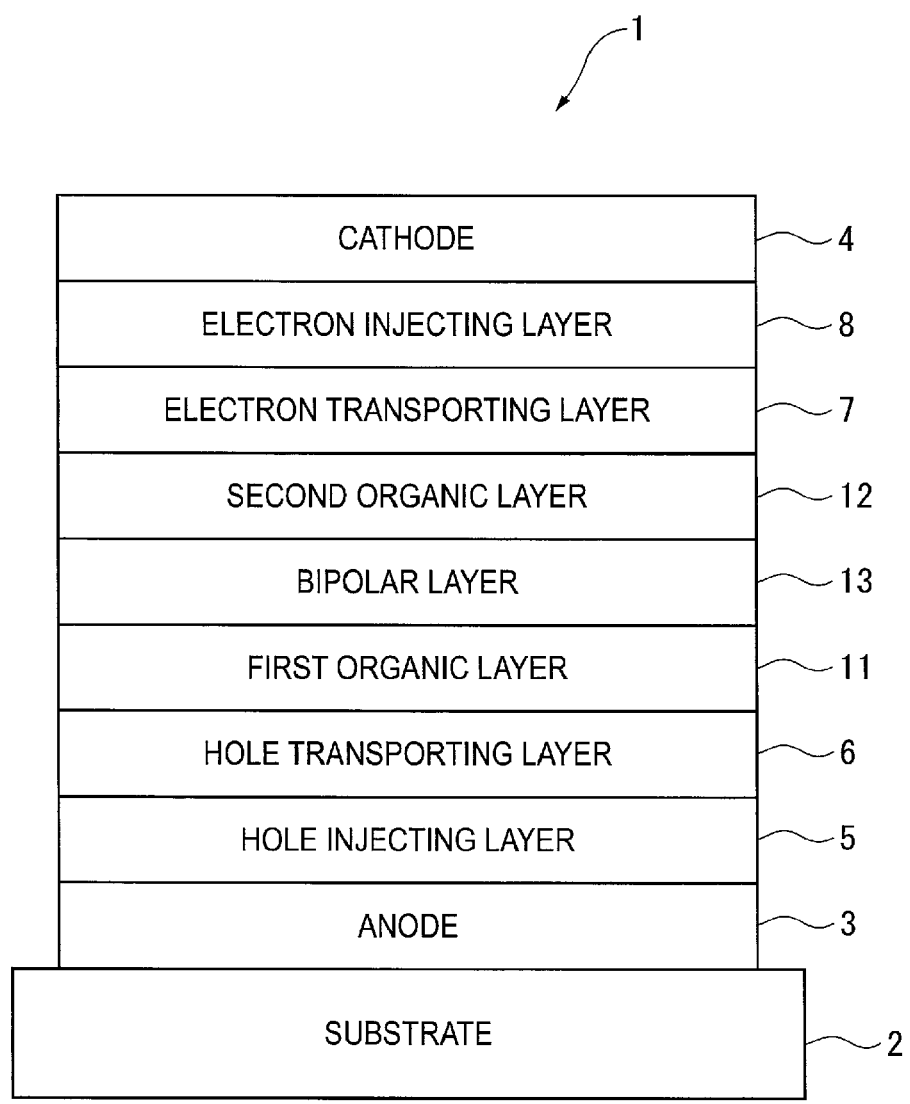
FIG. 1 schematically shows an exemplary arrangement of an organic electroluminescence device according to an exemplary embodiment of the invention.

FIG. 1 schematically shows an exemplary arrangement of an organic EL device according to the first exemplary embodiment.

An organic EL device 1 includes a light-transmissive substrate 2, anode 3, hole injecting layer 5, hole transporting layer 6, first organic layer 11, bipolar layer 13, second organic layer 12, electron transporting layer 7, electron injecting layer 8, and cathode 4 which are laminated in this order. It is preferable that the first organic layer 11 is bonded to the bipolar layer 13. It is preferable that the second organic layer 12 is bonded to the bipolar layer 13.

First Organic Layer and Second Organic Layer

In the exemplary embodiment, each of the first organic layer 11 and the second organic layer 12 includes a first compound exhibiting delayed fluorescence. A structure of the first compound contained in the first organic layer 11 may be the same as or different from a structure of the first compound contained in the second organic layer 12.

It is preferable to use the first compound having the same structure, for instance, since the first organic layer 11 and the second organic layer 12 can emit light in the same color.

At least one of the first organic layer 11 and the second organic layer 12 may include a second compound. In the exemplary embodiment, the first organic layer 11 further includes the second compound. An energy gap $T_{77K}(M2)$ at 77[K] of the second compound is larger than an energy gap $T_{77K}(M1)$ at 77[K] of the first compound.

Although the first organic layer 11 and the second organic layer 12 may include a metal complex, it is preferable to include no phosphorescent metal complex and it is more preferable to include no other metal complex in addition to the phosphorescent metal complex. The first compound in the exemplary embodiment is not a metal complex.

For instance, the structure of the first compound contained in the first organic layer 11 may be different from the structure of the first compound contained in the second organic layer 12. In this arrangement, it is preferable that a main peak wavelength λ1 (unit: nm) of an emission spectrum of the first compound included in the first organic layer 11 and a main peak wavelength λ2 (unit: nm) of an emission spectrum of the first compound included in the second organic layer 12 satisfy a relationship of Numerical Formula 1, $$|\lambda1-\lambda2| \leq 150 \text{ nm} \quad \text{(Numerical Formula 1).}$$

A value of $|\lambda1-\lambda2|$ is more preferably 90 nm or less, further preferably 50 nm or less.

For instance, the structure of the first compound contained in the first organic layer 11 may be different from the structure of the first compound contained in the second organic layer 12. In this arrangement, it is also preferable that the main peak wavelength $\lambda1$ (unit: nm) of the emission spectrum of the first compound included in the first organic layer 11 and the main peak wavelength $\lambda2$ (unit: nm) of the emission spectrum of the first compound included in the second organic layer 12 satisfy a relationship of Numerical Formula 2, $$|\lambda1-\lambda2| \geq 100 \text{ nm} \quad \text{(Numerical Formula 2).}$$

Moreover, the organic EL device 1 preferably emits a white light. In this case, for instance, it is only necessary that the first compound having a predetermined emission color is appropriately selected and used in the first organic layer 11 and the second organic layer 12 such that an emission color from the first organic layer 11 and an emission color from the second organic layer 12 are mixed into a white color. For instance, the first compound capable of blue emission may be used in the first organic layer 11 and the first compound capable of yellow emission may be used in the second organic layer 12.

Delayed Fluorescence

Delayed fluorescence (thermally activated delayed fluorescence) is described in, for instance, "Device Physics of Organic Semiconductor" Chihaya Adachi, pages 261 to 268, published by Kodansha Company Ltd. It is described in this document that, when an energy gap $\Delta E_1$ between a singlet state and a triplet state can be decreased, an inverse energy transfer from the triplet state to the singlet state, which occurs at a low transition probability, occurs highly efficiently to express Thermally Activated Delayed Fluorescence (TADF). Further, an occurrence mechanism of the delayed fluorescence is described in FIG. 10.38 of this document. The first compound of the exemplary embodiment is a compound exhibiting thermally activated delayed fluorescence occurring in this mechanism.

Emission of the delayed fluorescence can be checked by measuring the transient PL (Photo Luminescence).

Behavior of the delayed fluorescence can be analyzed based on the decay curve obtained by the transient PL measurement. The transient PL measurement is a method of measuring decay behavior (transient characteristics) of the PL emission after radiating a pulse laser on a sample and stopping radiating. The PL emission in the TADF material is classified into a luminescence component from singlet excitons generated in first PL excitation and a luminescence component from singlet excitons generated through triplet excitons. A lifetime of the singlet excitons generated in the first PL excitation is very short in a nanosecond order. Accordingly, the emission from the singlet excitons rapidly decays after radiation of the pulse laser.

Figure 2:
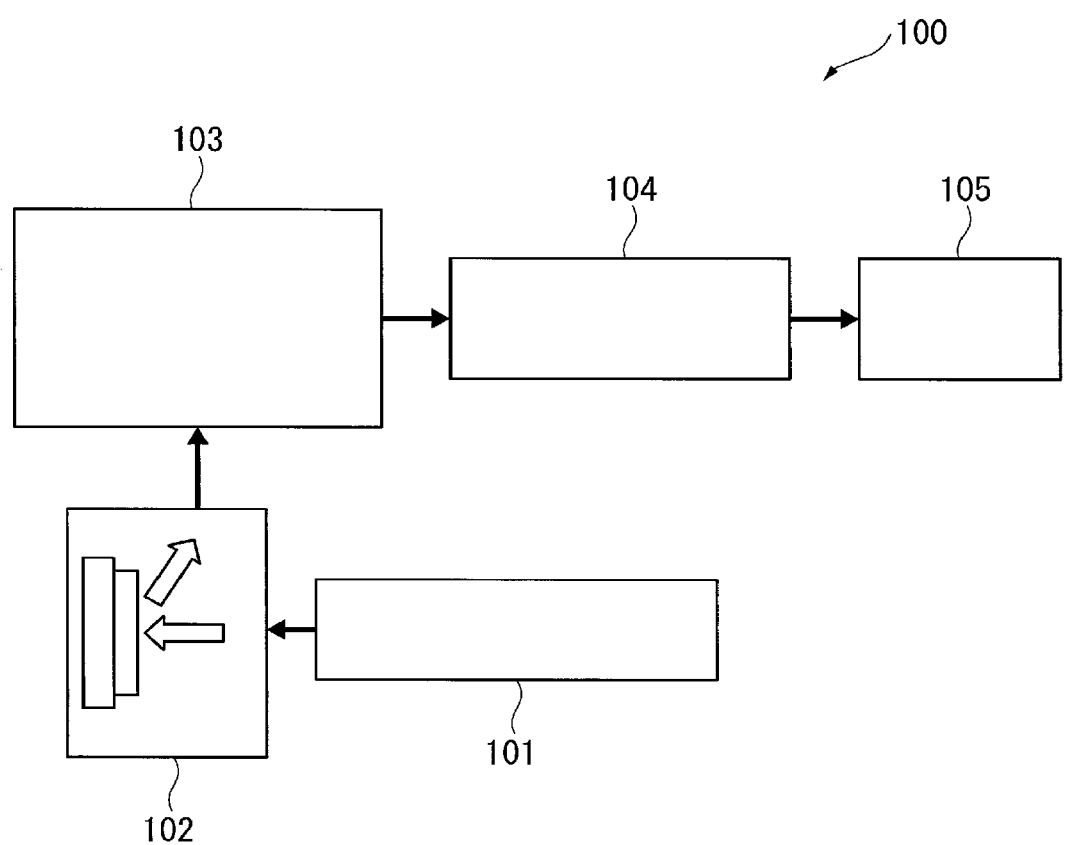
FIG. 2 schematically shows a device for measuring transient PL.

On the other hand, since delayed fluorescence provides an emission from singlet excitons generated through long-life triplet excitons, the delayed fluorescence gradually decays. Thus, there is a large difference in time between the emission from the singlet excitons generated in the first PL excitation and the emission from the singlet excitons through the triplet excitons. Accordingly, a luminous intensity derived from the delayed fluorescence is obtainable FIG. 2 schematically shows an exemplary device for measuring the transient PL.

A transient PL measuring device 100 in the exemplary embodiment includes: a pulse laser 101 capable of radiating a light having a predetermined wavelength; a sample chamber 102 configured to house a measurement sample; a spectrometer 103 configured to divide a light radiated from the measurement sample; a streak camera 104 configured to provide a two-dimensional image; and a personal computer 105 configured to import and analyze the two-dimensional image. A device for measuring the transient PL is not limited to the device described in the exemplary embodiment.

The sample to be housed in the sample chamber 102 is obtained by doping a matrix material with a doping material at a concentration of 12 mass % and forming a thin film on a quartz substrate.

The thin film sample housed in the sample chamber 102 is radiated with a pulse laser from the pulse laser 101 to excite the doping material. Emission is extracted in a direction of 90 degrees with respect to a radiation direction of the excited light. The extracted emission is divided by the spectrometer 103 to form a two-dimensional image in the streak camera 104. As a result, the two-dimensional image is obtainable in which the ordinate axis represents a time, the abscissa axis represents a wavelength, and a bright spot represents a luminous intensity. When this two-dimensional image is taken out at a predetermined time axis, an emission spectrum in which the ordinate axis represents the luminous intensity and the abscissa axis represents the wavelength is obtainable. Moreover, when this two-dimensional image is taken out at the wavelength axis, a decay curve (transient PL) in which the ordinate axis represents a logarithm and the abscissa axis represents the time is obtainable.

For instance, a thin film sample A was manufactured as described above using a reference compound H1 as the matrix material and a reference compound D1 as the doping material and was measured in terms of the transient PL.

[Formula 1]

Reference Compound H1

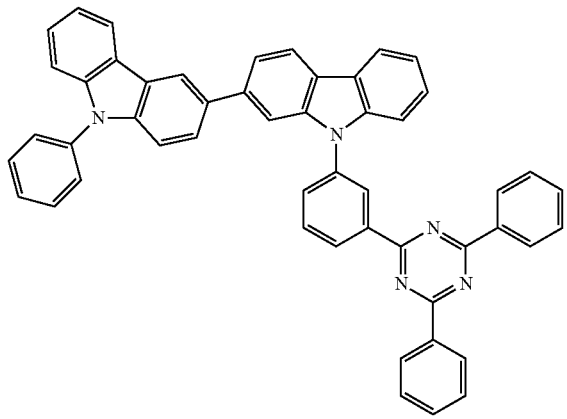

Reference Compound D1

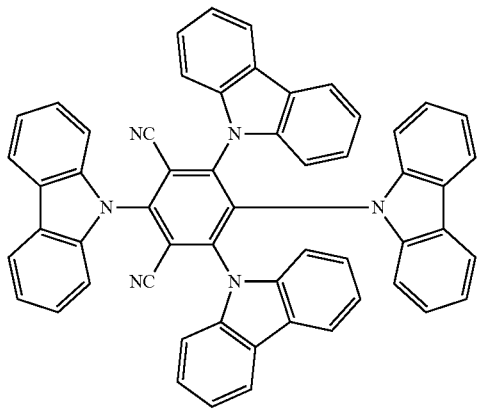

The decay curve was analyzed with respect to the above thin film sample A and a film sample B. The thin film sample B was manufactured in the same manner as described above using a reference compound H2 as the matrix material and the reference compound D1 as the doping material.

Figure 3:
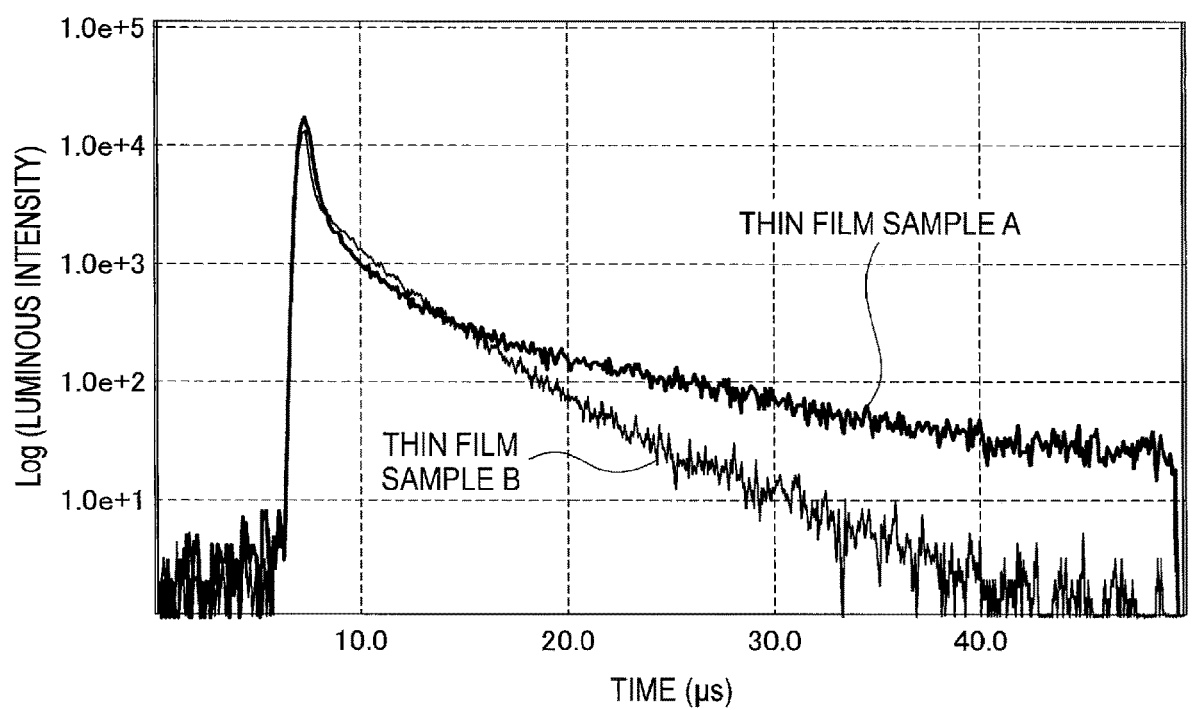
FIG. 3 shows an example of a decay curve of the transient PL.

FIG. 3 schematically shows decay curves obtained from transient PL obtained by measuring the respective thin film samples A and B.

[Formula 2]

Reference Compound H2

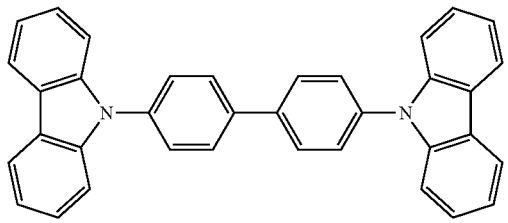

As described above, an emission decay curve in which the ordinate axis represents the luminous intensity and the abscissa axis represents the time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

In the exemplary embodiment, an emission amount of the delayed fluorescence can be obtained using the device shown in FIG. 2. In the first compound, Prompt emission and Delay emission are observed. Prompt emission is observed immediately when the excited state is achieved by exciting the first compound with a pulsed light (i.e., a light emitted from a pulse laser) having a wavelength to be absorbed by the first compound. Delay emission is observed not immediately when the excited state is achieved but after the excited state is achieved. In the exemplary embodiment, the amount of Delay emission is preferably 5% or more relative to the amount of Prompt emission.

The amount of Prompt emission and the amount of Delay emission can be obtained in the same method as a method described in "Nature" vol. 492, pp. 234-238 (2012). A device used for calculating the amount of Prompt emission and the amount of Delay emission is not limited to the device described in the above Literatures.

For instance, a sample usable for measuring delayed fluorescence is prepared by co-depositing the first compound and a compound TH-2 on a quartz substrate at a ratio of the first compound of 12 mass % to form a 100-nm-thick thin film.

[Formula 3]

TH-2

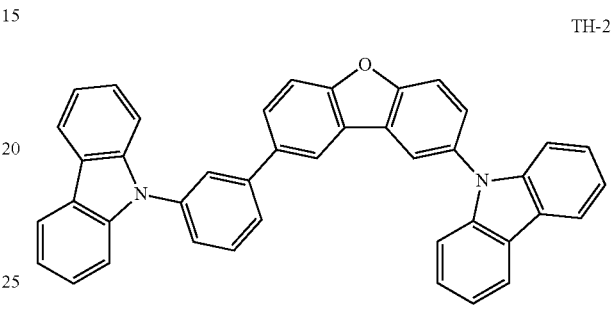

The first compound of the exemplary embodiment is a delayed fluorescent compound in which an emission color is not particularly limited. For instance, the first compound preferably emits a light with a main peak wavelength of 550 nm or less, and more preferably emits a light with a main peak wavelength of 480 nm or less. On the other hand, the first compound also preferably emits a light with a main peak wavelength exceeding 550 nm. A main peak wavelength means a peak wavelength of an emission spectrum exhibiting a maximum luminous intensity among emission spectra measured using a toluene solution where a measurement target compound is dissolved at a concentration from $10^{-6}$ mol/l to $10^{-5}$ mol/l.

TADF Mechanism

In the organic EL device in the exemplary embodiment, a compound having a small $\Delta ST$ is preferably used as the first compound. $\Delta ST$ refers to a difference between a singlet energy and a triplet energy of a compound. $\Delta ST$ of the first compound is hereinafter represented by $\Delta ST(M1)$. When $\Delta ST(M1)$ is small, inverse intersystem crossing from a triplet level of the first compound to a singlet level thereof is easily caused by heat energy given from the outside. An energy state conversion mechanism to perform spin exchange from the triplet state of electrically excited excitons within the organic EL device to the singlet state by inverse intersystem crossing is referred to as a TADF mechanism.

Figure 4:
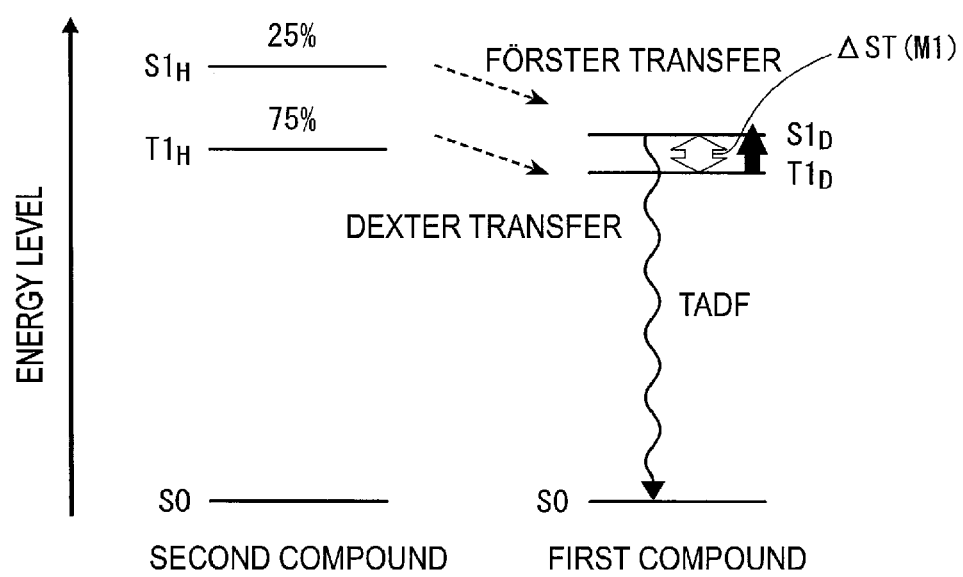
FIG. 4 shows a relationship between an energy level and an energy transfer of each of first and second compounds in an emitting layer.

FIG. 4 shows an example of a relationship between energy levels of the first and second compounds in a layer (e.g., emitting layer) including a first organic compound and a second organic compound. In FIG. 4, S0 represents a ground state, $S1_H$ represents a lowest singlet state of the second compound, $T1_H$ represents a lowest triplet state of the second compound, $S1_D$ represents a lowest singlet state of the first compound, and $T1_D$ represents a lowest triplet state of the first compound. A dotted-line arrow shows energy transfer between the excited states in FIG. 4. Energy is transferred from the lowest triplet state $T1_H$ of the second compound to the lowest singlet state $S1_D$ or the lowest triplet state $T1_D$ of the first compound by Dexter transfer. Further, when a material having a small $\Delta ST(M1)$ is used as the first compound, inverse intersystem crossing can be caused by a heat energy from the lowest triplet state $T1_D$ to the lowest singlet state $S1_D$ in the first compound. As a result, fluorescence from the lowest singlet state $S1_D$ of the first compound can be observed. It is inferred that the internal quantum efficiency can be theoretically raised up to 100% also by using delayed fluorescence by the TADF mechanism.

In the exemplary embodiment, a singlet energy S(M2) of the second compound is preferably larger than the singlet energy S(M1) of the first compound.

In the exemplary embodiment, the first compound is preferably contained at a concentration in a range from 20 mass % to 80 mass % in the first organic layer 11, more preferably at a concentration in a range from 40 mass % to 60 mass %.

In the exemplary embodiment, the first compound is preferably contained at a concentration in a range from 20 mass % to 80 mass % in the second organic layer 12, more preferably at a concentration in a range from 40 mass % to 60 mass %.

Film Thickness of First Organic Layer and Second Organic Layer

The first organic layer 11 and the second organic layer 12 of the organic EL device 1 of the exemplary embodiment each independently have a film thickness preferably in a range from 5 nm to 50 nm, more preferably in a range from 7 nm to 50 nm, and further preferably in a range from 10 nm to 50 nm. At the film thickness of 5 nm or more, the first organic layer 11 and the second organic layer 12 are easily formable and easily adjustable in terms of chromaticity. At the film thickness of 50 nm or less, increase in the drive voltage is easily suppressible.

In the exemplary embodiment, at least one of the first organic layer 11 and the second organic layer 12 may further include a fifth compound. Moreover, at least one of the first organic layer 11 and the second organic layer 12 may include two components that are the first compound and the fifth compound. Further, at least one of the first organic layer 11 and the second organic layer 12 may include three components that are the first compound, the second compound and the fifth compound.

Although the fifth compound is not particularly limited, the fifth compound is preferably a fluorescent compound. An emission color and an emission wavelength of the fluorescent compound are not particularly limited.

For instance, the fifth compound preferably exhibits red, yellow, green or blue fluorescence. The fifth compound is preferably a material exhibiting a high fluorescence quantum efficiency.

Bipolar Layer

The bipolar layer 13 is interposed between the first organic layer 11 and the second organic layer 12. Herein, bipolar characteristics refer to characteristics capable of transferring holes and electrons. The bipolar layer 13 is a layer capable of transferring holes and electrons.

The bipolar layer 13 may be formed of a single material or a plurality of materials. When the bipolar layer 13 is formed of a single material, a compound having a hole-transporting partial structure and an electron-transporting partial structure in one molecule is preferably used. When the bipolar layer 13 is formed of a plurality of materials, a hole-transporting compound and an electron-transporting compound are preferably used.

The bipolar layer 13 preferably includes a fourth compound having bipolar characteristics. A molecular structure of the first compound may be the same as or different from a molecular structure of the fourth compound.

Film Thickness of Bipolar Layer

A thickness of the bipolar layer 13 is preferably in a range of 1 nm to 30 nm, more preferably in a range of 1 nm to 20 nm, further preferably in a range of 1 nm to 10 nm.

Since the bipolar layer 13 is interposed between the first organic layer 11 and the second organic layer 12 each including the compound exhibiting delayed fluorescence (delayed fluorescent compound), a luminous efficiency of the organic EL device 1 in the exemplary embodiment is improvable. The above-described $\Delta ST$ of the delayed fluorescent compound is small to facilitate transfer of holes and electrons. Since the delayed fluorescent compound is less likely to cause concentration quenching even when the concentration of the delayed fluorescent compound in the layer exceeds 10 mass %, a long lifetime and a low voltage can be promoted by containing the delayed fluorescent compound at a high concentration. As described above, since the delayed fluorescent compound easily transfers holes and electrons, conductivity of holes and electrons is further improved when the delayed fluorescent compound is contained at a high concentration in the layer. Accordingly, it is inferred that holes and electrons injected into the first organic layer 11 and the second organic layer 12 are likely to leak into adjacent layers without recombination. Since the bipolar layer 13 is provided in the exemplary embodiment, for instance, holes leaking out of the first organic layer 11 are injected through the bipolar layer 13 into the second organic layer 12. Accordingly, it is inferred that, even when the holes leaking out of the first organic layer 11 are not used for recombination in the first organic layer 11, a probability that the holes leaking out of the first organic layer 11 are used for recombination in the second organic layer 12 is increased. Similarly, it is inferred that, even when electrons leaking out of the second organic layer 12 are not used for recombination in the second organic layer 12, a probability that the electrons leaking out of the second organic layer 12 are used for recombination in the first organic layer 11 is increased. It is inferred that luminous efficiency of the organic EL device 1 is improved as a result.

On the other hand, organic EL devices disclosed in Patent Literatures 1 to 7 in the above Citation List include laminated emitting layers including a fluorescent compound or a phosphorescent compound. A concentration of the fluorescent compound or the phosphorescent compound in the emitting layers is set as low as at about 10 mass % or less for concentration quenching and economy reasons. As a result, it is inferred that leakage of holes and electrons from the layers including the fluorescent compound or the phosphorescent compound to neighboring layers is less likely to occur in a typical organic EL device, as compared with the organic EL device including the delayed fluorescent compound.

An organic EL device disclosed in Patent Literature 8 includes laminated emitting layers respectively including a delayed fluorescent compound and a fluorescent compound. However, it appears that such a technical idea has not been found as providing the bipolar layer in order to effectively use the holes and electrons leaking out of the layer including the delayed fluorescent compound.

Further, it also appears that such a technical idea has not been found that the first compound and the second compound having an energy gap $T_{77K}(M2)$ at 77[K] larger than an energy gap $T_{77K}(M1)$ at 77[K] of the first compound are contained in at least one of the first organic layer 11 and the second organic layer 12 of the exemplary embodiment in order to prolong a lifetime and increase a luminous efficiency of the organic EL device.

Second Exemplary Embodiment

An arrangement of an organic EL device according to a second exemplary embodiment will be described. In the description of the second exemplary embodiment, the same components as those in the first exemplary embodiment are denoted by the same reference signs and names to simplify or omit an explanation of the components. In the second exemplary embodiment, the same materials and compounds as described in the above exemplary embodiment are usable unless particularly described.

In the second exemplary embodiment, the first organic layer 11 includes the first compound exhibiting delayed fluorescence and the second compound while the second organic layer 12 includes a third luminescent compound. In other words, the second exemplary embodiment is different from the first exemplary embodiment in the compound included in the second organic layer 12 and is the same as the first exemplary embodiment in the other points.

The third compound may be a fluorescent compound or a phosphorescent compound, preferably a fluorescent compound.

It is also preferable that a compound emitting in the first organic layer 11 is different from a compound emitting in the second organic layer 12. For instance, it is preferable that the first compound emits light in the first organic layer 11 and the third compound emits light in the second organic layer 12.

In the layer including the third compound, the above luminescent compound may be dispersed in another substance (host material). As the substance for dispersing the luminescent compound, various substances are usable, among which a substance having a Lowest Unoccupied Molecular Orbital level (LUMO level) higher than that of the luminescent compound and a Highest Occupied Molecular Orbital (HOMO level) lower than that of the luminescent compound is preferable.

In the second exemplary embodiment, it is preferable that the main peak wavelength λ1 (unit: nm) of the emission spectrum of the first compound and a main peak wavelength λ3 (unit: nm) of an emission spectrum of the third compound satisfy a relationship of Numerical Formula 3, $$|\lambda 1-\lambda 3|\leq 150 \text{ nm} \quad \text{(Numerical Formula 3).}$$

A value of |λ1−λ3| is more preferably 90 nm or less, further preferably 50 nm or less.

It is also preferable that the main peak wavelength λ1 (unit: nm) of the emission spectrum of the first compound and the main peak wavelength λ3 (unit: nm) of the emission spectrum of the third compound satisfy a relationship of Numerical Formula 4, $$|\lambda 1-\lambda 3|\geq 100 \text{ nm} \quad \text{(Numerical Formula 4).}$$

In the second exemplary embodiment, for instance, it is also preferable that an emission color of the first compound is the same as an emission color of the third compound.

Moreover, the organic EL device in the second exemplary embodiment preferably emits a white light. In this case, it is only necessary that the first and third compounds each having a predetermined emission color are appropriately selected and respectively used in the first organic layer 11 and the second organic layer 12 such that the emission color from the first organic layer 11 and the emission color from the second organic layer 12 are mixed into a white color.

Also in the second exemplary embodiment, since the bipolar layer 13 is interposed between the first organic layer 11 including the delayed fluorescent compound and the second organic layer 12 including third luminescent compound, a luminous efficiency of the organic EL device in the second exemplary embodiment is also improvable.

In a modification of the second exemplary embodiment, for instance, an organic EL device may be arranged such that the first organic layer 11 includes the third compound and the second organic layer 12 includes the first compound and the second compound. In the organic EL device with this arrangement, for instance, it is preferable that the third compound emits light in the first organic layer 11 and the first compound emits light in the second organic layer 12.

Third Exemplary Embodiment

An arrangement of an organic EL device according to a third exemplary embodiment will be described. In the description of the third exemplary embodiment, the same components as those in the first exemplary embodiment are denoted by the same reference signs and names to simplify or omit an explanation of the components. In the third exemplary embodiment, the same materials and compounds as described in the above exemplary embodiment are usable unless particularly described.

The third exemplary embodiment is different from the first exemplary embodiment in including the fifth compound in the bipolar layer 13 and is the same as the first exemplary embodiment in the other points. It is also preferable that the bipolar layer 13 includes the fourth compound and the fifth compound. This is because a carrier balance in the bipolar layer 13 is improved when the fifth compound is contained in the bipolar layer 13. It is also preferable that the bipolar layer 13 includes the fifth compound in the organic EL device according to the second exemplary embodiment.

Since the bipolar layer 13 is interposed between the first organic layer 11 and the second organic layer 12 each including the delayed fluorescent compound also in the third exemplary embodiment, a luminous efficiency of the organic EL device in the third exemplary embodiment is improvable.

Fourth Exemplary Embodiment

An arrangement of an organic EL device according to a fourth exemplary embodiment will be described. In the description of the fourth exemplary embodiment, the same components as those in the first exemplary embodiment are denoted by the same reference signs and names to simplify or omit an explanation of the components. In the fourth exemplary embodiment, the same materials and compounds as described in the above exemplary embodiment are usable unless particularly described.

In the fourth exemplary embodiment, the first organic layer 11 includes the first compound exhibiting delayed fluorescence and the second compound, the second organic layer 12 includes the third luminescent compound, and the bipolar layer 13 includes the fifth compound. In other words, the fourth exemplary embodiment is different from the first exemplary embodiment in the compound included in the second organic layer 12 and the compound included in the bipolar layer 13, and is the same as the first exemplary embodiment in the other points.

It is also preferable that a compound emitting in the first organic layer 11 is different from a compound emitting in the second organic layer 12. For instance, it is preferable that the first compound emits light in the first organic layer 11 and the third compound emits light in the second organic layer 12.

The third compound is preferably a fluorescent compound or a phosphorescent compound.

In the fourth exemplary embodiment, it is preferable that the second organic layer 12 does not include the first compound.

In the fourth exemplary embodiment, the second organic layer 12 may include the third compound and another substance (host material) different from the above luminescent compound. The same compound as described in the second exemplary embodiment is usable as the host material.

It is also preferable that the bipolar layer 13 includes the fourth compound and the fifth compound. This is because a carrier balance in the bipolar layer 13 is improved when the fifth compound is contained in the bipolar layer 13.

The bipolar layer 13 is interposed between the first organic layer 11 including the delayed fluorescent compound and the second organic layer 12 also in the fourth exemplary embodiment. Accordingly, a luminous efficiency of the organic EL device in the fourth exemplary embodiment is improvable In a modification of the fourth exemplary embodiment, for instance, an organic EL device may include the fifth compound in place of the third compound included in the second organic layer 12 of the fourth exemplary embodiment.

First, Second, Third, Fourth and Fifth Compounds

An example of each of the compounds used in the above exemplary embodiments will be described below.

First Compound

It is preferable that the first compound exhibiting delayed fluorescence has a donating moiety and an accepting moiety in the same molecule.

In the above exemplary embodiments, the first compound is exemplified by a compound represented by a formula (1).

[Formula 4]

  (1)

In the formula (1), A, which is an accepting moiety, is a group having a partial structure selected from formulae (a-1) to (a-7). When a plurality of A are present, the plurality of A are the same or different and may be bonded to each other to form a saturated or unsaturated ring.

B, which is a donating moiety, has a partial structure selected from formulae (b-1) to (b-6). When a plurality of B are present, the plurality of B are the same or different and may be bonded to each other to form a saturated or unsaturated ring.

a, b and d are each independently an integer of 1 to 5.

c is an integer of 0 to 5.

When c is 0, A is bonded to B by a single bond or a Spiro bond.

When c is an integer of 1 to 5, L is a linking group selected from the group consisting of a substituted or unsubstituted aromatic hydrocarbon group having 6 to 30 ring carbon atoms, and a substituted or unsubstituted heterocyclic group having 5 to 30 ring atoms. When a plurality of L are present, the plurality of L are the same or different and may be bonded to each other to form a saturated or unsaturated ring.

[Formula 5]

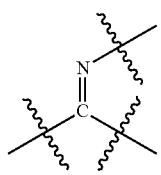 (a-1)

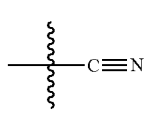 (a-2)

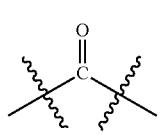 (a-3)

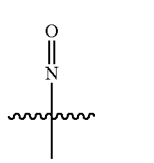 (a-4)

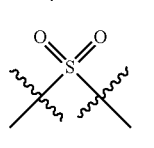 (a-5)

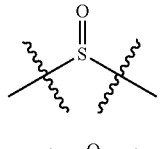 (a-6)

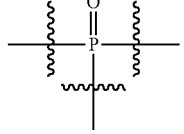 (a-7)

[Formula 6]

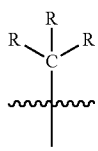 (b-1)

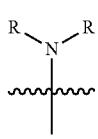 (b-2)

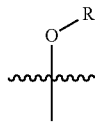 (b-3)

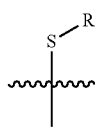 (b-4)

(b-5)

(b-6)

In the formulae (b-1) to (b-6): R each independently represents a hydrogen atom or a substituent. When R is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms. When a plurality of R are present, the plurality of R are the same or different and may be bonded to each other to form a saturated or unsaturated ring.

Examples of a bonding pattern of the compound represented by the formula (1) include bonding patterns shown in Table 1.

TABLE 1

| No. | a | b | c | d | Bonding Pattern |
|-----|---|---|---|---|-----------------|
| (1A) | 1 | 1 | 0 | 1 | B—A |
| (1B) | 1 | 1 | 1 | 1 | B—L—A |
| (1C) | 2 | 1 | 0 | 1 | B—A—A, A/B\A |
| (1D) | 1 | 2 | 0 | 1 | B—B—A, B\A/B |
| (1E) | 2 | 1 | 1 | 1 | B—L—A—A, B—L\A/A |
| (1F) | 1 | 2 | 1 | 1 | B—B—L—A, B\L—A/B |
| (1G) | 1 | 1 | 2 | 1 | B—L—L—A |

TABLE 1-continued

| No. | a | b | c | d | Bonding Pattern |
|-----|---|---|---|---|-----------------|
| (1H) | 1 | 1 | 1 | 2 | B—L\A/B—L, B—L—B—L—A |

Specific examples of the first compound are given below. It should be noted that the first compound in the exemplary embodiments are not limited thereto.

[Formula 7]

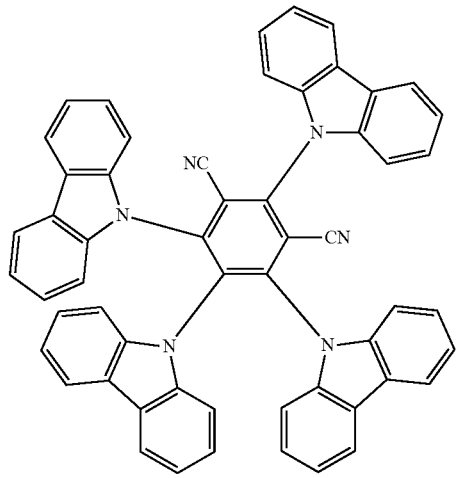

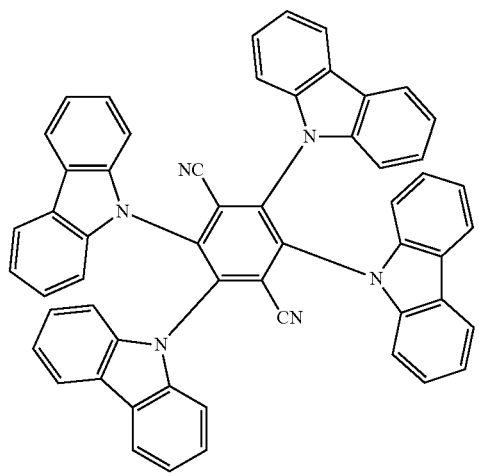

-continued
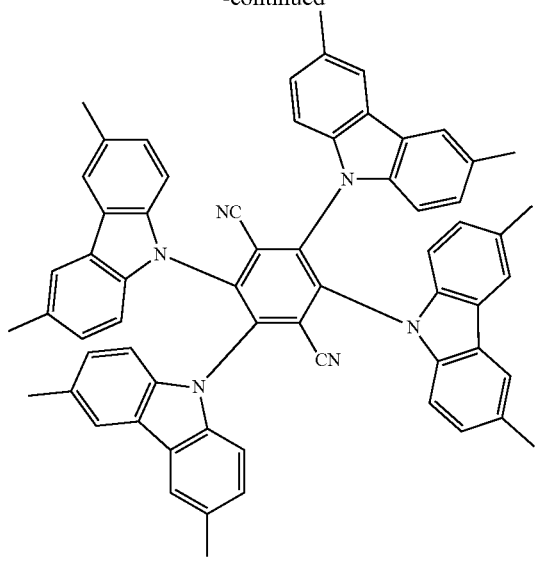
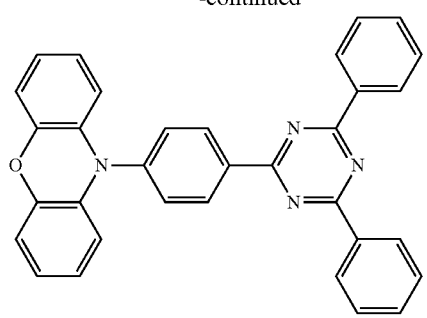
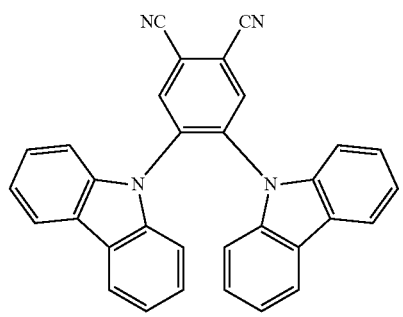
[Formula 9]
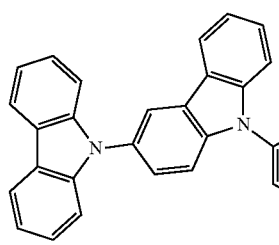
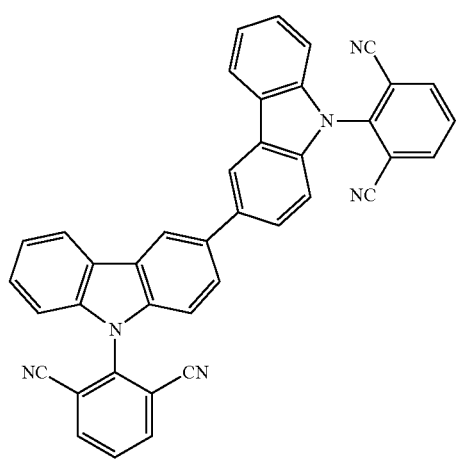
[Formula 8]
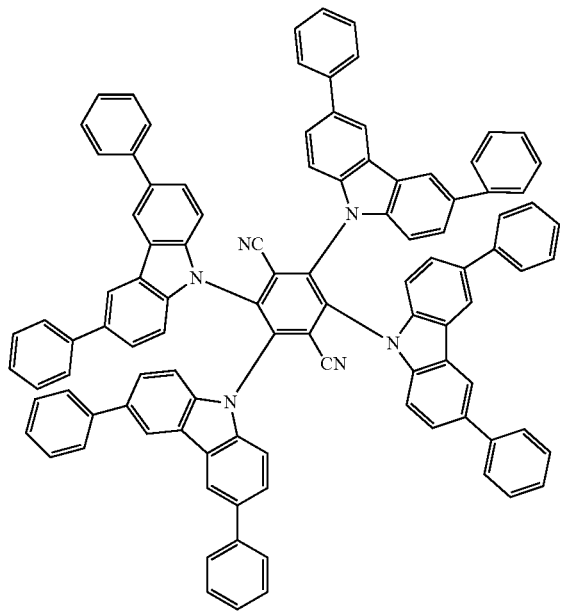
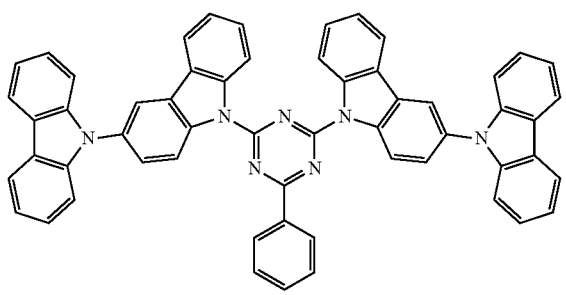

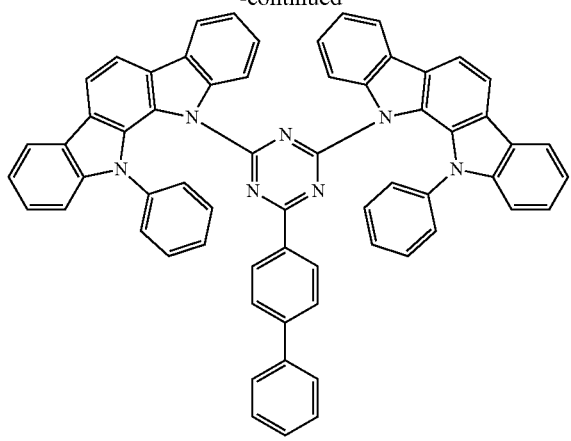
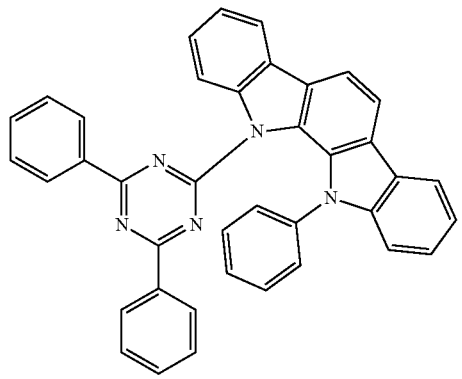
[Formula 10]
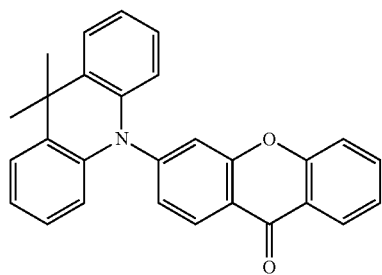
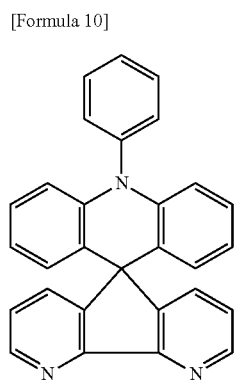
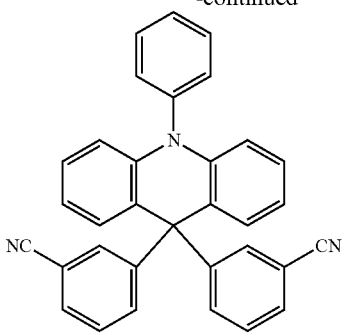
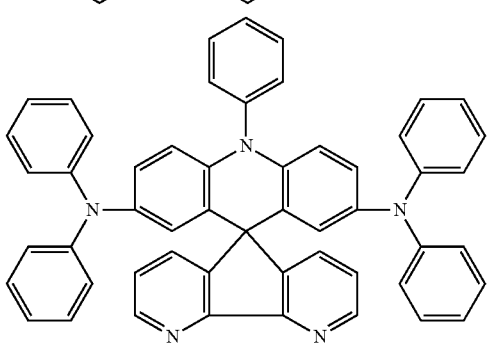
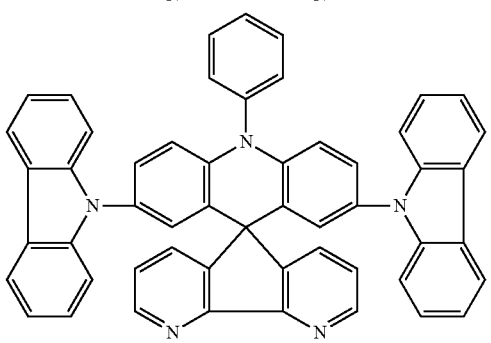
[Formula 11]
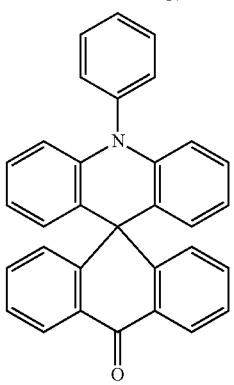
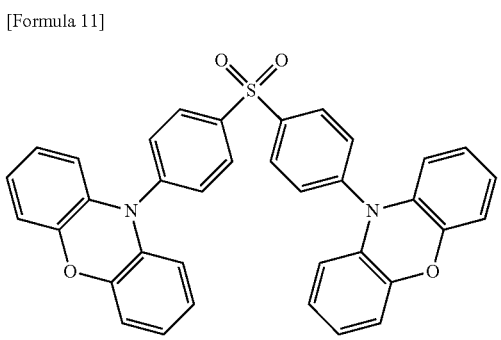

-continued
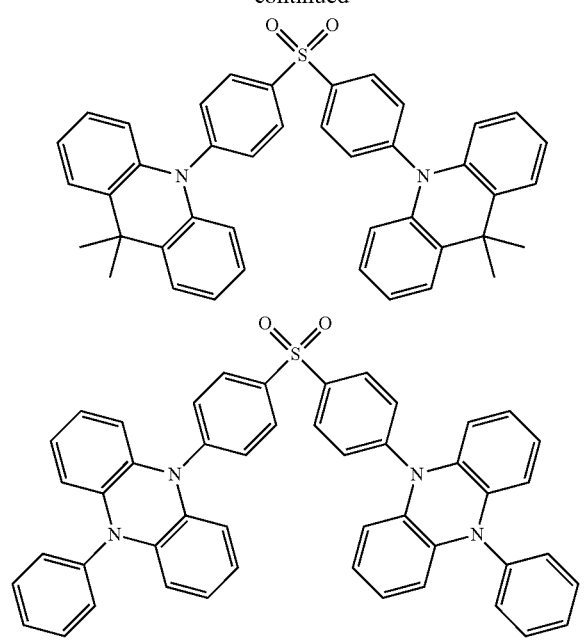
[Formula 12]
-continued
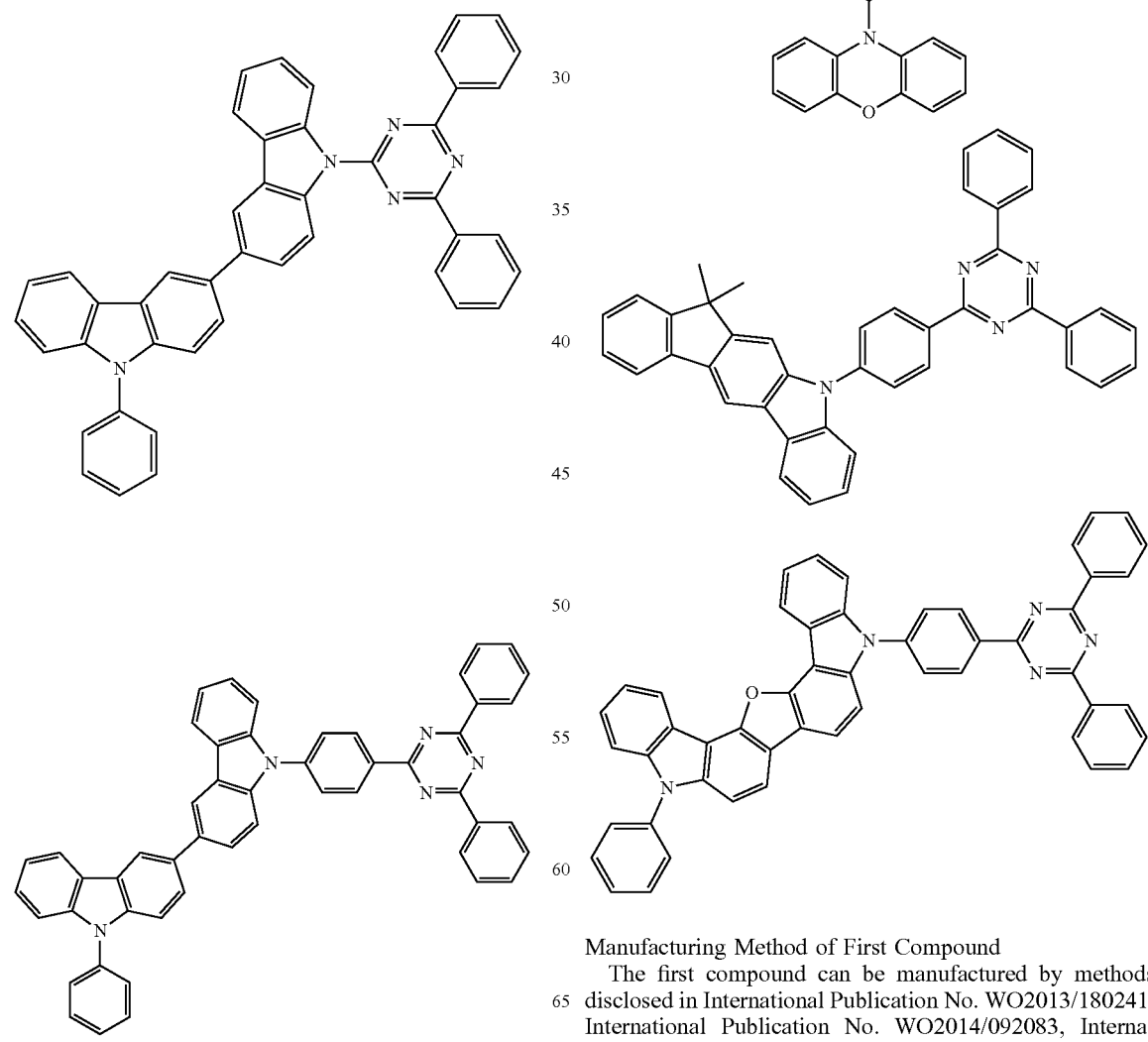
[Formula 13]
Manufacturing Method of First Compound
The first compound can be manufactured by methods disclosed in International Publication No. WO2013/180241, International Publication No. WO2014/092083, International Publication No. WO2014/104346, and the like.

Second Compound

Although the second compound is not particularly limited, the second compound is preferably a compound other than an amine compound. Although the second compound may be a carbazole derivative, dibenzofuran derivative, dibenzothiophene derivative, the second compound is not limited thereto.

It is also preferable that the second compound has at least one of a partial structure represented by a formula (21) and a partial structure represented by a formula (22) in one molecule.

[Formula 14]

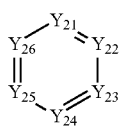
(21)

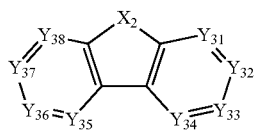
(22)

In the formula (21), $Y_{21}$ to $Y_{26}$ each independently represent a nitrogen atom or a carbon atom bonded to another atom in the molecule of the second compound.

At least one of $Y_{21}$ to $Y_{26}$ is a carbon atom bonded to another atom in the molecule of the second compound.

In the formula (22), $Y_{31}$ to $Y_{38}$ each independently represent a nitrogen atom or a carbon atom bonded to another atom in the molecule of the second compound.

At least one of $Y_{31}$ to $Y_{38}$ is a carbon atom bonded to another atom in the molecule of the second compound.

$X_2$ represents a nitrogen atom, an oxygen atom or a sulfur atom.

In the formula (22), it is also preferable that at least two of $Y_{31}$ to $Y_{38}$ are carbon atoms bonded to other atom in the molecule of the second compound and a cyclic structure including the carbon atoms is formed.

For instance, the partial structure represented by the formula (22) is preferably any one selected from the group consisting of partial structures represented by formulae (221), (222), (223), (224), (225) and (226).

[Formula 15]

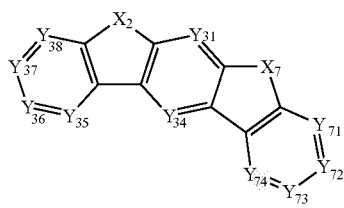
(221)

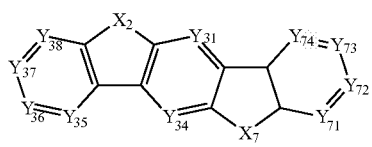
(222)

[Formula 16]

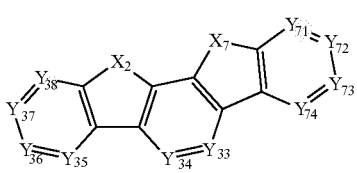
(223)

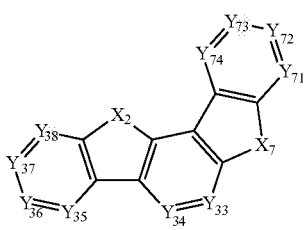
(224)

[Formula 17]

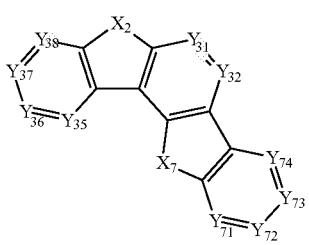
(225)

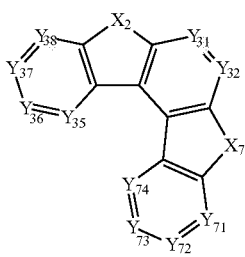
(226)

In the above formulae (221) to (226), $X_2$ represents a nitrogen atom, an oxygen atom or a sulfur atom.

$Y_{31}$ to $Y_{38}$ each independently represent a nitrogen atom or a carbon atom bonded to another atom in the molecule of the second compound.

$X_7$ represents a nitrogen atom, an oxygen atom, a sulfur atom or a carbon atom.

$Y_{71}$ to $Y_{74}$ each independently represent a nitrogen atom or a carbon atom bonded to another atom in the molecule of the second compound.

In the exemplary embodiments, the second compound preferably has the partial structure represented by the formula (223) among those represented by the formulae (221) to (226).

The partial structure represented by the formula (21) is preferably included in the second compound as at least one group selected from the group consisting of a group represented by a formula (23) and a group represented by a formula (24).

As for the second compound, bonding positions are preferably both situated in meta positions as shown in the formulae (23) and (24) to keep an energy gap $T_{77K}(M3)$ at 77 [K] high.

[Formula 18]

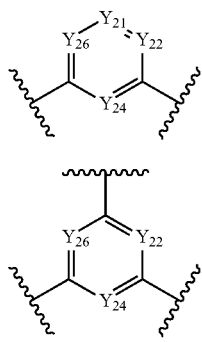

(23)

(24)

[Formula 19]

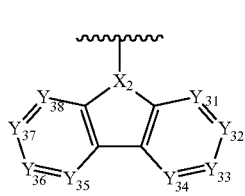

(25)

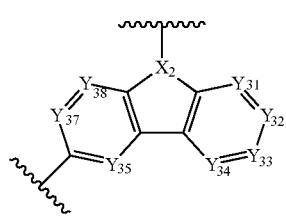

(26)

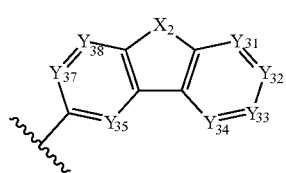

(27)

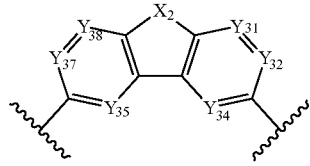

(28)

[Formula 20]

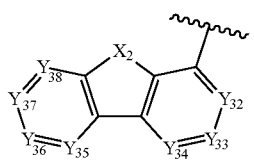

(29)

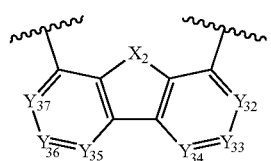

(20a)

In the above formulae (23) and (24), $Y_{21}$, $Y_{22}$, $Y_{24}$ and $Y_{26}$ each independently represent a nitrogen atom or $CR_{31}$.

$R_{31}$ represents a hydrogen atom or a substituent. When $R_{31}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogen atom, a cyano group, a nitro group, and a carboxy group. A substituted or unsubstituted aromatic hydrocarbon group having 6 to 30 ring carbon atoms in $R_{31}$ is preferably a non-fused ring.

Wavy lines in the formulae (23) and (24) each show a bonding position with another atom or another structure in the molecule of the second compound.

In the formula (23), $Y_{21}$, $Y_{22}$, $Y_{24}$ and $Y_{26}$ are each independently preferably $CR_{31}$, in which a plurality of $R_{31}$ may be the same or different.

In the formula (24), $Y_{22}$, $Y_{24}$ and $Y_{26}$ are each independently preferably $CR_{31}$, in which a plurality of $R_{31}$ may be the same or different.

The substituted germanium group is preferably represented by $-Ge(R_{101})_3$. $R_{101}$ is each independently a substituent. The substituent $R_{101}$ is preferably a substituted or unsubstituted alkyl group having 1 to 30 carbon atoms or a substituted or unsubstituted aromatic hydrocarbon group having 6 to 30 ring carbon atoms. A plurality of $R_{101}$ may be mutually the same or different.

The partial structure represented by the formula (22) is preferably included in the second compound as at least one group selected from the group consisting of a group represented by a formula (25), a group represented by a formula (26), a group represented by a formula (27), a group represented by a formula (28), a group represented by a formula (29), and a group represented by a formula (20a).

In the above formulae (25) to (29) and (20a), $Y_{31}$, $Y_{32}$, $Y_{33}$, $Y_{34}$, $Y_{35}$, $Y_{36}$, $Y_{37}$ and $Y_{38}$ each independently represent a nitrogen atom or $CR_{32}$.

$R_{32}$ represents a hydrogen atom or a substituent. When $R_{32}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogen atom, a cyano group, a nitro group, and a carboxy group. A substituted or unsubstituted aromatic hydrocarbon group having 6 to 30 ring carbon atoms in R32 is preferably a non-fused ring.

$X_2$ in the formulae (25) and (26) represents a nitrogen atom.

$X_2$ in (27) to (29) and (20a) represents $NR_{33}$, an oxygen atom or a sulfur atom.

$R_{33}$ represents a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a fluorine atom, a cyano group, a nitro group, and a carboxy group. A substituted or unsubstituted aromatic hydrocarbon group having 6 to 30 ring carbon atoms in $R_{33}$ is preferably a non-fused ring.

Wavy lines in the formulae (25) to (29) and (20a) each show a bonding position with another atom or another structure in the molecule of the second compound.

In the formula (25), $Y_{31}$ to $Y_{38}$ are each independently preferably $CR_{32}$. In the formulae (26) and (27), $Y_{31}$ to $Y_{35}$, $Y_{37}$ and $Y_{38}$ are each independently preferably $CR_{32}$. In the formula (28), $Y_{31}$, $Y_{32}$, $Y_{34}$, $Y_{35}$, $Y_{37}$ and $Y_{38}$ are each independently preferably $CR_{32}$. In the formula (29), $Y_{32}$ to $Y_{38}$ are each independently preferably $CR_{32}$. In the formula (20a), $Y_{32}$ to $Y_{37}$ are each independently preferably $CR_{32}$. A plurality of $R_{32}$ may be the same or different.

In the second compound, $X_2$ is preferably an oxygen atom or a sulfur atom, more preferably an oxygen atom.

$X_7$ is preferably an oxygen atom or a sulfur atom, more preferably an oxygen atom.

$X_2$ and $X_7$ are preferably oxygen atoms.

In the second compound, $R_{31}$ and $R_{32}$ each independently represent a hydrogen atom or a substituent. The substituent in $R_{31}$ and $R_{32}$ are preferably selected from the group consisting of a fluorine atom, a cyano group, a substituted or unsubstituted alkyl group having 1 to 30 carbon atoms, a substituted or unsubstituted aromatic hydrocarbon group having 6 to 30 ring carbon atoms, and a substituted or unsubstituted heterocyclic group having 5 to 30 ring atoms. $R_{31}$ and $R_{32}$ are more preferably a hydrogen atom, a cyano group, a substituted or unsubstituted aromatic hydrocarbon group having 6 to 30 ring carbon atoms, or a substituted or unsubstituted heterocyclic group having 5 to 30 ring atoms. The substituted or unsubstituted aromatic hydrocarbon group having 6 to 30 ring carbon atoms in $R_{31}$ and $R_{32}$ is preferably a non-fused ring.

In the second compound, $R_{33}$ is each independently preferably a substituent selected from the group consisting of a substituted or unsubstituted aromatic hydrocarbon group having 6 to 30 ring carbon atoms and a substituted or unsubstituted heterocyclic group having 5 to 30 ring atoms, more preferably a substituent selected from the group consisting of a substituted or unsubstituted aromatic hydrocarbon group having 6 to 20 ring carbon atoms and a substituted or unsubstituted heterocyclic group having 5 to 20 ring atoms. The substituted or unsubstituted aromatic hydrocarbon group having 6 to 30 ring carbon atoms in $R_{33}$ is preferably a non-fused ring.

It is also preferable that the second compound is an aromatic hydrocarbon compound or an aromatic heterocyclic compound. Moreover, it is preferable that the second compound does not have a fused aromatic hydrocarbon ring.

Manufacturing Method of Second Compound

The second compound can be manufactured by methods disclosed in International Publication No. WO2012/153780, International Publication No. WO2013/038650, and the like.

Examples of the substituent in the second compound are shown below, but the invention is not limited thereto.

Specific examples of the aromatic hydrocarbon group (occasionally referred to as an aryl group) include a phenyl group, tolyl group, xylyl group, naphthyl group, phenanthryl group, pyrenyl group, chrysenyl group, benzo[c]phenanthryl group, benzo[g]chrysenyl group, benzoanthryl group, triphenylenyl group, fluorenyl group, 9,9-dimethylfluorenyl group, benzofluorenyl group, dibenzofluorenyl group, biphenyl group, terphenyl group, quarterphenyl group and fluoranthenyl group, among which a phenyl group, biphenyl group, terphenyl group, quarterphenyl group, naphthyl group, triphenylenyl group and fluorenyl group may be preferable.

Specific examples of the aromatic hydrocarbon group having a substituent include a tolyl, xylyl group and 9,9-dimethylfluorenyl group.

As is understood from the specific examples, the aryl group includes both fused aryl group and non-fused aryl group.

Preferable examples of the aromatic hydrocarbon group include a phenyl group, biphenyl group, terphenyl group, quarterphenyl group, naphthyl group, triphenylenyl group and fluorenyl group.

Specific examples of the aromatic heterocyclic group (occasionally referred to as a heteroaryl group, heteroaromatic ring group or heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thiophenyl group, benzothiophenyl group, dibenzothiophenyl group, azadibenzothiophenyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothiophenyl group, carbazolyl group, pyridyl group, pyrimidinyl group, triazinyl group, azadibenzofuranyl group and azadibenzothiophenyl group may be preferable.

The aromatic heterocyclic group is preferably a dibenzofuranyl group, dibenzothiophenyl group, carbazolyl group, pyridyl group, pyrimidinyl group, triazinyl group, azadibenzofuranyl group or azadibenzothiophenyl group, and further preferably a dibenzofuranyl group, dibenzothiophenyl group, azadibenzofuranyl group or azadibenzothiophenyl group.

In the second compound, it is also preferable that the substituted silyl group is a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include trimethylsilyl group and trimethylsilyl group.

Specific examples of the substituted or unsubstituted arylalkylsilyl group include diphenylmethylsilyl group, ditolylmethylsilyl group, and phenyl dimethylsilyl group.

Specific examples of the substituted or unsubstituted triarylsilyl group include triphenlsilyl group and tritolylsilyl group.

In the second compound, it is also preferable that the substituted phosphine oxide group is a substituted or unsubstituted diaryl phosphine oxide group.

Specific examples of the substituted or unsubstituted diaryl phosphine oxide group include a diphenyl phosphine oxide group and ditolyl phosphine oxide group.

Third Compound

The third compound is preferably a fluorescent compound or a phosphorescent compound.

Examples of a blue fluorescent material include a pyrene derivative, styrylamine derivative, chrysene derivative, fluoranthene derivative, fluorene derivative, diamine derivative, and triarylamine derivative. Specific examples of the blue fluorescent material include N,N'-bis[4-(9H-carb azole-9-yl)phenyl]-N,N'-diphenyl stilbene-4,4'-diamine (abbreviation: YGA2S), 4-(9H-carbazole-9-yl)-4'-(10-phenyl-9-anthryl) triphenylamine (abbreviation: YGAPA), and 4-(10-phenyl-9-anthryl)-4'-(9-phenyl-9H-carbazole-3-yl)triphenylamine (abbreviation: PCBAPA). In addition to the above, the examples of the blue fluorescent material further include a boron complex compound, examples of which include a bis(azinyl)amine boron complex and a pyrromethene boron complex.

A green fluorescent material is exemplified by an aromatic amine derivative. Specific examples of the green fluorescent material include N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1, 1'-biphenyl-2-yl)-2-anthryl]-N,N',N'-triphenyl-1,4-phenyl ene diamine (abbreviation: 2DPABPhA), N-[9,10-bis(1,1'-biphenyl-2-yl)]-N-[4-(9H-carbazole-9-yl)phenyl]-N-phenyl anthracene-2-amine (abbreviation: 2YGABPhA), and N,N, 9-triphenylanthracene-9-amine (abbreviation: DPhAPhA). In addition to the above, the examples of the green fluorescent material further include a boron complex compound, examples of which include a bis(azinyl)amine boron complex and a pyrromethene boron complex.

A red fluorescent material is exemplified by a tetracene derivative and a diamine derivative. Examples of the red fluorescent material include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-diamine (abbreviation: p-mPhAFD). In addition to the above, the examples of the red fluorescent material further include a boron complex compound, examples of which include a bis(azinyl)amine boron complex and a pyrromethene boron complex.

A blue phosphorescent material is exemplified by a metal complex such as an iridium complex, osmium complex, and platinum complex. Specific examples of the blue phosphorescent material include bis[2-(4',6'-difluorophenyl)pyridinato-N,C2']iridium(III)tetrakis(1-pyrazolyl)borate (abbreviation: FIr6), bis[2-(4',6'-difluorophenyl)pyridinato-N,C2'] iridium(III)picolinate (abbreviation: FIrpic), bis[2-(3', 5'bistrifluoromethylphenyl)pyridinato-N,C2']iridium(III) picolinate(abbreviation: Ir(CF3ppy)2(pic)), and bis[2-(4',6'-difluorophenyl)pyridinato-N,C2']iridium(III) acetylacetonato (abbreviation: FIracac).

A green phosphorescent material is exemplified by the iridium complex. Examples of the green phosphorescent material further include tris(2-phenylpyridinatoN,C2') iridium(III) (abbreviation: Ir(ppy)$_3$), bis(2-phenylpyridinatoN,C2')iridium(III)acetylacetonato (abbreviation: Ir(ppy)$_2$(acac)), bis(1,2-diphenyl-1H-benzoimidazolato)iridium(III) acetyl acetonato (abbreviation: Ir(pbi)$_2$(acac)), and bis (benzo[h]quinolinato)iridium(III)acetylacetonato (abbreviation: Ir(bzq)$_2$(acac)).

A red phosphorescent material is exemplified by a metal complex such as an iridium complex, platinum complex, terbium complex and europium complex. Specifically, the red phosphorescent material is exemplified by an organic metal complex such as bis[2-(2'-benzo[4,5-a]thienyl)pyridinato-N,C3']iridium(III)acetylacetonato (abbreviation: Ir(btp)$_2$(acac)), bis(1-phenylisoquinolinato-N,C2') iridium (III)acetylacetonato (abbreviation: Ir(piq)$_2$(acac)), (acetylacetonato)bis[2,3-bis(4-fluorophenyl)quinoxalinato] iridium(III) (abbreviation: Ir(Fdpq)$_2$(acac)), and 2,3,7,8,12, 13,17,18-octaethyl-21H,23H-porphyrinplatinum(II) (abbreviation: PtOEP).

Since a rare earth metal complex such as tris(acetylacetonato)(monophenanthroline)terbium(III)(abbreviation: Tb(acac)$_3$(Phen)), tris (1,3-diphenyl-1,3-propanedionato) (monophenanthroline)europium (III)(abbreviation: Eu(DBM)$_3$(Phen)), and tris [1-(2-thenoyl)-3,3,3-trifluoroacetonato](monophenanthroline)europium (III)(abbreviation: Eu(TTA)$_3$(Phen)) produces emission from a rare earth metal ion (electron transition between different multiplicities), the rare earth metal complex is usable as the phosphorescent compound.

Fourth Compound

It is also preferable that the fourth compound is represented by a formula (2).

[Formula 21]

$$(Cz)_n\text{-}L_2\text{-}R_2 \qquad (2)$$

In the formula (2), Cz is represented by a formula (2a) or (2b) and a plurality of Cz are mutually the same or different; n represents an integer of 1 to 4; L$_2$ represents a single bond or a linking group, in which the linking group in L$_2$ is a group selected from the group consisting of a substituted or unsubstituted aromatic hydrocarbon group having 6 to 30 ring carbon atoms and a substituted or unsubstituted heterocyclic group having 5 to 30 ring atoms; and R$_2$ is represented by a formula (20).

[Formula 22]

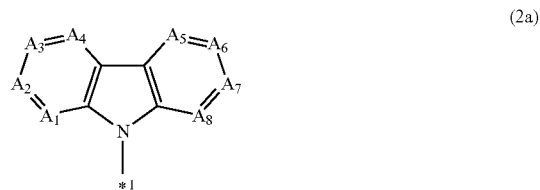

(2a)

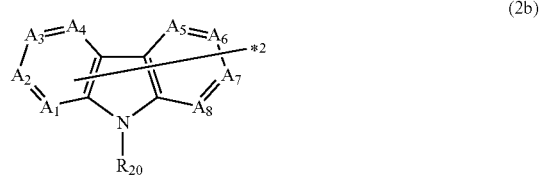

(2b)

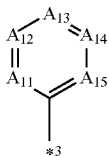

(20)

In the above formulae (2a) and (2b), *1 and *2 represent a bonding site to $L_2$.

$A_1$, $A_2$, $A_3$, $A_4$, $A_5$, $A_6$, $A_7$ and $A_8$ each independently represent a nitrogen atom or $CR_{21}$.

$R_{21}$ represents a hydrogen atom or a substituent. When $R_{21}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogeno group, a cyano group, a carbonyl group, and a carboxy group. A plurality of $R_{21}$ may be mutually the same or different. When at least two of the plurality of $R_{21}$ are the substituents, the substituents $R_{21}$ may be bonded to each other to form a cyclic structure.

$R_{20}$ represents a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, and a substituted silyl group. A plurality of $R_{20}$ may be mutually the same or different.

In the formula (20), *3 represents a bonding site to $L_2$. $A_{11}$, $A_{12}$, $A_{13}$, $A_{14}$ and $A_{15}$ each independently represent a nitrogen atom or $CR_{22}$ in which $R_{22}$ is a hydrogen atom or a substituent. When $R_{22}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogeno group, a cyano group, a carbonyl group, and a carboxy group. A plurality of $R_{22}$ may be mutually the same or different. When at least two of the plurality of $R_{22}$ are the substituents, the substituents $R_{22}$ may be bonded to each other to form a cyclic structure. At least one of $A_{11}$ to $A_{15}$ is a nitrogen atom, or alternatively, when all of the $A_{11}$ to $A_{15}$ are $CR_{22}$, at least one of the plurality of $R_{22}$ is a cyano group.

It is also preferable that the fourth compound is represented by a formula (2A).

[Formula 23]

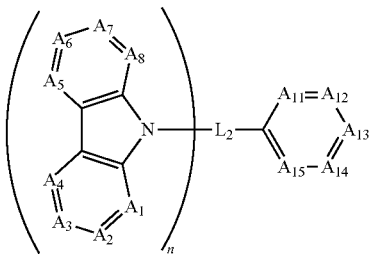

(2A)

In the formula (2A), $A_1$ to $A_8$, $A_{11}$ to $A_{15}$, $L_2$ and n respectively represent the same as $A_1$ to $A_8$, $A_{11}$ to $A_{15}$, $L_2$ and n of the formula (2).

It is preferable that at least two of $A_{11}$, $A_{13}$ and $A_{15}$ are nitrogen atoms. It is also preferable that $A_{11}$, $A_{13}$ and $A_{15}$ are nitrogen atoms. When $A_{11}$, $A_{13}$ and $A_{15}$ are nitrogen atoms, $A_{12}$ and $A_{14}$ are $CR_{21}$ in which $R_{21}$ is preferably a substituent. The substituent $R_{21}$ is preferably a substituted or unsubstituted aromatic hydrocarbon group having 6 to 30 ring carbon atoms, more preferably a substituted or unsubstituted aromatic hydrocarbon group having 6 to 20 ring carbon atoms, further preferably a phenyl group.

It is also preferable that $A_{11}$ to $A_{15}$ are $CR_{22}$, in which at least one of the plurality of $R_{22}$ is a cyano group.

It is also preferable that $A_1$, $A_2$, $A_3$, $A_4$, $A_5$, $A_6$, $A_7$ and $A_8$ are each independently $CR_{21}$. It is also preferable that $A_1$, $A_2$, $A_3$, $A_4$, $A_5$, $A_6$, $A_7$ and $A_8$ are $CR_{21}$, in which $R_{21}$ is a hydrogen atom.

It is also preferable that n is 1 or 2.

It is also preferable that at least one of $A_1$ to $A_8$ is $CR_{21}$, in which at least one of $R_{21}$ is a heterocyclic group represented by a formula (2c) or (2d).

[Formula 24]

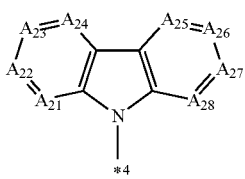

(2c)

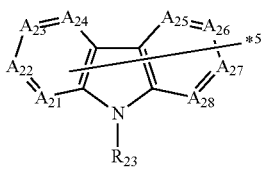

(2d)

In the above formulae (2c) and (2d), *4 and *5 represent a bonding site to $A_1$ to $A_8$ in the formula (2a).

$A_{21}$, $A_{22}$, $A_{23}$, $A_{24}$, $A_{25}$, $A_{26}$, $A_{27}$ and $A_{28}$ each independently represent a nitrogen atom or $CR_{24}$.

$R_{24}$ represents a hydrogen atom or a substituent. When $R_{24}$ is a substituent, the substituent is selected from the group consisting of the examples of the substituent when $R_{21}$ is the substituent. A plurality of $R_{24}$ are mutually the same or different. When at least two of the plurality of $R_{24}$ are substituents, the substituents $R_{24}$ may be bonded to each other to form a cyclic structure.

$R_{23}$ is selected from the group consisting of the examples of substituent listed for $R_{20}$. A plurality of $R_{23}$ may be the same or different.

It is also preferable that $A_{21}$, $A_{22}$, $A_{23}$, $A_{24}$, $A_{25}$, $A_{26}$, $A_{27}$ and $A_{28}$ are each independently $CR_{24}$. It is also preferable that $A_1$, $A_2$, $A_3$, $A_4$, $A_5$, $A_6$, $A_7$ and $A_8$ are $CR_{24}$, in which $R_{24}$ is a hydrogen atom.

It is also preferable that the bonding site *4 in the formula (2c) is bonded to $A_3$ or $A_6$.

In the formulae (2) and (2A), $L_2$ represents a single bond or a linking group. The linking group in $L_2$ is preferably selected from the group consisting of a substituted or unsubstituted aromatic hydrocarbon group having 6 to 20 ring carbon atoms or a substituted or unsubstituted heterocyclic group having 5 to 20 ring atoms, more preferably a substituted or unsubstituted aromatic hydrocarbon group having 6 to 20 ring carbon atoms. $L_2$ in the formulae (2) and (2A) is preferably a phenylene group, biphenyldiyl group or naphthylene group, more preferably a phenylene group or biphenyldiyl group, further preferably a p-phenylene group. The substituent in $L_2$ in the formulae (2) and (2A) is preferably at least one of a phenyl group, alkyl group and cyano group.

The formula (2a) is preferably represented by one of the following formulae (2e) to (2t).

[Formula 25]

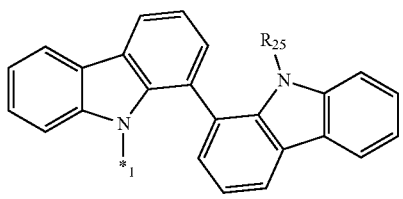

(2e)

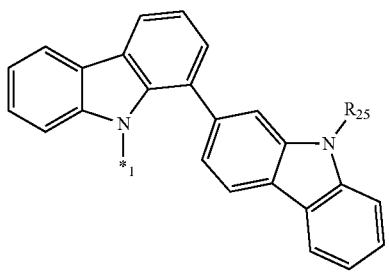

(2f)

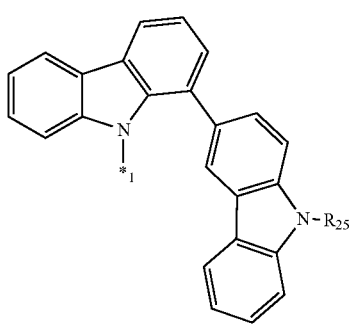

(2g)

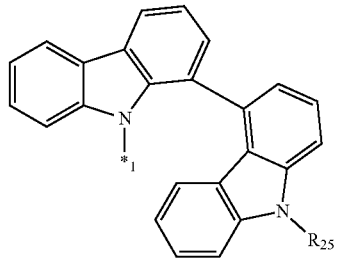

(2h)

[Formula 26]

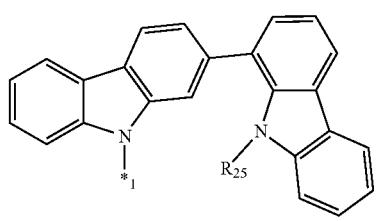

(2i)

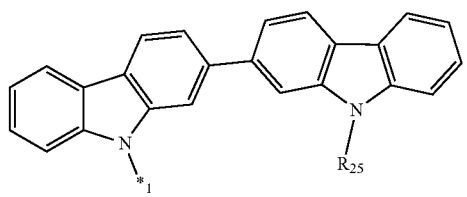

(2j)

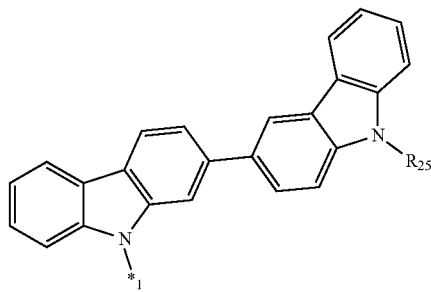

(2k)

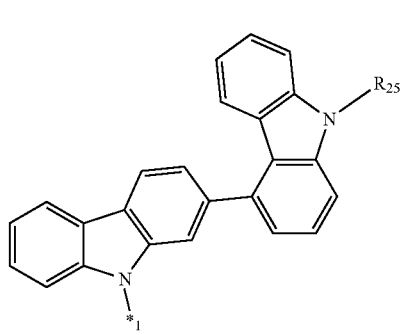

(2l)

[Formula 27]
(2m)
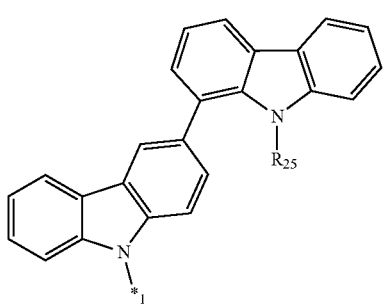
(2n)
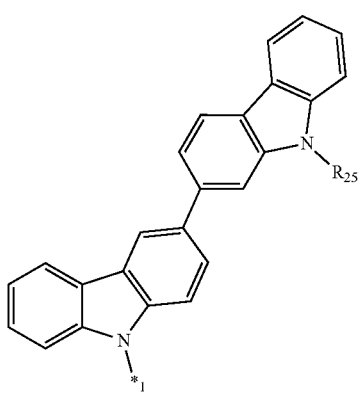
(2o)
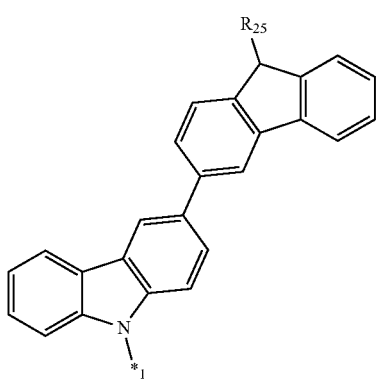
(2p)
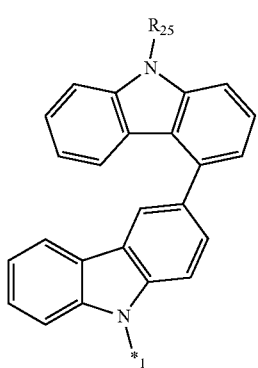
[Formula 28]
(2q)
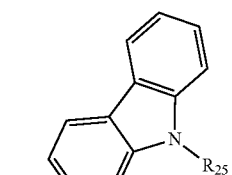
(2r)
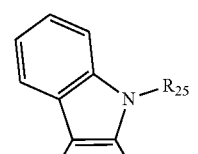
(2s)
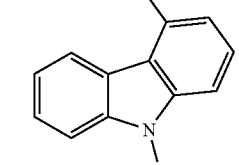
(2t)
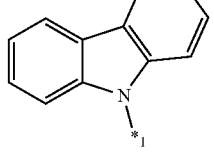

In the formulae (2e) to (2t), *₁ represents a bonding site to L₂. R₂₅ represents a hydrogen atom or a substituent. When R₂₅ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogeno group, a cyano group, a carbonyl group, and a carboxy group.

A carbazole ring in the formulae (2e) to (2t) may have a substituent. The substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogeno group, a cyano group, a carbonyl group, and a carboxy group. A plurality of substituents may be mutually the same or different and may be bonded to each other to form a cyclic structure.

The formula (2a) is further preferably represented by any one of the formulae (2j), (2k), (2l), (2n), (2p), (2r) and (2s) among the formulae (2e) to (2t).

Manufacturing Method of Fourth Compound

The fourth compound can be manufactured by methods disclosed in International Publication No. WO2003/080760, International Publication No. WO2011/132683, or International Publication No. WO2011/132684.

Examples of the fourth compound are given below. It should be noted that the fourth compound in the exemplary embodiments are not limited thereto.

[Formula 29]

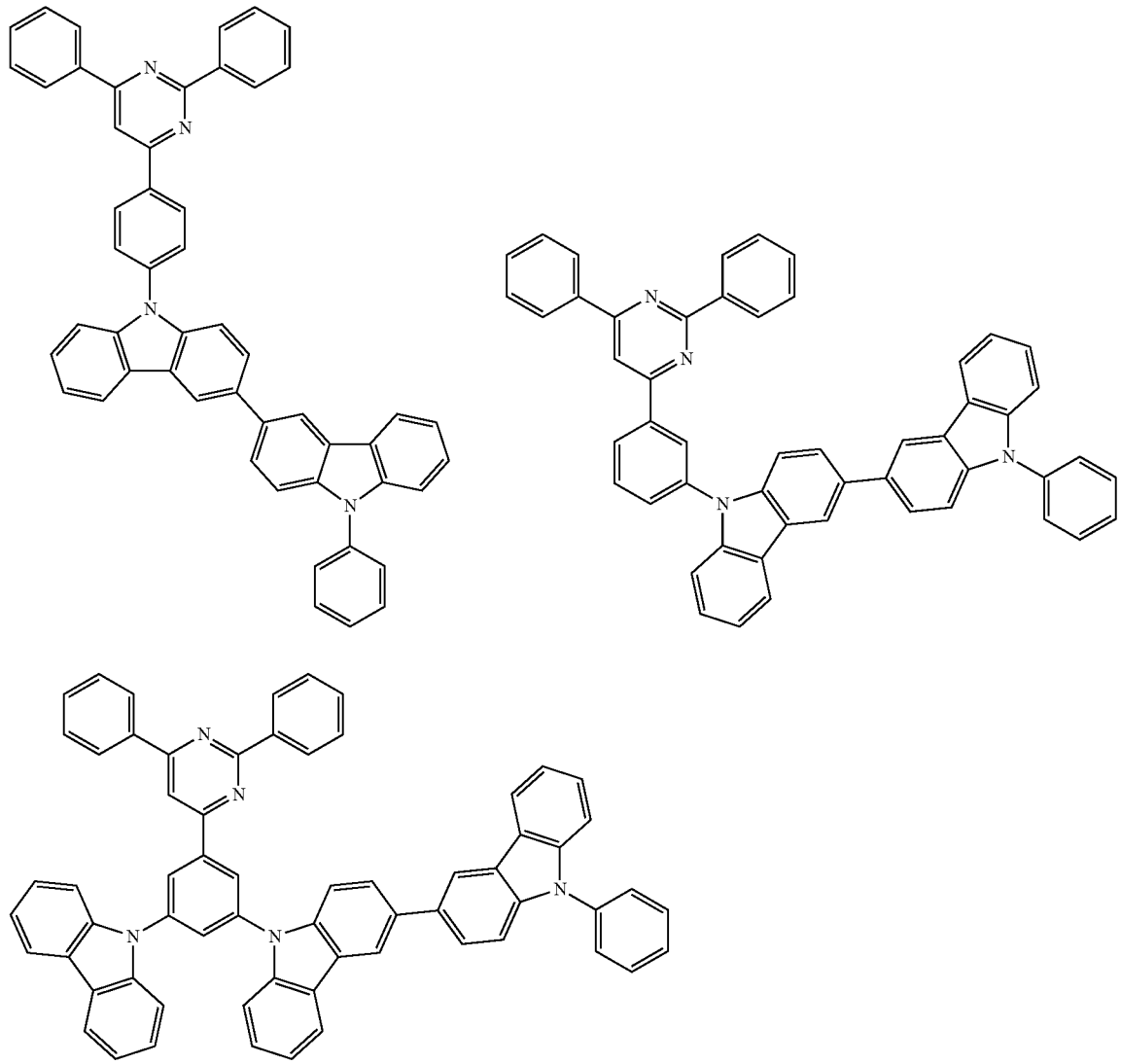

-continued
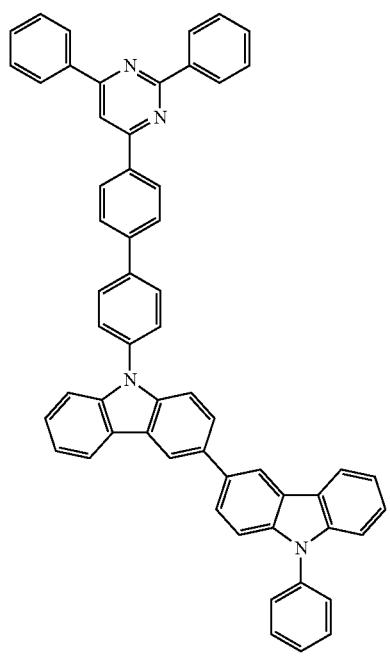
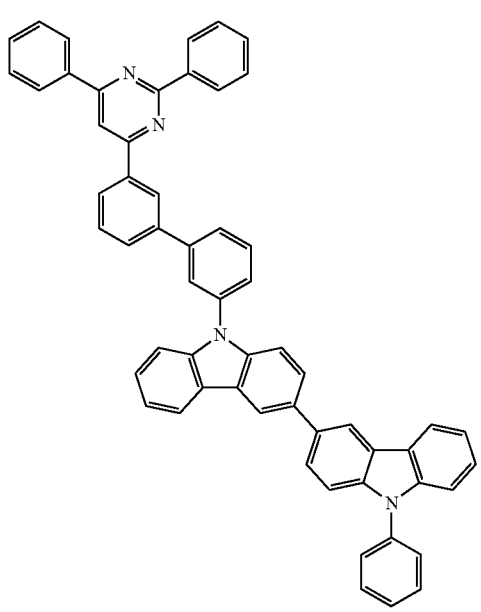
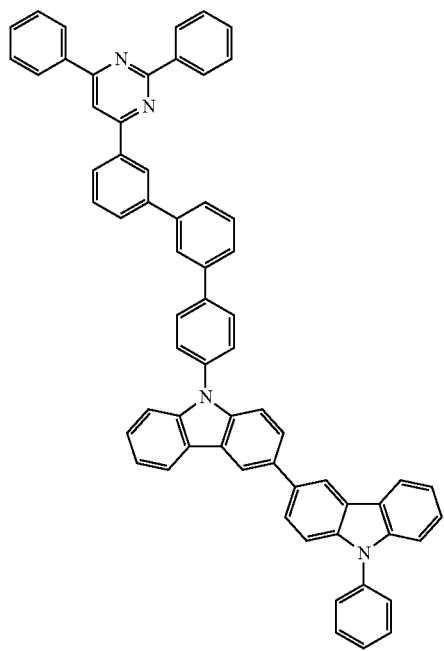
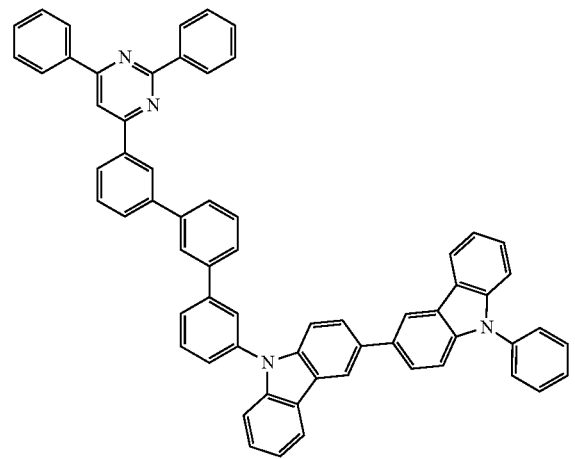

[Formula 30]
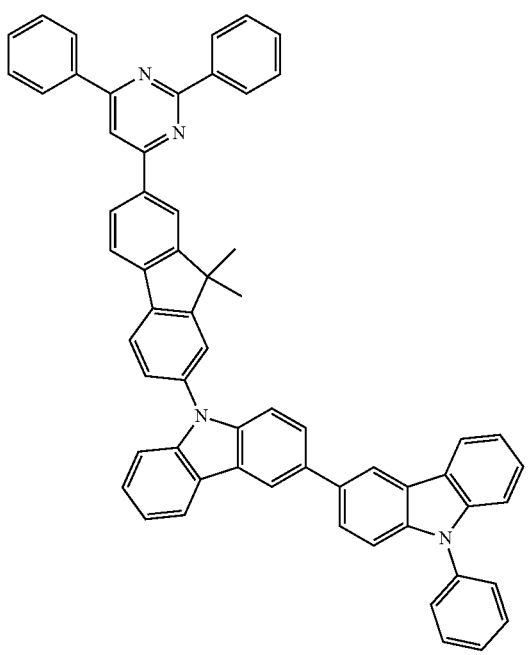
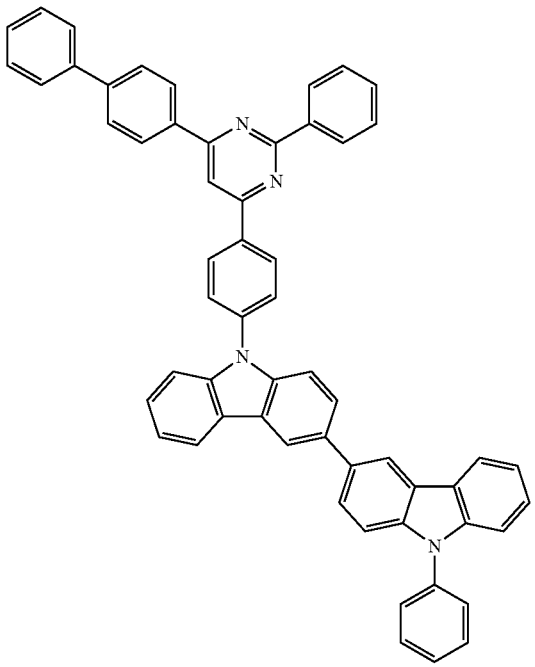
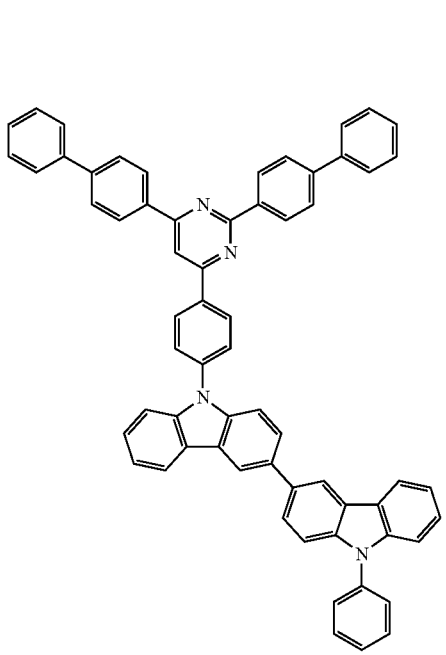
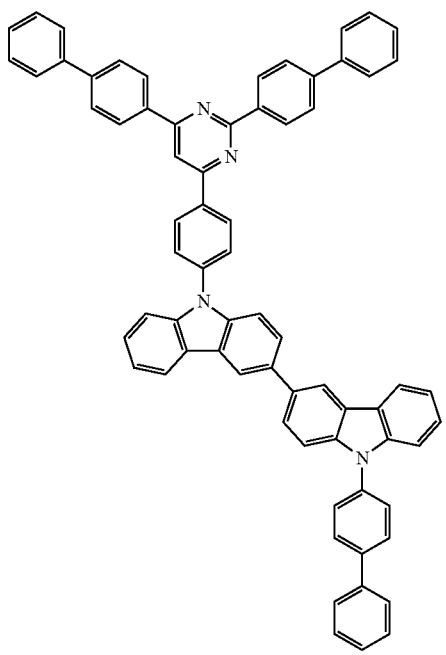

41
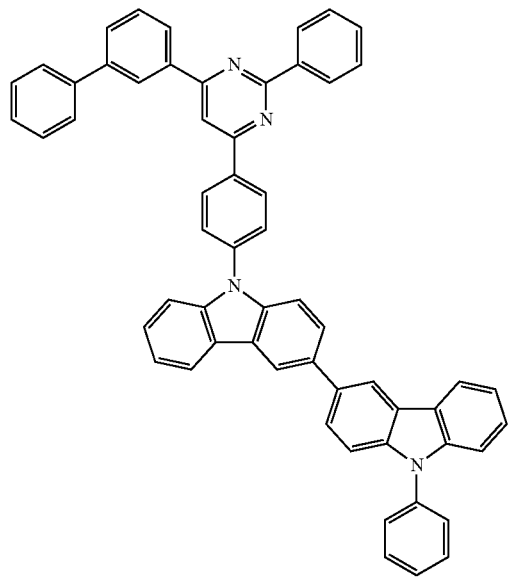
42
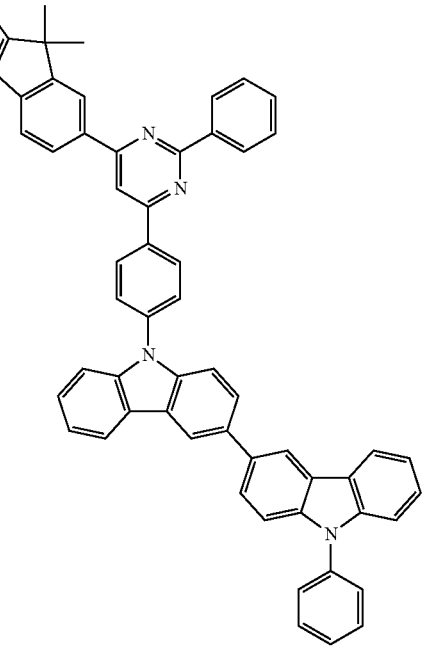
[Formula 31]
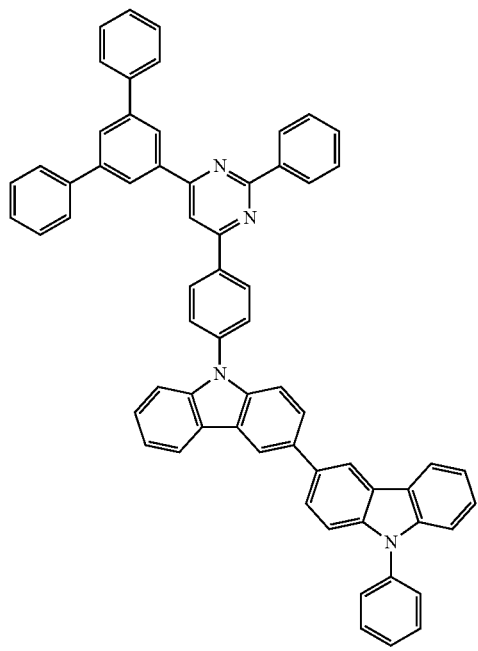
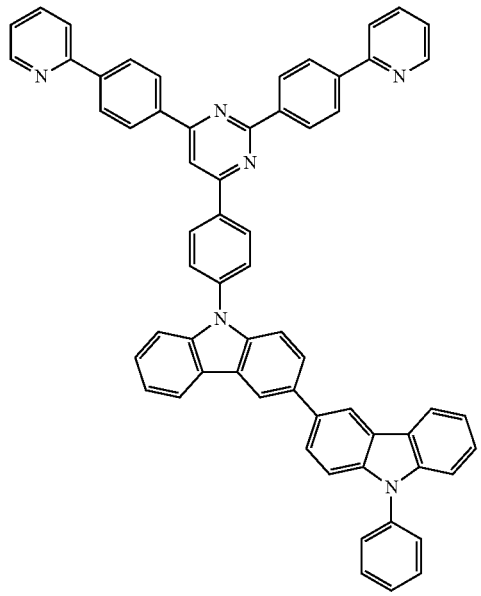

-continued
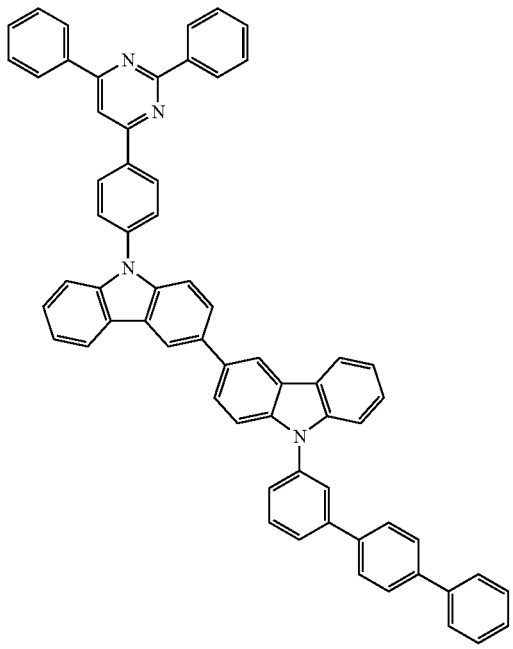
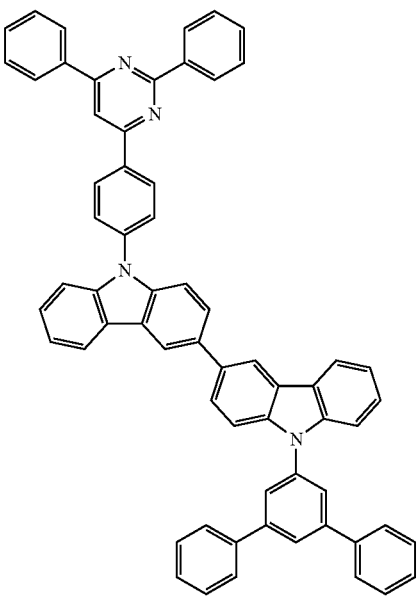
[Formula 32]
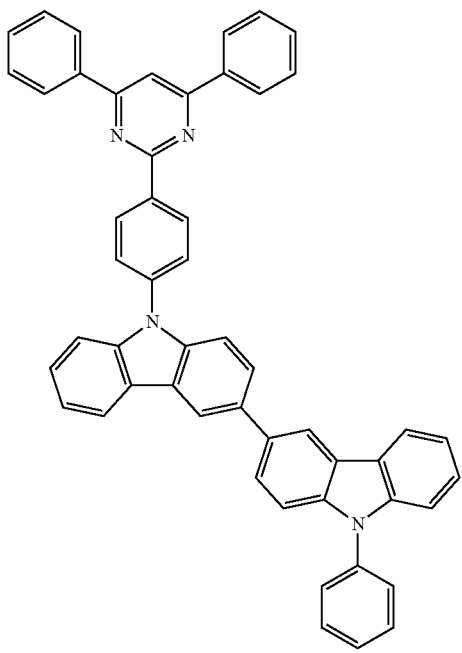
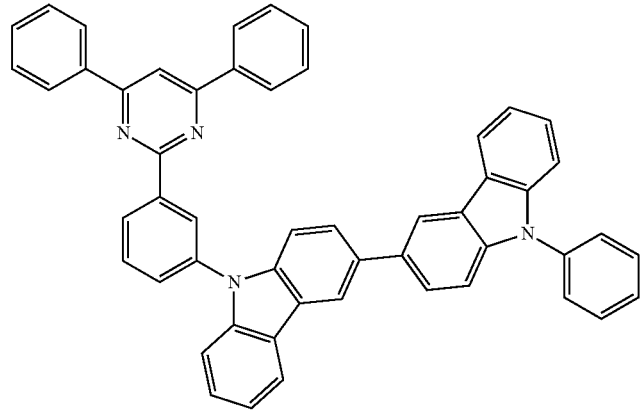

-continued
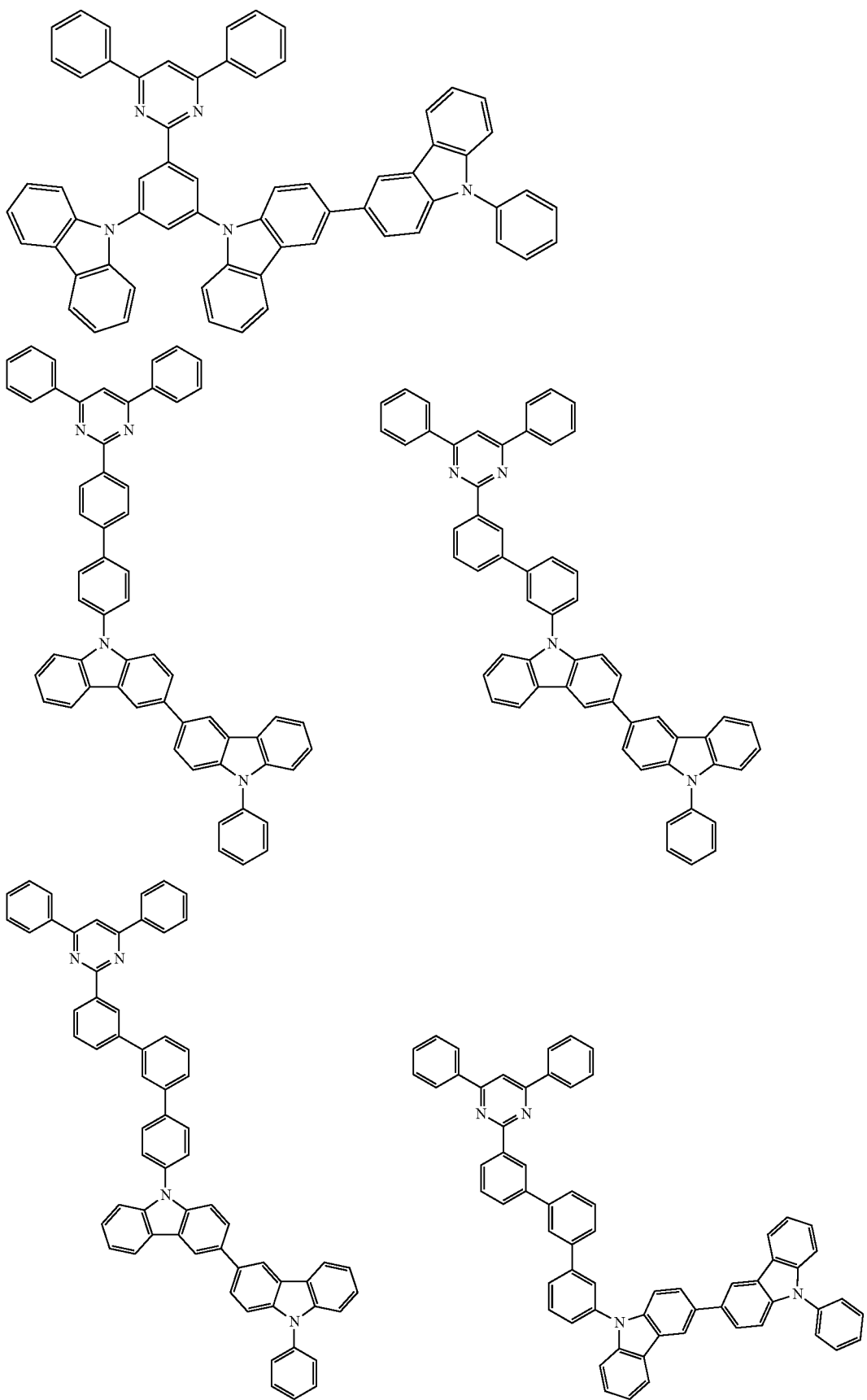

[Formula 33]
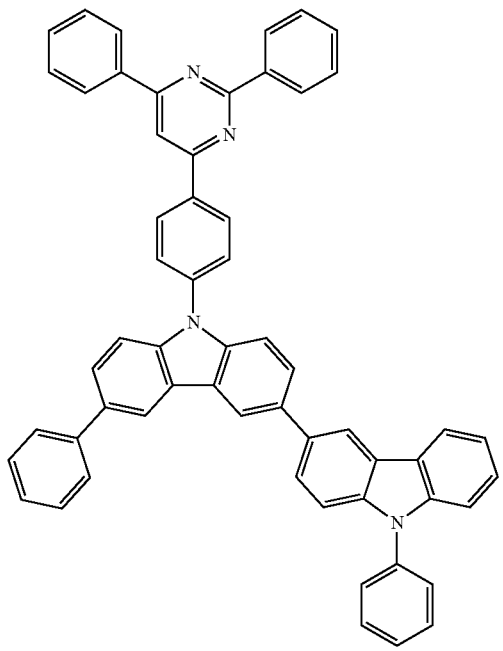
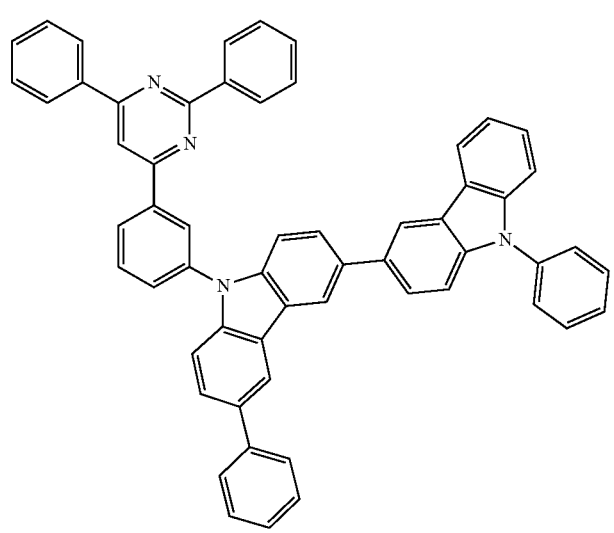
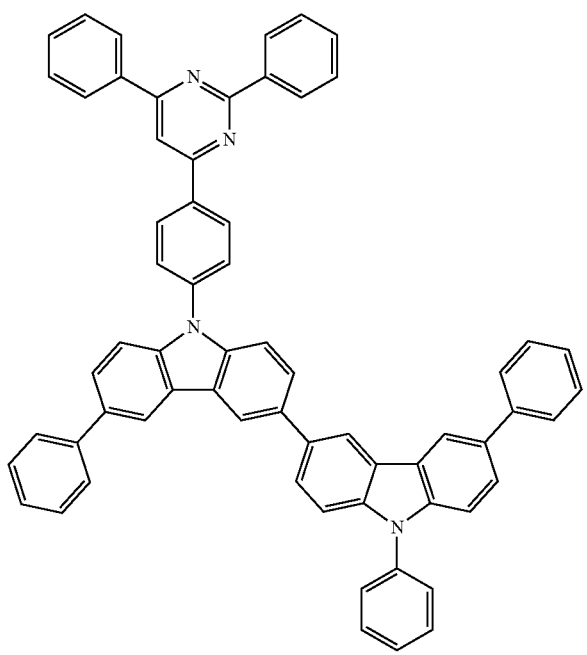

[Formula 34]
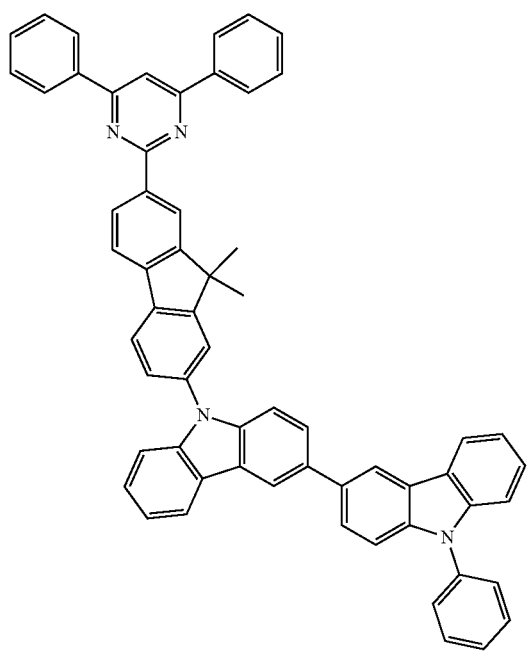
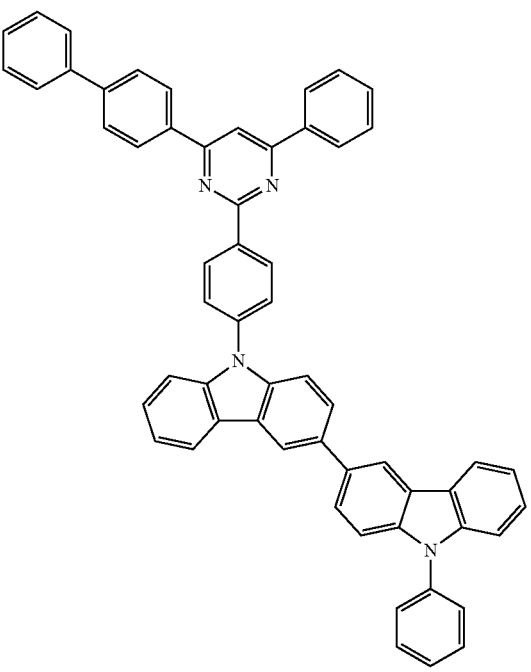
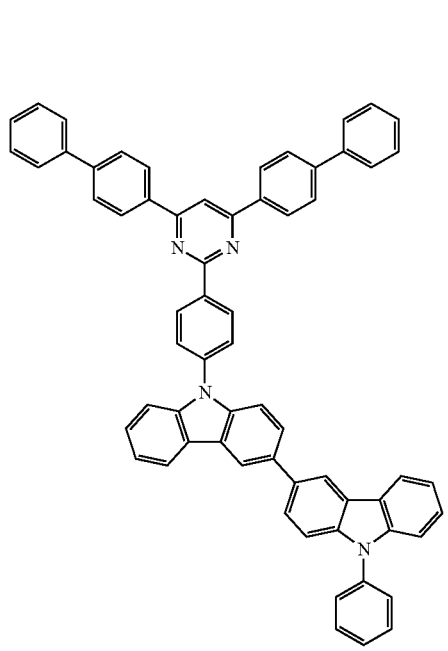
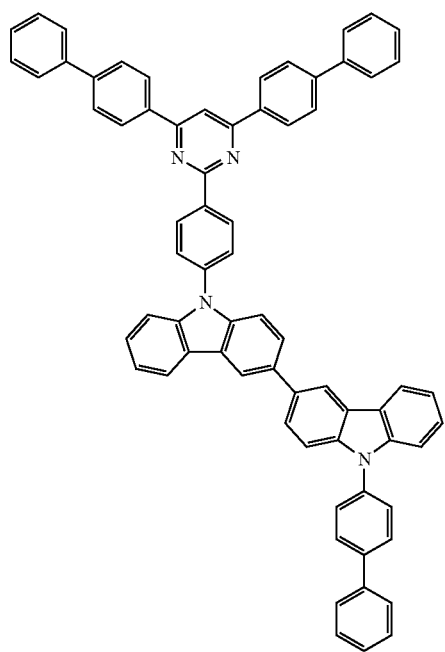

51
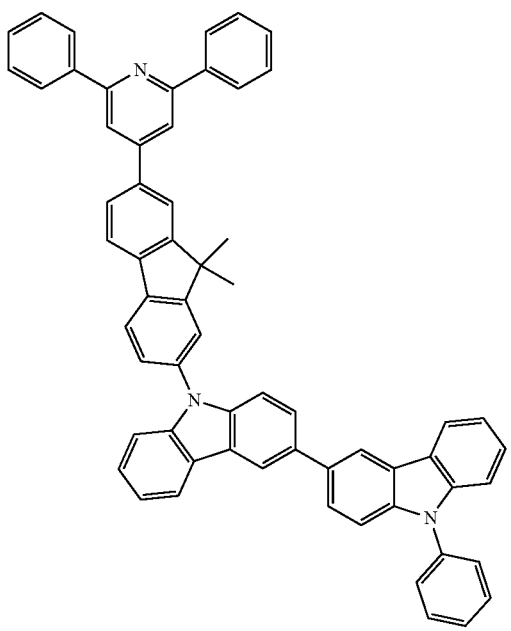
-continued
52
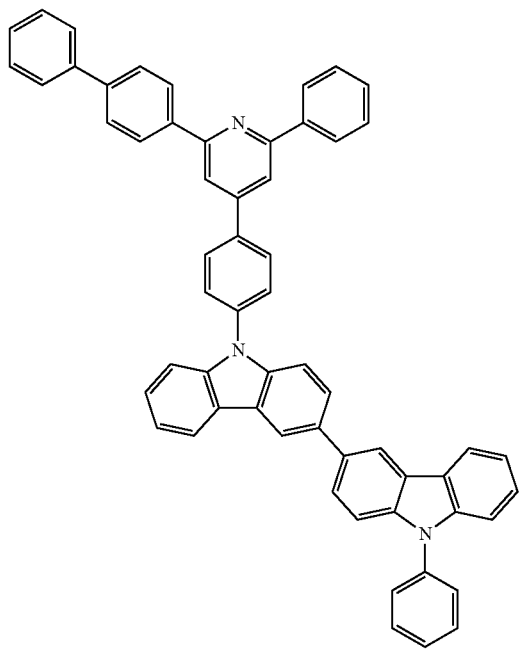
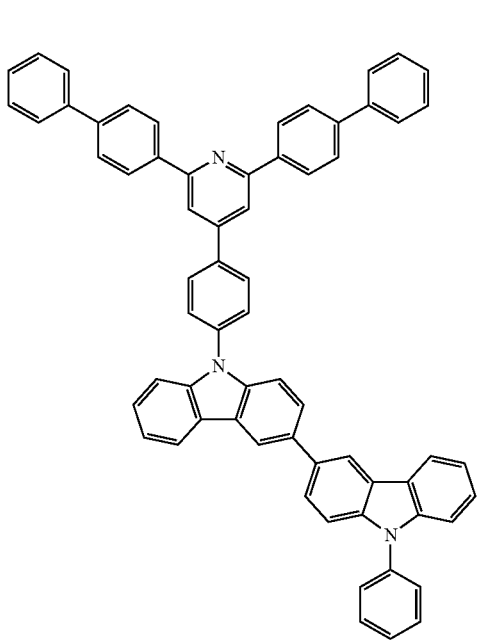
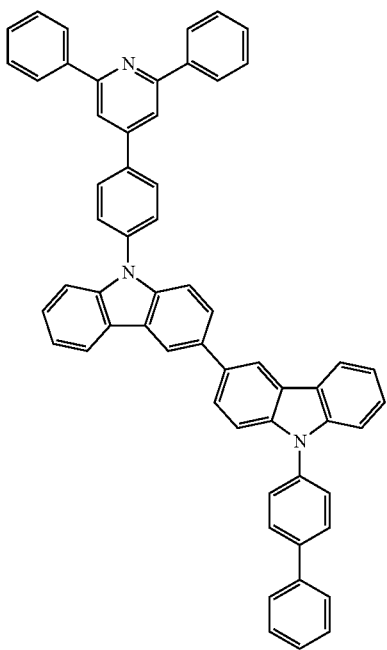

[Formula 35]
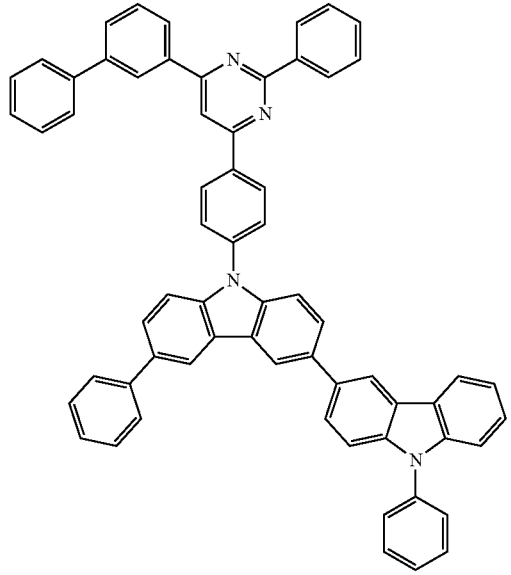
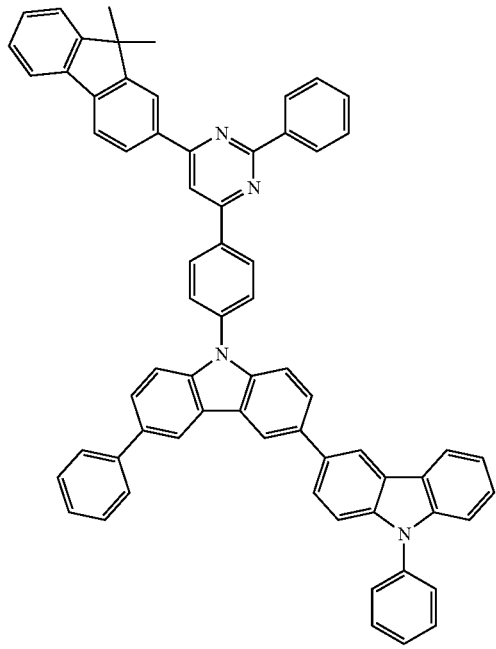
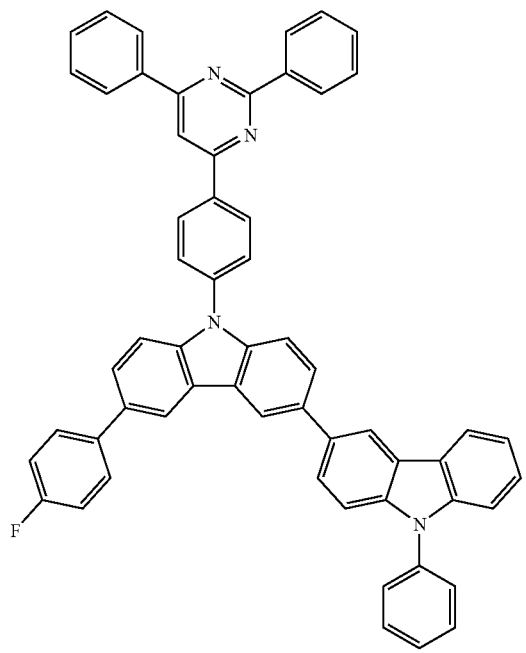
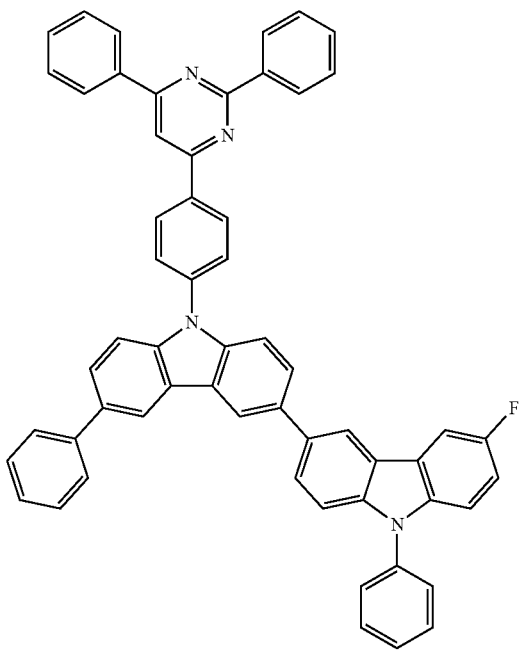

55
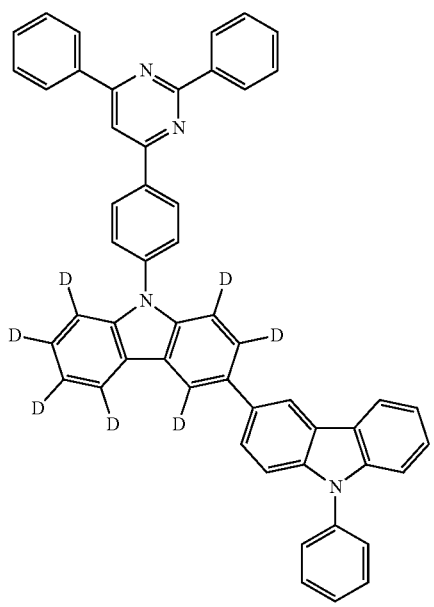
-continued
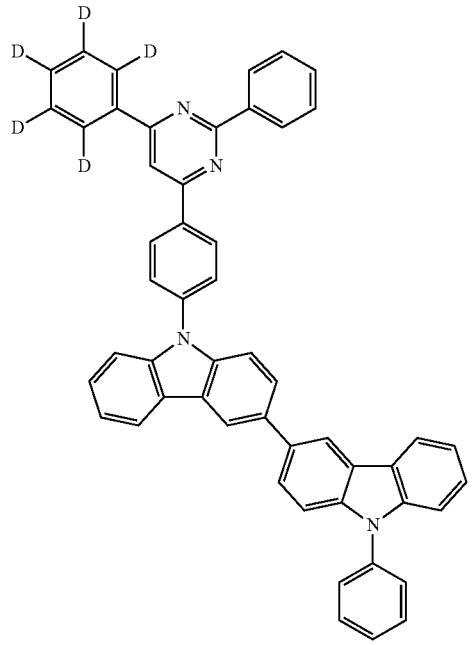
56
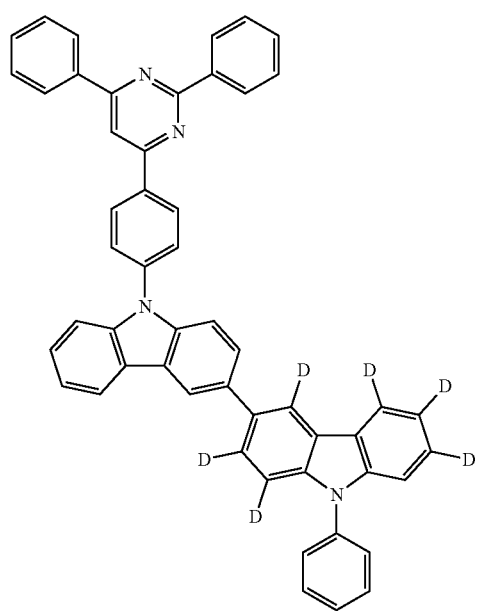
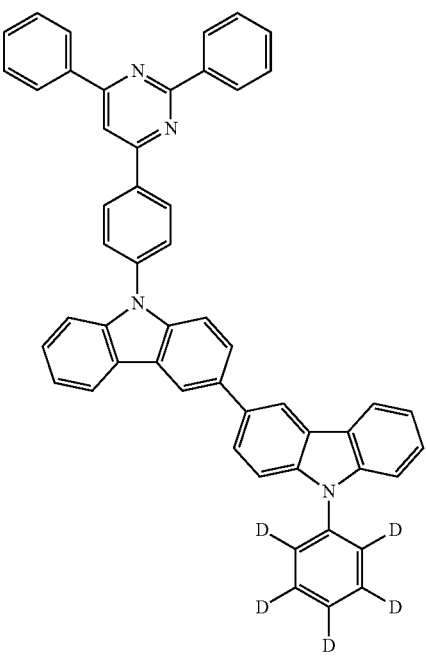

-continued
[Formula 36]
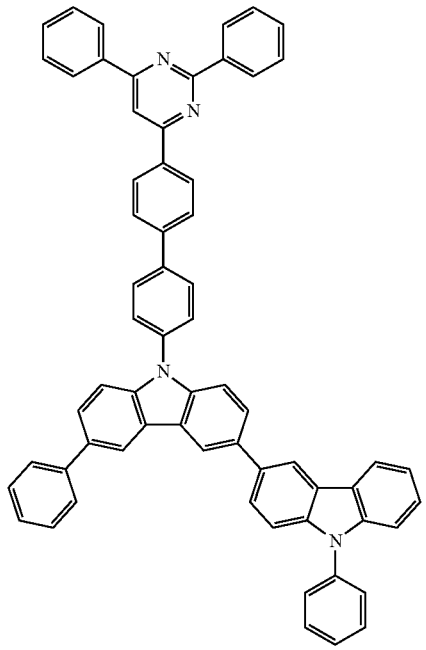
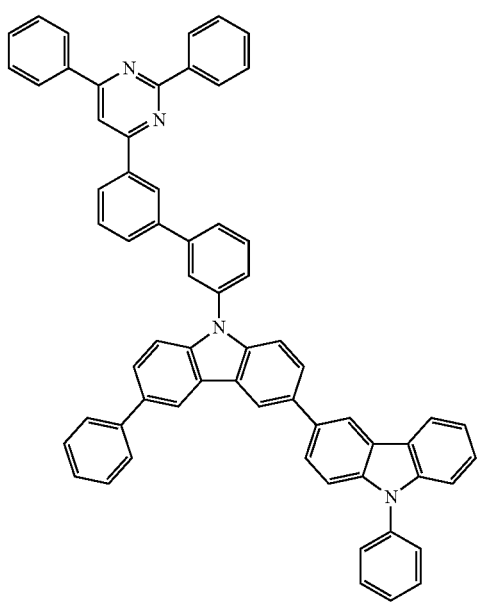
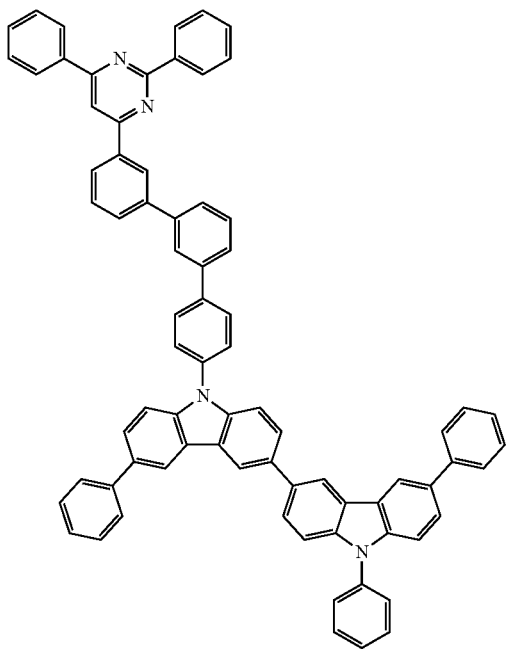
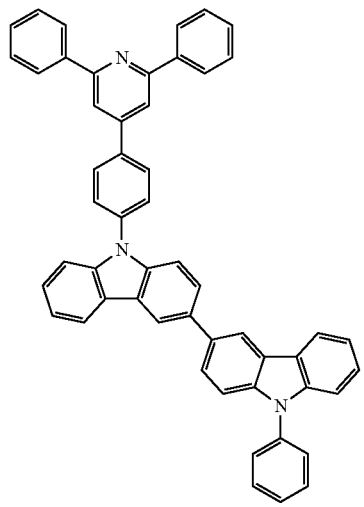
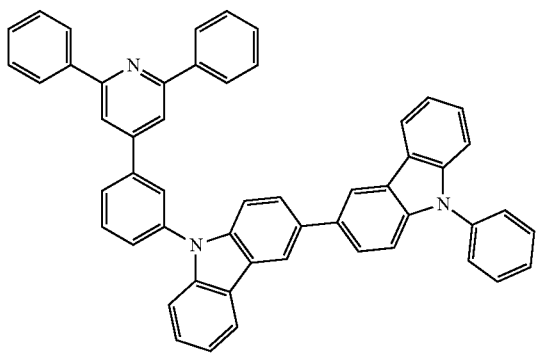
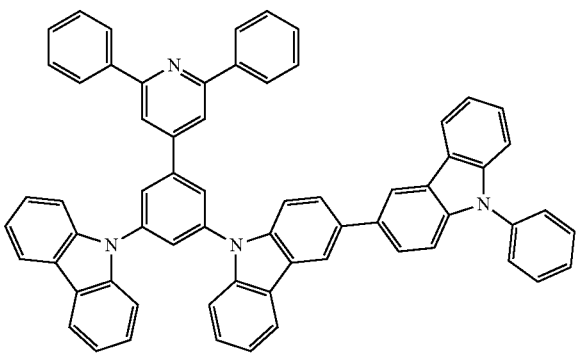

-continued
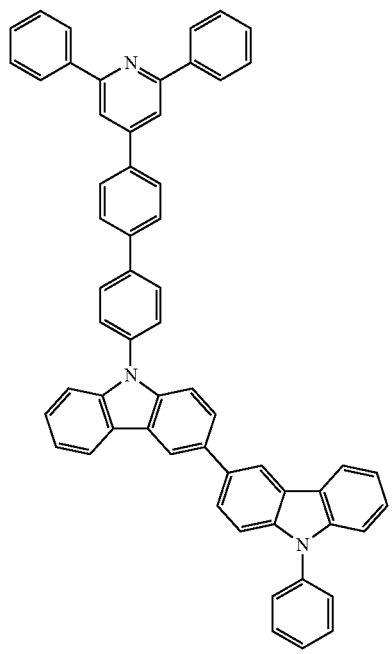
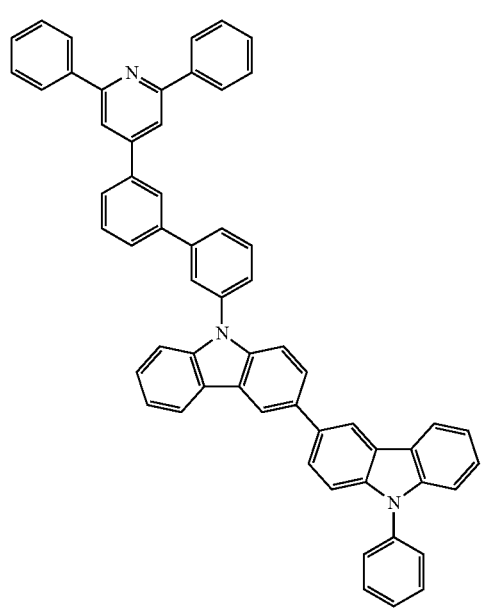
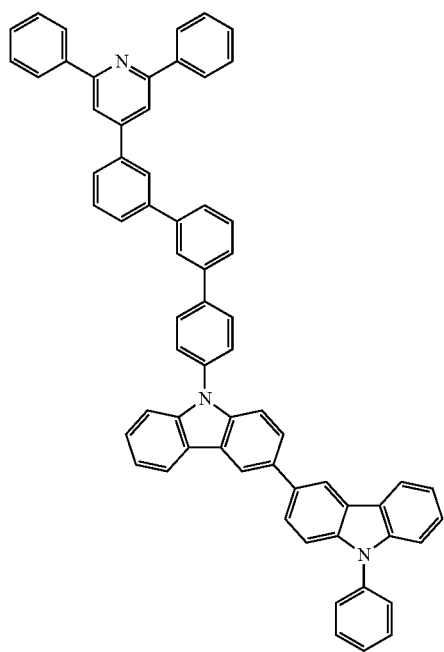
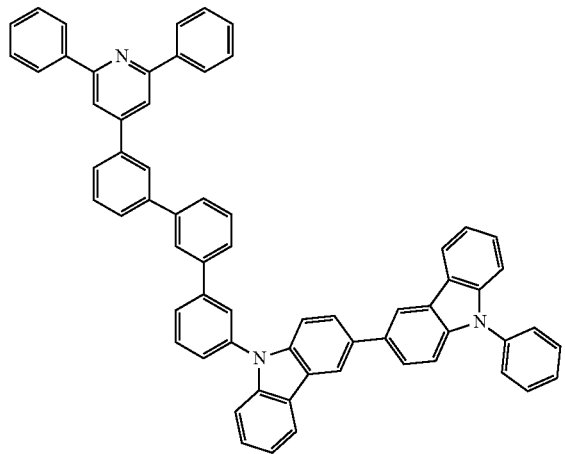

[Formula 38]
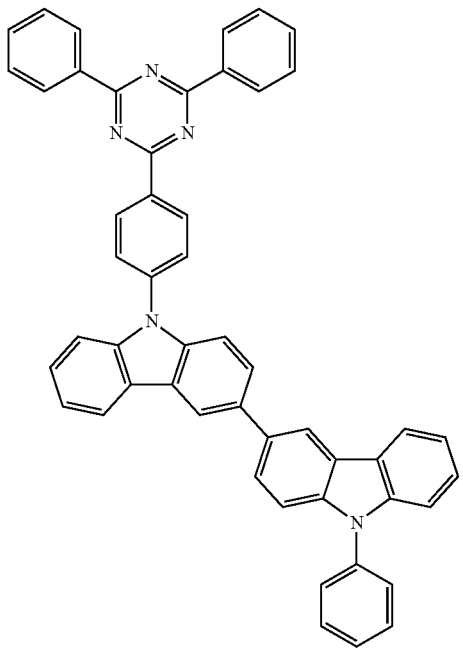
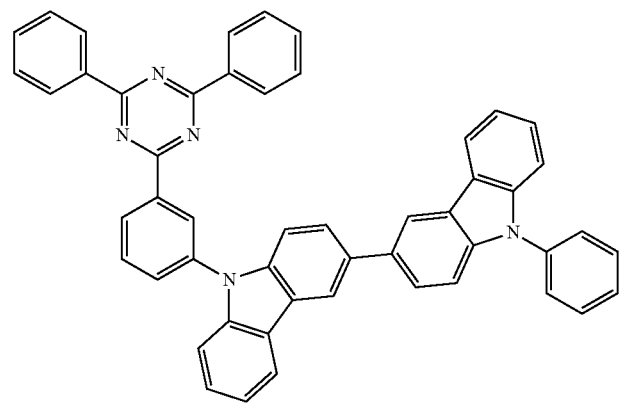
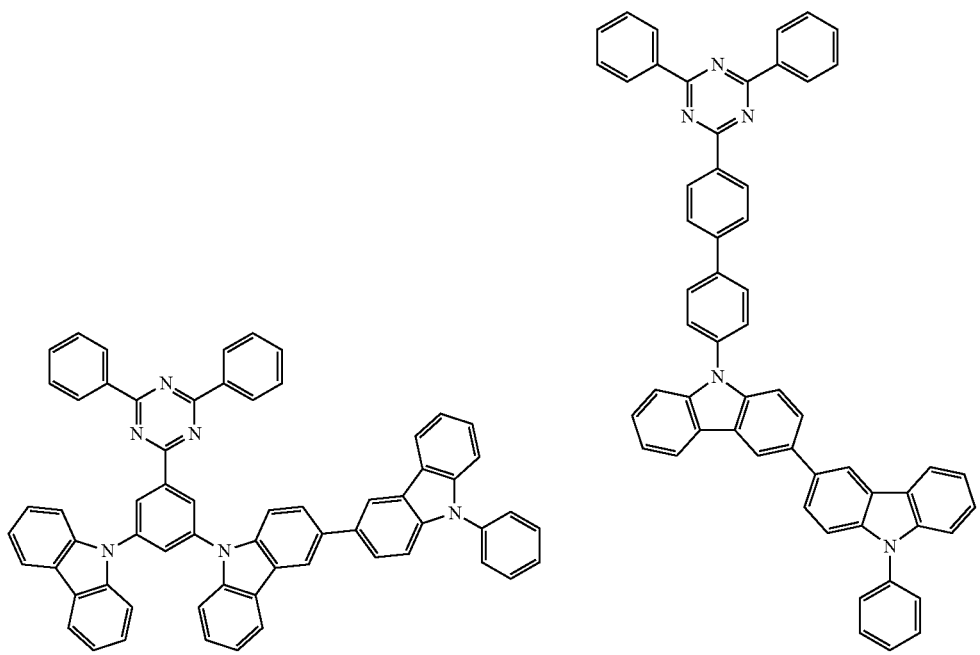

-continued
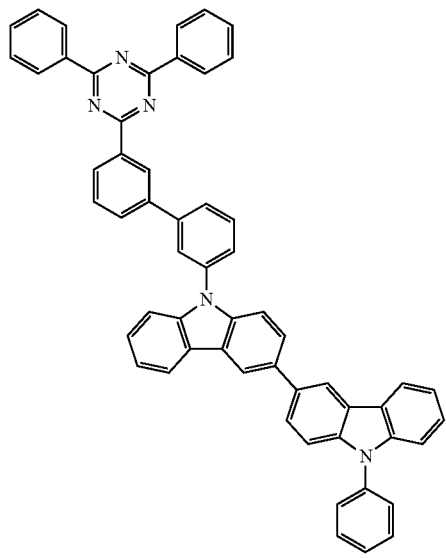
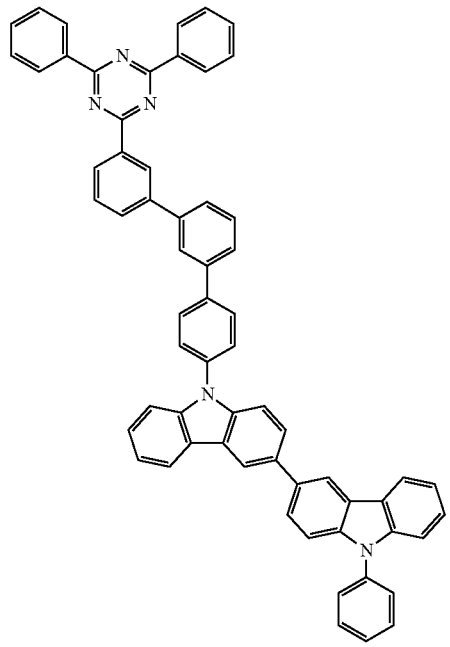
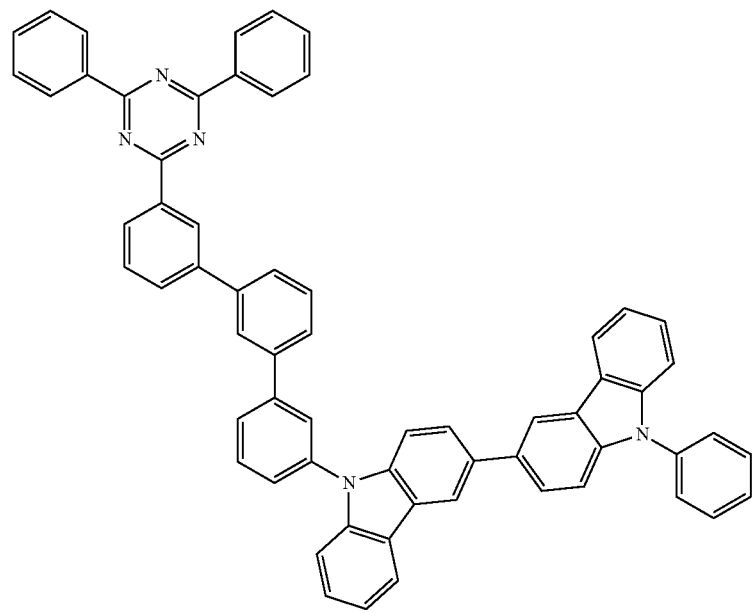

[Formula 39]
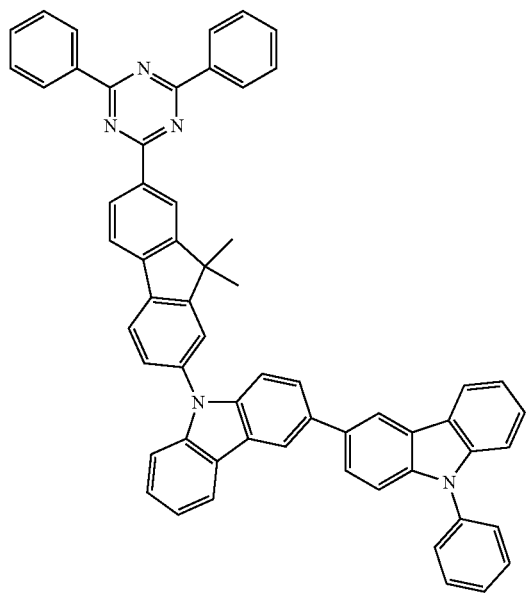
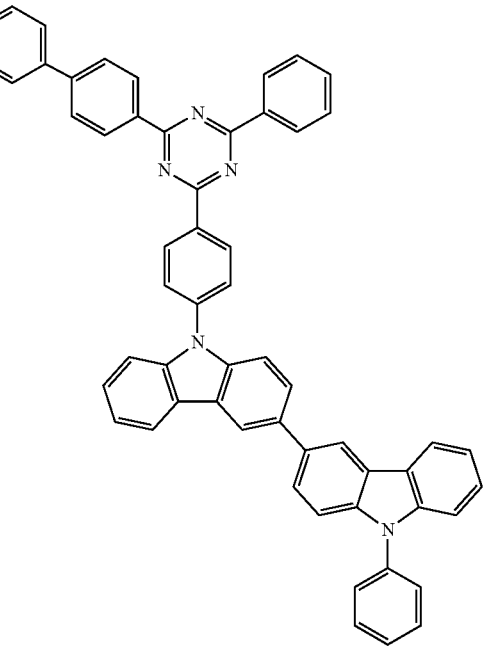
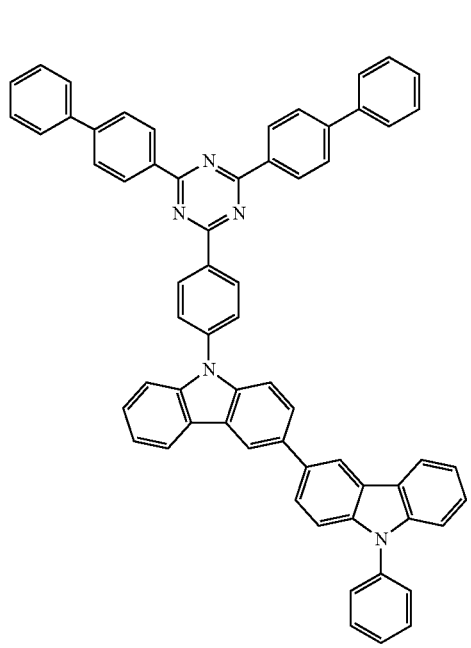
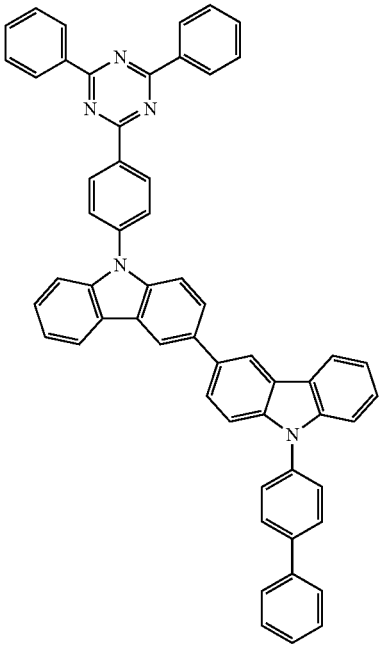

[Formula 40]
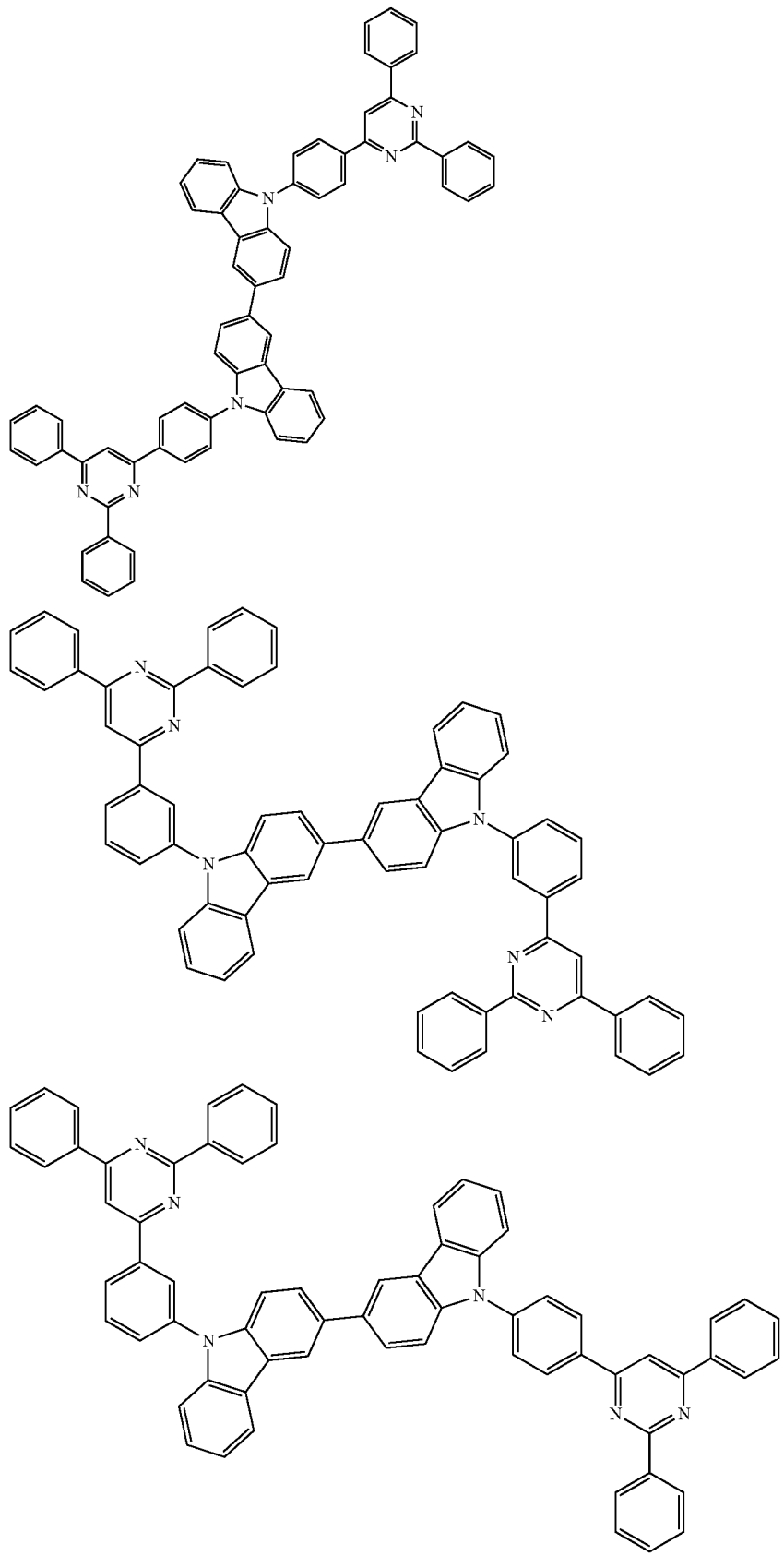

-continued
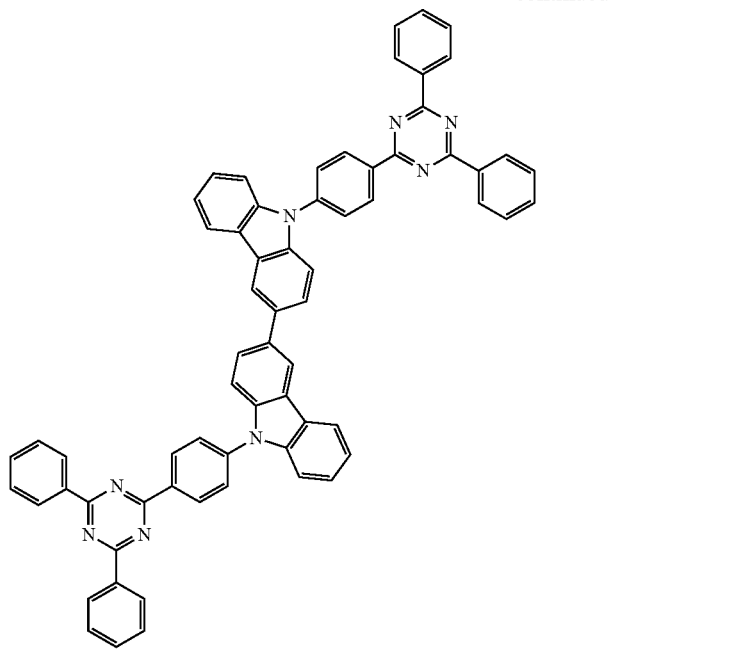
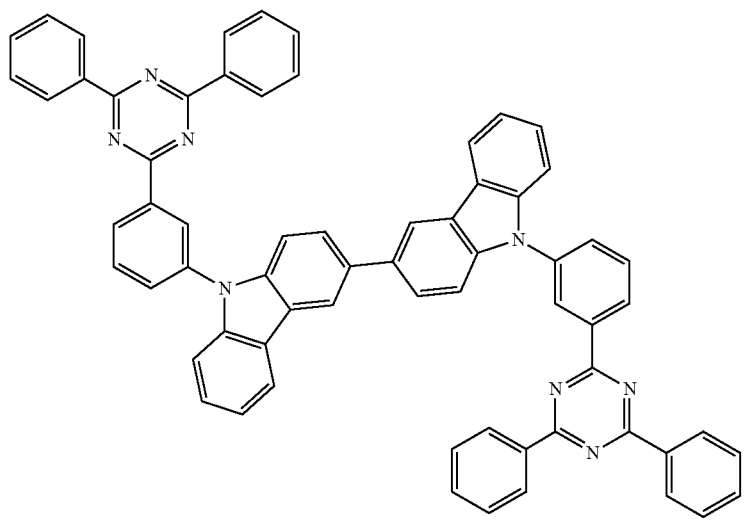
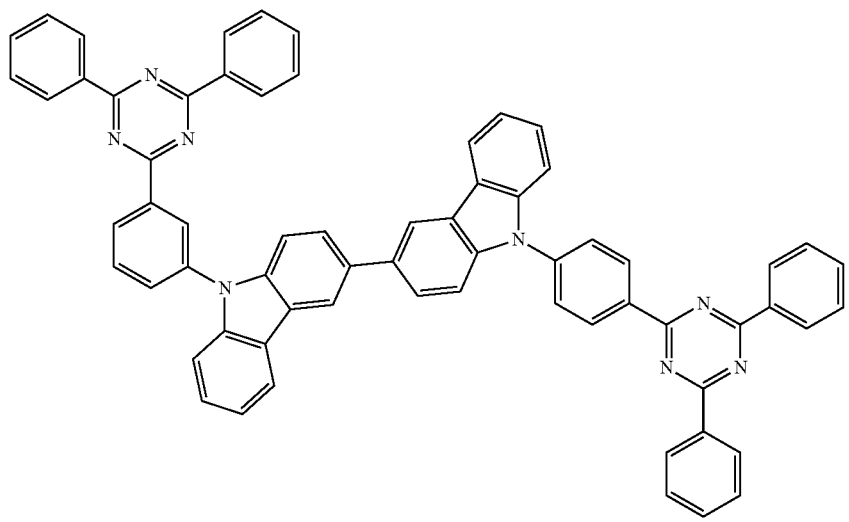

-continued
[Formula 41]
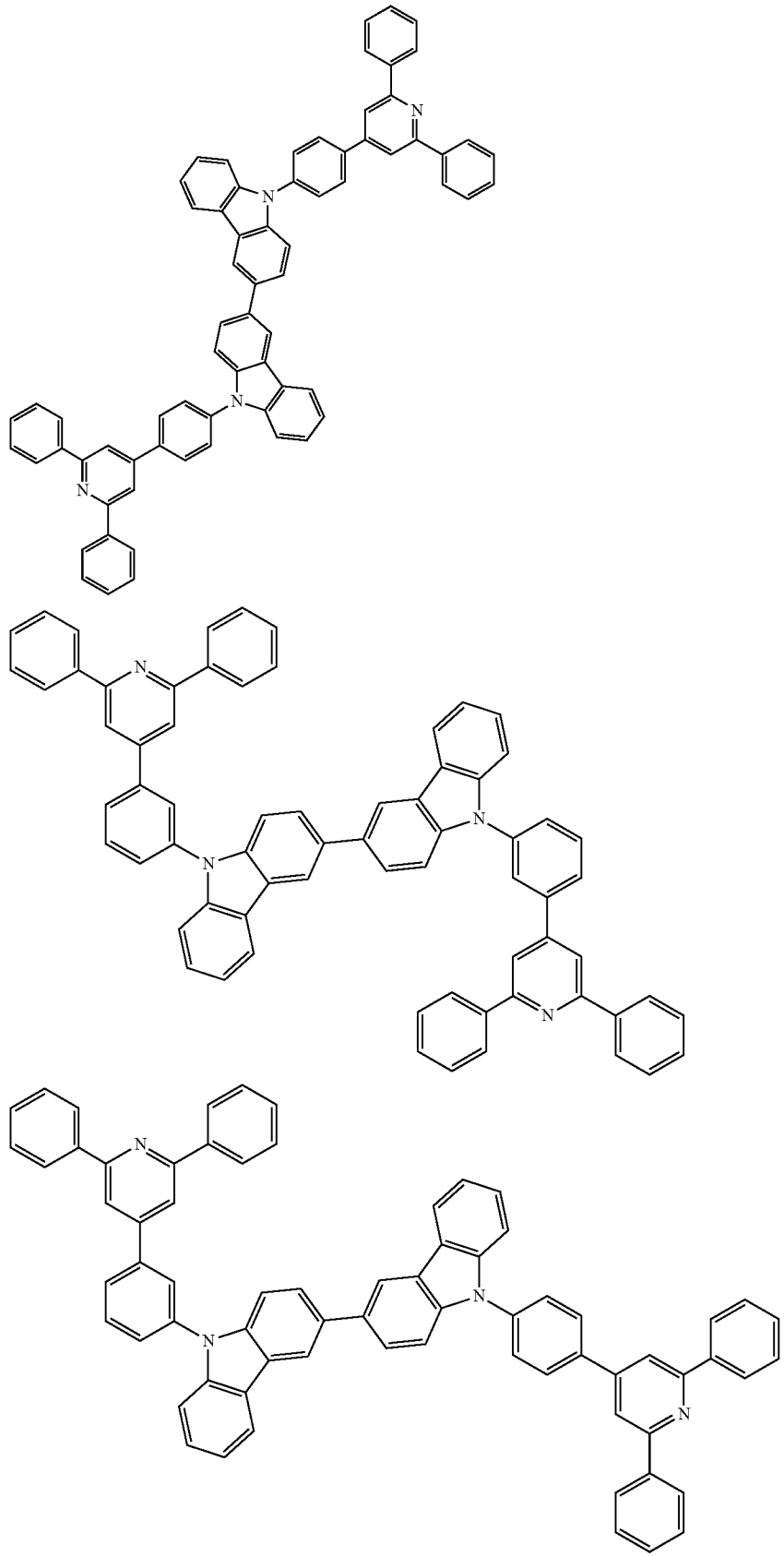

[Formula 42]
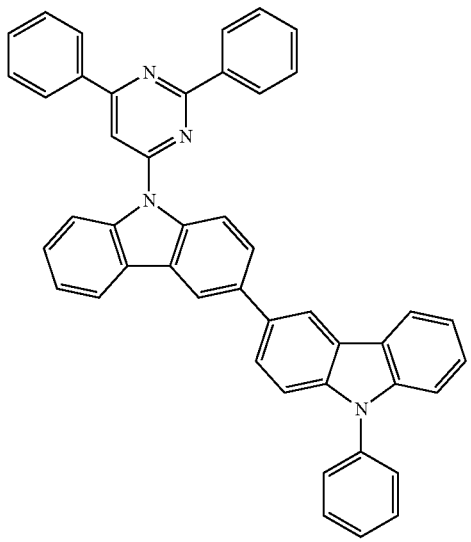
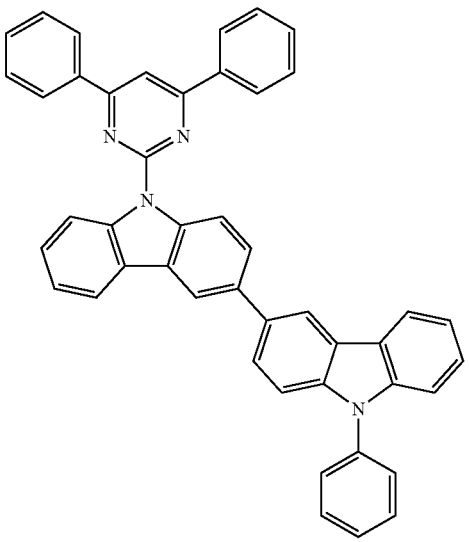
-continued
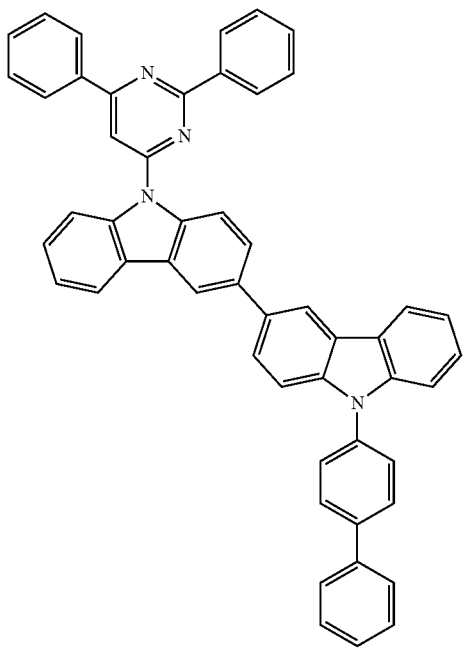
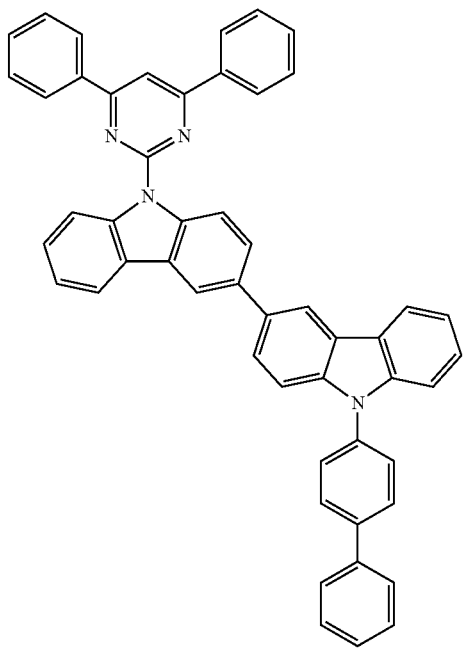

75
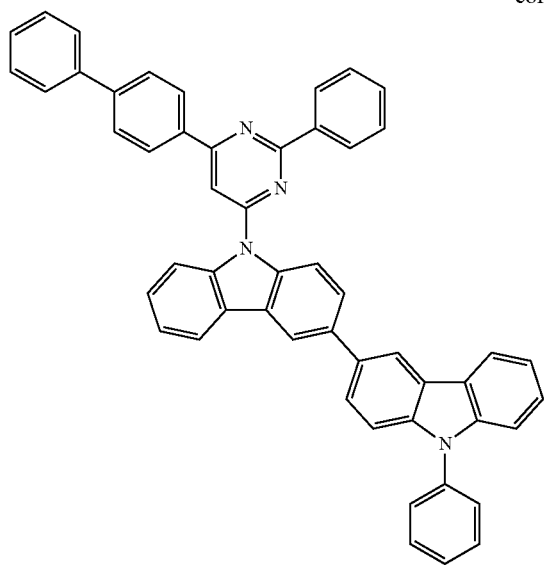
76
-continued
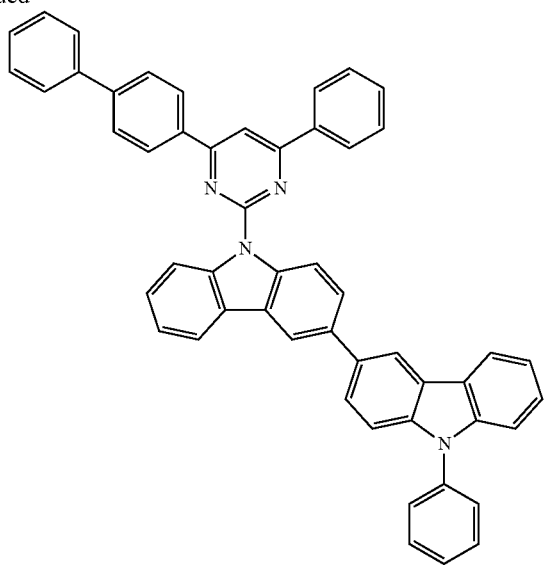
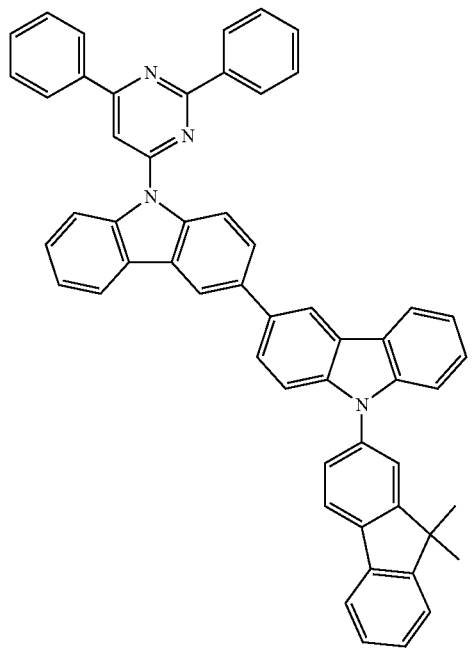
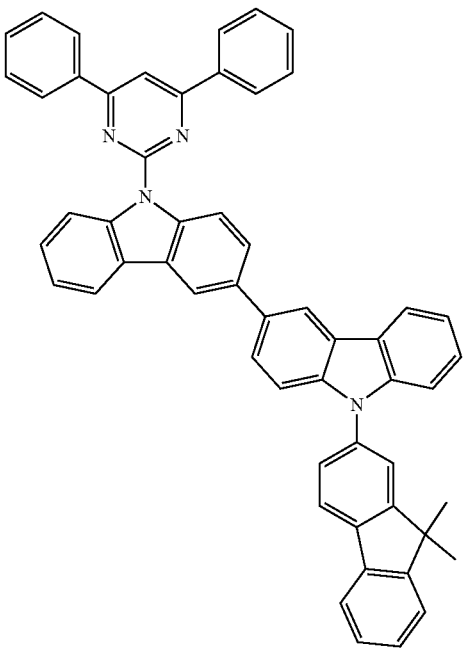

[Formula 43]
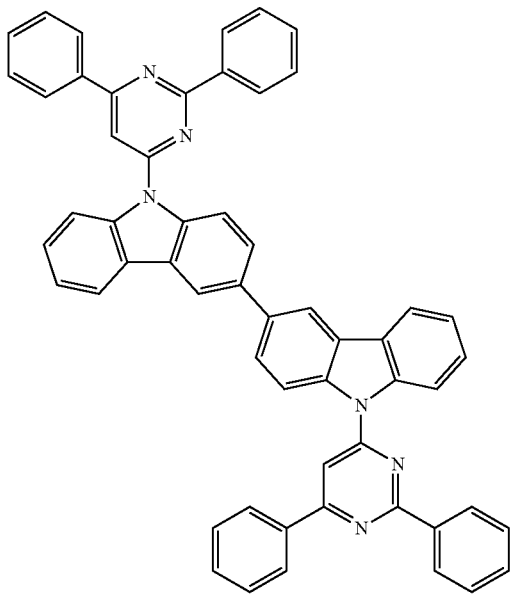
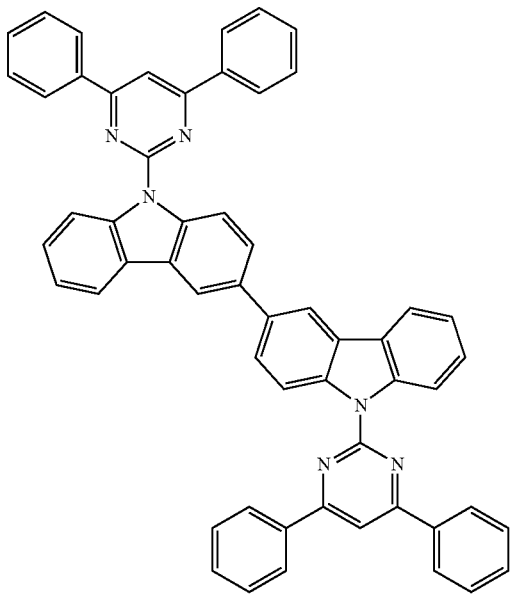
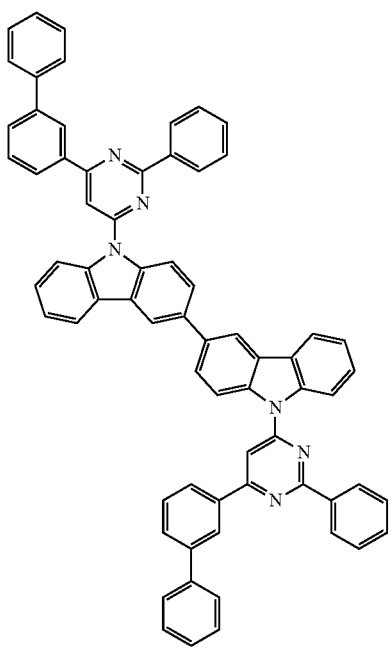
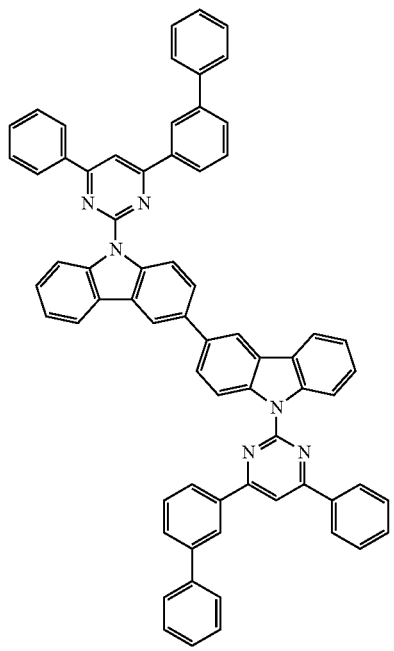

[Formula 44]
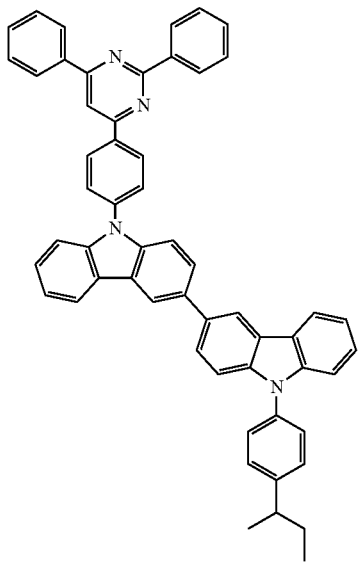
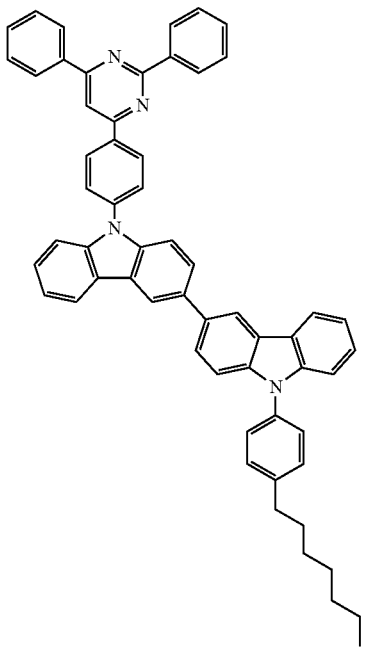
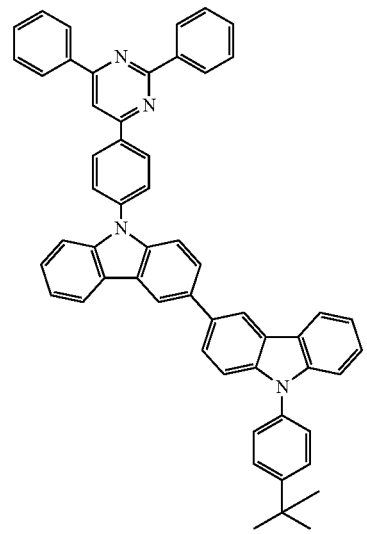
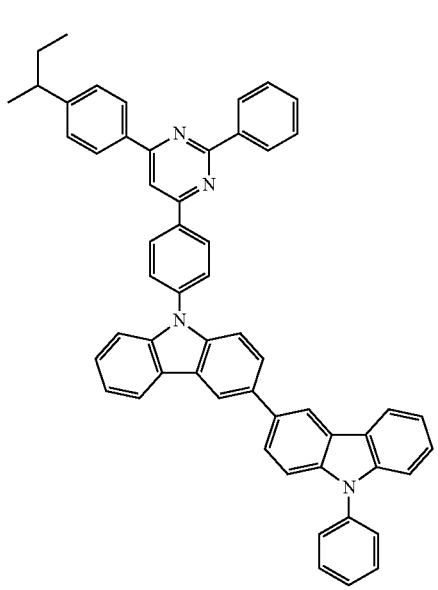
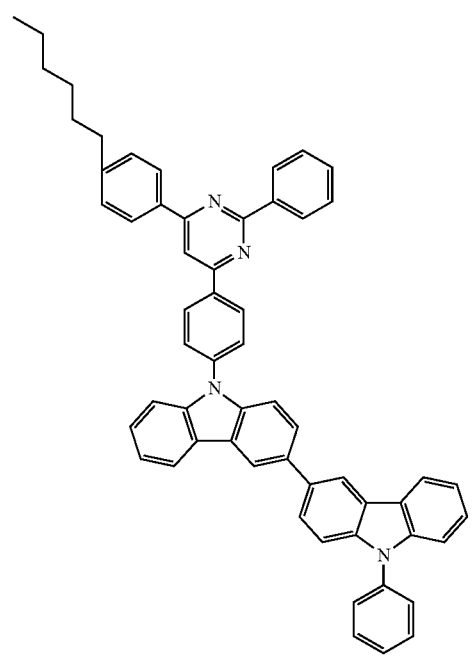

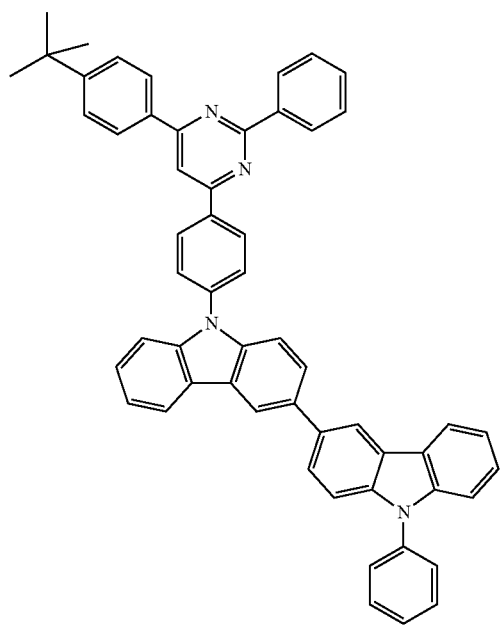
[Formula 45]
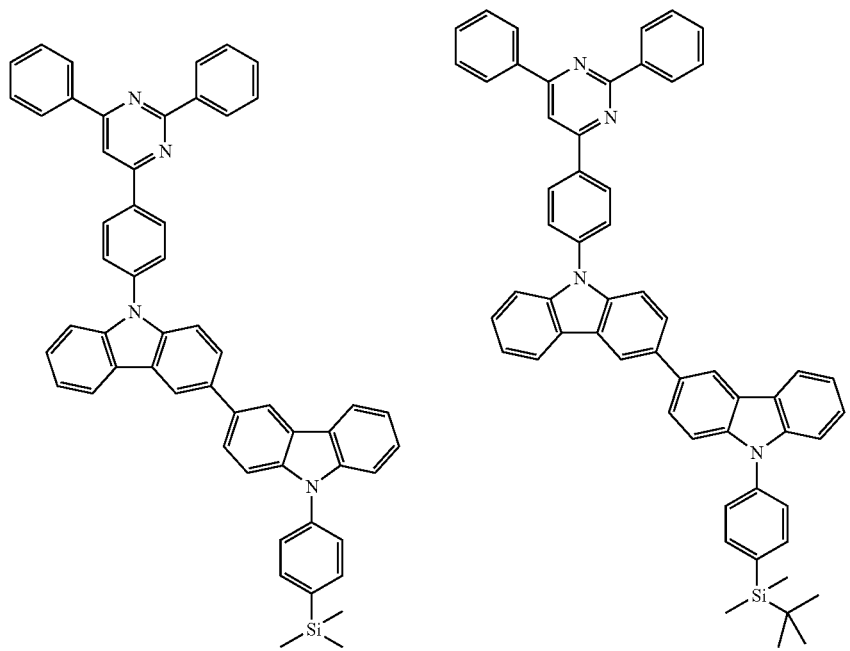

83
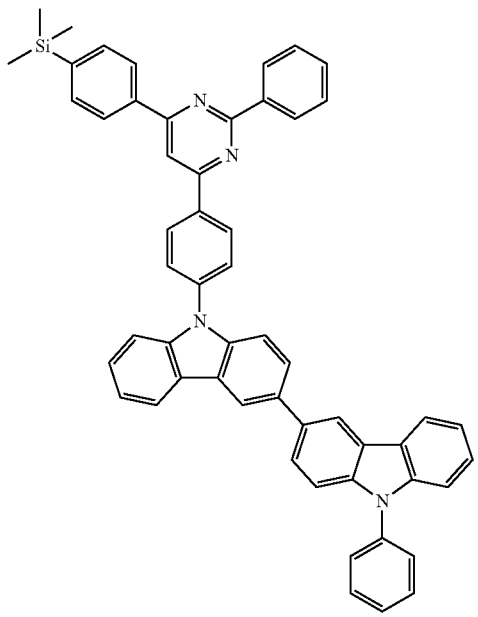
-continued
84
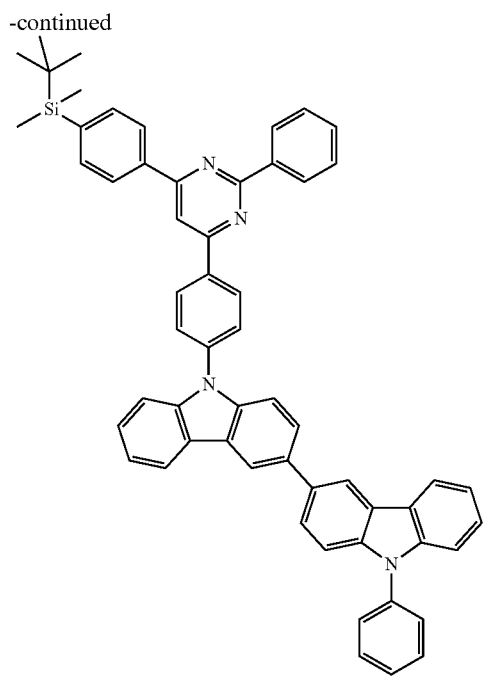
[Formula 46]
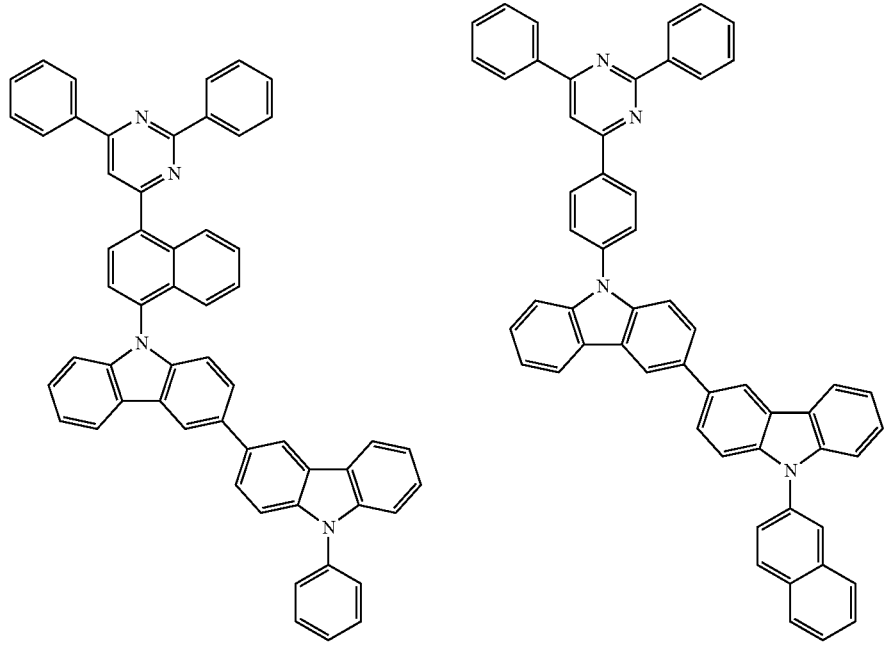

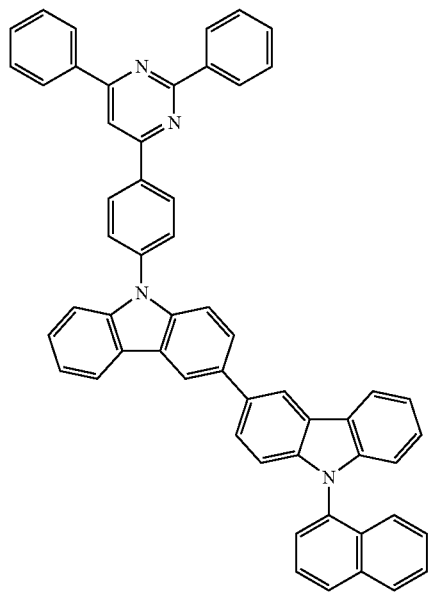
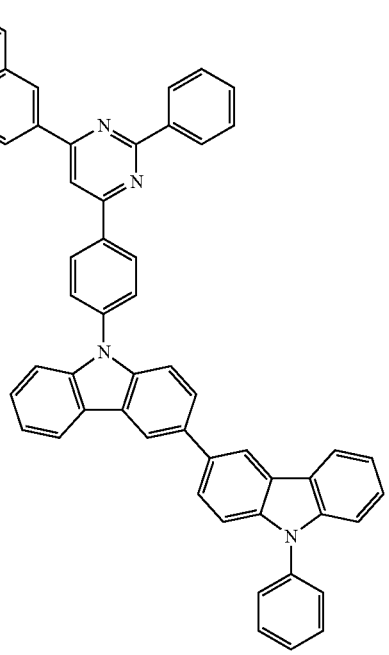
-continued
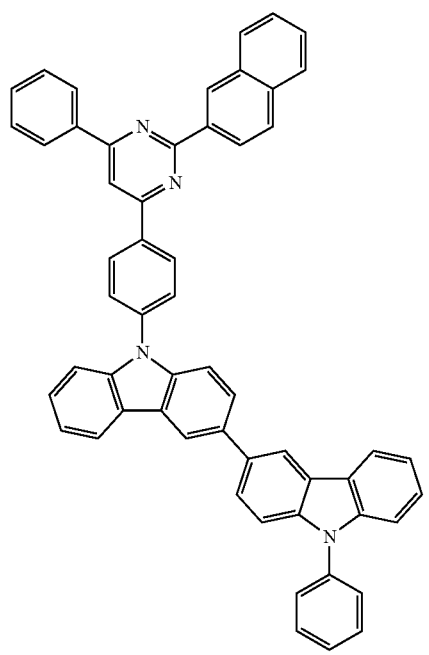
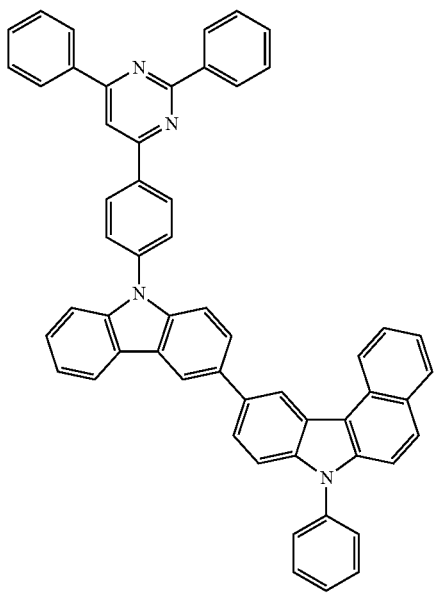

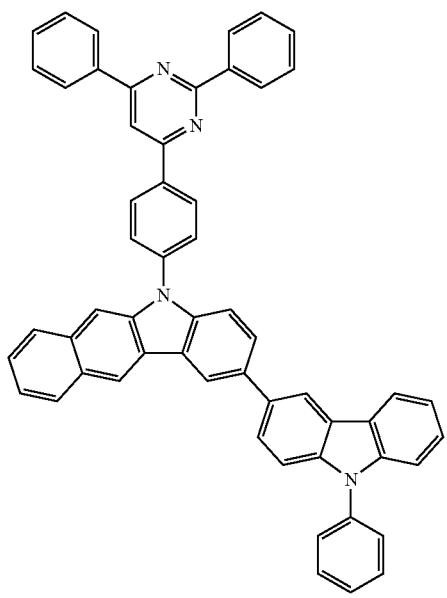
[Formula 47]
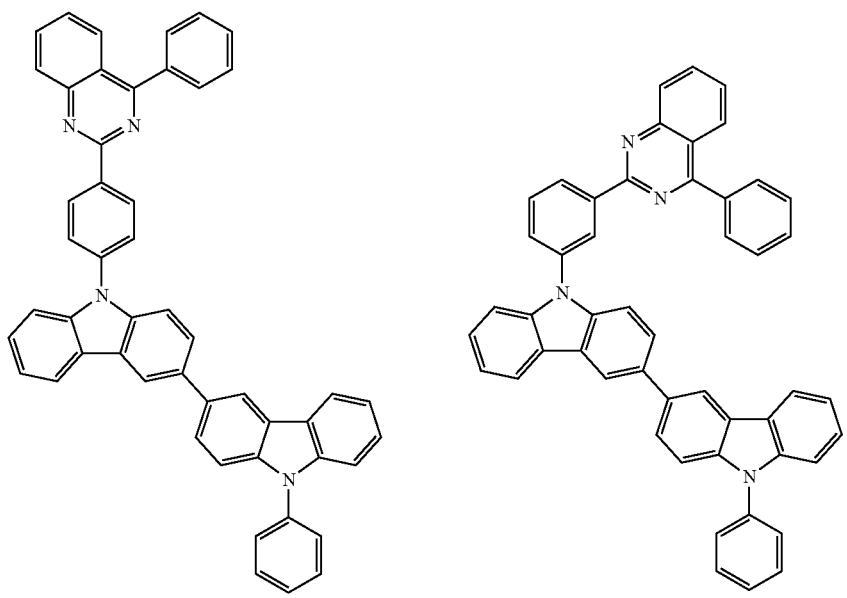

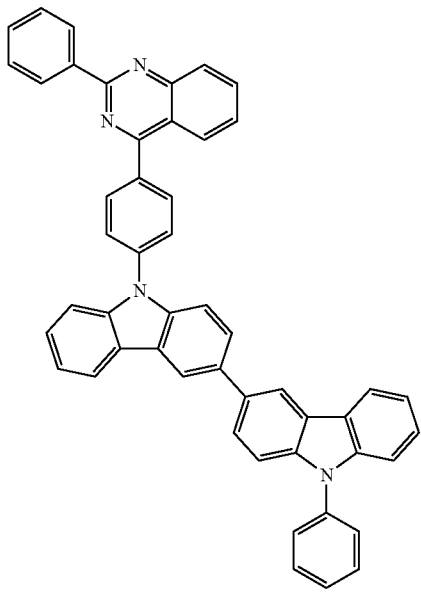 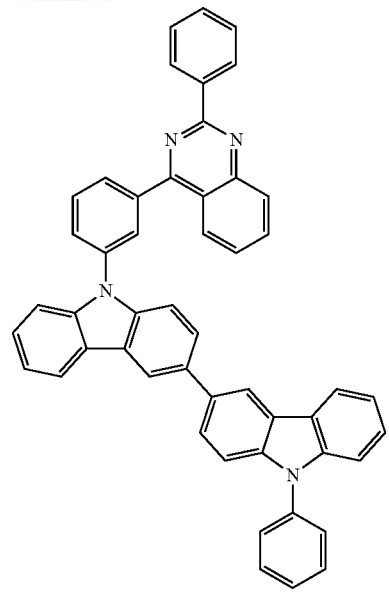
[Formula 48]
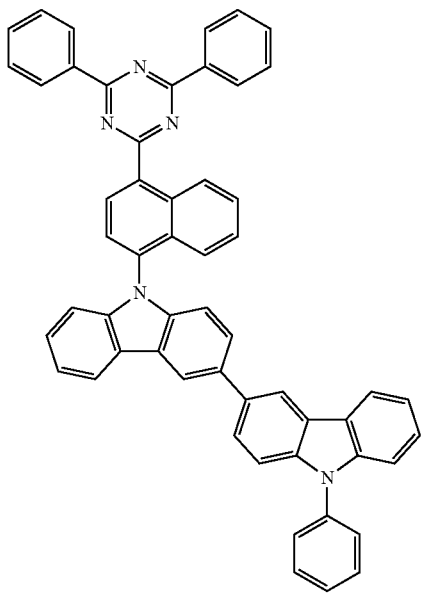 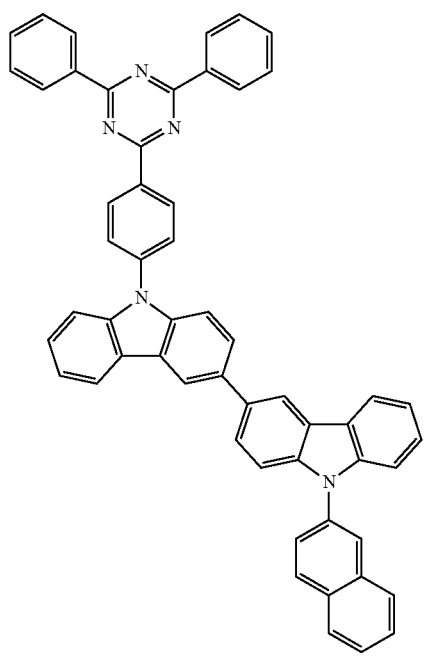

-continued
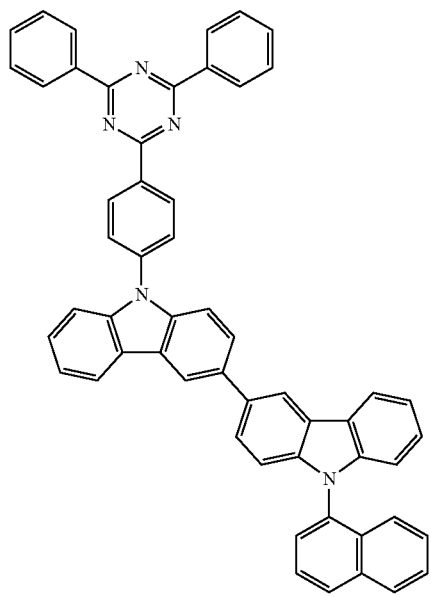
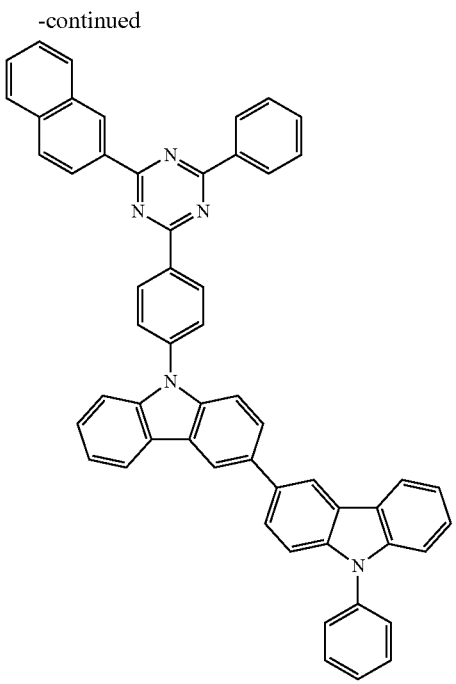
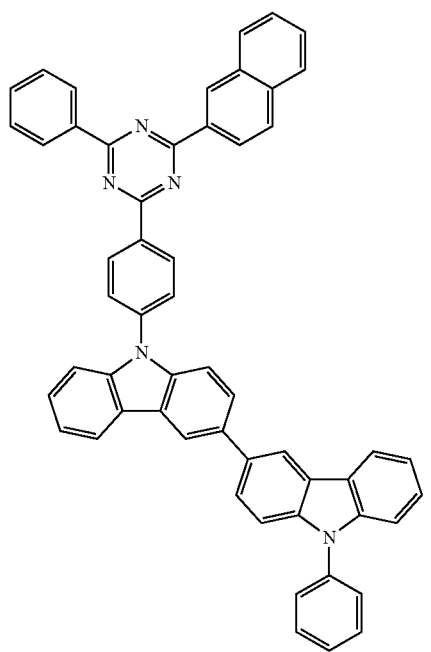
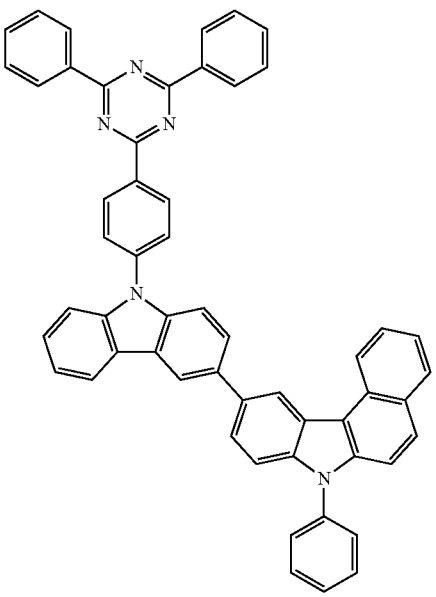

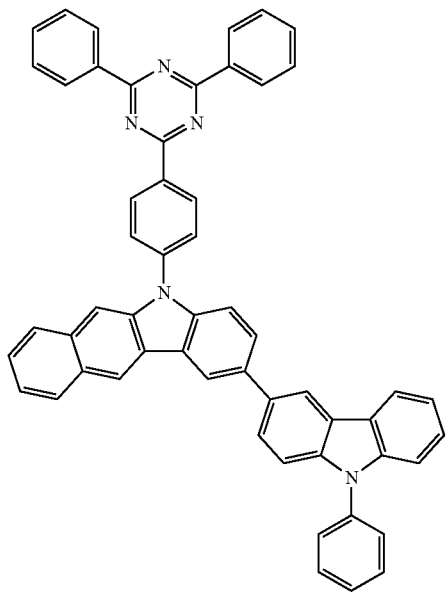
-continued
[Formula 49]
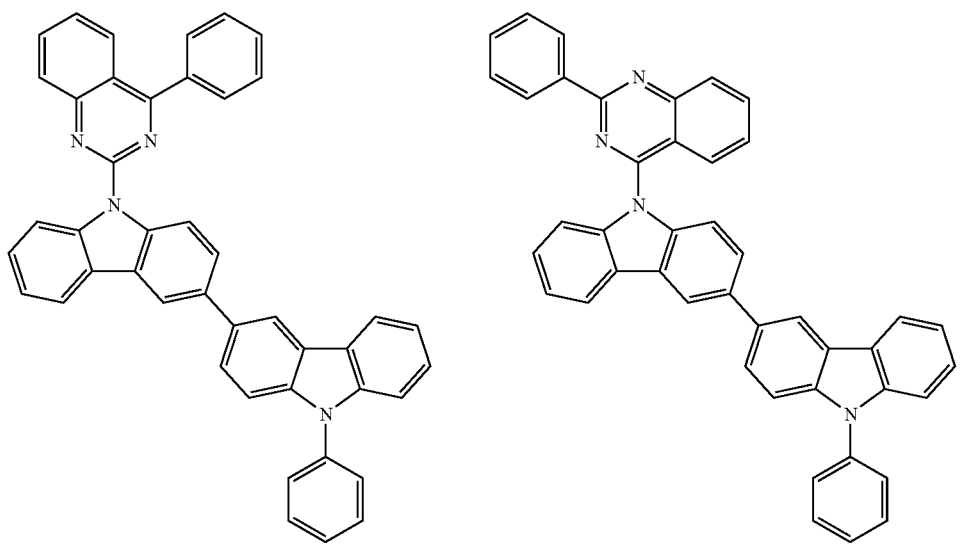

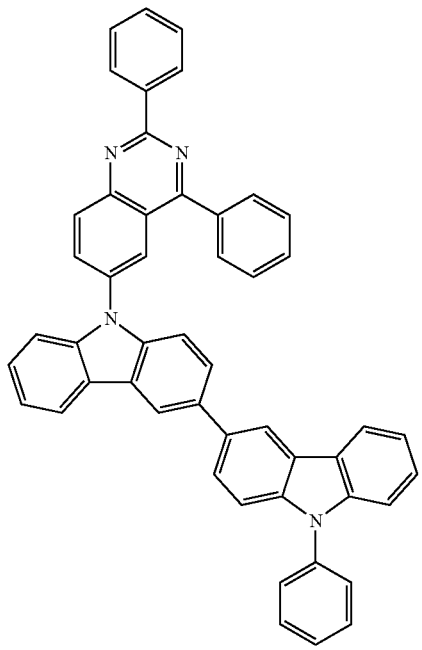 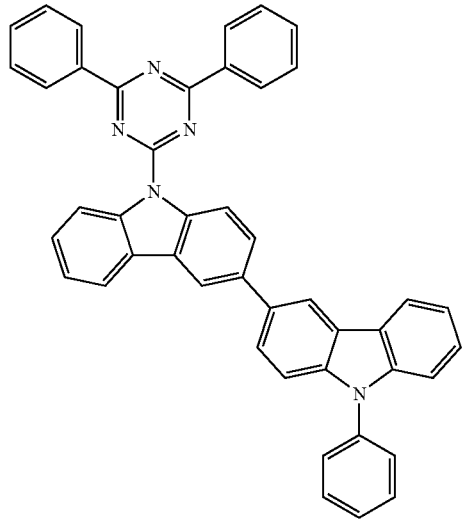
[Formula 50]
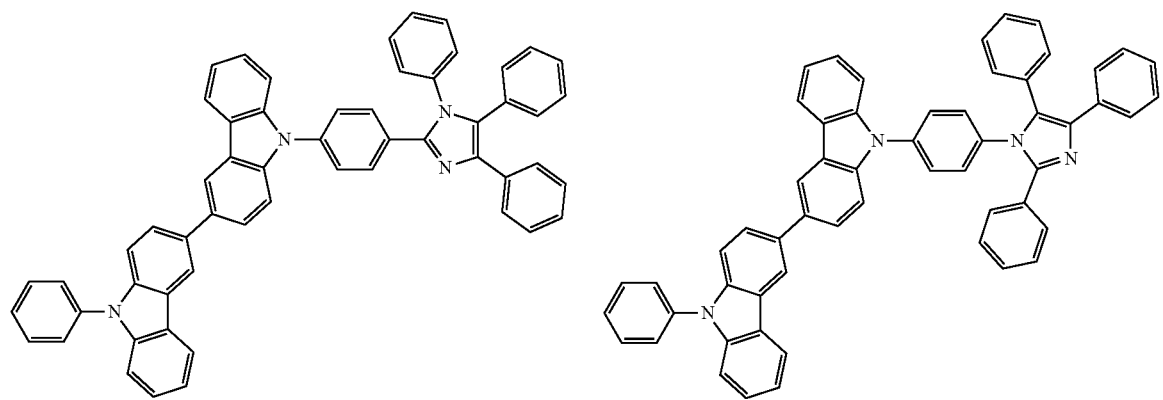

[Formula 51]
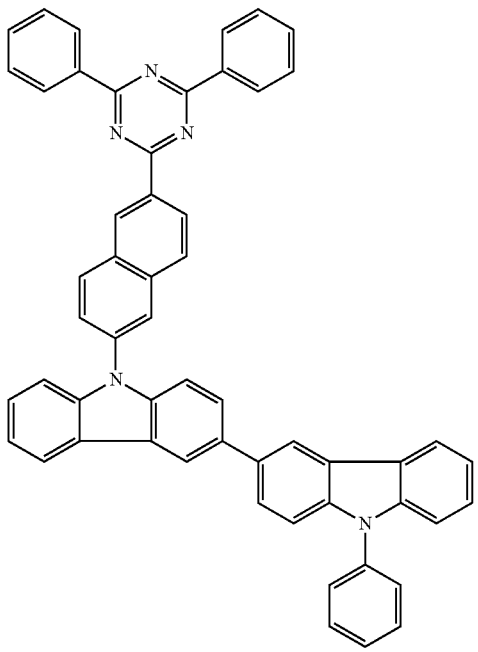
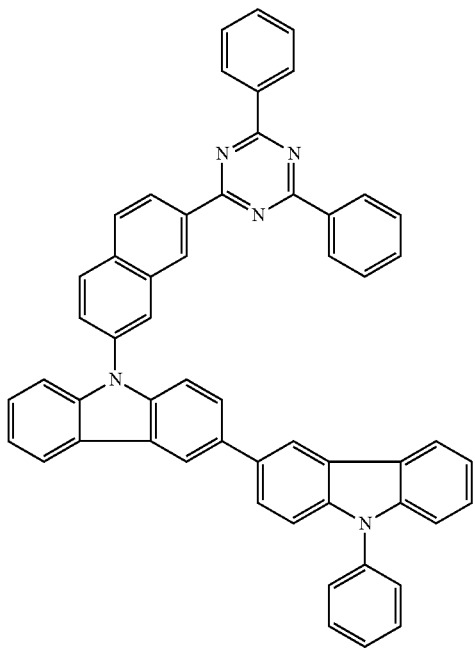
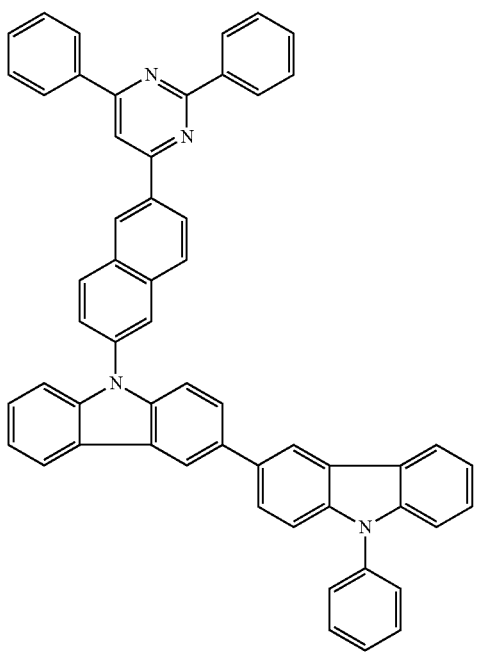
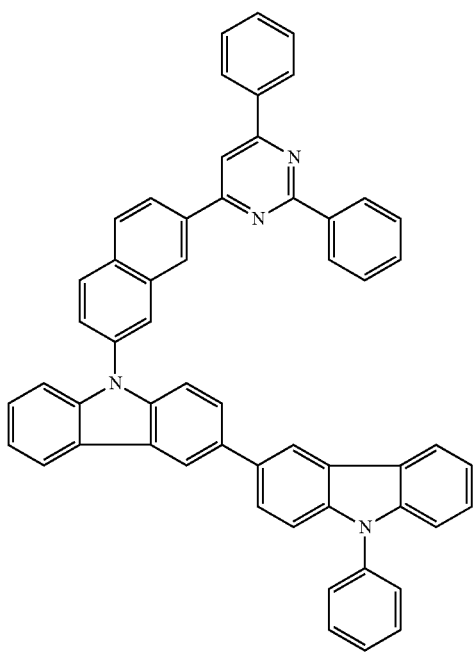

99
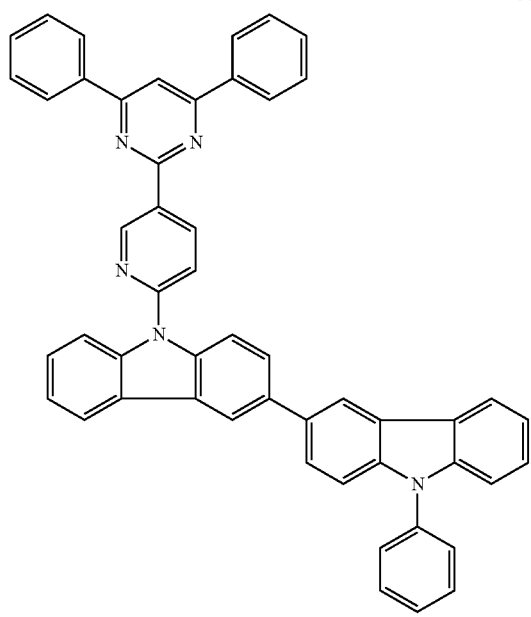
100
-continued
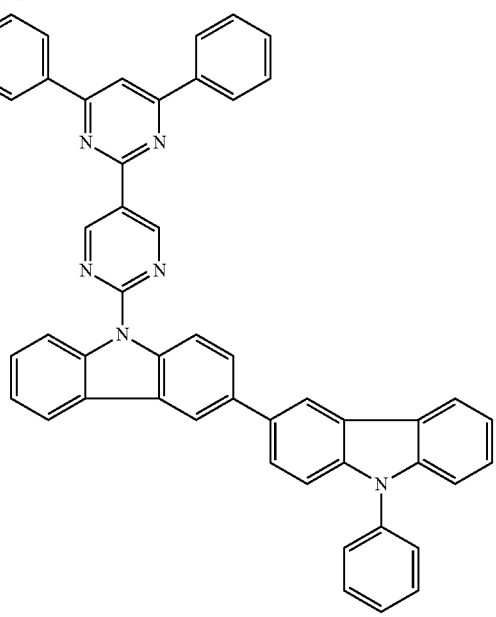
[Formula 52]
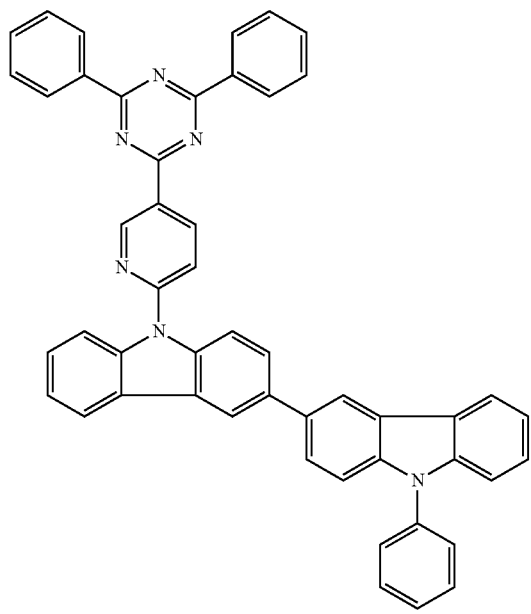
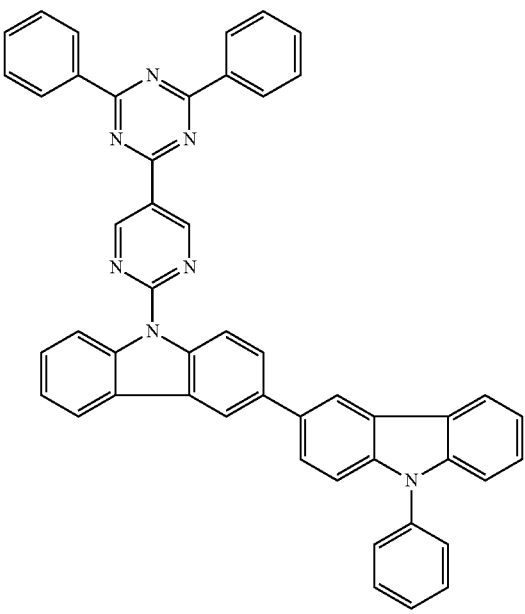

-continued
101
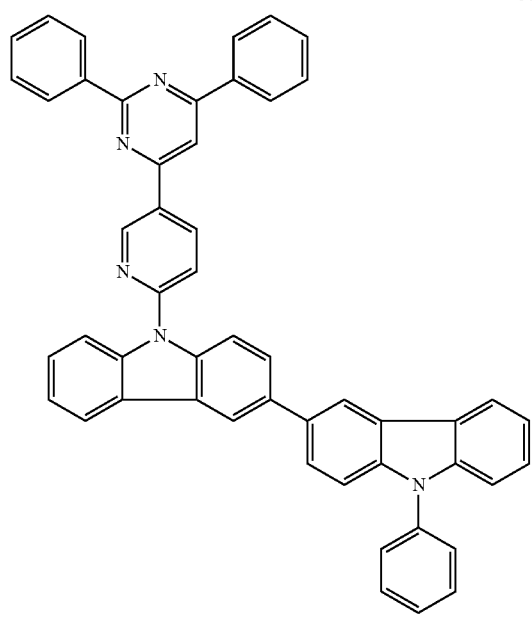
102
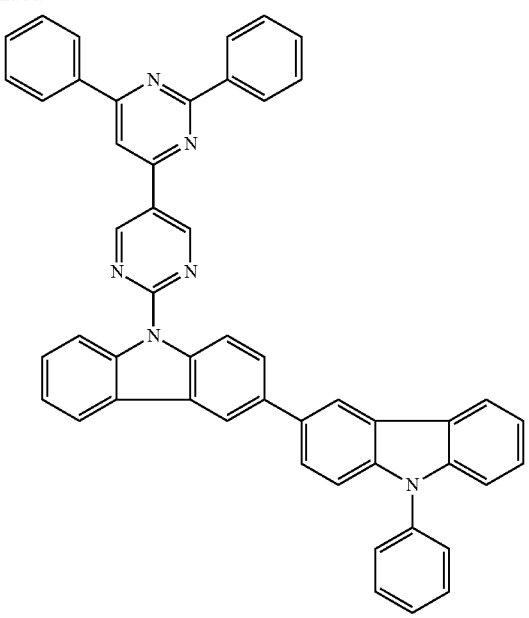
[Formula 53]
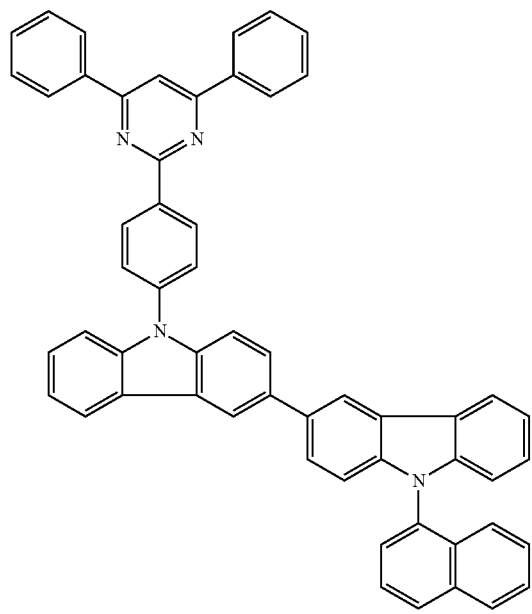
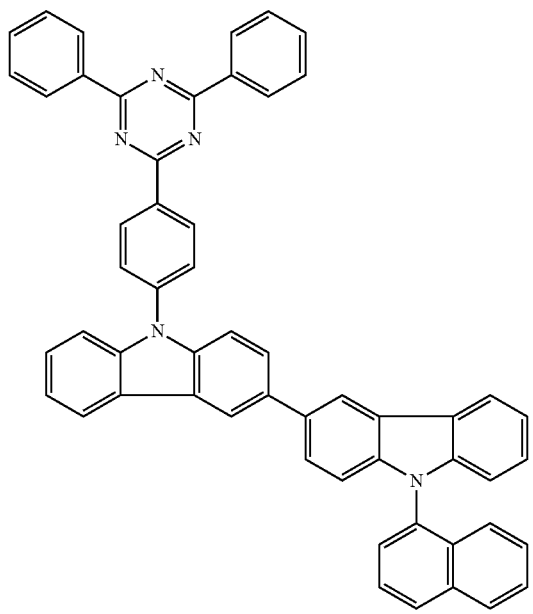

103
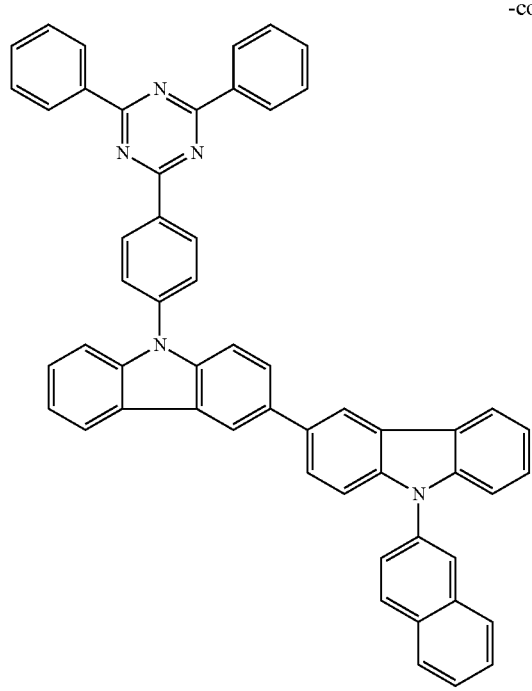
104
-continued
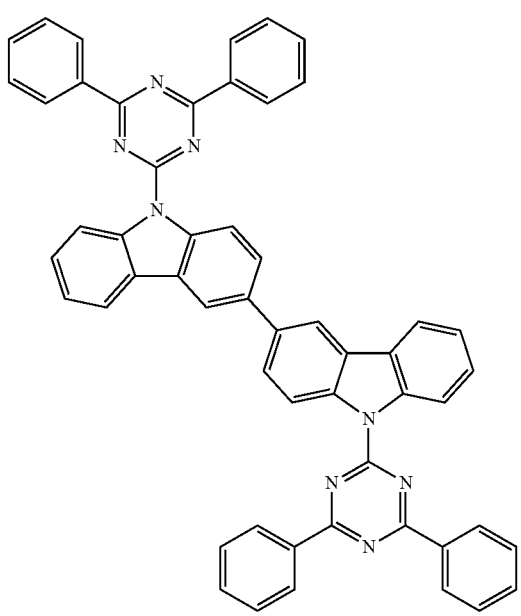
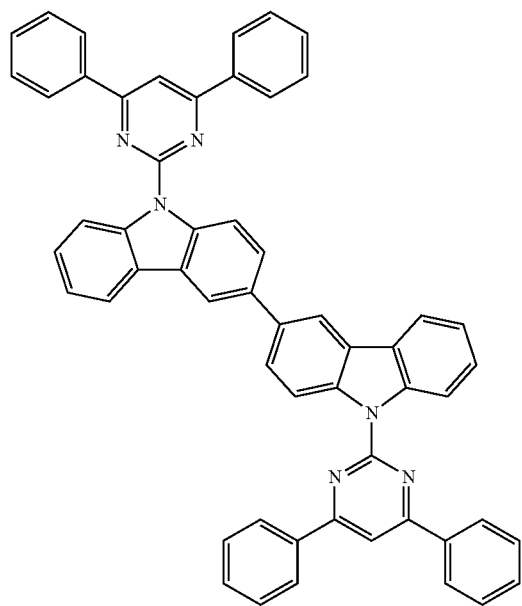
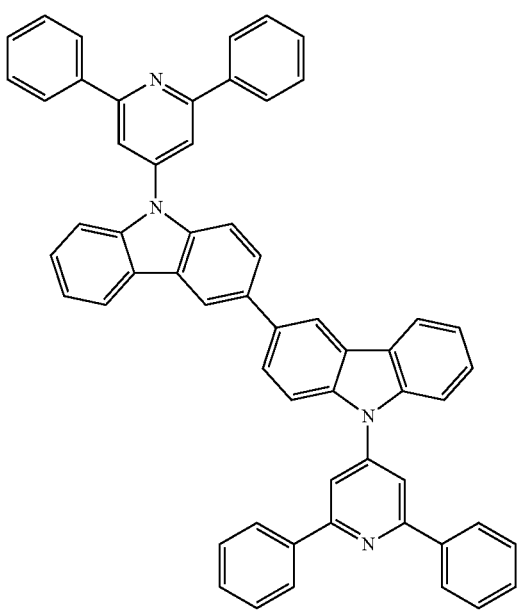

[Formula 54]
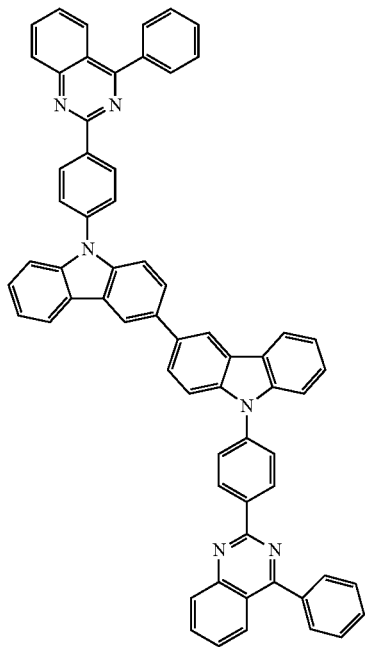 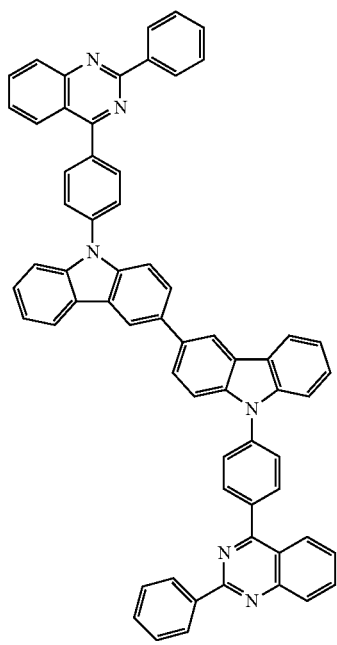
[Formula 55]
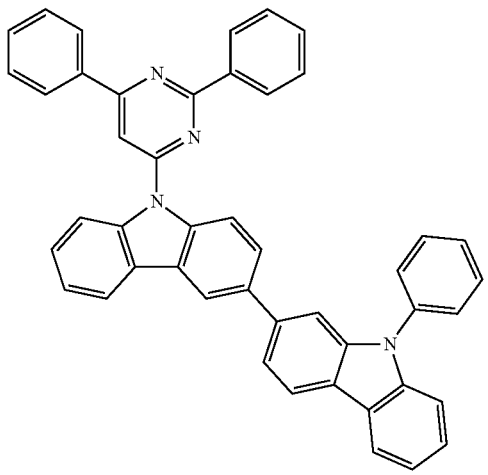 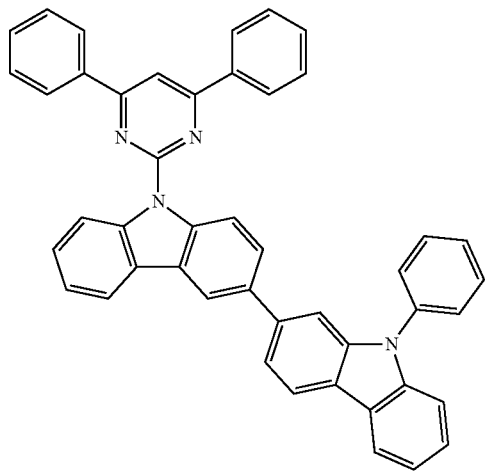
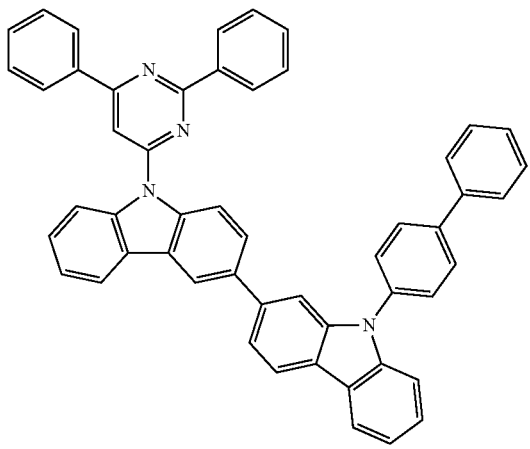 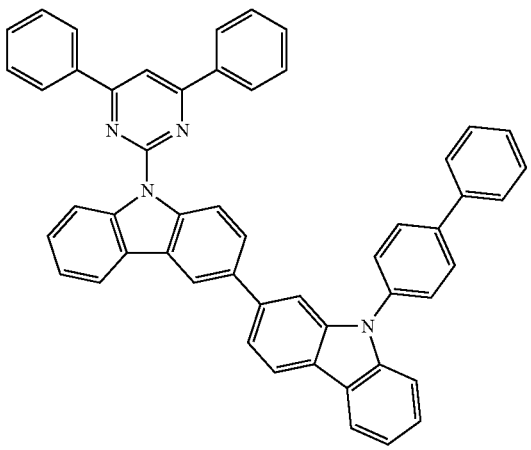

-continued
107
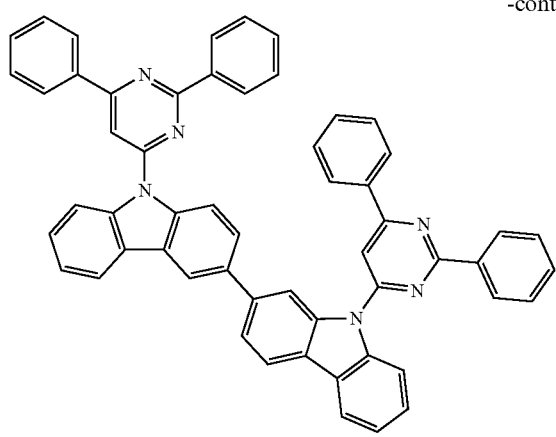
108
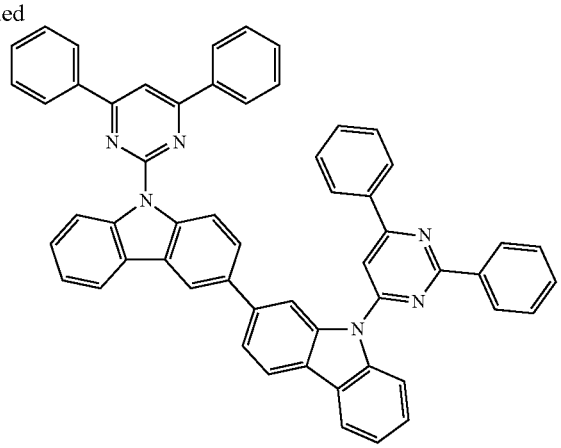
[Formula 56]
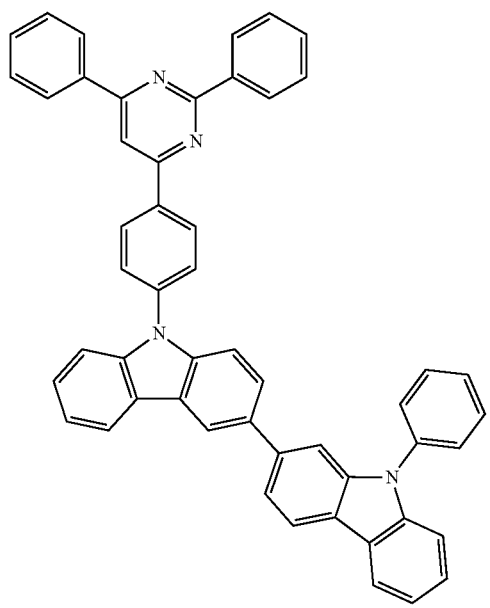
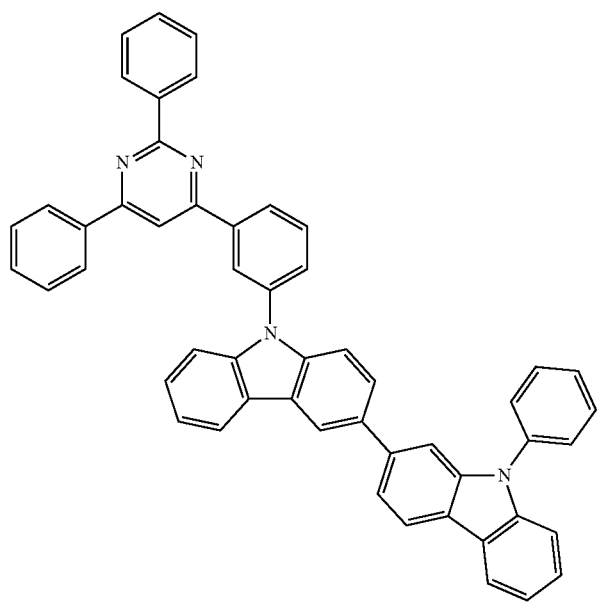
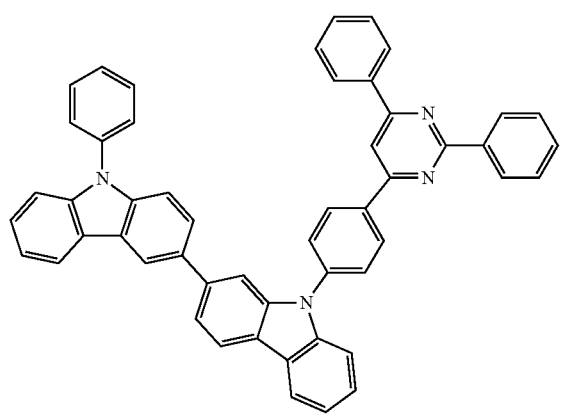
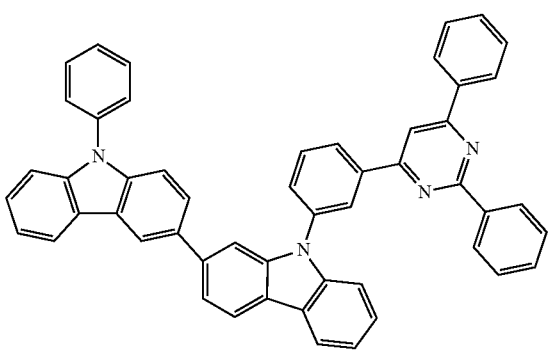

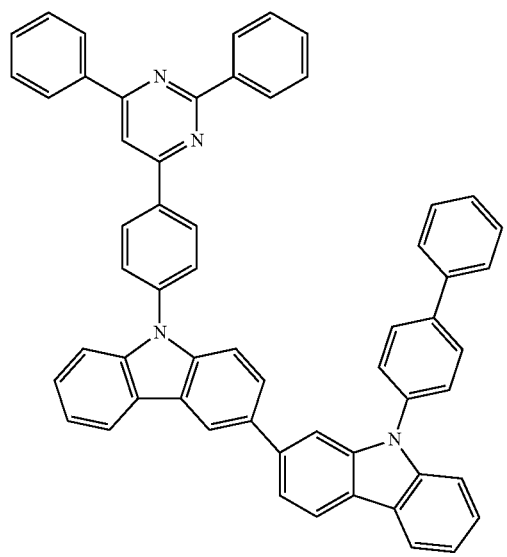
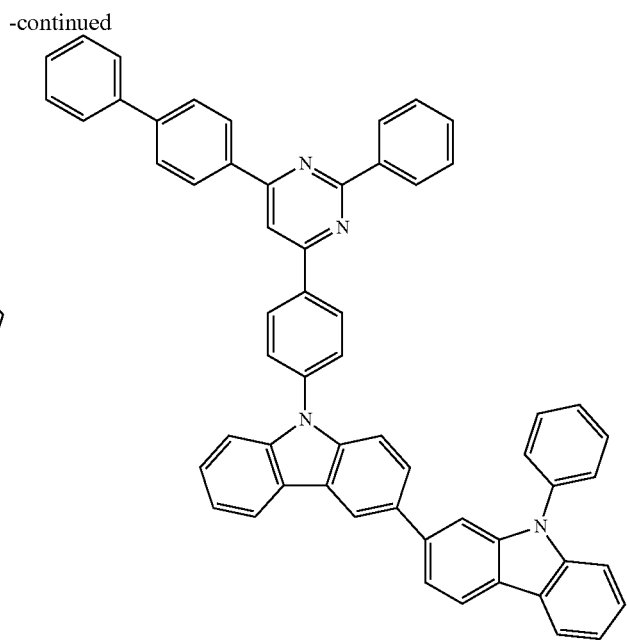
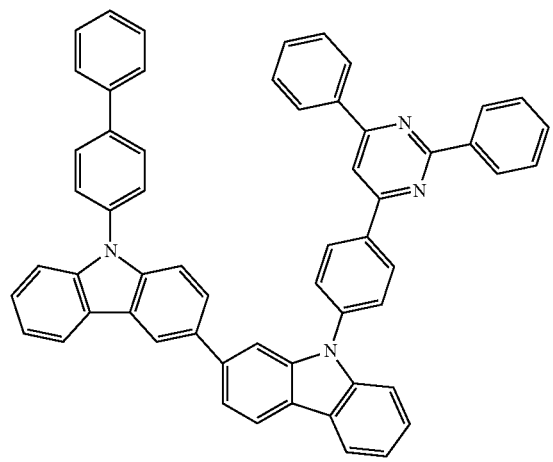
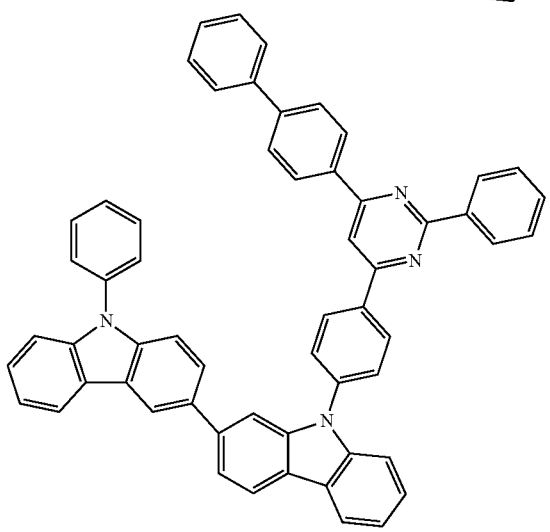
[Formula 57]
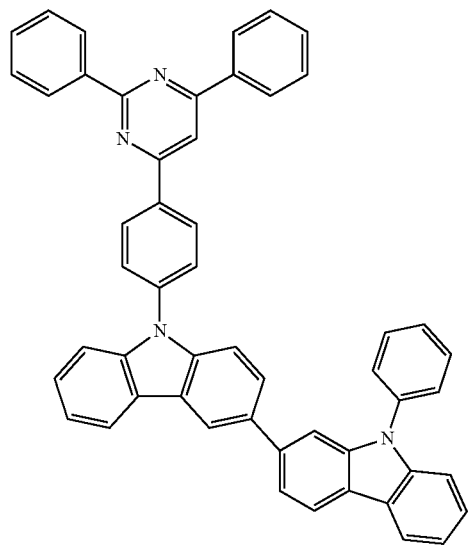
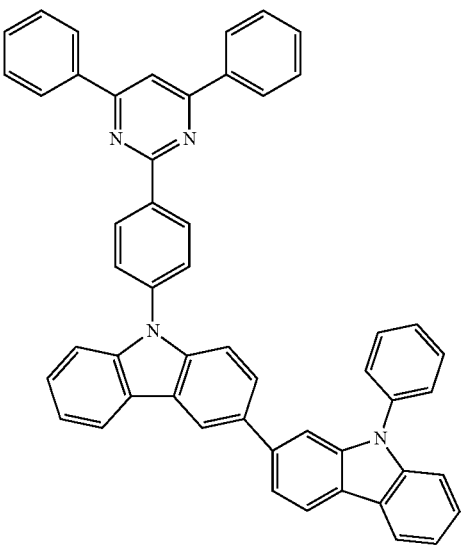

-continued
111
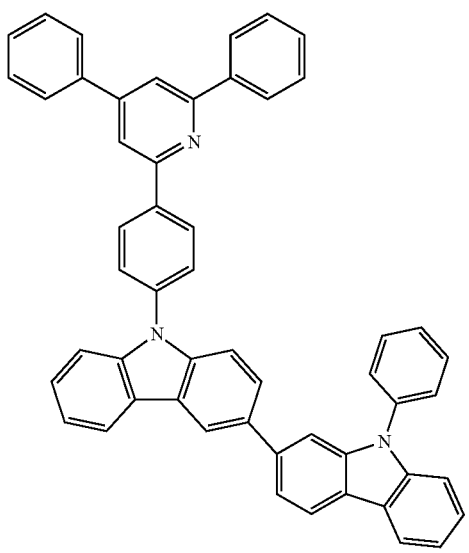
112
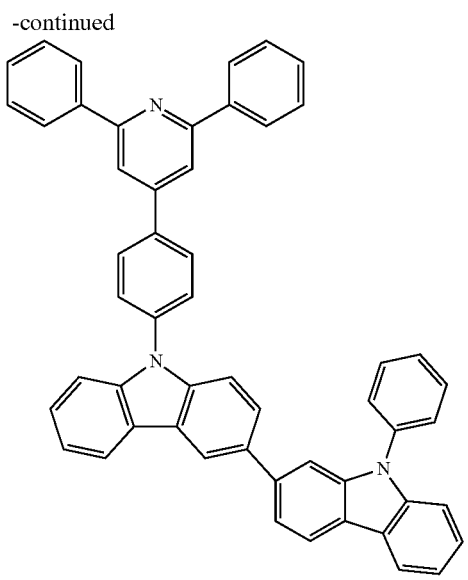
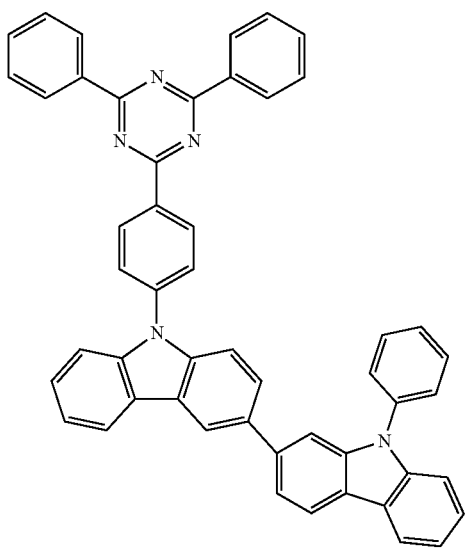
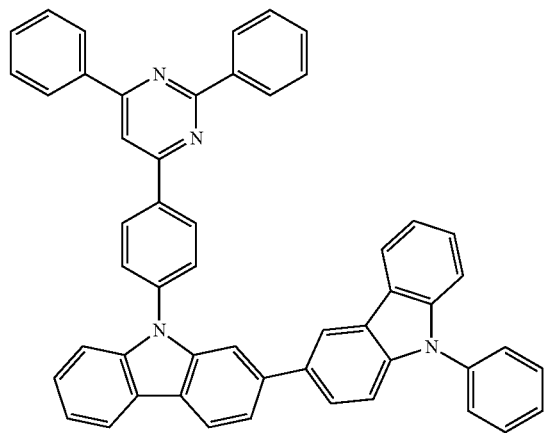
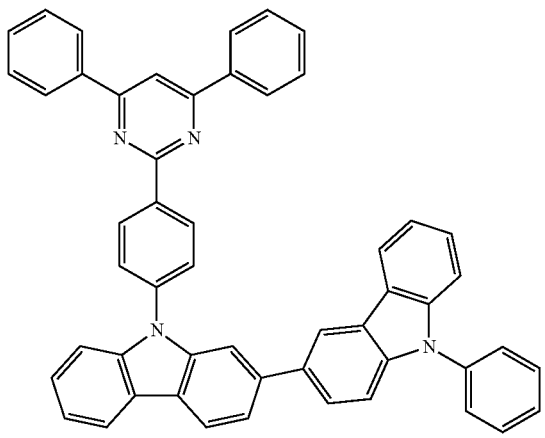
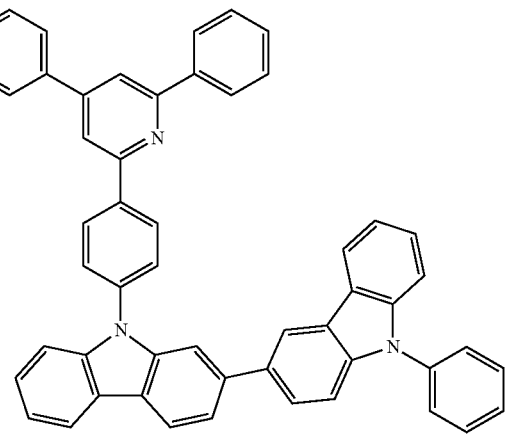

113
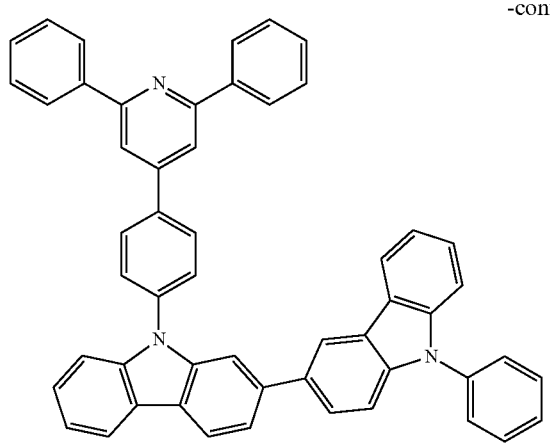
114
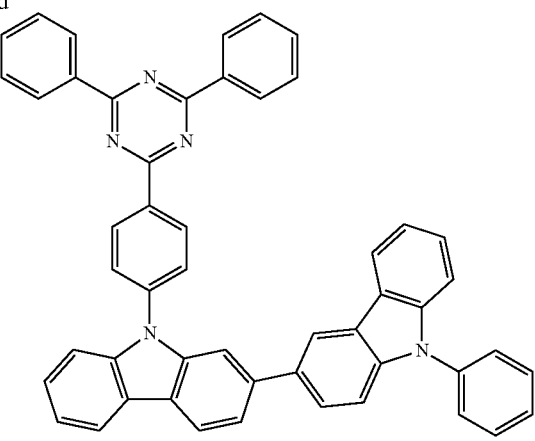
[Formula 58]
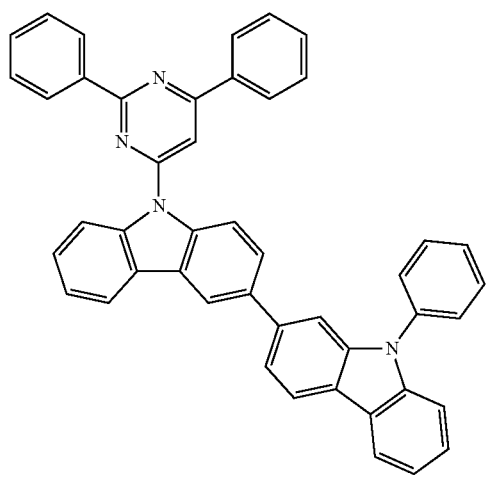
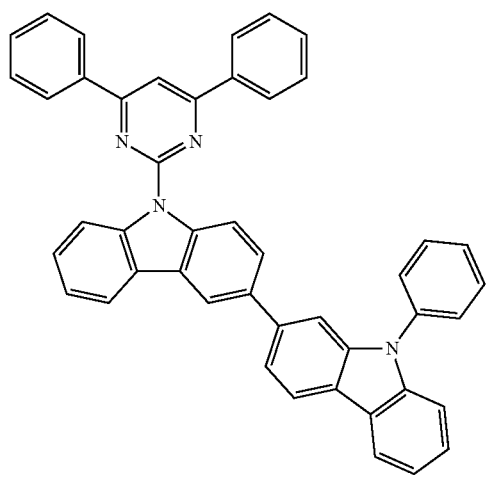
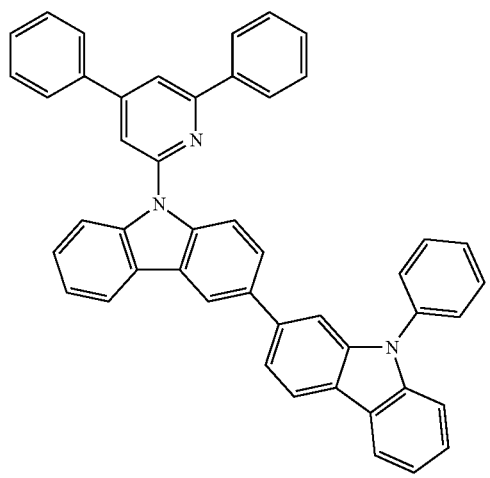
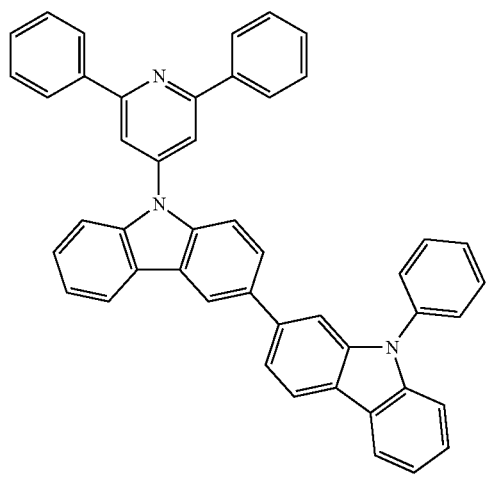

-continued
115
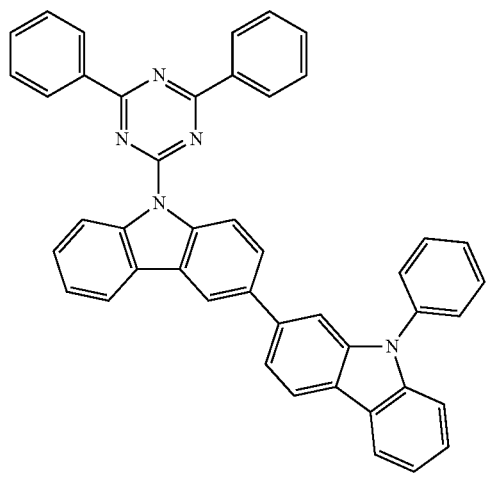
116
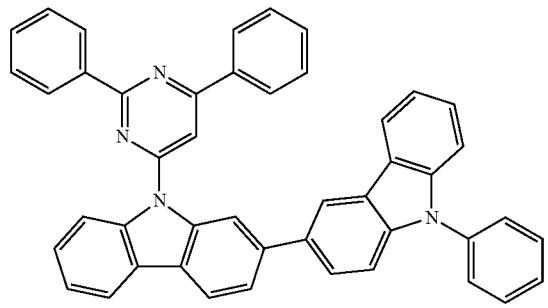
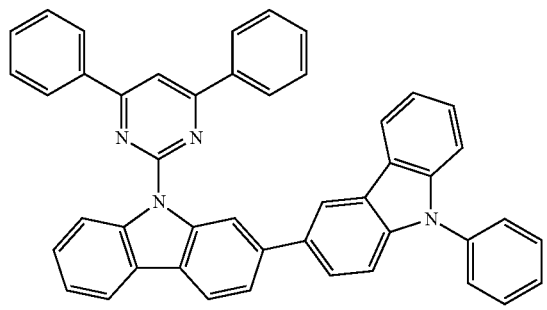
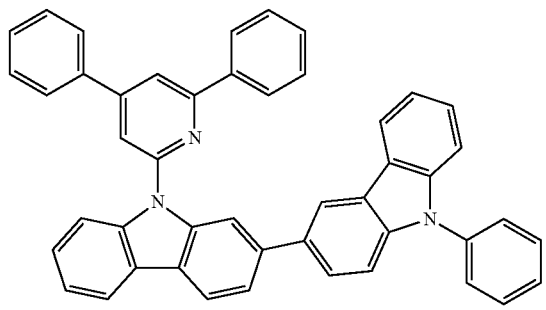
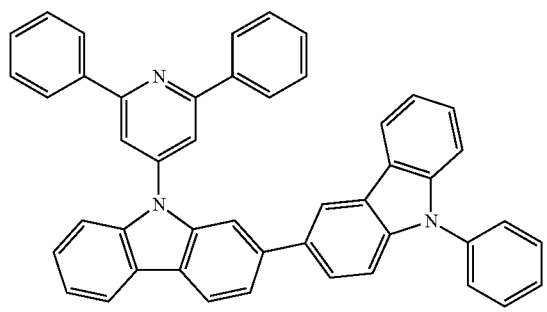
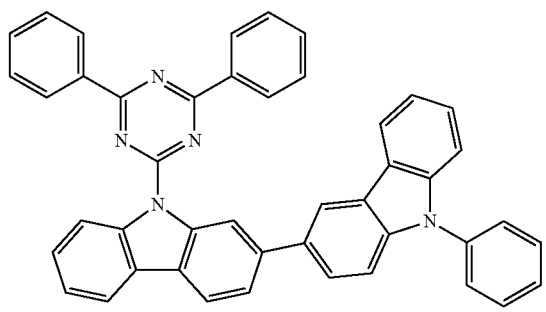

[Formula 59]
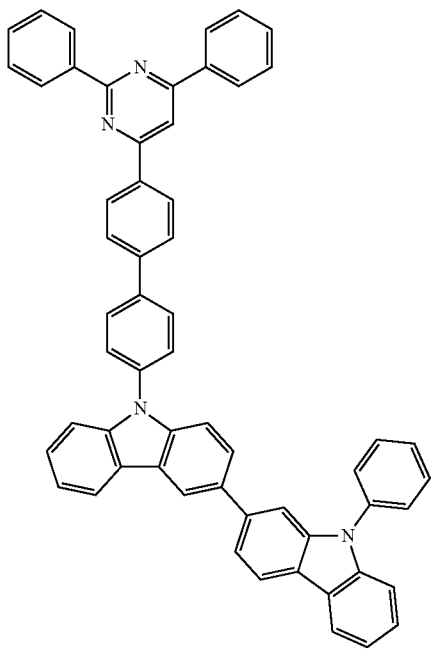
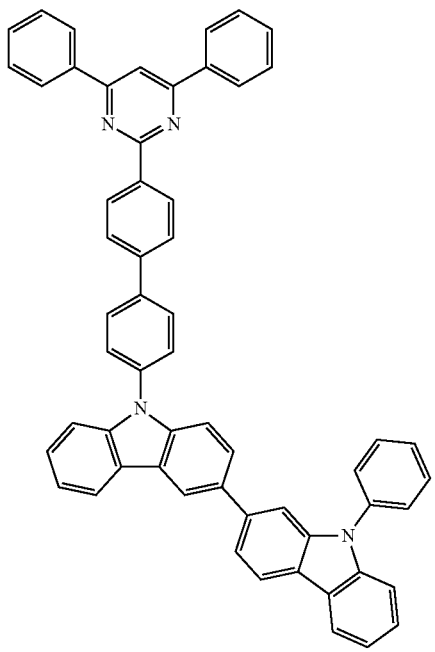
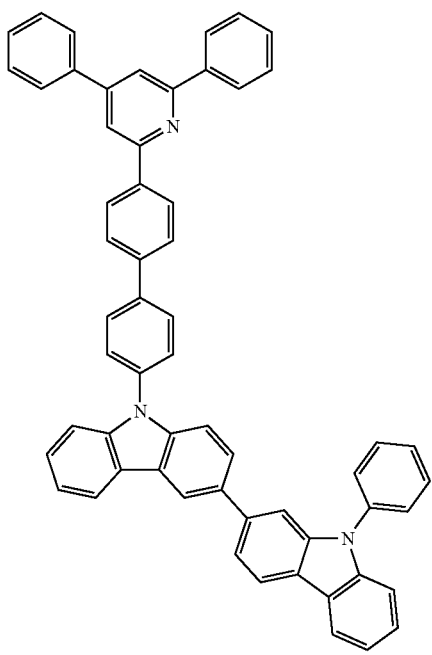
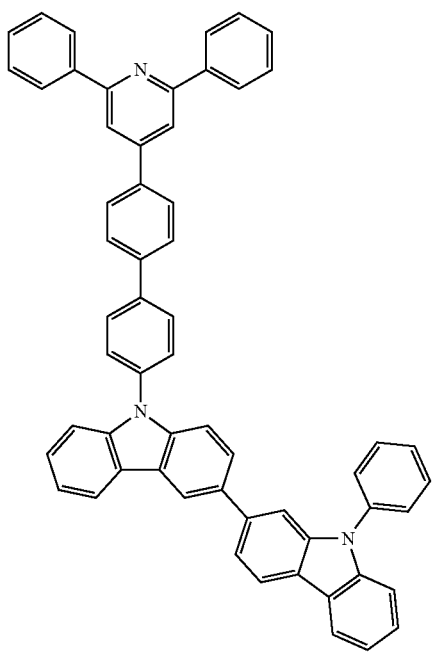

119
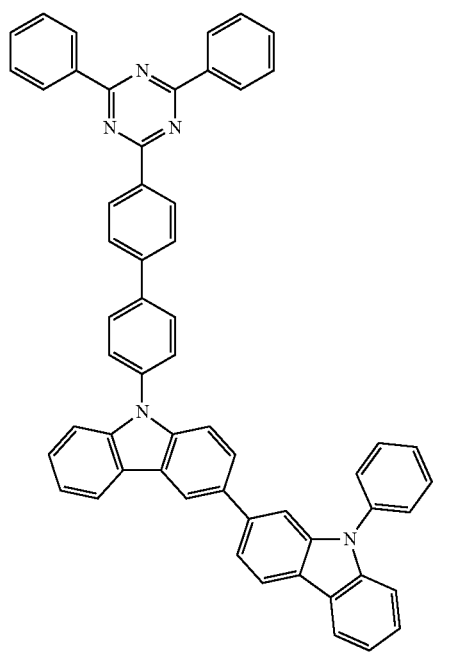
120
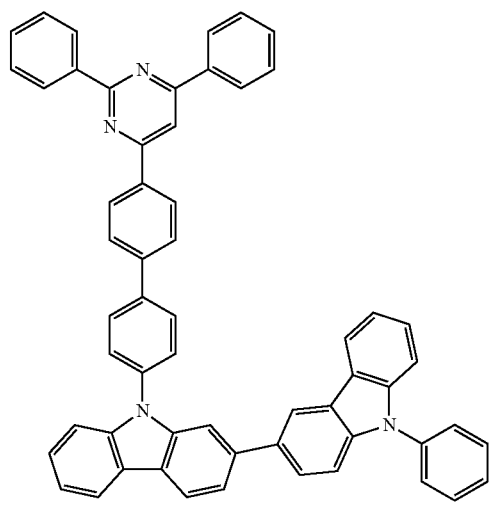
-continued
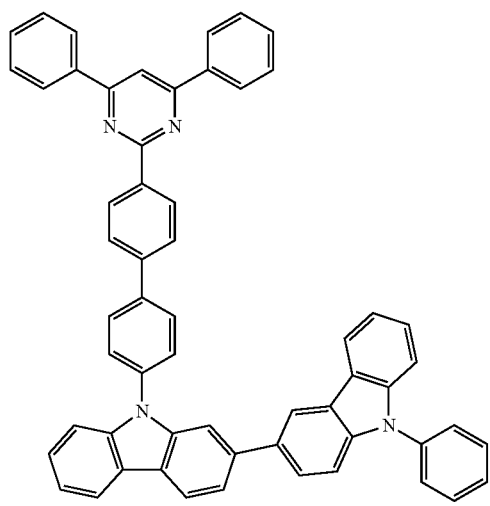
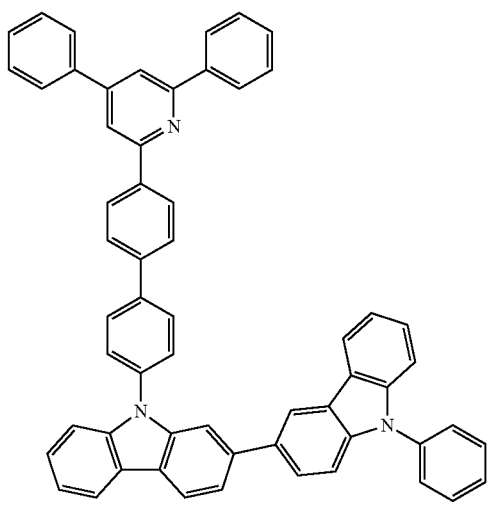

[Formula 60]
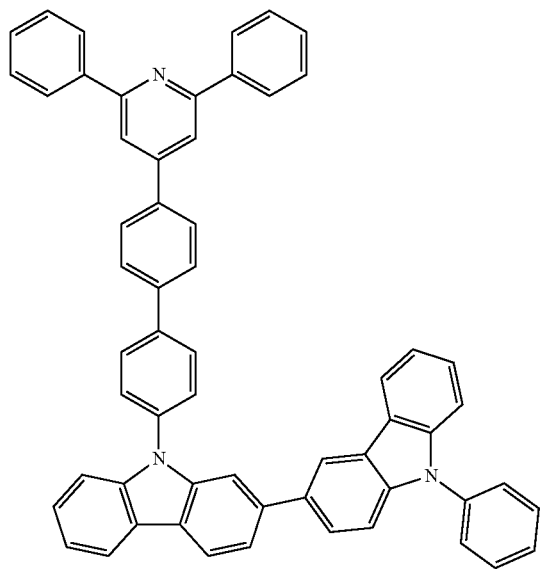
121
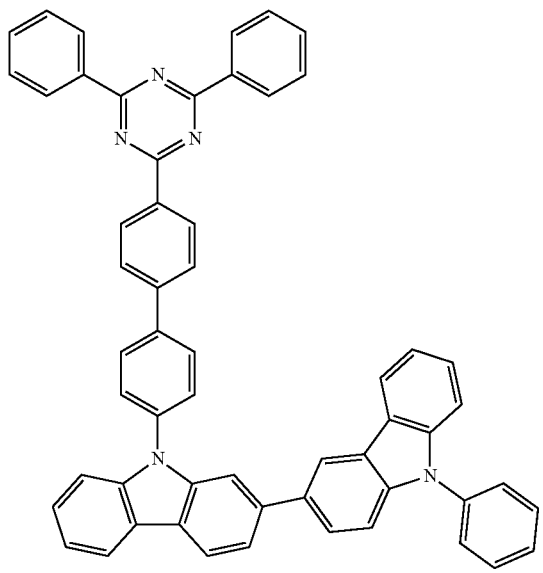
122
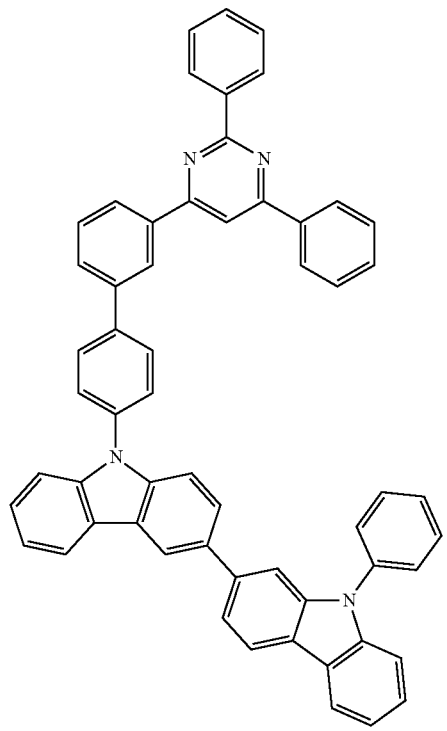
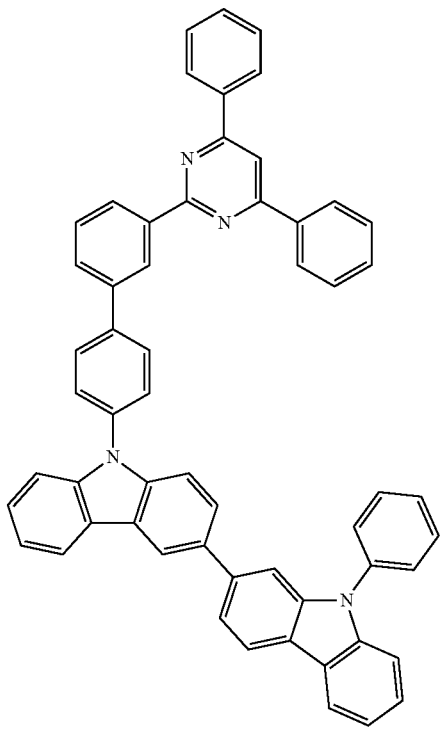

123
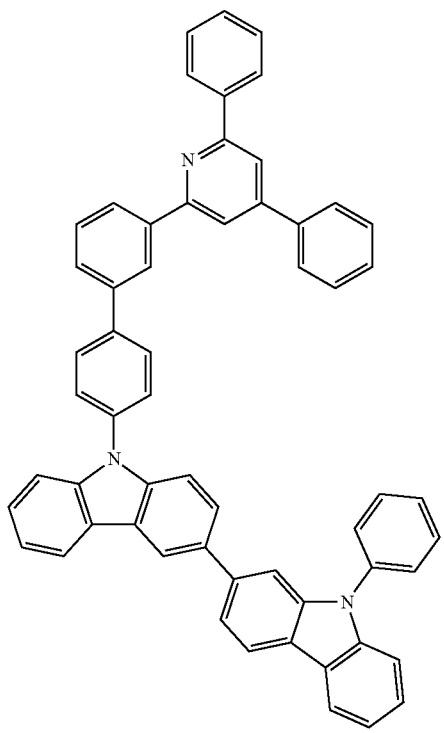
124
-continued
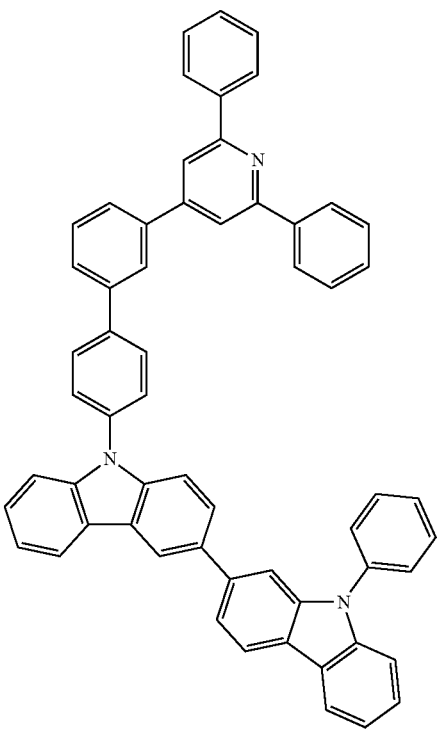
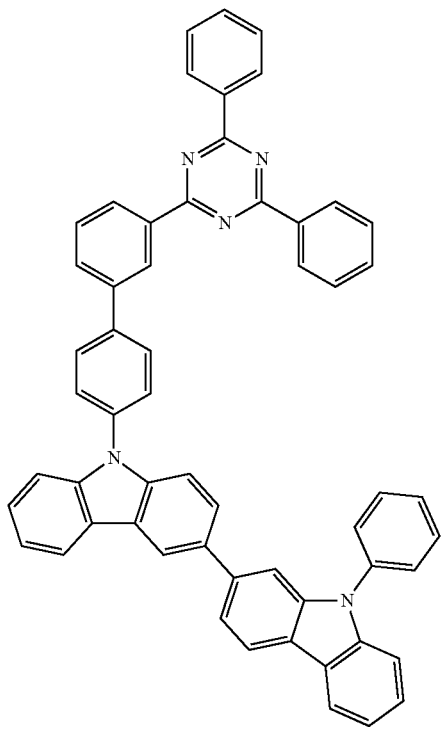

[Formula 61]
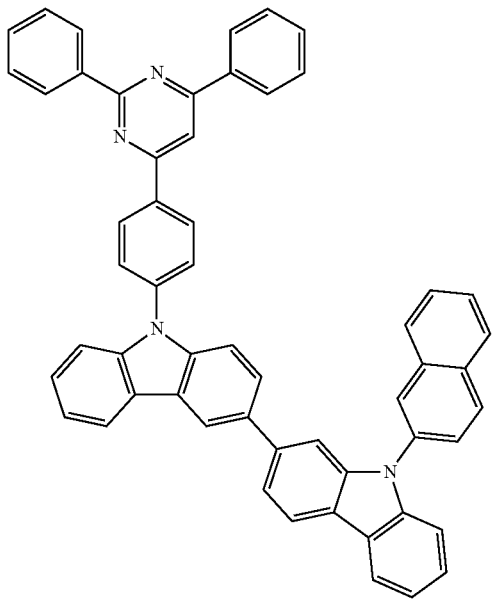
125
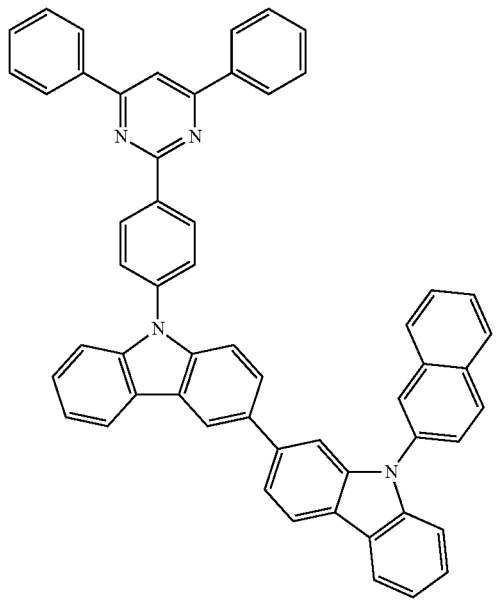
126
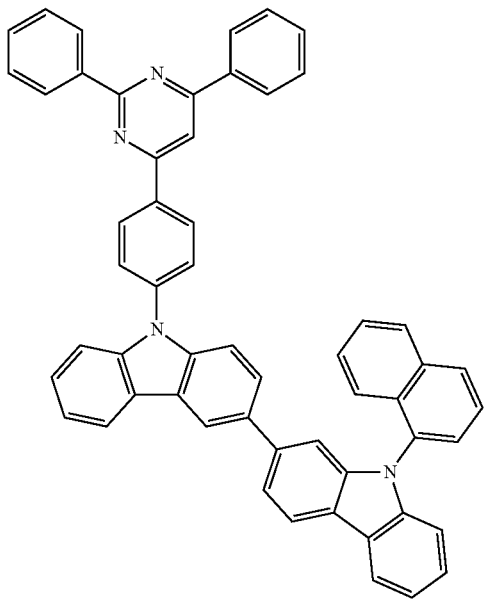
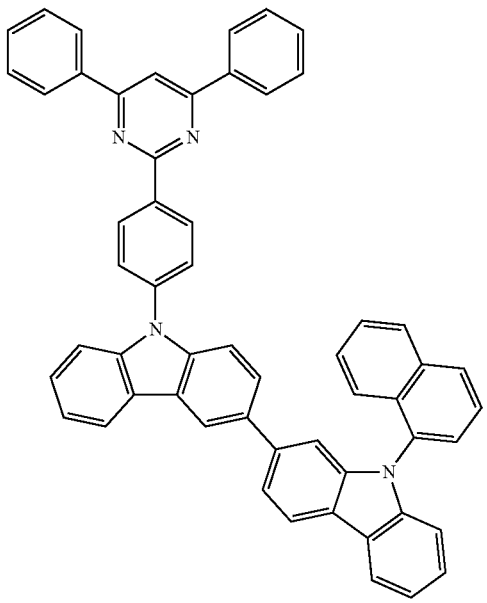

-continued
127
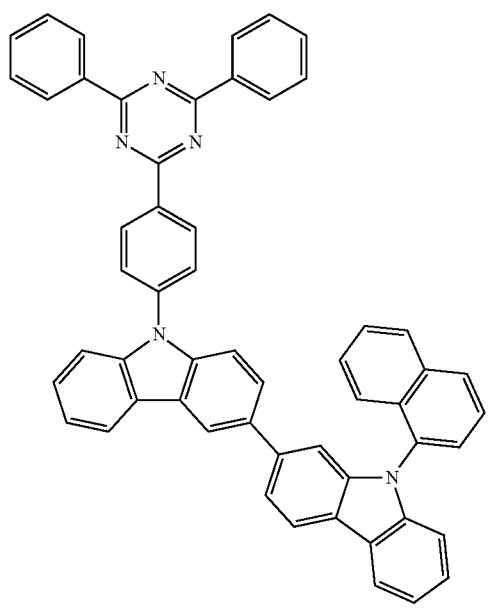
128
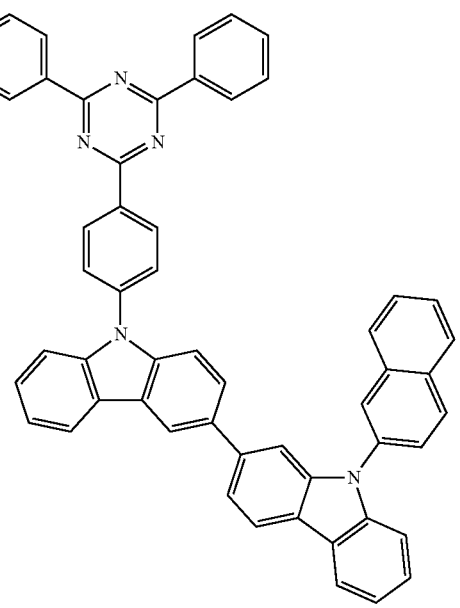
[Formula 62]
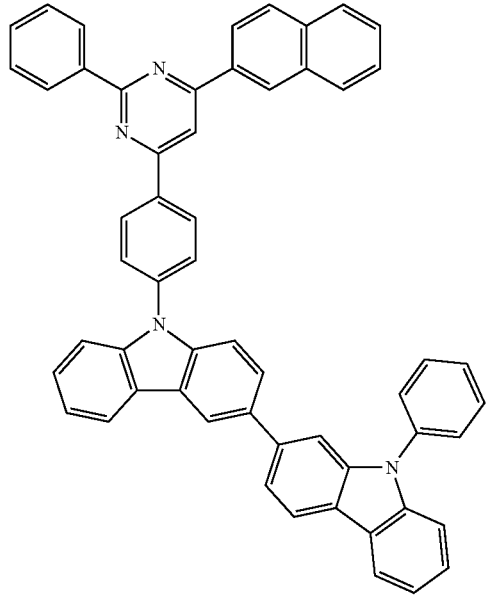
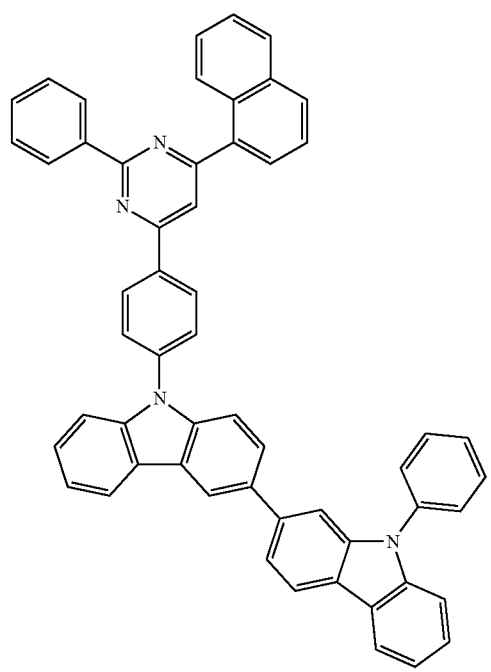

129 130
-continued
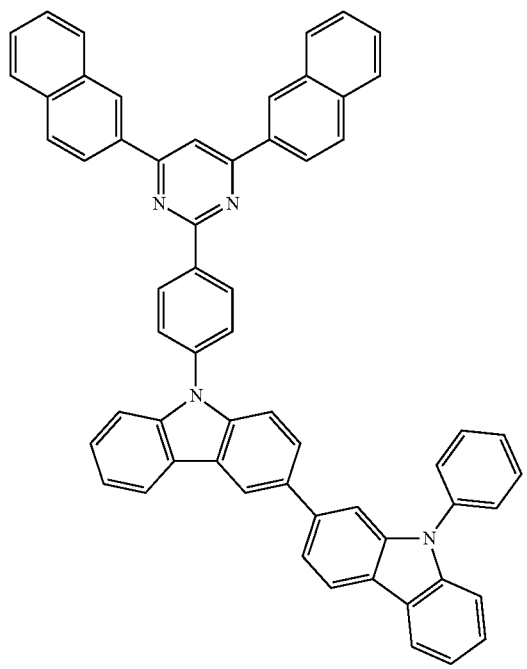 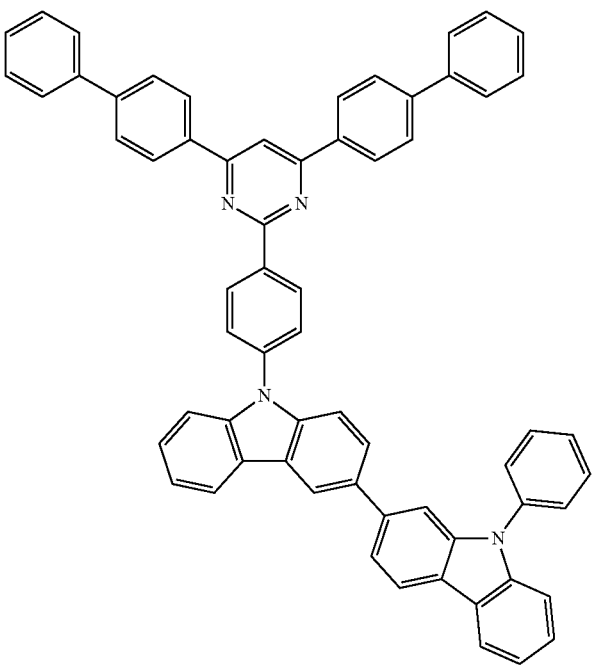
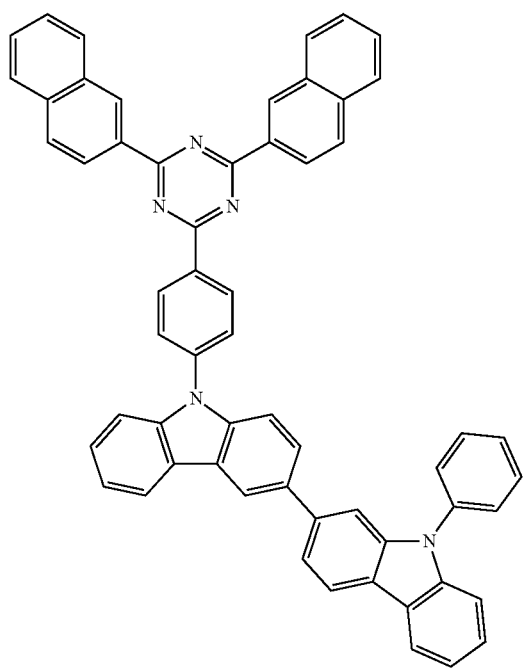

-continued
131
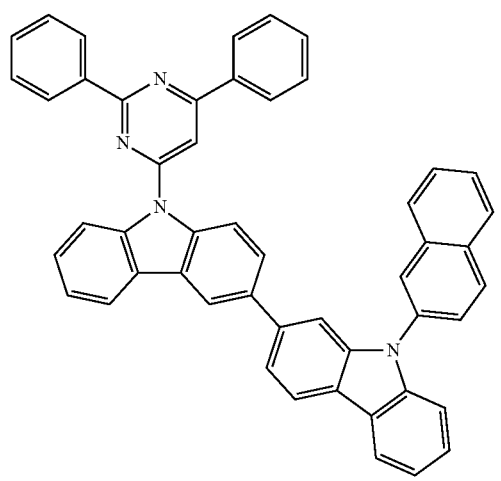
132
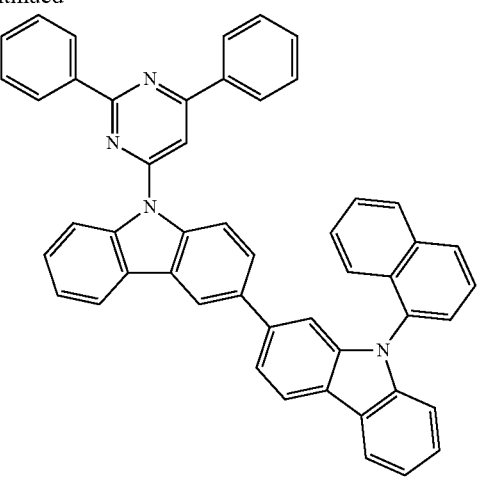
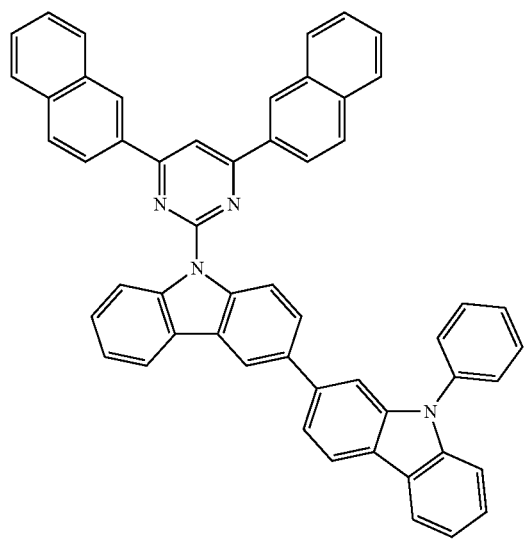
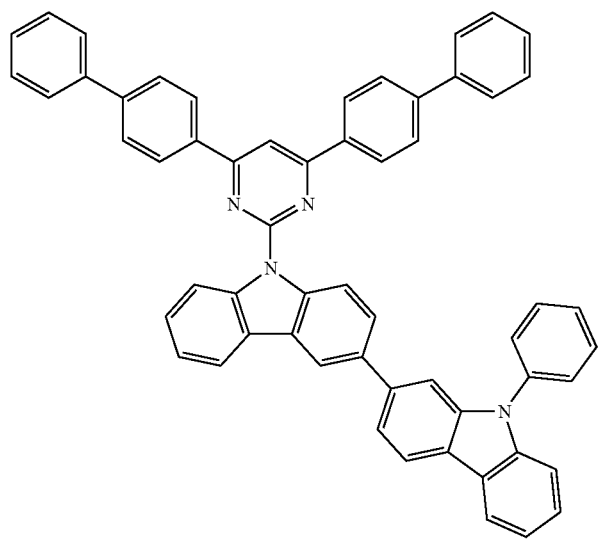
[Formula 63]
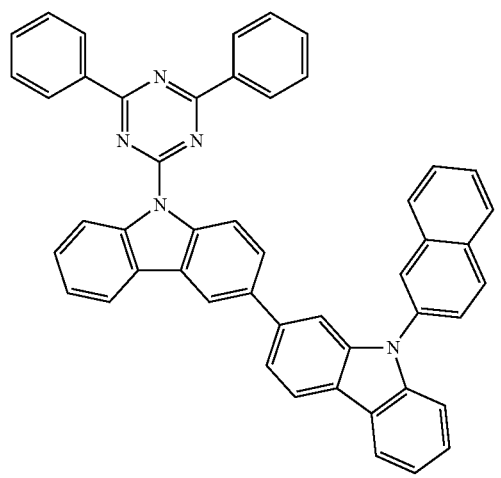
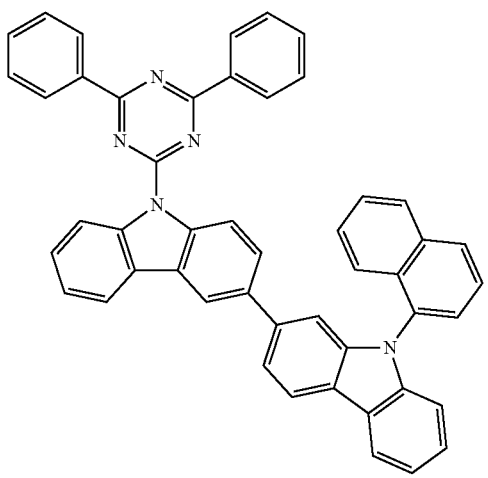

-continued
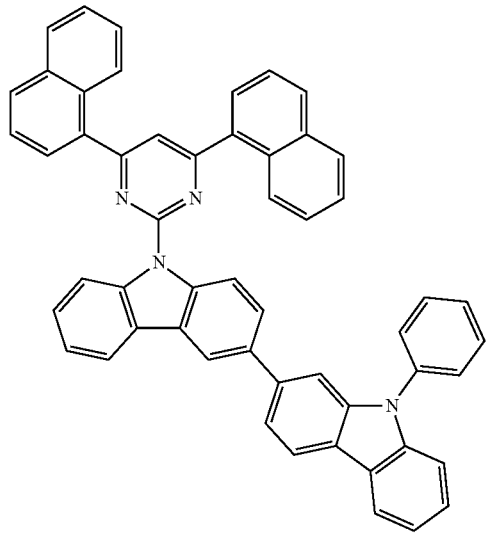
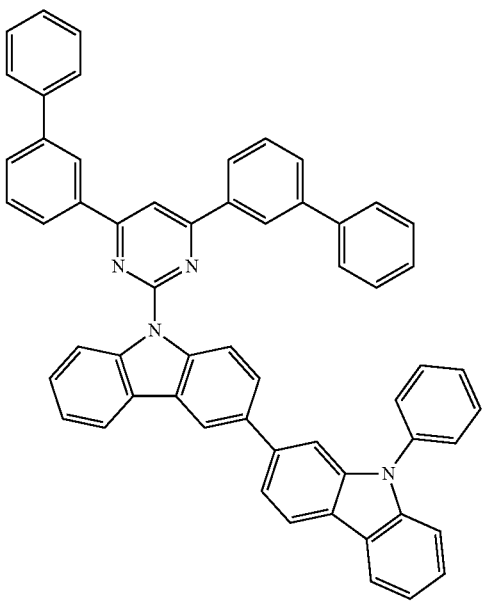
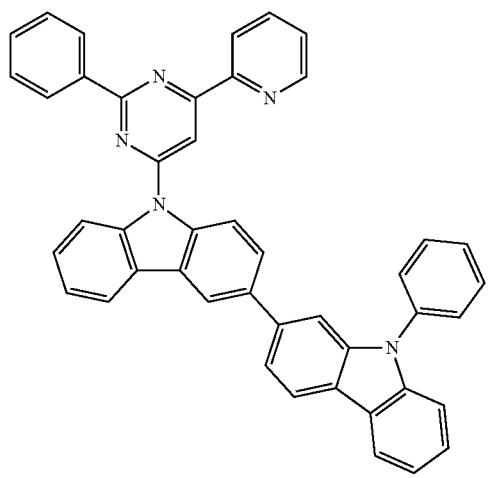
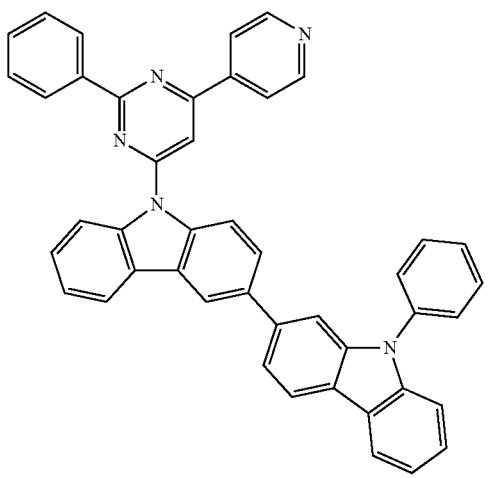
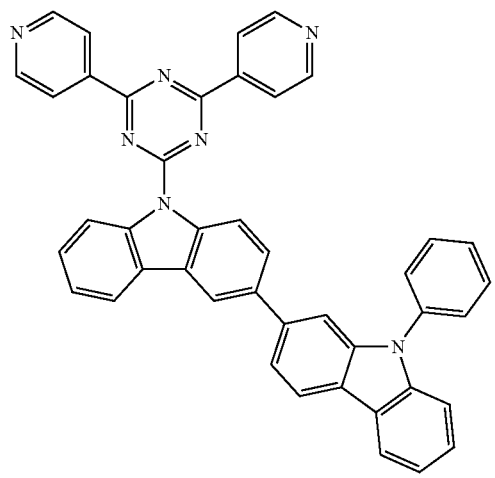
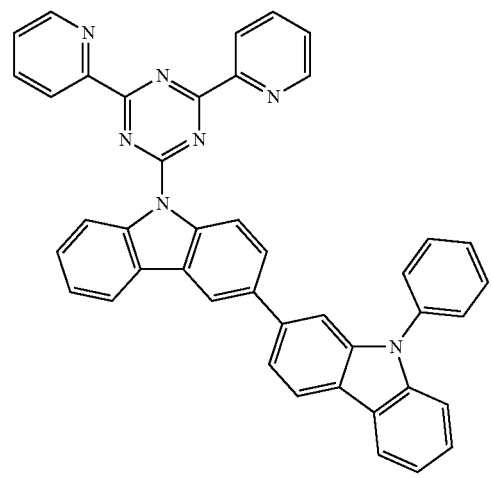

135                                          136
-continued
[Formula 64]
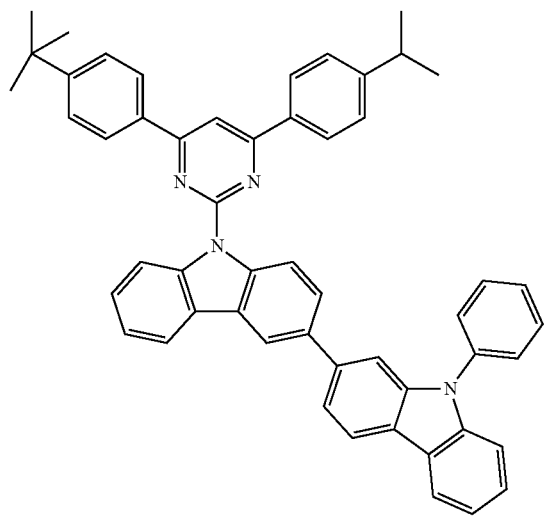
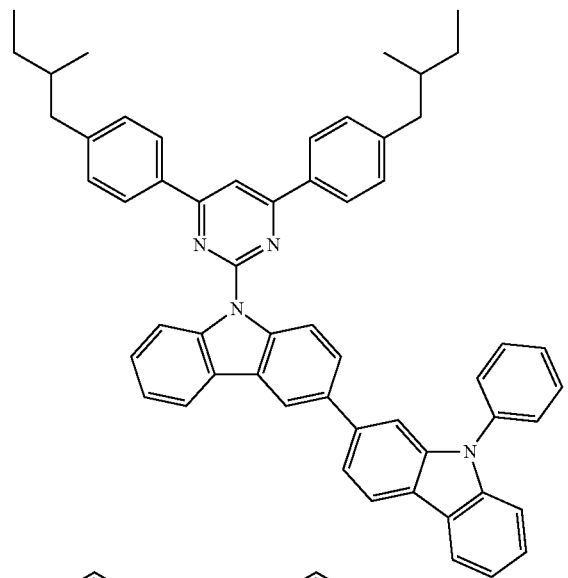
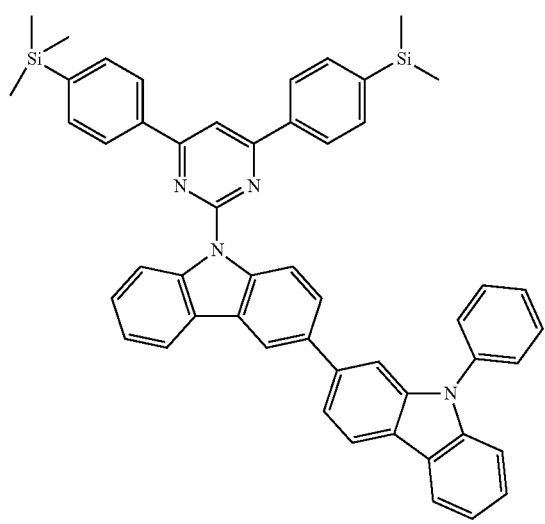
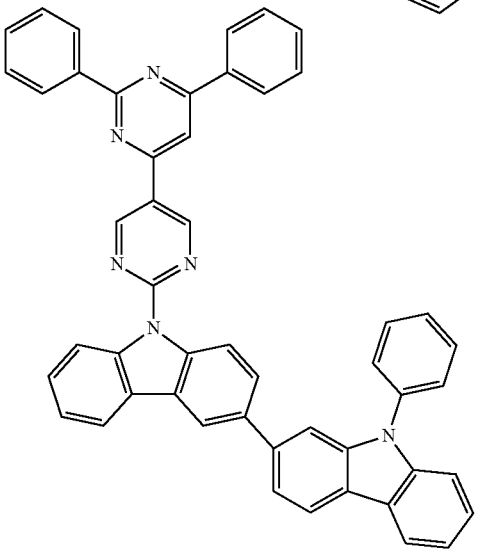
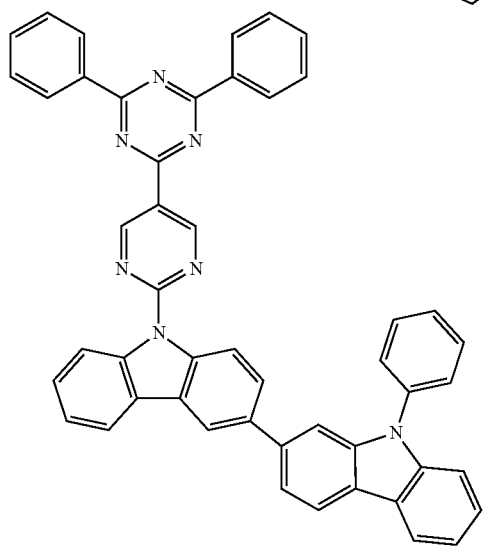
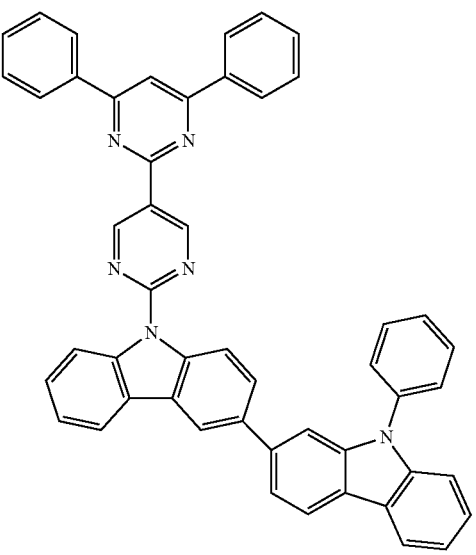

-continued
137
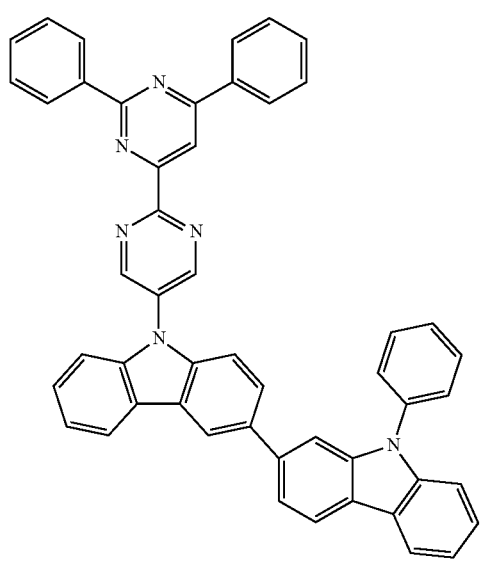
138
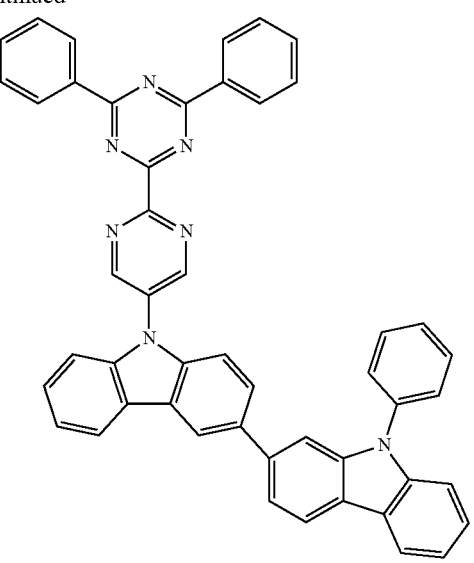
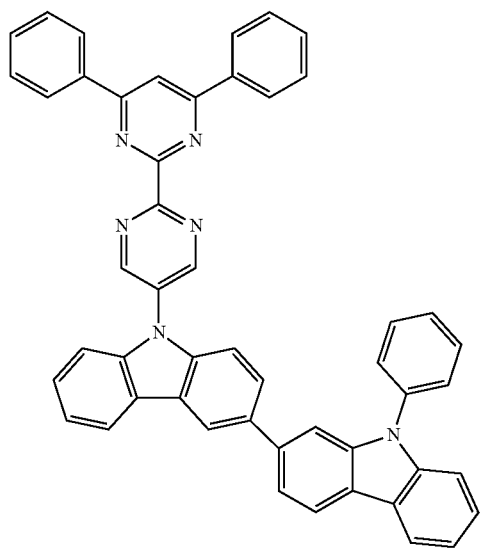
[Formula 65]
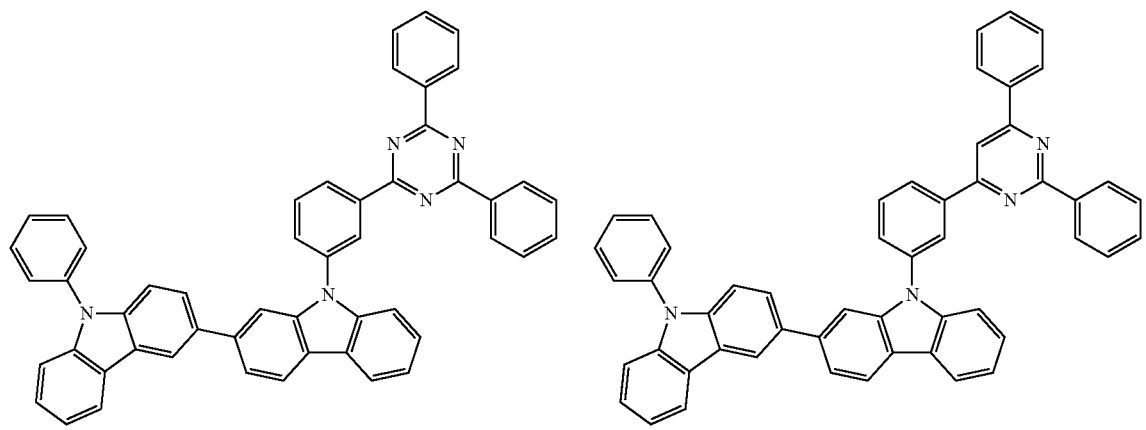

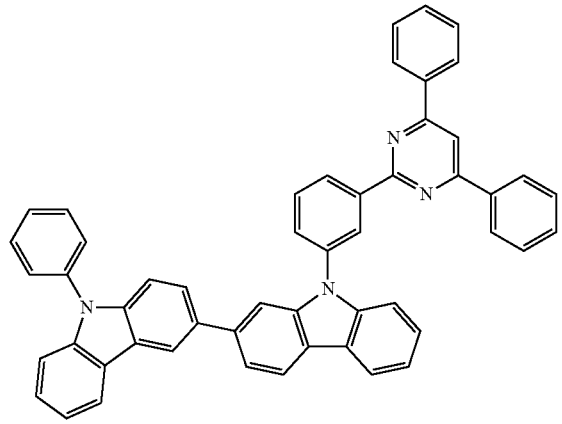
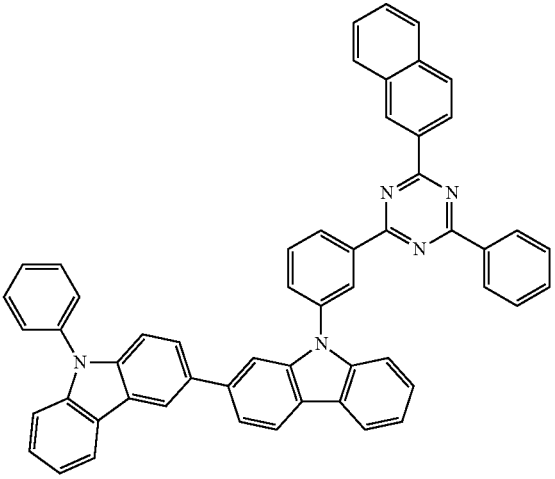
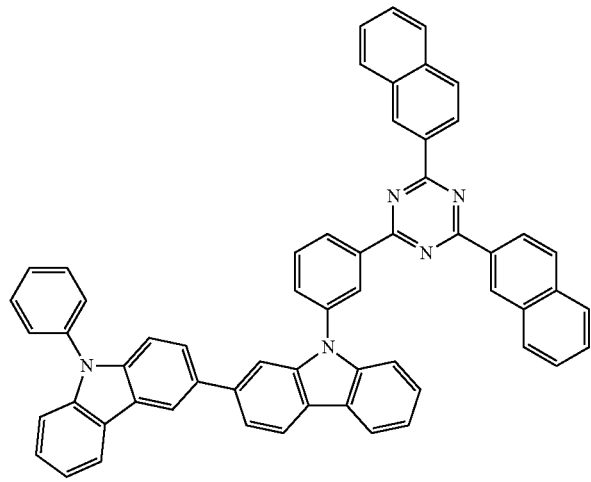
[Formula 66]
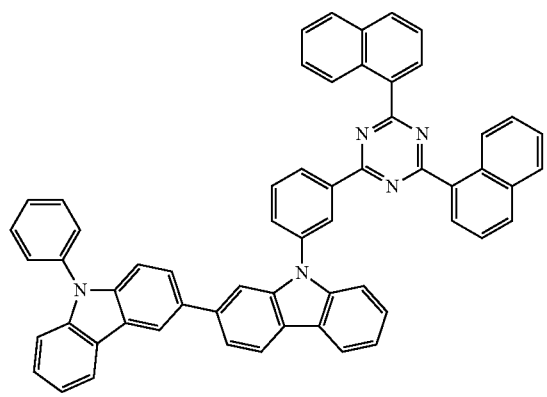
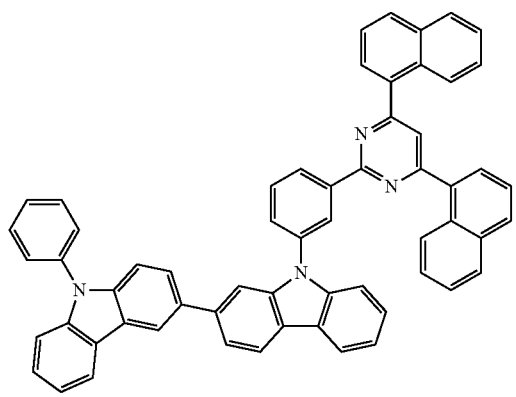

-continued
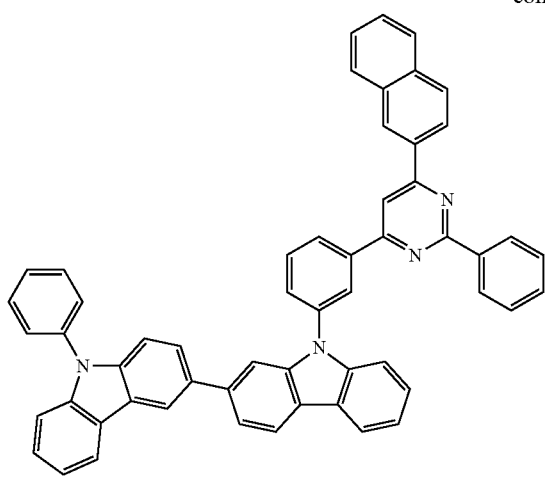
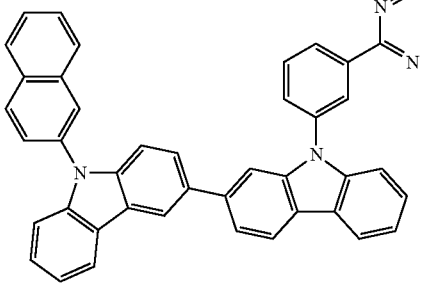
[Formula 67]
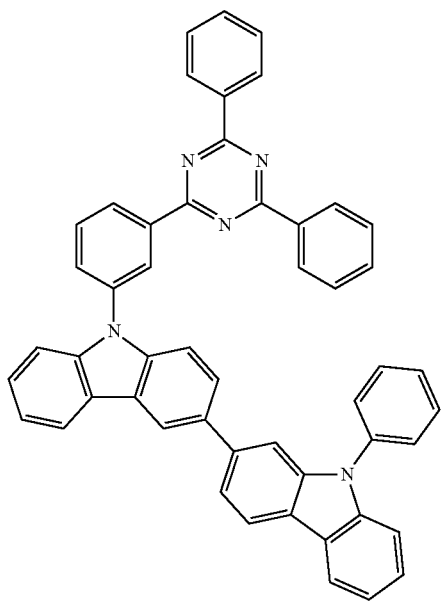
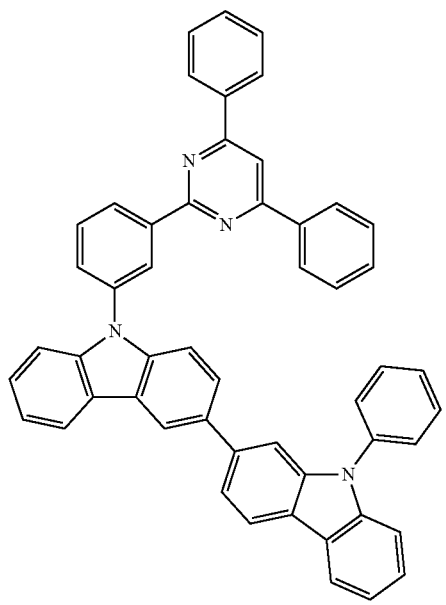
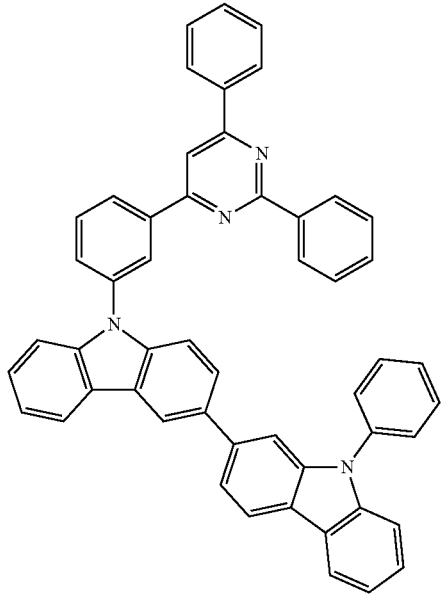

[Formula 68]

[Formula 69]

-continued
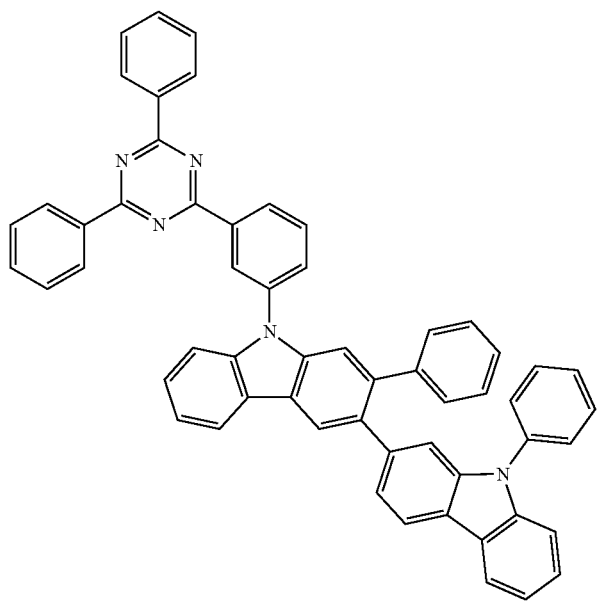
[Formula 70]
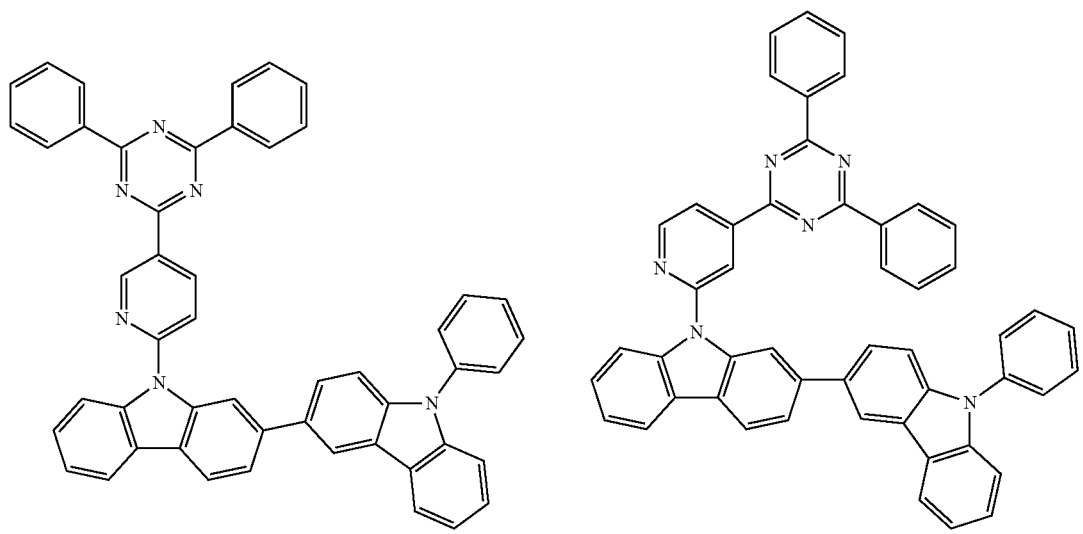
[Formula 71]
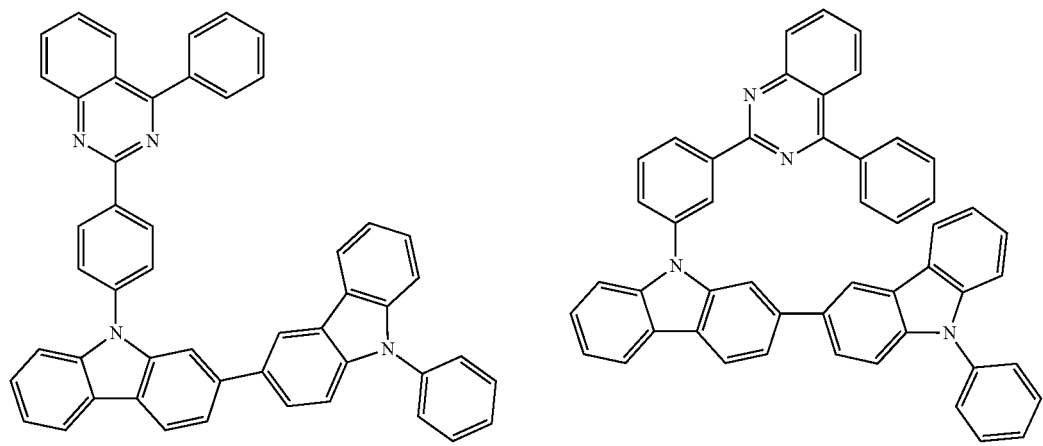

-continued
147
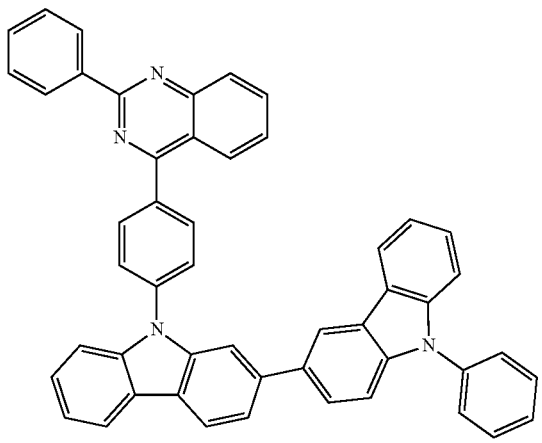
148
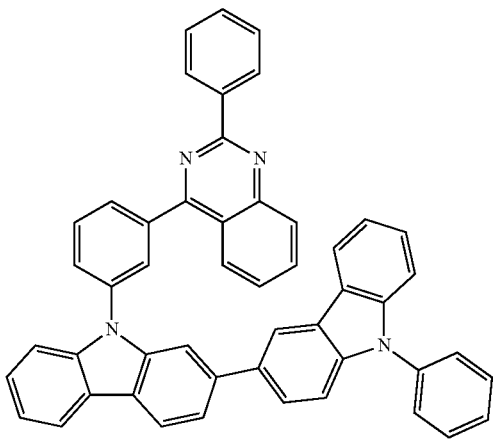
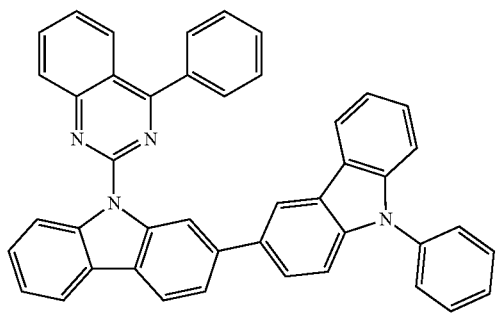
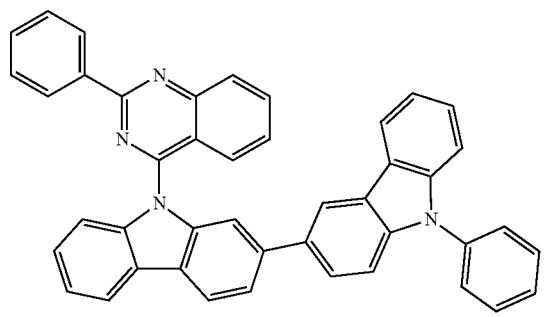
[Formula 72]
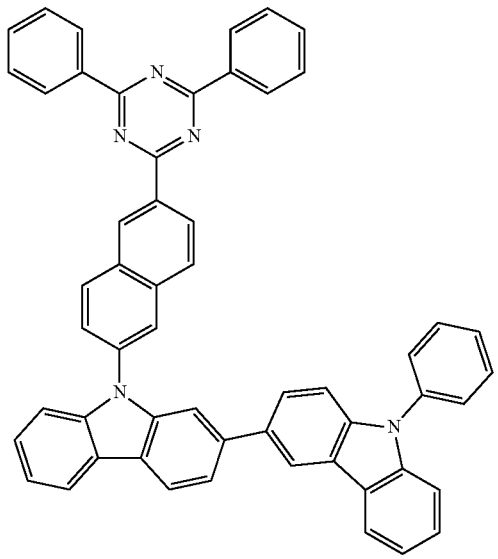
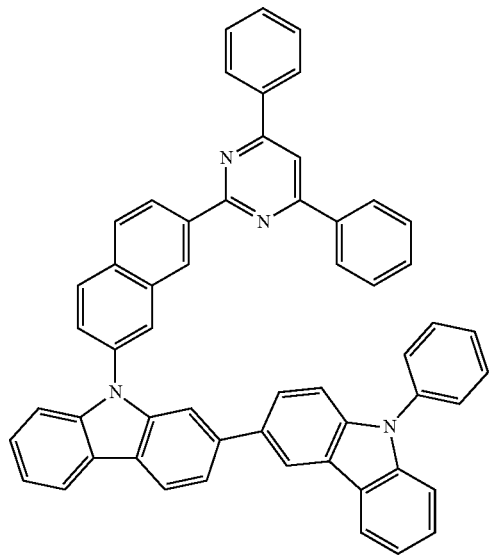

-continued
149
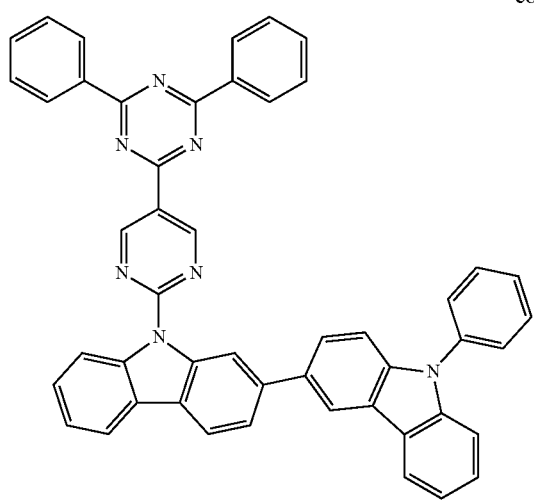
150
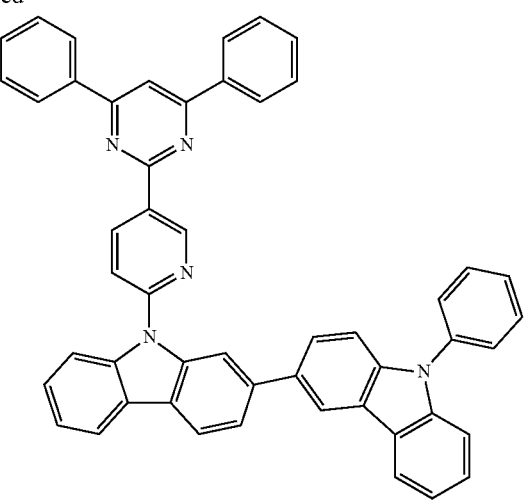
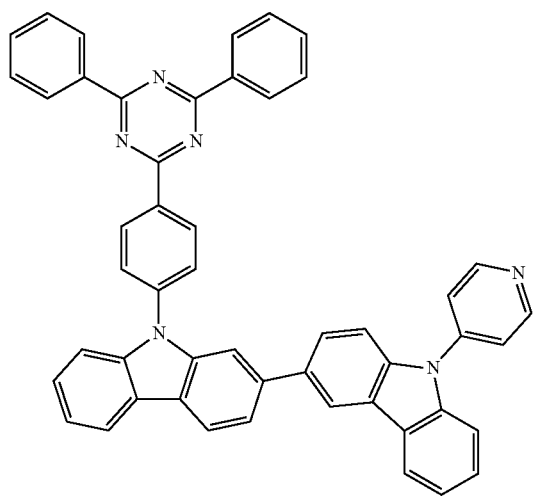
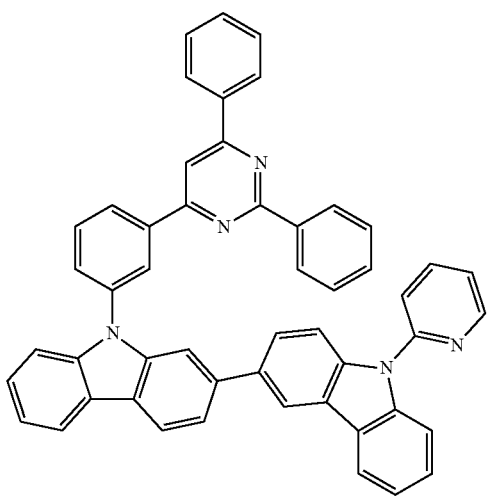
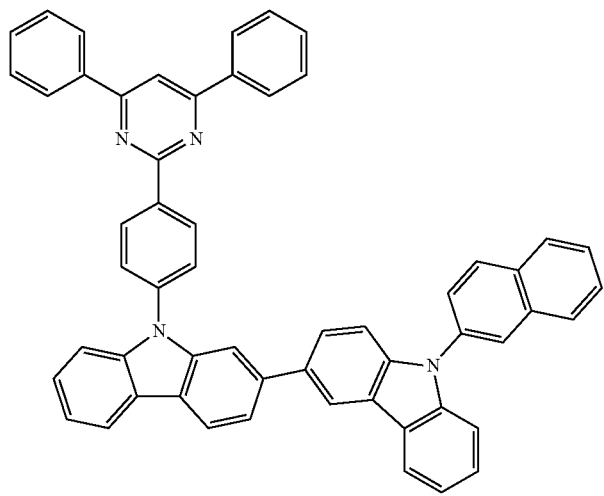

151
[Formula 73]
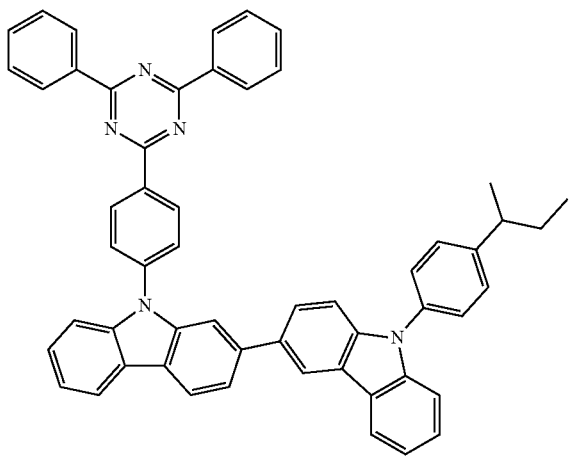
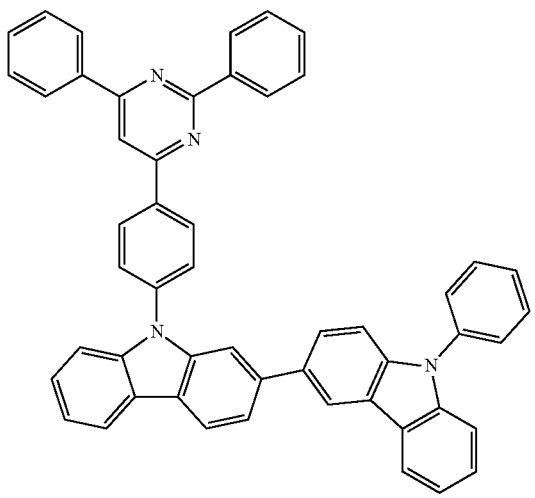
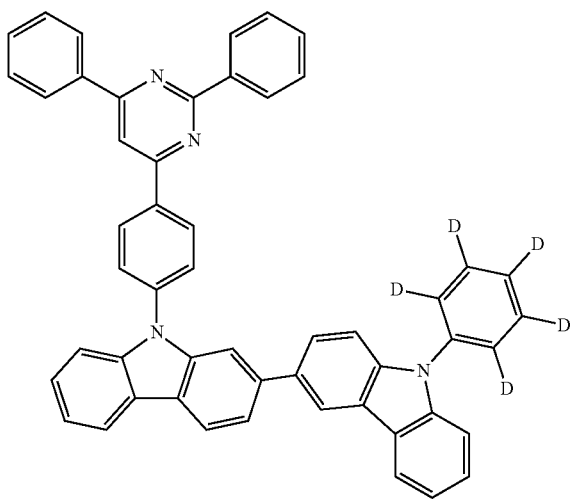
152
-continued
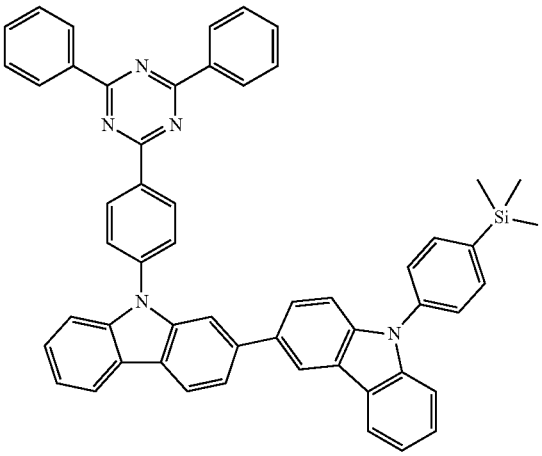
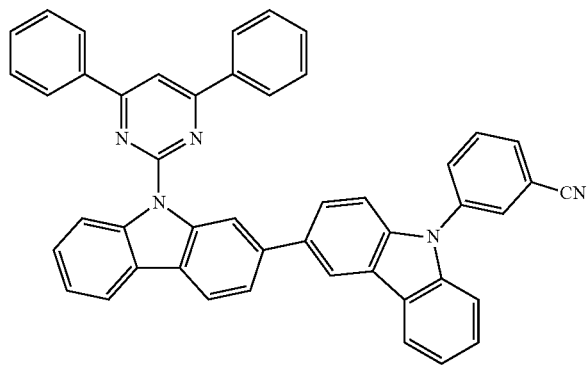
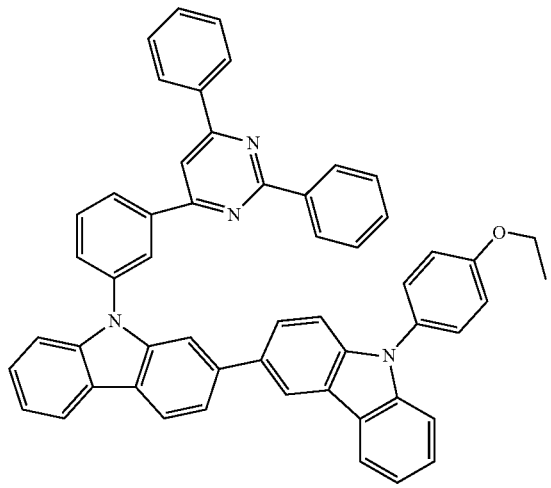

153 154
-continued
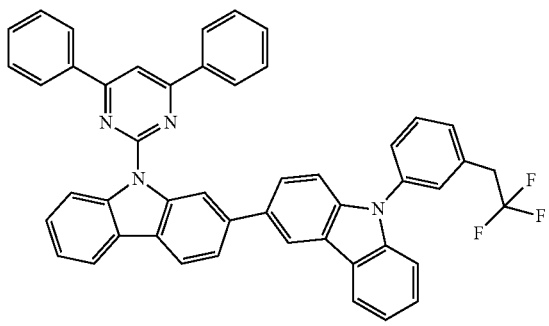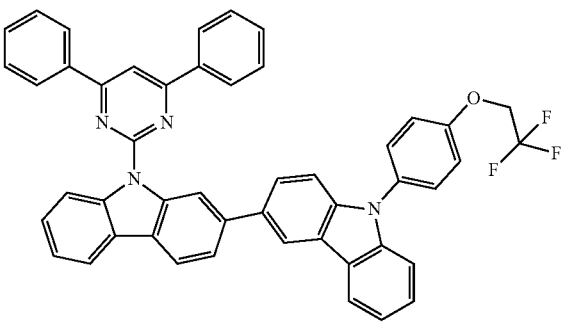
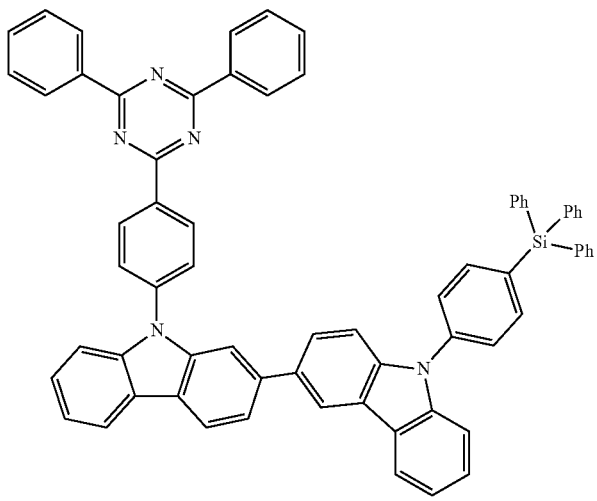
[Formula 74]
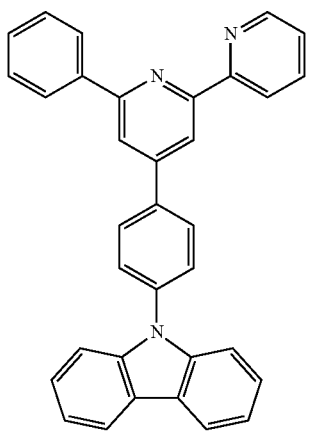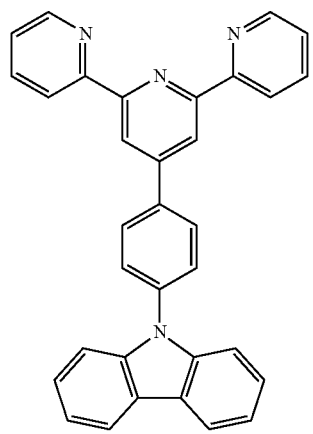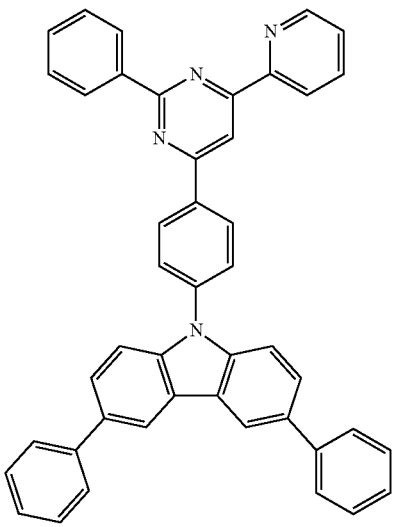

-continued
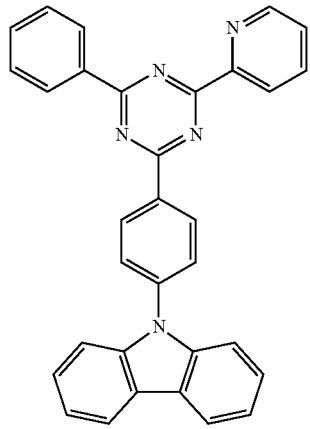
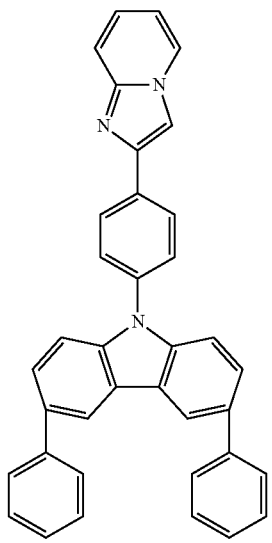
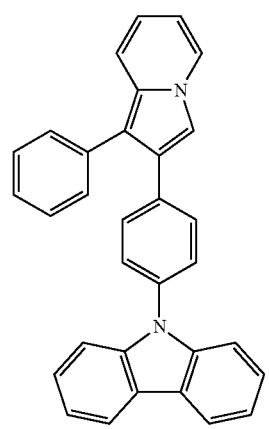
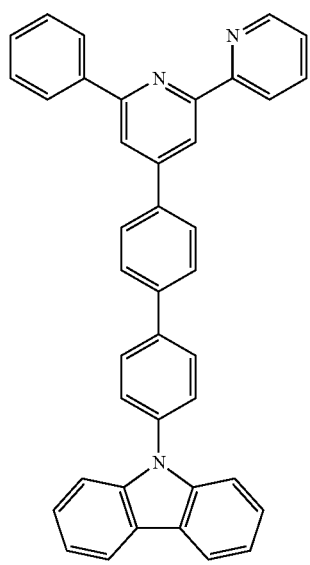
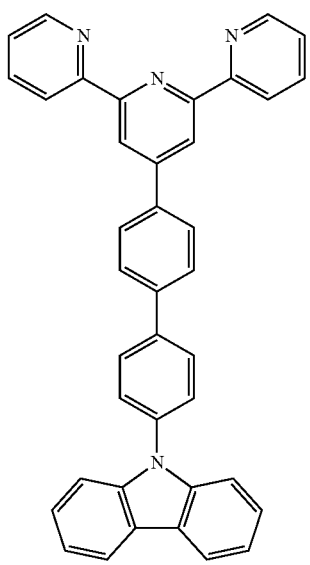
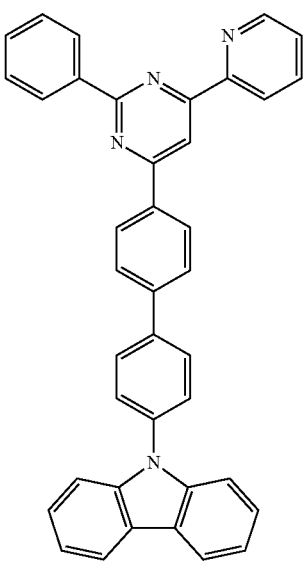

157  158
-continued
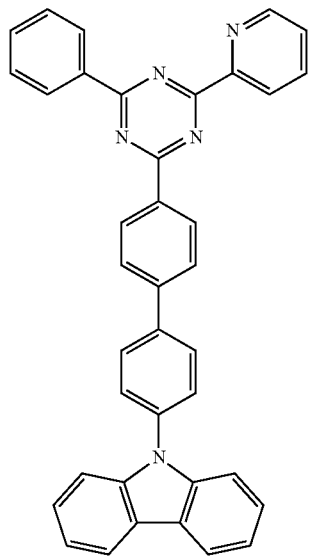
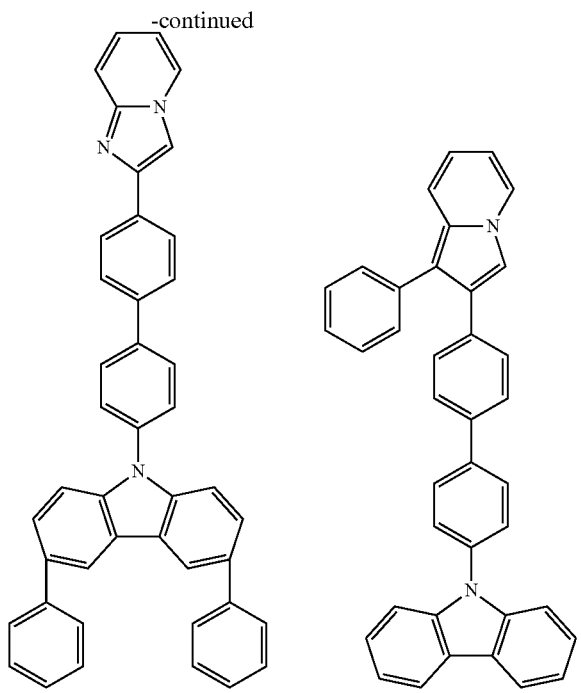
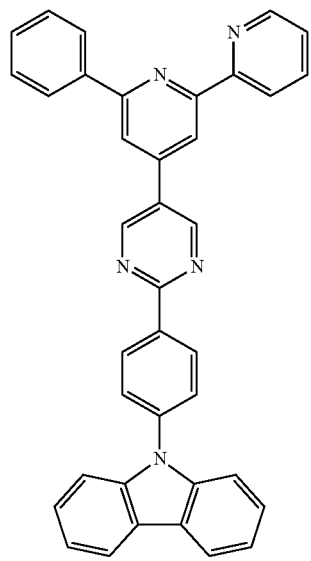
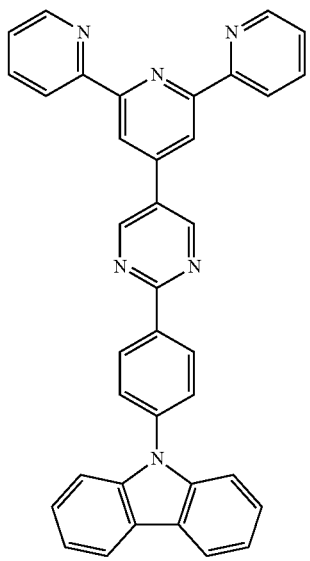
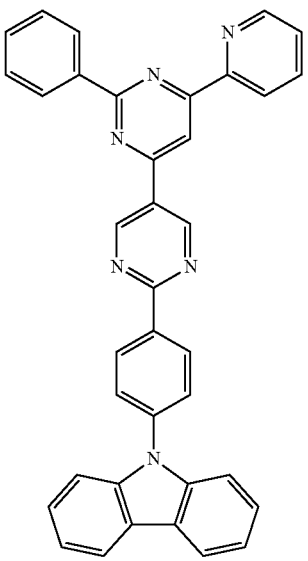

-continued
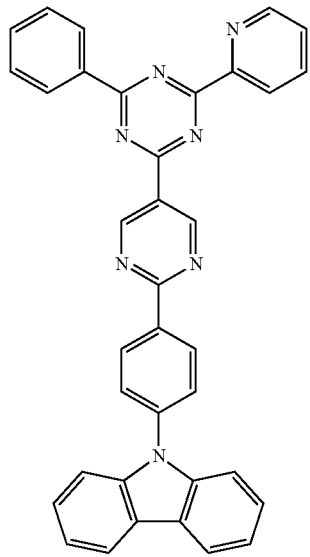
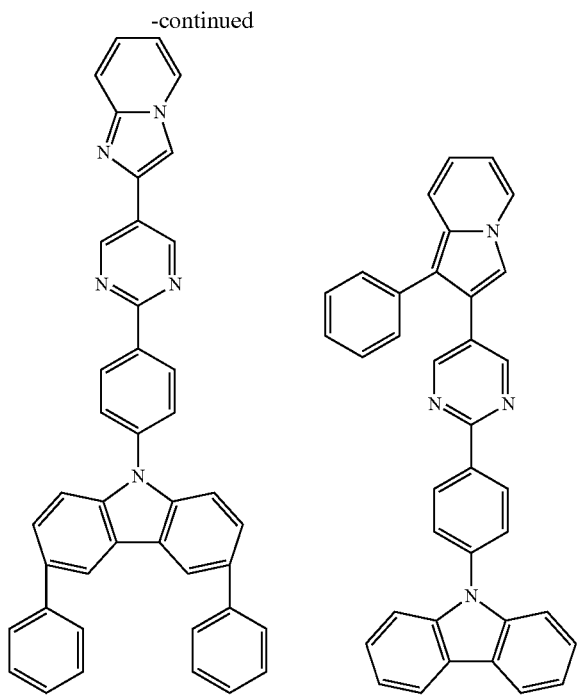
[Formula 75]
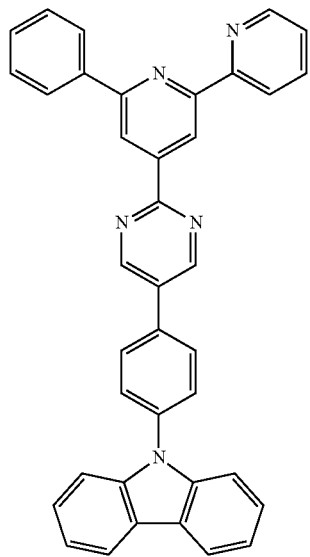
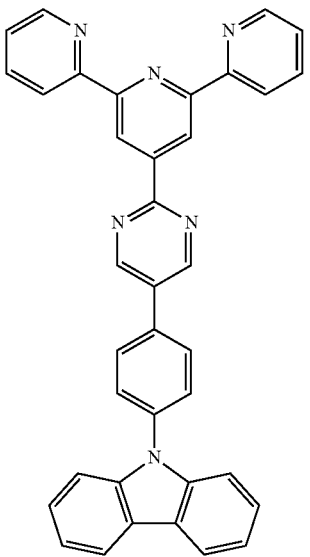
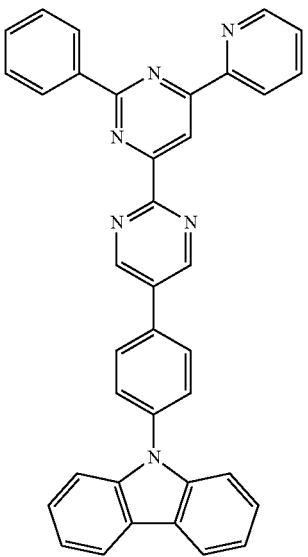

161
-continued
162
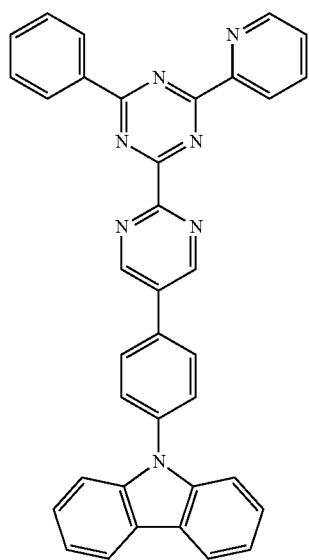
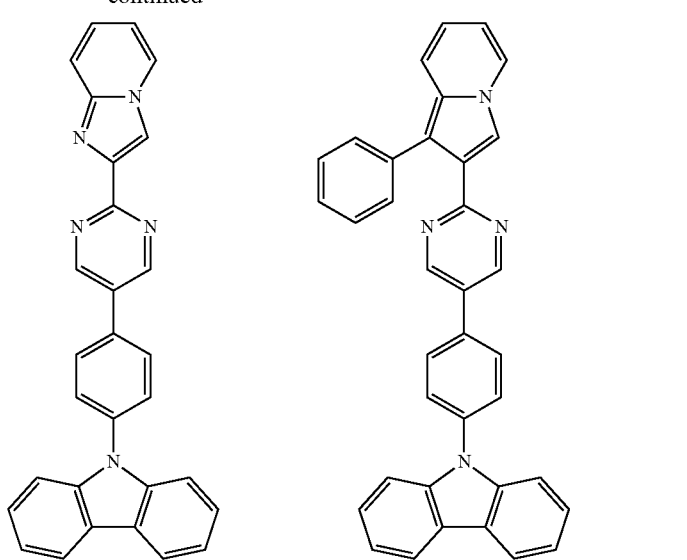
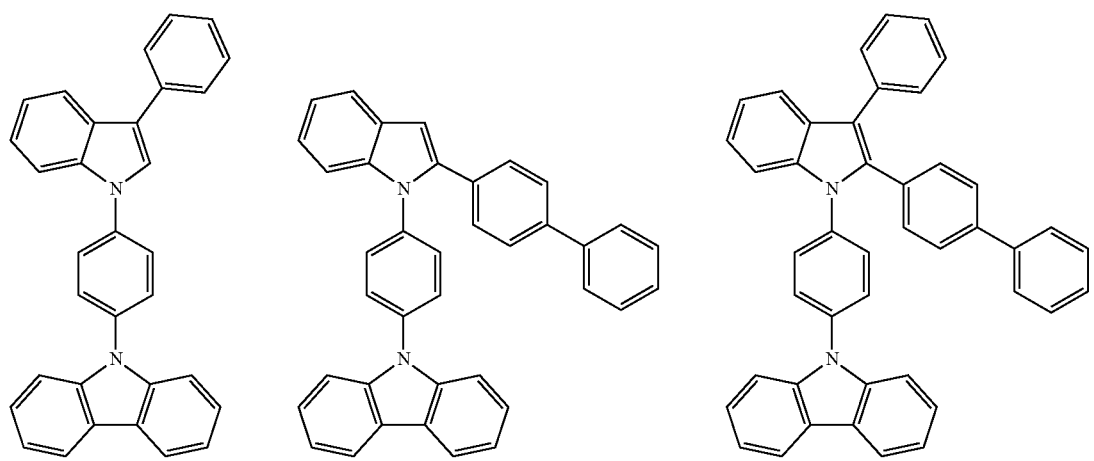
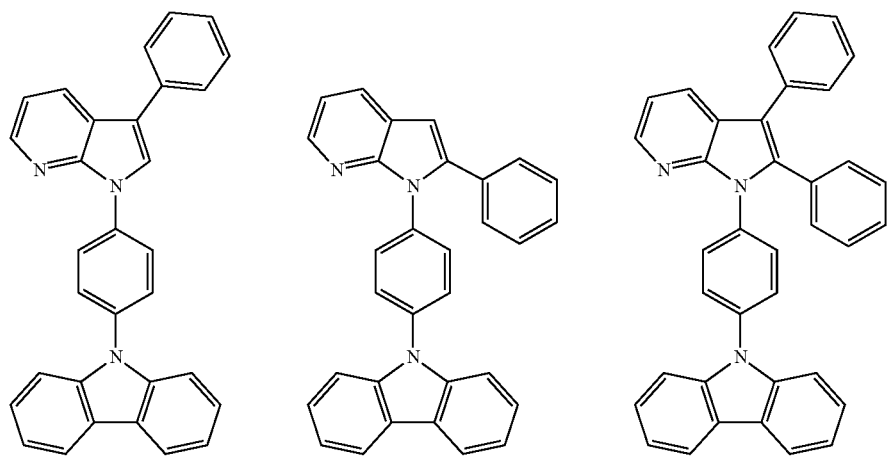

-continued
[Formula 76]
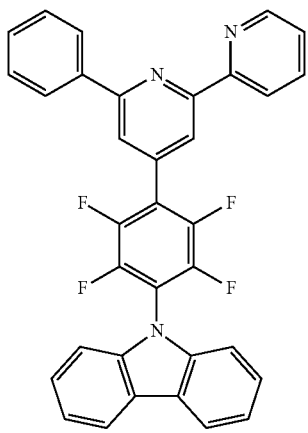 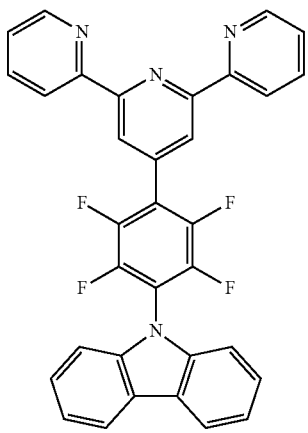 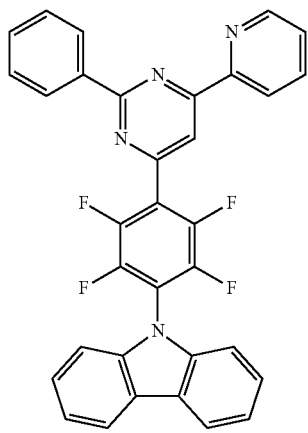
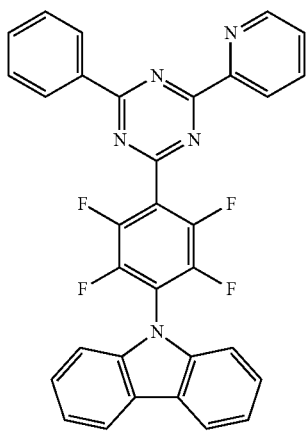 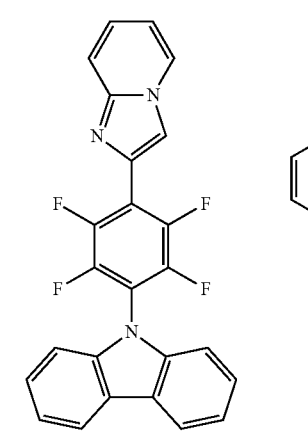 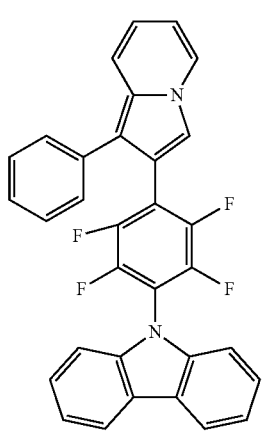
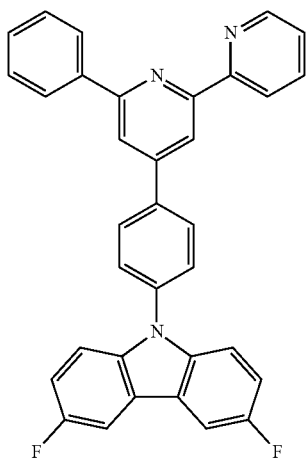 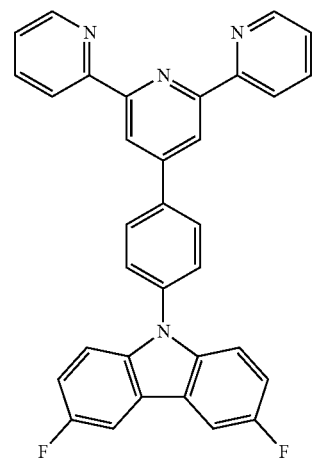 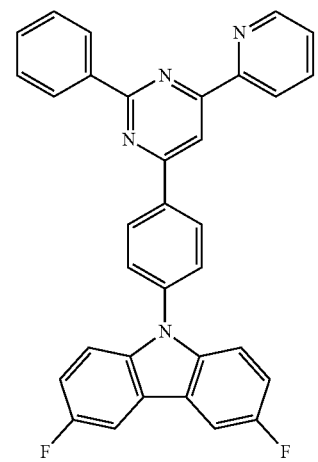

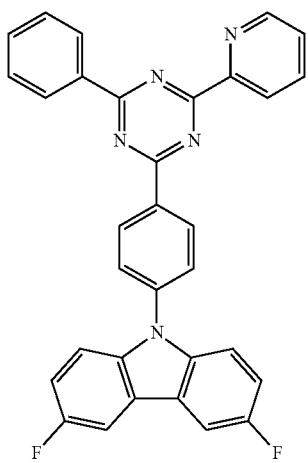
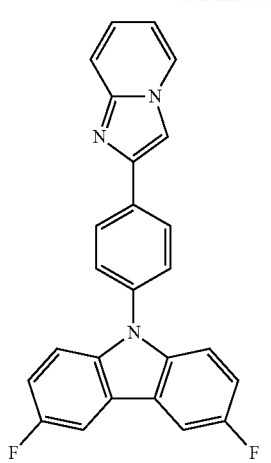
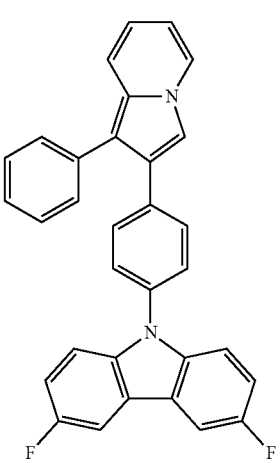
[Formula 77]
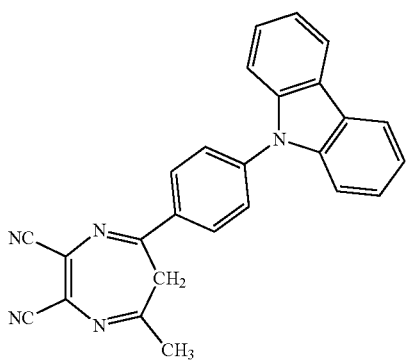
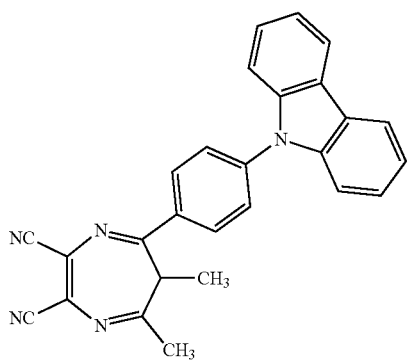
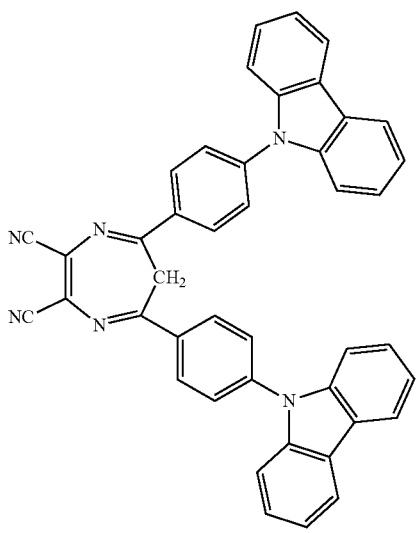
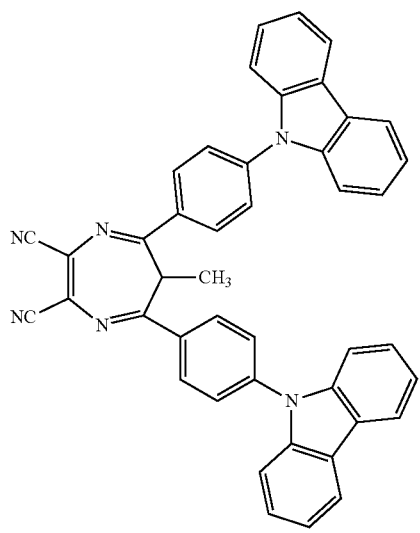

-continued
| 167 | 168 |
|---|---|
| 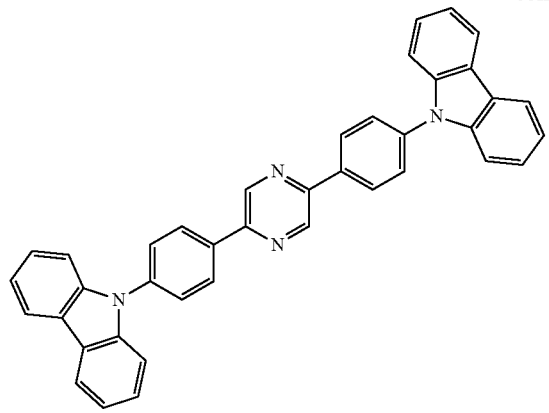 | 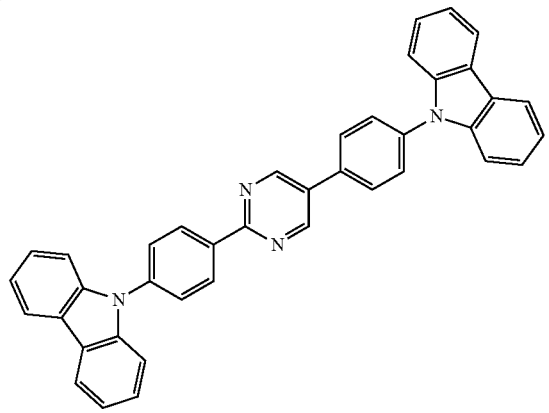 |
| 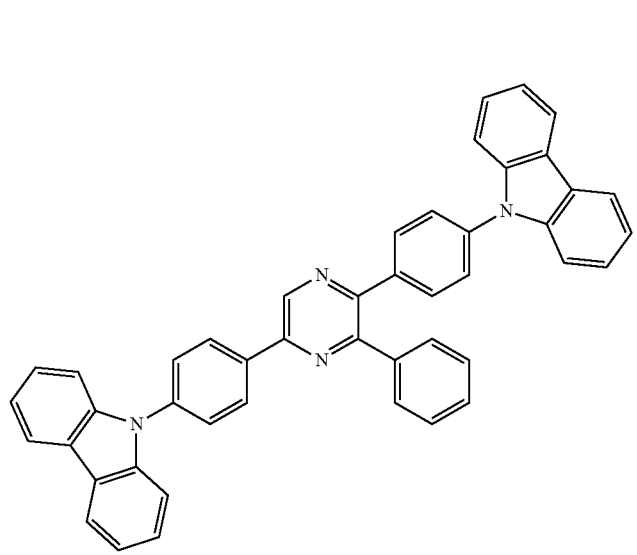 | 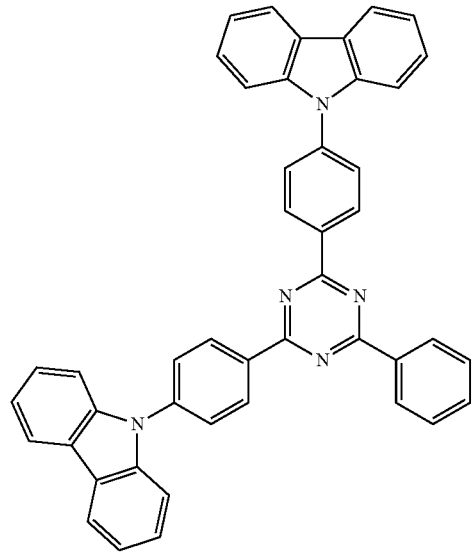 |
| 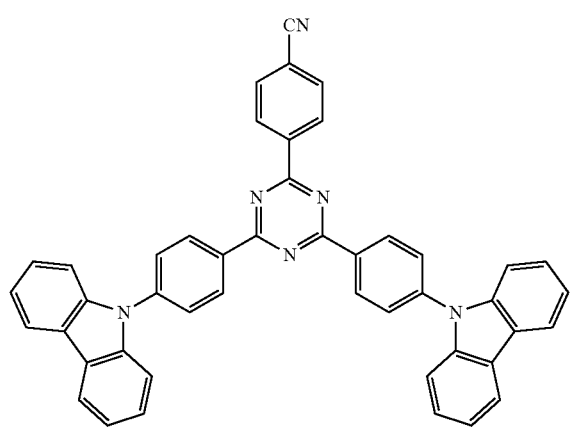 | 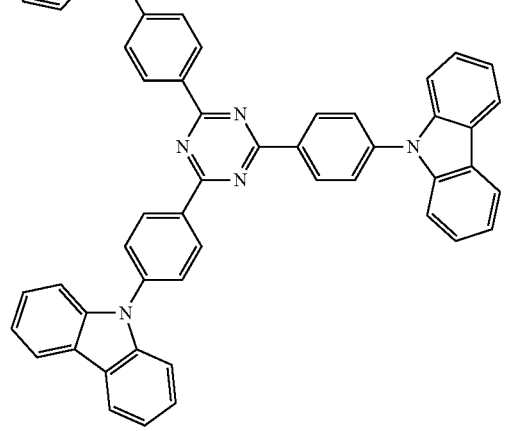 |

-continued
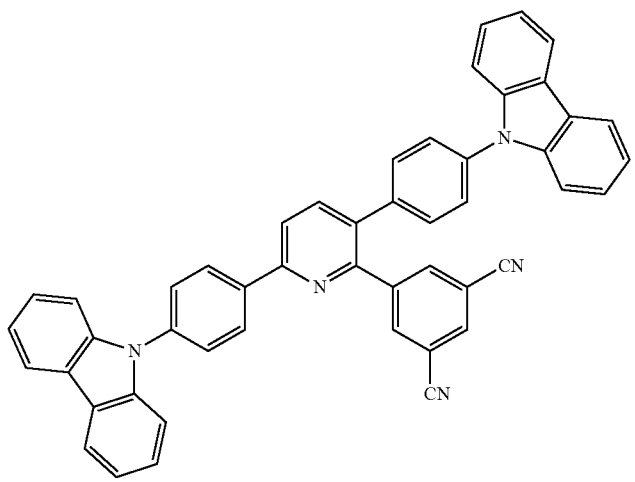
[Formula 78]
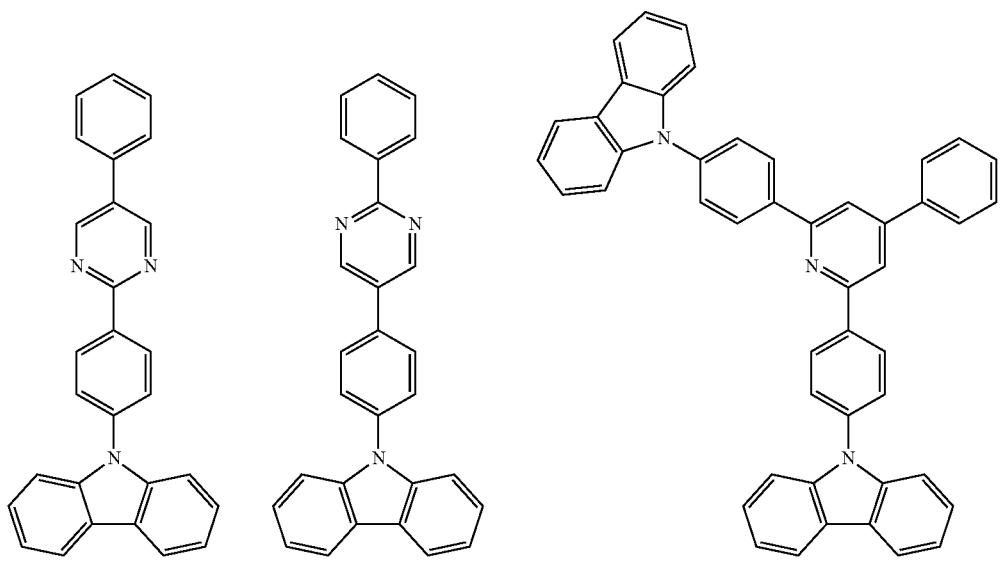
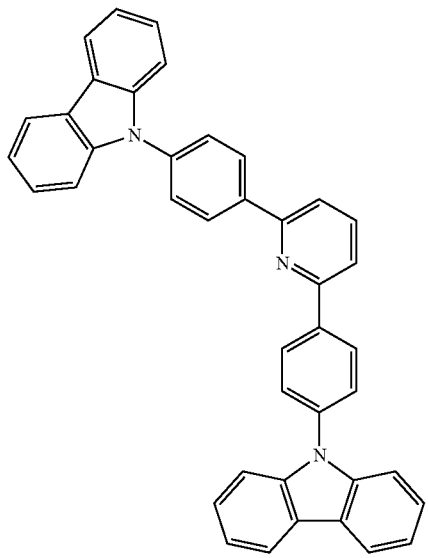

[Formula 79]
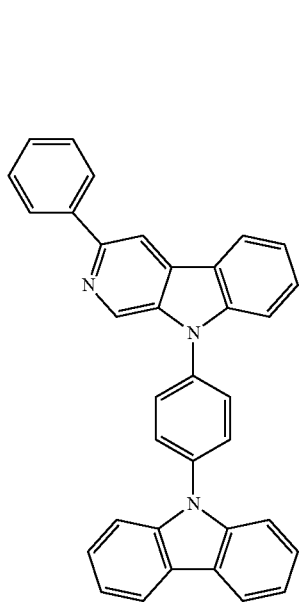 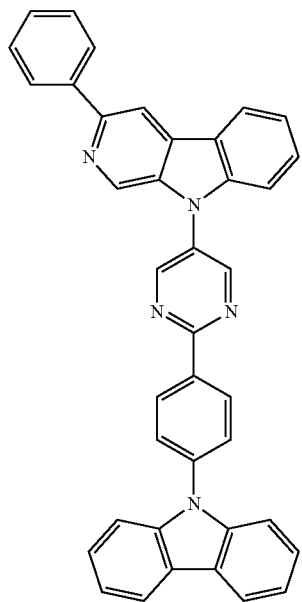 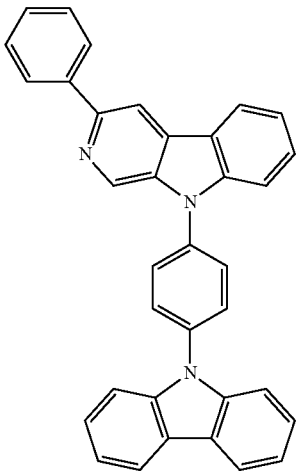
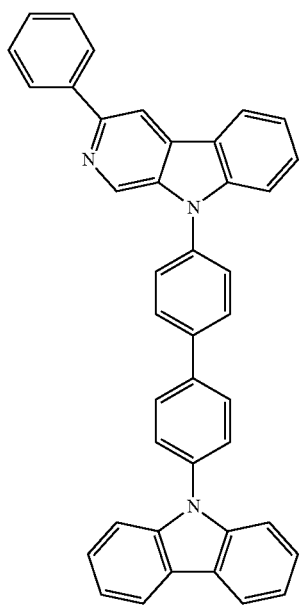 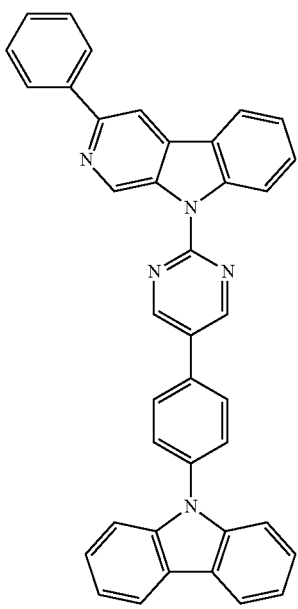 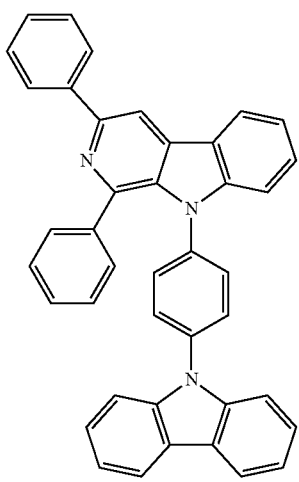

-continued
173
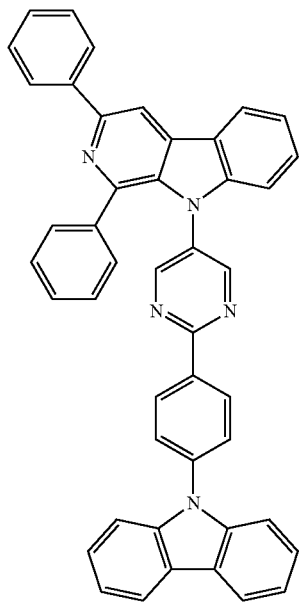
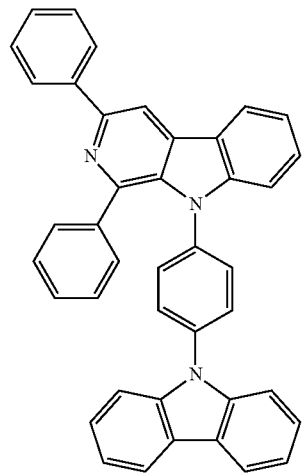
174
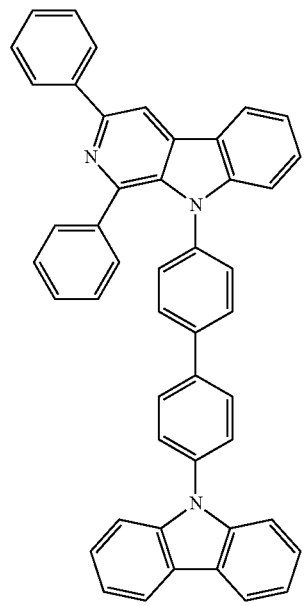
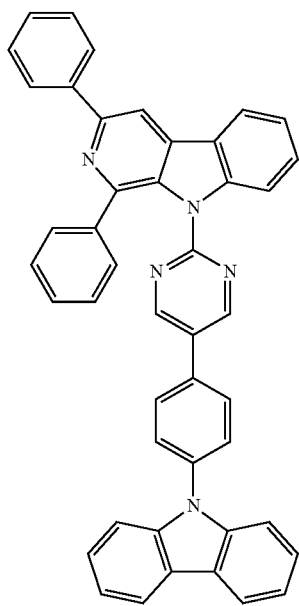
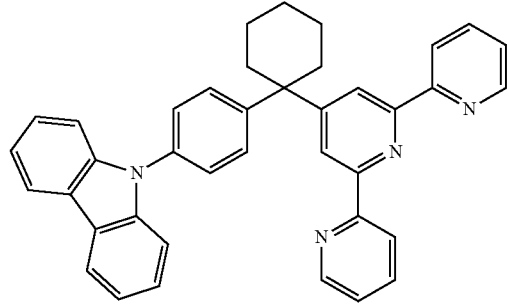

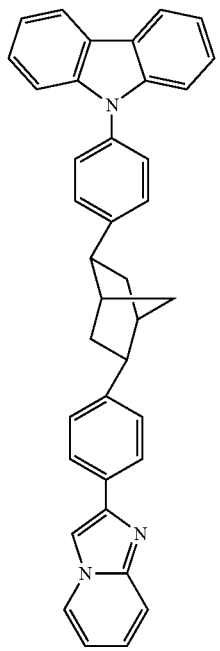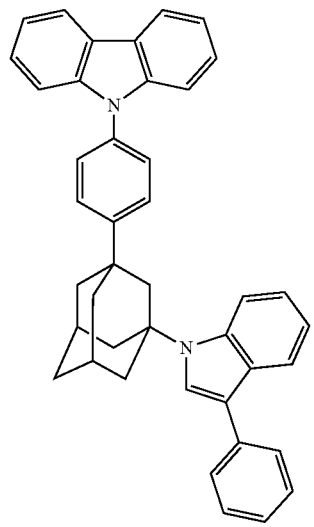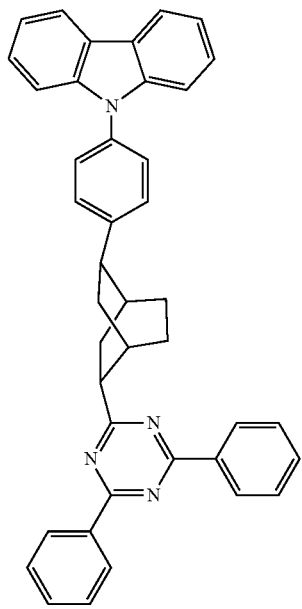
[Formula 80]
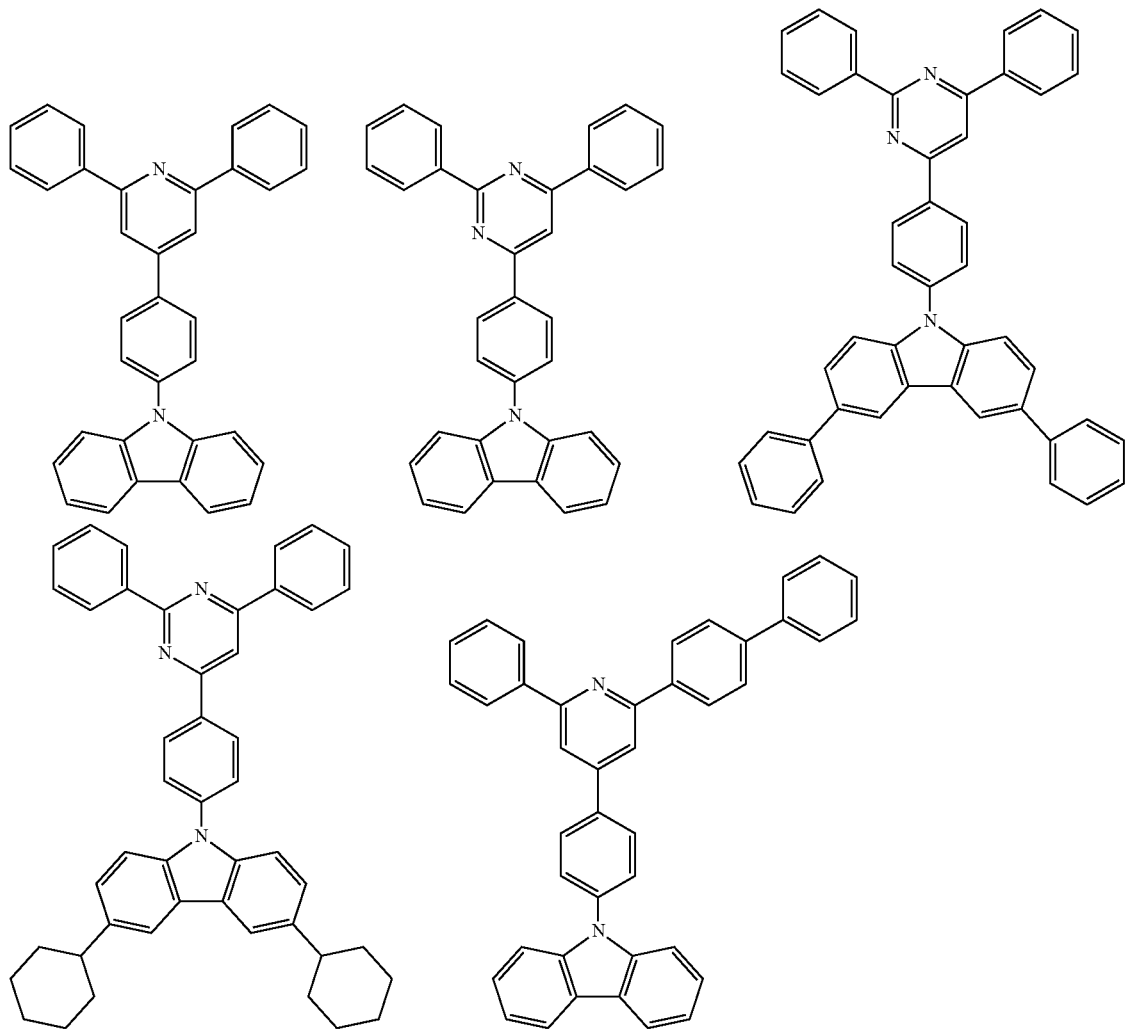

-continued
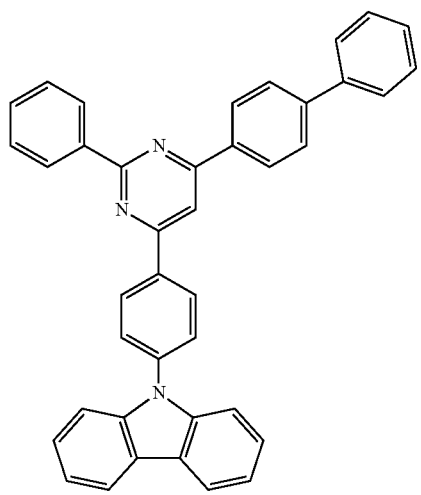
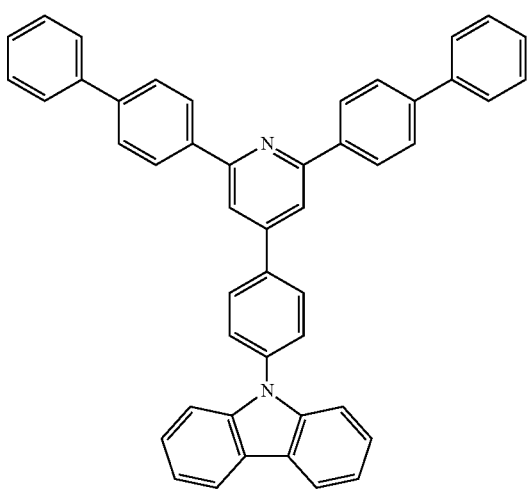
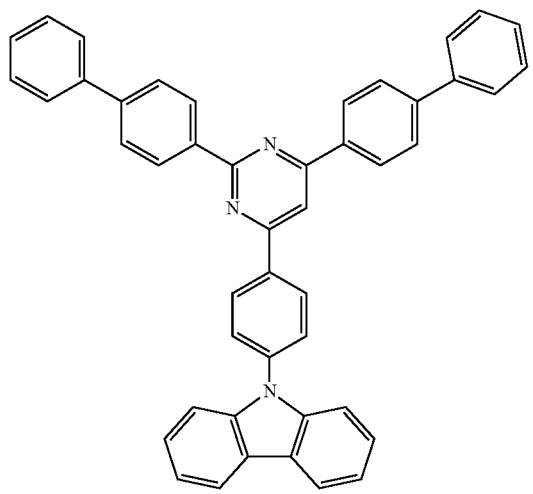
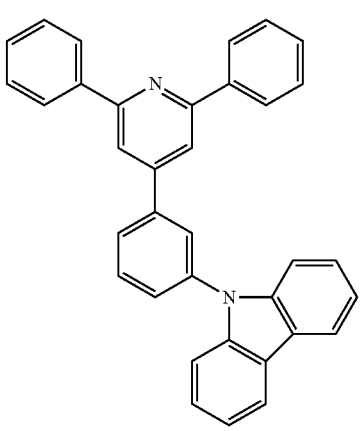
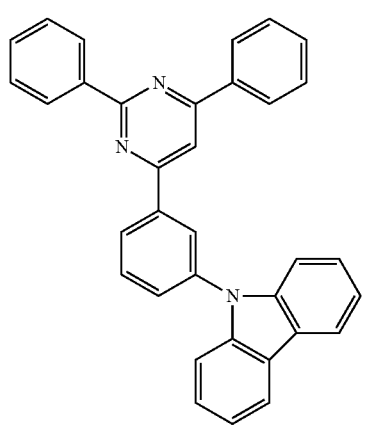
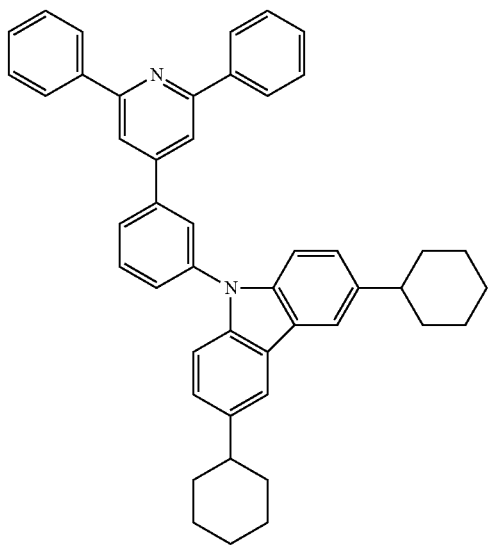

-continued
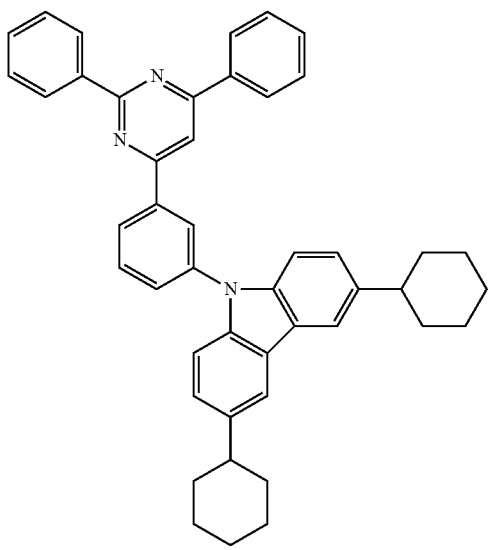
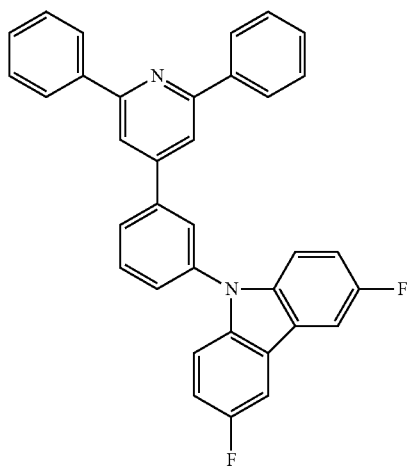
[Formula 81]
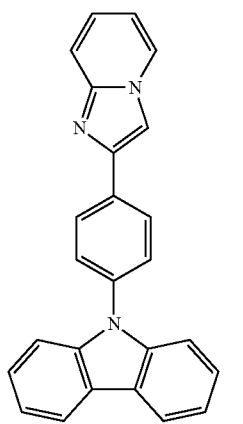 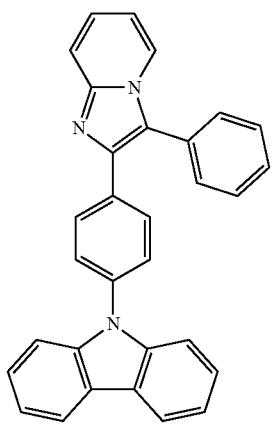 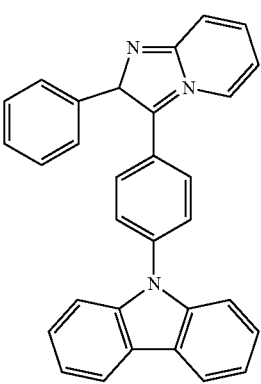
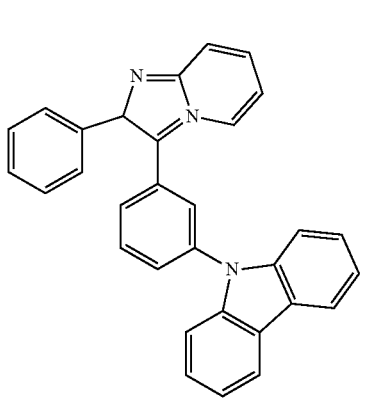 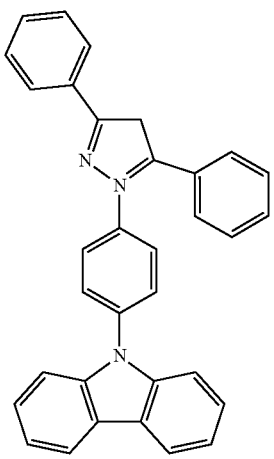 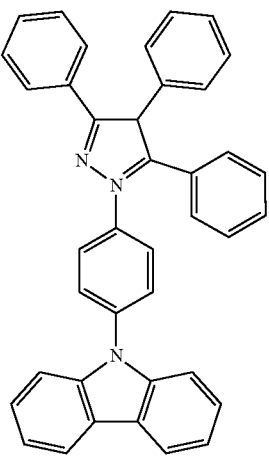

181 182
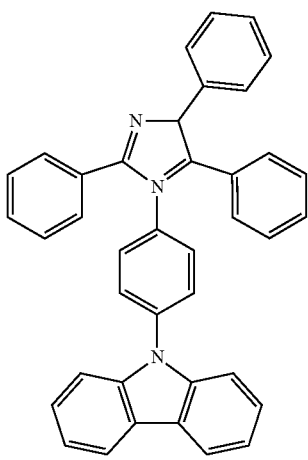
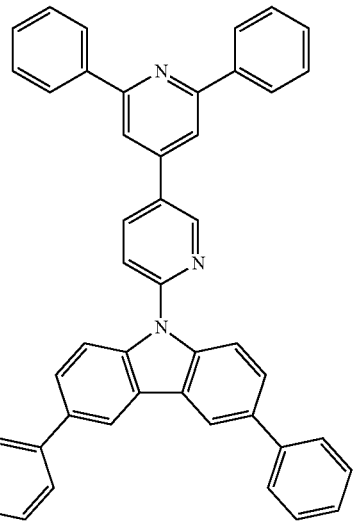
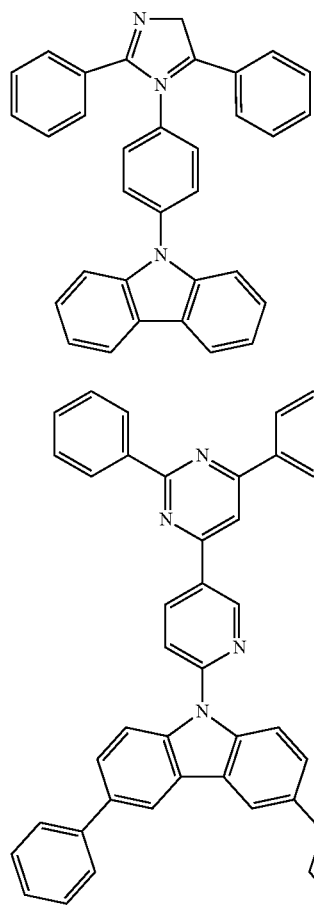
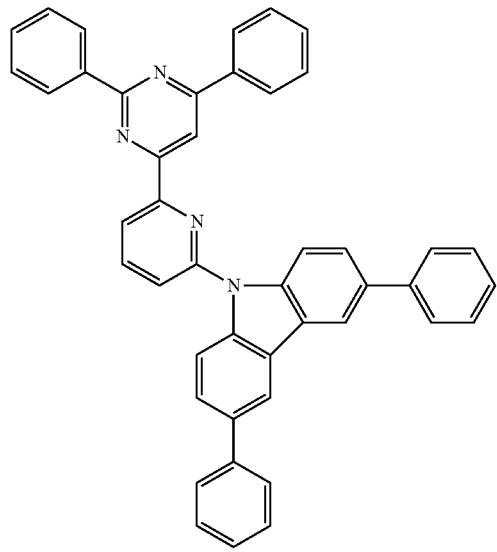
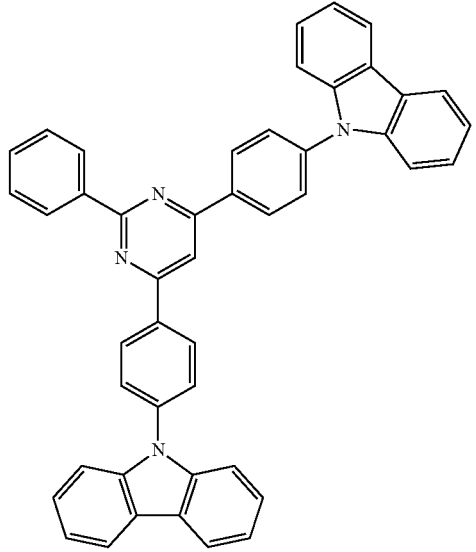

[Formula 82]
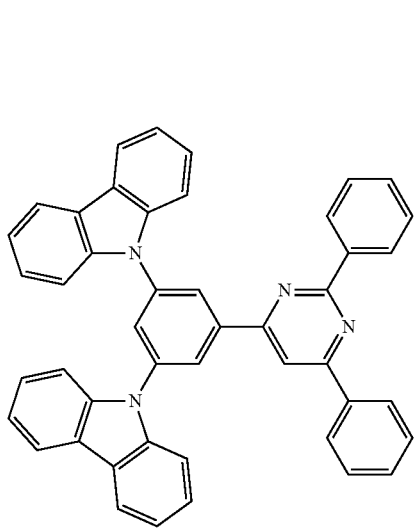
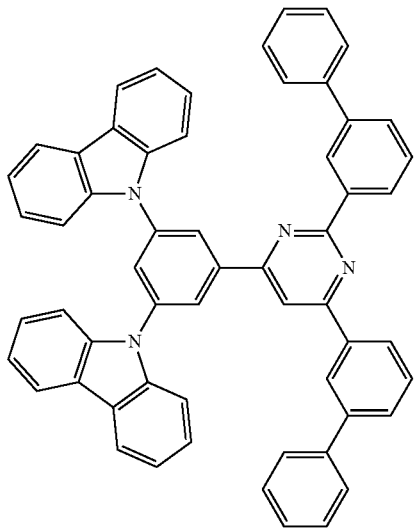
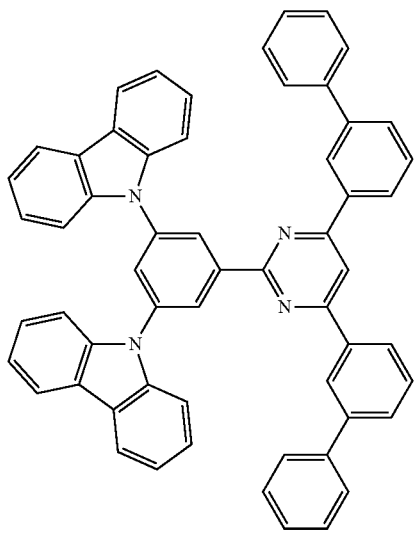
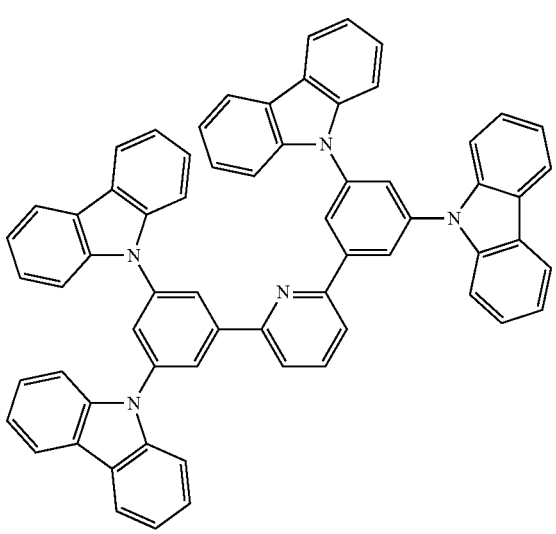
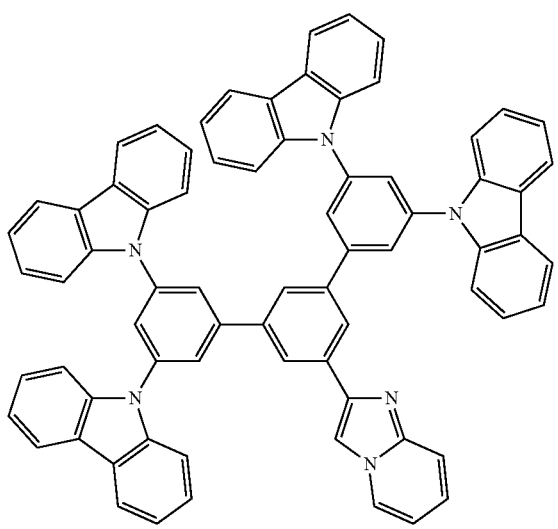
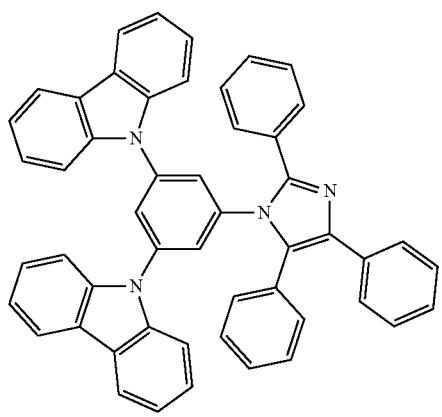

[Formula 83]
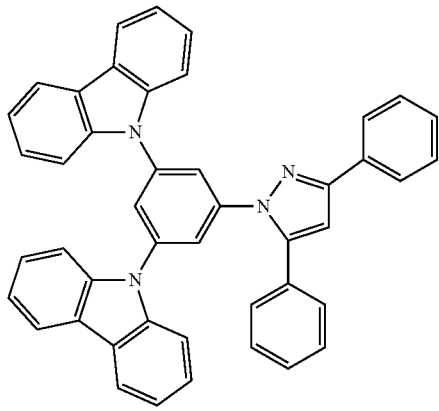
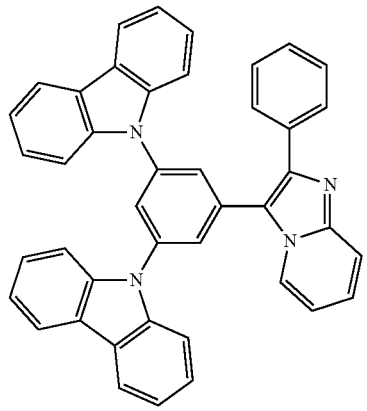
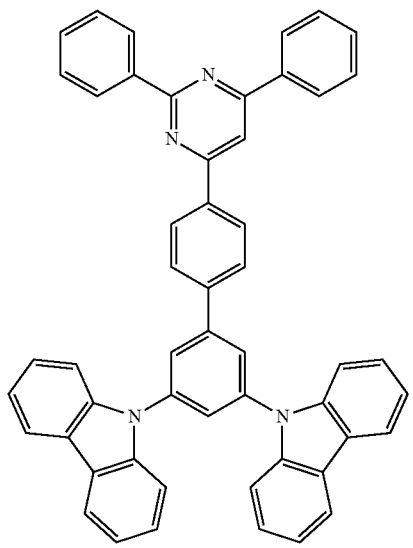
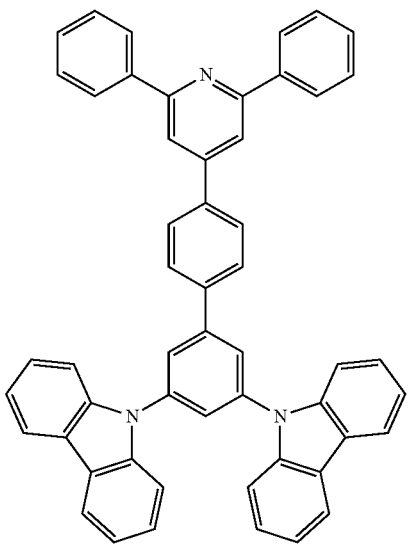
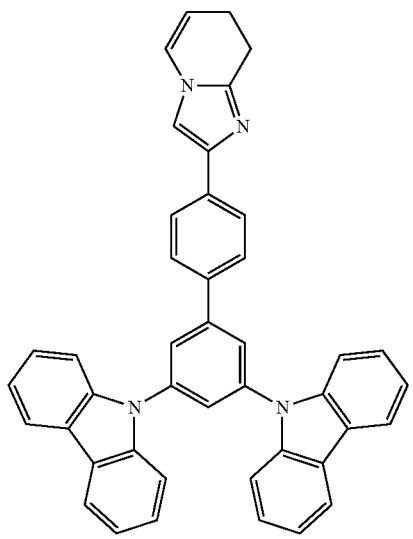
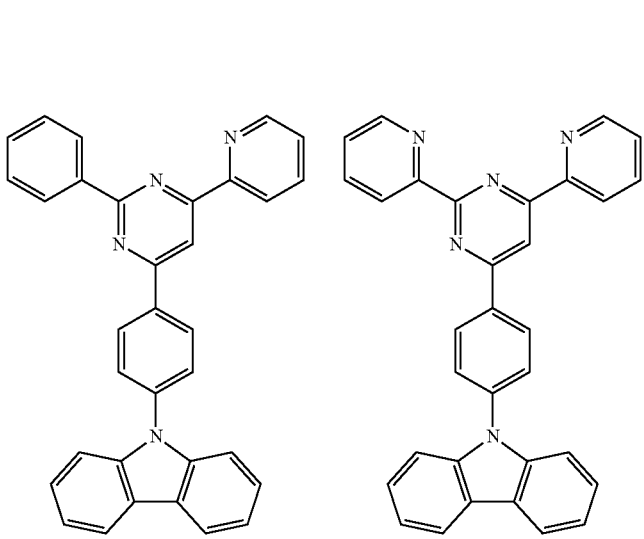

[Formula 84]
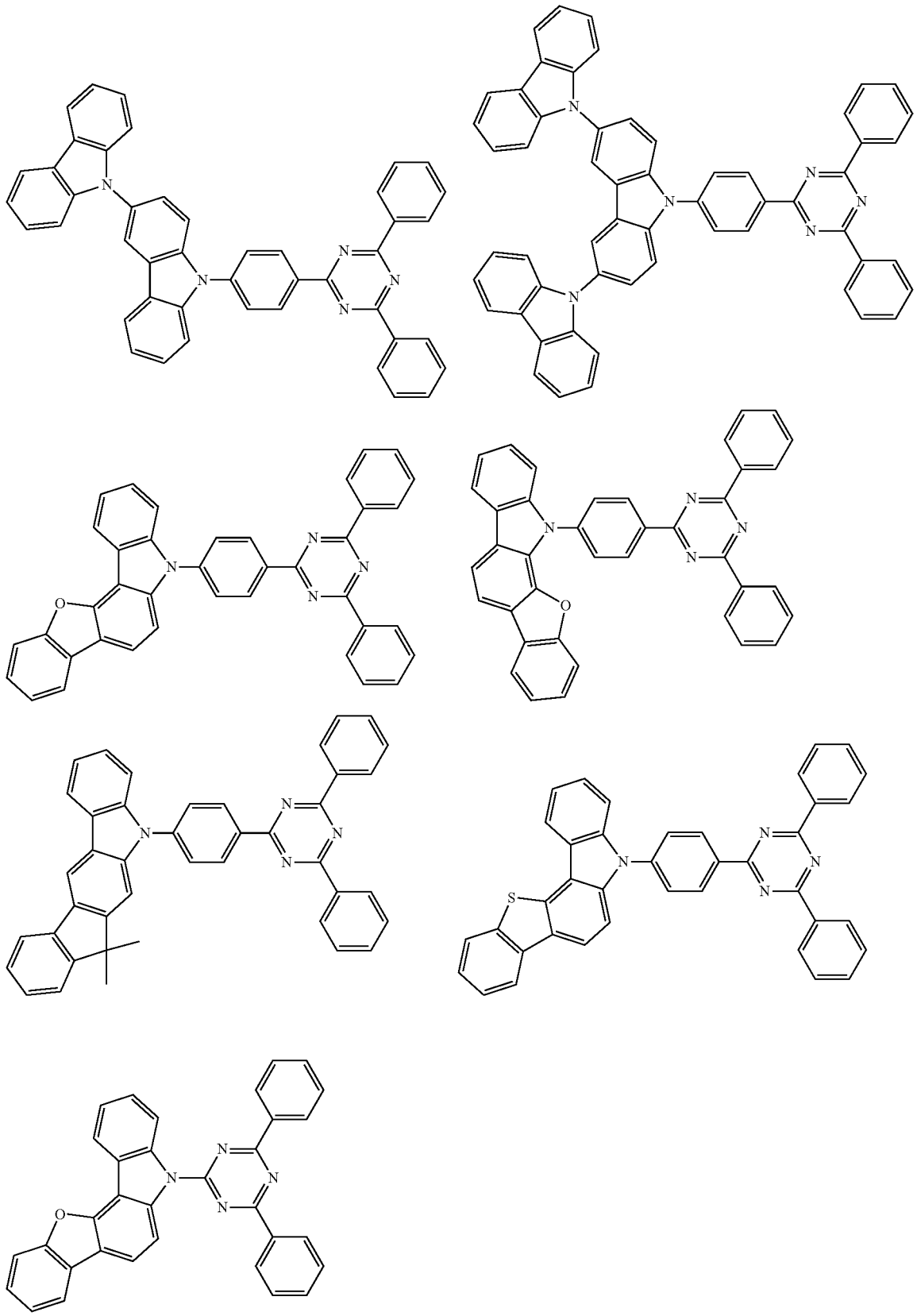

[Formula 85]

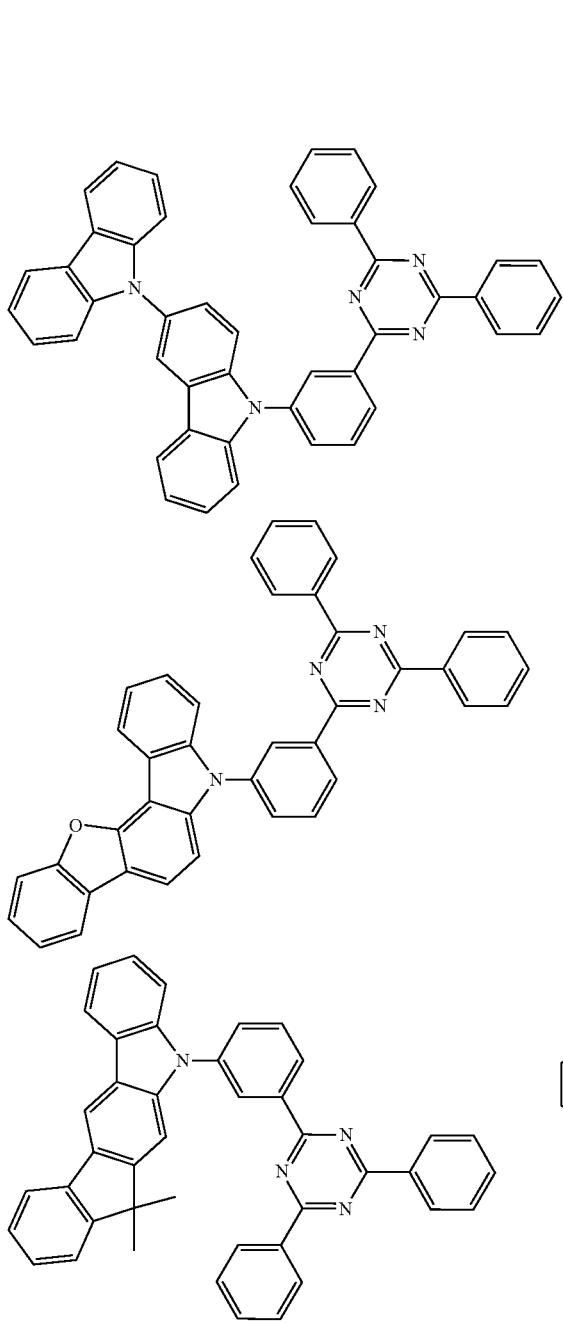
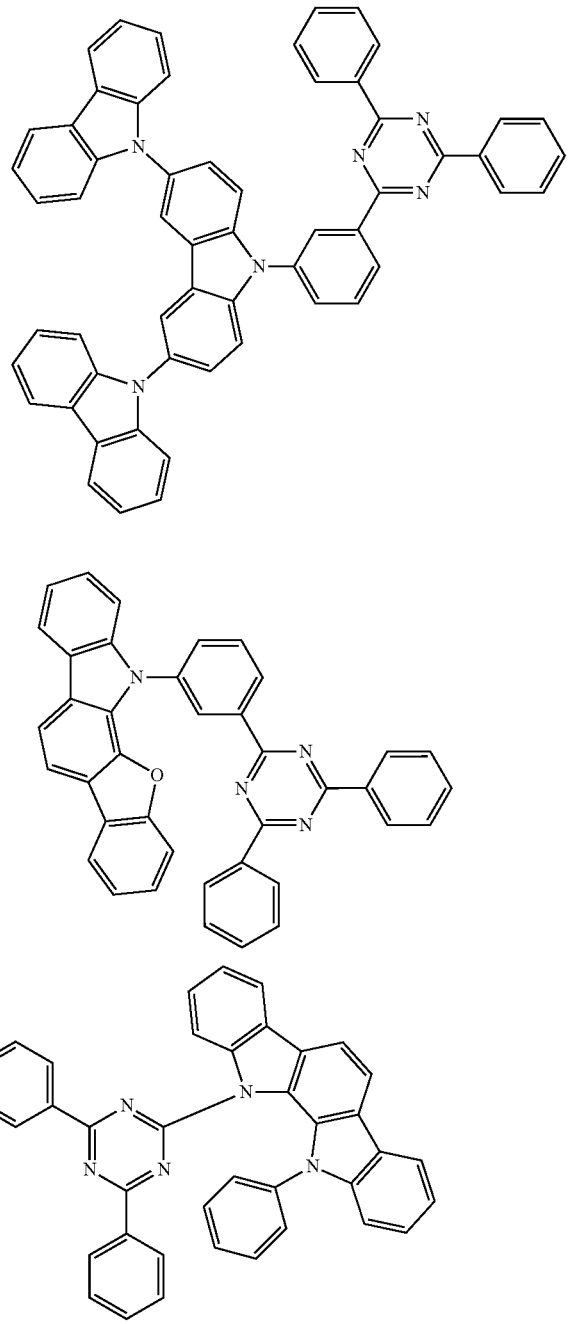

Fifth Compound

A fluorescent material is usable as the fifth compound. Specific examples of the fifth compound include a bisarylaminonaphthalene derivative, aryl-substituted naphthalene derivative, bisarylaminoanthracene derivative, aryl-substituted anthracenederivative, bisarylaminopyrene derivative, aryl-substituted pyrene derivative, bisarylaminochrysene derivative, aryl-substituted chrysene derivative, bisarylaminofluoranthene derivative, aryl-substituted fluoranthene derivative, indenoperylene derivative, pyrromethene boron complex compound, compound having a pyrromethene skeleton, metal complex of a compound having a pyrromethene skeleton, diketopyrolopyrrol derivative, perylene derivative, arylaminofluorene derivative, aryl-substituted fluorene derivative, arylaminobenzofluorene derivative, aryl-substituted benzofluorene derivative, arylaminoindenofluorene derivative, and aryl-substituted indenofluorene derivative.

It is preferable to use a compound including at least one partial structure represented by a formula (3) in one molecule as the fifth compound. When the fifth compound includes a plurality of the partial structures represented by the formula (3), the plurality of the partial structures may be mutually the same or different.

[Formula 86]

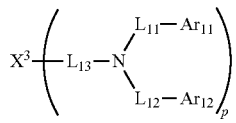

(3)

In the formula (3), $X^3$ represents a substituted or unsubstituted fused aromatic hydrocarbon group having 10 to 40 ring carbon atoms; $Ar_{11}$ and $Ar_{12}$ each independently represent a group selected from the group consisting of a substituted or unsubstituted aromatic hydrocarbon group having 6 to 40 ring carbon atoms and a substituted or unsubstituted heterocyclic group having 5 to 30 ring atoms; and $L_{11}$, $L_{12}$ and $L_{13}$ each independently represent a single bond or a linking group. When $L_{11}$, $L_{12}$ and $L_{13}$ are substituents, each of the substituents is selected from the group consisting of a substituted or unsubstituted aromatic hydrocarbon group having 6 to 30 ring carbon atoms and a substituted or unsubstituted heterocyclic group having 5 to 30 ring atoms p represents an integer of 1 to 4.

In the formula (3), $X^3$ is preferably a residue of a fused aromatic hydrocarbon ring selected from the group consisting of naphthalene, phenanthrene, fluoranthene, anthracene, pyrene, perylene, coronene, chrysene, picene, diphenylanthracene, fluorene, triphenylene, rubicene, benzanthracene, phenyl anthracene, bisanthracene, dianthrylbenzene, dibenzoanthracene, benzofluorene, indenofluorene, and benzindenofluorene.

Particularly, when $X^3$ is a residue of anthracene, the fifth compound is preferably 9,10-substituted anthracene or 2,6-substituted anthracene. When $X^3$ is a residue of pyrene, the fifth compound is preferably 1,6-substituted pyrene or 3,8-substituted pyrene. When $X^3$ is a residue of chrysene, the fifth compound is preferably 6,12-substituted chrysene.

The partial structure represented by the formula (3) is preferably a group represented by a formula (3A) below.

[Formula 87]

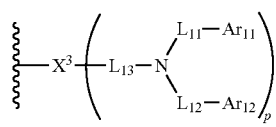

(3A)

In the formula (3A), $X^3$, $Ar_{11}$, $Ar_{12}$, $L_{11}$, $L_{12}$, $L_{13}$ and p each independently represent the same as $X^3$, $Ar_{11}$, $Ar_{12}$, $L_{11}$, $L_{12}$, $L_{13}$ and p of the formula (3). A wavy line in the formula (3A) shows a bonding position with another atom or another structure in the molecule of the fifth compound.

It is also preferable that the fifth compound is a compound represented by a formula (30).

[Formula 88]

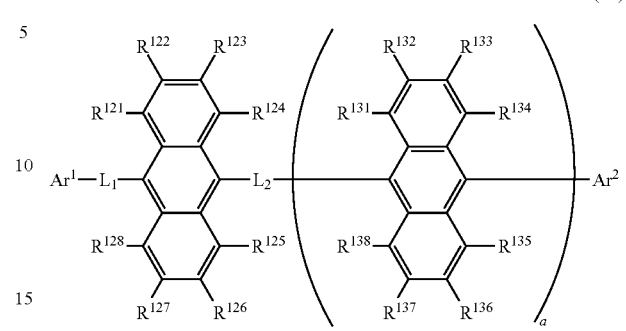

(30)

In the formula (30), a represents an integer of 0 or 1. When a is 0, $L_2$ is directly bonded to $Ar^2$, and at least two of $Ar^1$, $Ar^2$, $R^{121}$, $R^{122}$, $R^{123}$, $R^{124}$, $R^{125}$, $R^{126}$, $R^{127}$ and $R^{128}$ are groups represented by a formula (31). When a is 1, at least two of $Ar^1$, $Ar^2$, $R^{121}$, $R^{122}$, $R^{123}$, $R^{124}$, $R^{125}$, $R^{126}$, $R^{127}$, $R^{128}$, $R^{131}$, $R^{132}$, $R^{133}$, $R^{134}$, $R^{135}$, $R^{136}$, $R^{137}$, and $R^{138}$ are groups represented by the formula (31) and the rest of $Ar^1$, $Ar^2$, $R^{121}$, $R^{122}$, $R^{123}$, $R^{124}$, $R^{125}$, $R^{126}$, $R^{127}$, $R^{128}$, $R^{131}$, $R^{132}$, $R^{133}$, $R^{134}$, $R^{135}$, $R^{136}$, $R^{137}$ and $R^{138}$ are each independently a hydrogen atom or a substituent. When $Ar^1$, $Ar^2$, $R^{121}$, $R^{122}$, $R^{123}$, $R^{124}$, $R^{125}$, $R^{126}$, $R^{127}$, $R^{128}$, $R^{131}$, $R^{132}$, $R^{133}$, $R^{134}$, $R^{135}$, $R^{136}$, $R^{137}$ and $R^{138}$ are substituents, each of the substituents is selected from the group consisting of a halogen atom, a cyano group, a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted silyl group, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, and a substituted or unsubstituted aryloxy group having 6 to 30 ring carbon atoms. $L_1$ and $L_2$ each independently represent a single bond or a linking group. When $L_1$ and $L_2$ are linking groups, each of the linking groups is selected from the group consisting of a substituted or unsubstituted aromatic hydrocarbon group having 6 to 30 ring carbon atoms and a substituted or unsubstituted heterocyclic group having 5 to 30 ring atoms. When two or more of R121 to $R^{128}$ and $R^{131}$ to $R^{138}$ are substituents, the substituents may be mutually bonded to form a ring.

[Formula 89]

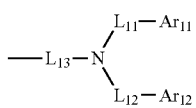

(31)

In the formula (31): $L_{11}$, $L_{12}$ and $L_{13}$ each independently represent a single bond or a linking group. When $L_{11}$, $L_{12}$ and $L_{13}$ are linking groups, each of the linking groups is selected from the group consisting of a substituted or unsubstituted aromatic hydrocarbon group having 6 to 30 ring carbon atoms and a substituted or unsubstituted heterocyclic group having 5 to 30 ring atoms; and $Ar_{11}$ and $Ar_{12}$ are each independently a group selected from the group consisting of a substituted or unsubstituted aromatic hydrocarbon group having 6 to 30 ring carbon atoms and a substituted or unsubstituted heterocyclic group having 5 to 30 ring atoms.

It is preferable that a is 0 and $Ar^1$ and $Ar^2$ are the groups represented by the formula (31) in the formula (30).

It is also preferable that a is 0 and $R^{122}$ and $R^{126}$ are the groups represented by the formula (31) in the formula (30).

It is also preferable that a is 1 and $Ar^1$ and $Ar^2$ are the groups represented by the formula (31) in the formula (30).

In the formula (30), the substituents $Ar^1$, $Ar^2$, $R^{121}$ to $R^{128}$, and $R^{131}$ to $R^{138}$ are selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted silyl group, a cyano group, and a substituted or unsubstituted trifluoroalkyl group having 1 to 20 carbon atoms.

Manufacturing Method of Fifth Compound

The fifth compound can be manufactured by methods disclosed in International Publication No. WO2004/092111 (WO2004/092111A1), International Publication No. WO2011/096506 (WO2011/096506A1), and the like.

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, the "ring carbon atoms" do not include carbon(s) contained in the substituent. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. When the benzene ring and/or the naphthalene ring is substituted by, for instance, an alkyl group, the number of carbon atoms of the alkyl group is not included in the number of the ring carbon atoms. When a fluorene ring is substituted by, for instance, a fluorene ring (e.g., a spirofluorene ring), the number of carbon atoms of the fluorene ring as a substituent is not counted in the number of the ring carbon atoms for the fluorene ring.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring (e.g., a hydrogen atom for terminating the atoms forming the ring) and atoms included in a substituent substituting the ring are not counted in the number of the ring atoms. Unless specifically described, the same applies to the "ring atoms" described later. For instance, a pyridine ring has 6 ring atoms, a quinazoline ring has 10 ring atoms, and a furan ring has 5 ring atoms. Hydrogen atoms respectively bonded to the pyridine ring and the quinazoline ring and atoms forming the substituents are not counted in the number of the ring atoms. When a fluorene ring is substituted by, for instance, a fluorene ring (e.g., a spirofluorene ring), the number of atoms of the fluorene ring as a substituent is not included in the number of the ring atoms for the fluorene ring.

Next, each of substituents described herein in the above formulae will be described.

Examples of the aromatic hydrocarbon group (occasionally referred to as an aryl group) having 6 to 30 ring carbon atoms include a phenyl group, biphenyl group, terphenyl group, naphthyl group, anthryl group, phenanthryl group, fluorenyl group, pyrenyl group, chrysenyl group, fluoranthenyl group, benzo[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are particularly preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms described later.

The heterocyclic group (occasionally, referred to as a heteroaryl group, heteroaromatic ring group or aromatic heterocyclic group) having 5 to 30 ring atoms preferably contains as a hetero atom at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group (occasionally, referred to as a heteroaryl group, heteroaromatic ring group or aromatic heterocyclic group) having 5 to 30 ring atoms include a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are further preferable. In 1-carbazolyl group, 2-carbazolyl group, 3-carbazolyl group and 4-carbazolyl group, a nitrogen atom at the position 9 is preferably substituted by a substituted or unsubstituted aryl group having 6 to 30 ring carbon atoms or a substituted or unsubstituted heterocyclic group having 5 to 30 ring atoms.
The heterocyclic group may be a group derived from any one of partial structures represented by formulae (XY-1) to (XY-18).
[Formula 90]
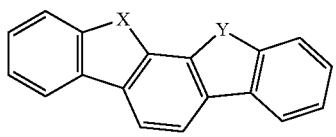
(XY-1)
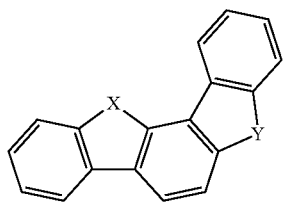
(XY-2)
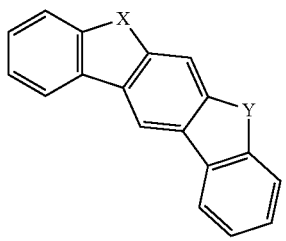
(XY-3)
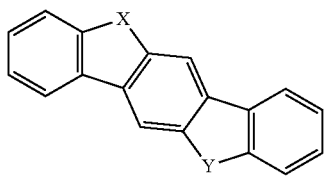
(XY-4)
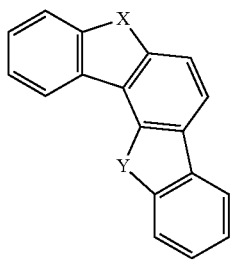
(XY-5)
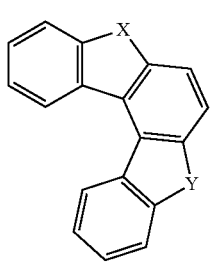
(XY-6)
[Formula 91]
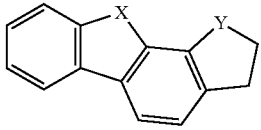
(XY-7)
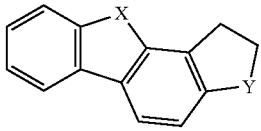
(XY-8)
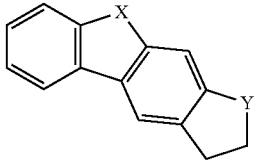
(XY-9)
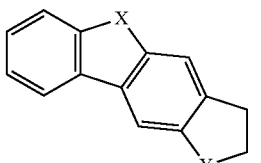
(XY-10)
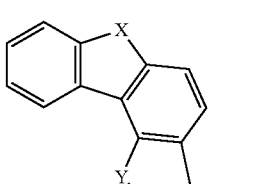
(XY-11)
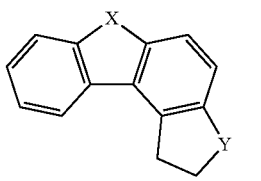
(XY-12)
[Formula 92]
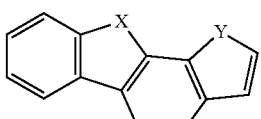
(XY-13)
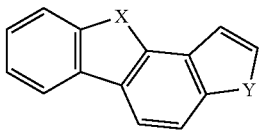
(XY-14)
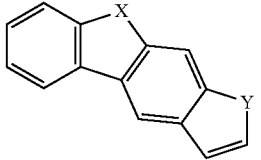
(XY-15)

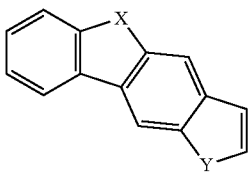

(XY-16)

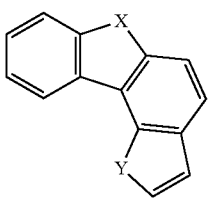

(XY-17)

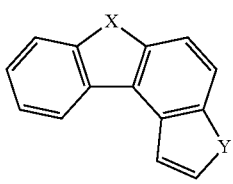

(XY-18)

In the formulae (XY-1) to (XY-18), X and Y each independently represent a hetero atom, and preferably represent an oxygen atom, sulfur atom, selenium atom, silicon atom or germanium atom. The partial structures represented by the formulae (XY-1) to (XY-18) may each be bonded in any position to be a heterocyclic group, which may be substituted.

Examples of the substituted or unsubstituted carbazolyl group may include a group in which a carbazole ring is further fused with a ring(s) as shown in the following formulae. Such a group may be substituted. The group may be bonded in any position as desired.

[Formula 93]

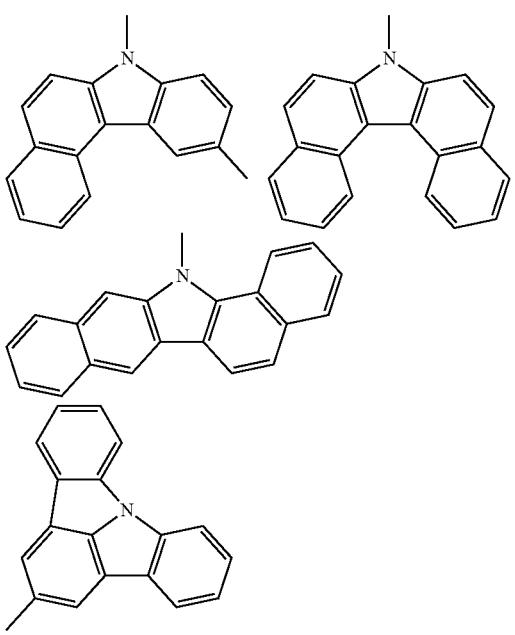

The alkyl group having 1 to 30 carbon atoms may be linear, branched or cyclic. Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

The linear or branched alkyl group preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are preferable.

Examples of the cycloalkyl group include a cyclopropyl group, cyclobutyl group, cyclopentyl group, cyclohexyl group, 4-methylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are preferable.

A halogenated alkyl group provided by substituting the alkyl group with a halogen atom is exemplified by a halogenated alkyl group provided by substituting the alkyl group having 1 to 30 carbon atoms with one or more halogen groups. Specific examples of the halogenated alkyl group includes a fluoromethyl group, difluoromethyl group, trifluoromethyl group, fluoroethyl group, trifluoromethylmethyl group, trifluoroethyl group, and pentafluoroethyl group.

Examples of the substituted silyl group are an alkylsilyl group and aryllsilyl group.

The alkylsilyl group having 3 to 30 carbon atoms is exemplified by an alkylsilyl group having the alkyl group listed as the examples of the alkyl group having 1 to 30 carbon atoms. Specifically, examples of the alkylsilyl group are a trimethylsilyl group, a triethylsilyl group, a tri-n-butylsilyl group, a tri-n-octylsilyl group, a triisobutylsilyl group, a dimethylethylsilyl group, a dimethylisopropylsilyl group, a dimethyl-n-propylsilyl group, a dimethyl-n-butylsilyl group, a dimethyl-t-butylsilyl group, a diethylisopropylsilyl group, a vinyldimethylsilyl group, a propyldimethylsilyl group and triisopropylsilyl group. Three alkyl groups in the trialkylsilyl group may be mutually the same or different.

Examples of the arylsilyl group having 6 to 30 ring carbon atoms are a dialkylarylsilyl group, alkyldiarylsilyl group and triarylsilyl group.

The dialkylarylsilyl group is exemplified by a dialkylarylsilyl group having two of the examples of the alkyl group having 1 to 30 carbon atoms and one of the aryl group having 6 to 30 ring carbon atoms. The dialkylarylsilyl group preferably has 8 to 30 carbon atoms.

The alkyldiarylsilyl group is exemplified by an alkyldiarylsilyl group having one of the examples of the alkyl group having 1 to 30 carbon atoms and two of the aryl group having 6 to 30 ring carbon atoms. The dialkylarylsilyl group preferably has 13 to 30 carbon atoms.

The triarylsilyl group is exemplified by a triarylsilyl group having three of the aryl group having 6 to 30 ring carbon atoms. The triarylsilyl group preferably has 18 to 30 carbon atoms.

The substituted phosphine oxide group is preferably represented by a formula (100).

[Formula 94]

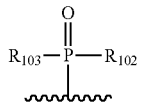

(100)

In the formula (100), $R_{102}$ and $R_{103}$ are each independently a substituent. The substituents $R_{102}$ and $R_{103}$ are preferably each independently selected from the group consisting of a substituted or unsubstituted alkyl group having 1 to 30 carbon atoms and a substituted or unsubstituted aromatic hydrocarbon group having 6 to 30 ring carbon atoms.

The substituted phosphine oxide group is more preferably a substituted or unsubstituted diaryl phosphine oxide group.

The alkoxy group having 1 to 30 carbon atoms is represented by —$OZ_1$. $Z_1$ is exemplified by the above alkyl group having 1 to 30 carbon atoms. Examples of the alkoxy group are a methoxy group, ethoxy group, propoxy group, butoxy group, pentyloxy group and hexyloxy group. The alkoxy group preferably has 1 to 20 carbon atoms.

A halogenated alkoxy group provided by substituting the alkoxy group with a halogen atom is exemplified by a halogenated alkoxy group provided by substituting the alkoxy group having 1 to 30 carbon atoms with one or more fluorine groups.

The aryloxy group having 6 to 30 ring carbon atoms is represented by —$OZ_2$. $Z_2$ is exemplified by the above aryl group having 6 to 30 ring carbon atoms. The aryloxy group preferably has 6 to 20 ring carbon atoms. The aryloxy group is exemplified by a phenoxy group.

The alkylamino group having 2 to 30 carbon atoms is represented by —$NHR_V$ or —$N(R_V)_2$. $R_V$ is exemplified by the alkyl group having 1 to 30 carbon atoms.

The arylamino group having 6 to 60 ring carbon atoms is represented by —$NHR_W$ or —$N(R_W)_2$. $R_W$ is exemplified by the above aryl group having 6 to 30 ring carbon atoms.

The alkylthio group having 1 to 30 carbon atoms is represented by —$SR_V$. $R_V$ is exemplified by the alkyl group having 1 to 30 carbon atoms. The alkylthio group preferably has 1 to 20 carbon atoms.

The arylthio group having 6 to 30 ring carbon atoms is represented by —$SR_W$. $R_W$ is exemplified by the above aryl group having 6 to 30 ring carbon atoms. The arylthio group preferably has 6 to 20 ring carbon atoms.

Examples of the halogen atom are a fluorine atom, a chlorine atom, a bromine atom and an iodine atom, among which a fluorine atom is preferable.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

Herein, a hydrogen atom includes isotope having different numbers of neutrons, specifically, protium, deuterium and tritium.

Herein, examples of the substituent meant by "substituted or unsubstituted" are an alkenyl group, alkynyl group, aralkyl group, halogen atom, cyano group, hydroxyl group, nitro group and carboxy group, in addition to the above-described aryl group, heterocyclic group, alkyl group (linear or branched alkyl group, cycloalkyl group and haloalkyl group), alkylsilyl group, arylsilyl group, alkoxy group, aryloxy group, alkylamino group, arylamino group, alkylthio group, and arylthio group.

In the above-described substituents, the aryl group, heterocyclic group, alkyl group, halogen atom, alkylsilyl group, arylsilyl group and cyano group are preferable. The preferable ones of the specific examples of each substituent are further preferable.

These substituents may be further substituted by the above substituent(s). In addition, plural ones of these substituents may be mutually bonded to form a ring.

The alkenyl group is preferably an alkenyl group having 2 to 30 carbon atoms, which may be linear, branched or cyclic. Examples of the alkenyl group include a vinyl group, propenyl group, butenyl group, oleyl group, eicosapentaenyl group, docosahexaenyl group, styryl group, 2,2-diphenylvinyl group, 1,2,2-triphenyl vinyl group, 2-phenyl-2-propenyl group, cyclopentadienyl group, cyclopentenyl group, cyclohexenyl group, and cyclohexadienyl group.

The alkynyl group is preferably an alkynyl group having 2 to 30 carbon atoms, which may be linear, branched or cyclic. Examples of the alkynyl group include ethynyl, propynyl, and 2-phenylethynyl.

The aralkyl group is preferably an aralkyl group having 6 to 30 ring carbon atoms and is represented by —$Z_3$—$Z_4$. $Z_3$ is exemplified by an alkylene group derived from the above alkyl group having 1 to 30 carbon atoms. $Z_4$ is exemplified by the above aryl group having 6 to 30 ring carbon atoms. This aralkyl group is preferably an aralkyl group having 7 to 30 carbon atoms, in which an aryl moiety has 6 to 30 carbon atoms, preferably 6 to 20 carbon atoms, more preferably 6 to 12 carbon atoms and an alkyl moiety has 1 to 24 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

"Unsubstituted" in "substituted or unsubstituted" herein means that a group is not substituted by the above-described substituents but bonded with a hydrogen atom. Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX." "XX" and "YY" each mean an integer of 1 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX." "XX" and "YY" each mean an integer of 1 or more.

The same description as the above applies to "substituted or unsubstituted" in the following compound or a partial structure thereof.

Herein, when the substituents are bonded to each other to form a cyclic structure, the cyclic structure is a saturated ring, an unsaturated ring, or an aromatic ring.

Herein, examples of the aromatic hydrocarbon group and the heterocyclic group in the linking group include a divalent or multivalent group obtained by eliminating one or more atoms from the above monovalent groups.

Moreover, herein, examples of the aromatic hydrocarbon ring and the hetero ring include a cyclic structure from which the above monovalent group is derived.

Components of Organic EL Device

Examples of constitutional elements of the organic EL device other than the above constitutional elements will be described below.

Substrate

A substrate 2 is used as a support for the organic EL device 1. For instance, glass, quartz, plastics and the like are usable as the substrate 2. A flexible substrate is also usable. The flexible substrate is a bendable substrate, which is exemplified by a plastic substrate. Examples of a material for forming the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, alloy, an electrically conductive compound and a mixture thereof, which have a large work function, specifically, of 4.0 eV or more, is preferably usable as the anode 3 formed on the substrate 2. Specific examples of the material for the anode include indium tin oxide (ITO), indium tin oxide containing silicon or silicon oxide, indium zinc oxide, tungsten oxide, indium oxide containing zinc oxide and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), or nitrides of a metal material (e.g., titanium nitride) are usable.

The above materials are typically deposited as a film by sputtering. For instance, indium zinc oxide can be deposited as a film by sputtering using a target that is obtained by adding zinc oxide in a range from 1 mass % to 10 mass % to indium oxide. Moreover, for instance, indium oxide containing tungsten oxide and zinc oxide can be deposited as a film by sputtering using a target that is obtained by adding tungsten oxide in a range from 0.5 mass % to 5 mass % and zinc oxide in a range from 0.1 mass % to 1 mass % to indium oxide. In addition, vapor deposition, coating, ink jet printing, spin coating and the like may be used for forming a film.

Among the organic layers formed on the anode 3, the hole injecting layer 5 formed adjacent to the anode 3 is formed of a composite material in which holes are easily injectable irrespective of the work function of the anode 3. Accordingly, other materials usable as an electrode material (e.g., a metal, alloy, electrically conductive compound, mixture thereof, and elements belonging to Group 1 or 2 in the periodic table of the elements) are also usable for the anode 3.

A material having a small work function such as elements belonging to Groups 1 and 2 in the periodic table of the elements, a rare earth metal and an alloy including the elements and/or the rare earth metal are also usable for the anode 3. Examples of the elements belonging to Group 1 in the periodic table of the elements include an alkali metal. Examples of the elements belonging to Group 2 in the periodic table of the elements include an alkaline earth metal. Examples of the alkali metal include lithium (Li) and cesium (Cs). Examples of the alkaline earth metal include magnesium (Mg), calcium (Ca) and strontium (Sr). Examples of the rare earth metal include europium (Eu) and ytterbium (Yb). Examples of the alloy are MgAg and AlLi.

Hole Injecting Layer

The hole injecting layer 5 is a layer containing a highly hole-injectable substance. Examples of the highly hole-injectable substance include molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenyl carbazole (abbreviation: PCzPCA1), 3,6-bis[N-(9-phenylcarbazole-3-yl)-N-phenyl amino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

Moreover, a high-molecule compound is also usable as the highly hole-injectable substance. Examples of the high-molecule compound include an oligomer, dendrimer and polymer. Specific examples of the high-molecule compound include poly(N-vinylcarbazole) (abbreviation: PVK), poly(4-vinyltriphenylamine) (abbreviation: PVTPA), poly[N-(4-{N'-[4-(4-diphenyl amino)phenyl]phenyl-N'-phenylamino}phenyl)methacrylamido] (abbreviation: PTPDMA), and poly[N,N'-bis(4-butyl phenyl)-N,N'-bis(phenyl)benzidine] (abbreviation: Poly-TPD). Furthermore, the examples of the high-molecule compound include a high-molecule compound added with an acid such as poly(3,4-ethylene dioxythiophene)/poly(styrene sulfonic acid) (PEDOT/PSS), and polyaniline/poly(styrene sulfonic acid) (PAni/PSS).

Hole Transporting Layer

The hole transporting layer 6 is a layer containing a highly hole-transporting substance. For instance, an aromatic amine compound, carbazole derivative, anthracene derivative and the like are usable for the hole transporting layer 6. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ cm$^2$/(V·s) or more.

A carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA), and an anthracene derivative such as t-BuDNA, DNA, and DPAnth may also be used for the hole transporting layer 6. Moreover, a high-molecule compound such as poly(N- vinylcarbazole) (abbreviation: PVK) and poly(4-vinyltriphenylamine) (abbreviation: PVTPA) is also usable for the hole transporting layer 6.

However, any substance having a hole transporting performance higher than an electron transporting performance may be used in addition to the above substances. A layer including the highly hole-transporting substance may be provided in the form of a single layer or a laminate of two or more layers.

When the hole transporting layer includes two or more layers, one of the layers with a larger energy gap is preferably provided closer to the emitting layer.

Electron Transporting Layer

The electron transporting layer 7 is a layer containing a highly electron-transporting substance. For the electron transporting layer 7, 1) a metal complex such as an aluminum complex, beryllium complex and zinc complex, 2) heteroaromatic compound such as an imidazole derivative, benzimidazole derivative, azine derivative, carbazole derivative, and phenanthroline derivative, and 3) a high-molecule compound are usable. Specifically, as a low-molecule organic compound, a metal complex such as Alq, tris(4-methyl-8-quinolinato)aluminum (abbreviation: Almq$_3$), bis(10-hydroxybenzo[h]quinolinato)beryllium (abbreviation: BeBq$_2$), BAlq, Znq, ZnPBO and ZnBTZ are usable. In addition to the metal complex, a heteroaromatic compound such as 2-(4-biphenyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenyl)-1,2,4-triazole (abbreviation: TAZ), 3-(4-tert-butylphenyl)-4-(4-ethylphenyl)-5-(4-biphenyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) are usable. In the above exemplary embodiments, a benzimidazole compound is suitably usable. The above-described substances mostly have an electron mobility of $10^{-6}$ cm$^2$/(V·s) or more. However, any substance having an electron transporting performance higher than a hole transporting performance may be used for the electron transporting layer 7 in addition to the above substances. The electron transporting layer 7 may be provided in the form of a single layer or a laminate of two or more layers of the above substance(s).

Moreover, a high-molecule compound is also usable for the electron transporting layer 7. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)](abbreviation: PF-BPy) and the like are usable.

Electron Injecting Layer

The electron injecting layer 8 is a layer containing a highly electron-injectable substance. Examples of a material for the electron injecting layer 8 include an alkali metal, alkaline earth metal and a compound thereof, examples of which include lithium (Li), cesium (Cs), calcium (Ca), lithium fluoride (LiF), cesium fluoride (CsF), calcium fluoride (CaF2), and lithium oxide (LiOx). In addition, a compound containing an alkali metal, alkaline earth metal and a compound thereof in the electron-transporting substance, specifically, a compound containing magnesium (Mg) in Alq and the like may be used. With this compound, electrons can be more efficiently injected from the cathode 4.

Alternatively, a composite material provided by mixing an organic compound with an electron donor may be used for the electron injecting layer 8. The composite material exhibits excellent electron injecting performance and electron transporting performance since the electron donor generates electron in the organic compound. In this arrangement, the organic compound is preferably a material exhibiting an excellent transforming performance of the generated electrons. Specifically, for instance, the above-described substance for the electron transporting layer 7 (e.g., the metal complex and heteroaromatic compound) is usable. The electron donor may be any substance exhibiting an electron donating performance to the organic compound. Specifically, an alkali metal, an alkaline earth metal or a rare earth metal is preferable, examples of which include lithium, cesium, magnesium, calcium, erbium and ytterbium. Moreover, an alkali metal oxide and alkaline earth metal oxide are preferably used as the electron donor, examples of which include lithium oxide, calcium oxide, and barium oxide. Further, Lewis base such as magnesium oxide is also usable. Furthermore, tetrathiafulvalene (abbreviation: TTF) is also usable.

Cathode

Metal, alloy, an electrically conductive compound, a mixture thereof and the like, which have a small work function, specifically, of 3.8 eV or less, is preferably usable as a material for the cathode 4. Specific examples of the material for the cathode include the elements belonging to Groups 1 and 2 in the periodic table of the elements, a rare-earth metal and an alloy including the elements and/or the rare-earth metal. Examples of the elements belonging to Group 1 in the periodic table of the elements include an alkali metal. Examples of the elements belonging to Group 2 in the periodic table of the elements include an alkaline earth metal. Examples of the alkali metal include lithium (Li) and cesium (Cs). Examples of the alkaline earth metal include magnesium (Mg), calcium (Ca) and strontium (Sr). Examples of the rare earth metal include europium (Eu) and ytterbium (Yb). Examples of the alloy include MgAg and AlLi.

When the cathode 4 is formed of the alkali metal, alkaline earth metal and alloy thereof, vapor deposition and sputtering are usable. Moreover, when the cathode 4 is formed of silver paste and the like, coating, ink jet printing and the like are usable.

By providing the electron injecting layer 8, various conductive materials such as Al, Ag, ITO, graphene and indium oxide-tin oxide containing silicon or silicon oxide are usable for forming the cathode 4 irrespective of the magnitude of the work function. The conductive materials can be deposited as a film by sputtering, ink jet printing, spin coating and the like.

Layer Formation Method(s)

A method for forming each layer of the organic EL device in the above exemplary embodiments is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

Although the thickness of each organic layer of the organic EL device in the above exemplary embodiments is not particularly limited except for the above description, the thickness is generally preferably in a range of several nanometers to 1 μm because an excessively-thinned film likely entails defects such as a pin hole while an excessively-thickened film requires high voltage to be applied and deteriorates efficiency.

Electronic Device

The organic EL device 1 according to one of the above exemplary embodiments is usable in an electronic device such as a display unit and a light-emitting unit. Examples of the display unit include display components such as en organic EL panel module, TV, mobile phone, tablet, and personal computer. Examples of the light-emitting unit include an illuminator and a vehicle light.

Modification of Embodiments

It should be noted that the invention is not limited to the above exemplary embodiments but may include any modification and improvement as long as such modification and improvement are compatible with the invention.

In the above exemplary embodiments, the organic EL device including the first organic layer 11, the second organic layer 12, and the bipolar layer 13 provided between the first organic layer 11 and the second organic layer 12 is described as an example. However, the invention is not limited to the organic EL device with the above arrangement. For instance, an organic EL device may have an arrangement in which the organic layer and the bipolar layer are alternately repeatedly laminated.

For instance, the organic EL device may have the following arrangements (A) to (C). However, the invention is not limited to the organic EL devices having the arrangements (A) to (C).

Arrangement (A)

anode/hole injecting layer/hole transporting layer/first organic layer/first bipolar layer/second organic layer/second bipolar layer/third organic layer/electron transporting layer/electron injecting layer/cathode Arrangement (B)

anode/hole injecting layer/hole transporting layer/first organic layer/first bipolar layer/second organic layer/third organic layer/electron transporting layer/electron injecting layer/cathode Arrangement (C)

anode/hole injecting layer/hole transporting layer/first organic layer/third organic layer/first bipolar layer/second organic layer/electron transporting layer/electron injecting layer/cathode In addition to the organic EL devices described in the above exemplary embodiments, examples of the organic EL device emitting a white light include an organic EL device with the arrangement (A) in which the first compound capable of blue emission is used in the first organic layer 11, the first compound capable of green emission is used in the second organic layer 12, and the first compound capable of red emission is used in the third organic layer.

Moreover, the examples of the organic EL device emitting a white light further include an organic EL device with the arrangement (A) or (B) in which the first compound capable of blue emission is used in the first organic layer 11, the third compound capable of emitting green fluorescence or phosphorescence is used in the second organic layer 12, and the third compound capable of emitting red fluorescence or phosphorescence is used in the third organic layer.

Moreover, the examples of the organic EL device emitting a white light further include an organic EL device with the arrangement (C) in which the third compound capable of emitting red fluorescence or phosphorescence is used in the first organic layer 11, the third compound capable of emitting green fluorescence or phosphorescence is used in the third organic layer, and the first compound capable of blue emission is used in the second organic layer 12.

When the organic EL device has a plurality of bipolar layers as in the arrangements (A) to (C), the compounds described in the above exemplary embodiments are usable in each of the bipolar layers and may be the same or different.

A combination of emission colors for allowing the organic EL device to emit a white light is not limited to the above combinations.

The second compound may be included in both of the first organic layer 11 and the second organic layer 12. In such a case, a structure of the second compound contained in the first organic layer 11 may be the same as or different from a structure of the second compound contained in the second organic layer 12.

Moreover, the first organic layer 11 may include two components of the first compound and the second compound and the second organic layer 12 may include three components of the first compound, the second compound, and the fifth compound.

In the above exemplary embodiments, the organic EL device including the bipolar layer formed of the compound having bipolar characteristics is described as an example. However, the invention is not limited thereto. For instance, the bipolar layer may include a hole-transporting compound and a electron-transporting compound. Examples of the hole-transporting compound and the electron-transporting compound include the compounds described above in relation to the hole transporting layer and the electron transporting layer.

In the above exemplary embodiments, the organic EL device in which a hole transporting zone between the first organic layer 11 and the anode 3 includes the hole injecting layer 5 and the hole transporting layer 6 is described as an example. However, the invention is not limited to the organic EL device with the above arrangement. The hole transporting zone preferably includes at least one of the hole injecting layer and the hole transporting layer. The hole injecting layer may be provided in a single layer or in a plurality of layers respectively including different compounds. The hole transporting layer may be provided in a single layer or in a plurality of layers respectively containing different compounds.

In the above exemplary embodiments, the organic EL device in which an electron transporting zone between the second organic layer 12 and the cathode 4 includes the electron transporting layer 7 and the electron injecting layer 8 is described as an example. However, the invention is not limited to the organic EL device with the above arrangement. The electron transporting zone preferably includes at least one of the electron injecting layer and the electron transporting layer. The electron injecting layer may be provided in a single layer or in a plurality of layers respectively containing different compounds. The electron transporting layer may be provided in a single layer or in a plurality of layers respectively containing different compounds.

For instance, a blocking layer may be provided adjacent to an anode-side of the first organic layer or a cathode-side of the second organic layer. The blocking layer is preferably provided in contact with the first organic layer or the second organic layer to at least block holes, electrons or excitons.

For instance, when the blocking layer is provided in contact with the cathode-side of the second organic layer, the blocking layer permits transport of electrons, but blocks holes from reaching a layer provided near the cathode (e.g., the electron transporting layer) beyond the blocking layer. When the organic EL device includes the electron transporting layer, the blocking layer is preferably interposed between the second organic layer and the electron transporting layer.

When the blocking layer is provided in contact with the anode-side of the first organic layer, the blocking layer permits transport of holes, but blocks electrons from reaching a layer provided near the anode (e.g., the hole transporting layer) beyond the blocking layer. When the organic EL device includes the hole transporting layer, the blocking layer is preferably interposed between the first organic layer and the hole transporting layer.

Further, the blocking layer may be provided in contact with the first organic layer and the second organic layer to prevent an excitation energy from leaking from the first organic layer and the second organic layer into neighboring layers. The blocking layer blocks excitons generated in the first organic layer and the second organic layer from moving into a layer provided near the electrode (e.g., the electron transporting layer and the hole transporting layer) beyond the blocking layer.

It is preferable that the first organic layer and the second organic layer are bonded to the blocking layer.

Further, specific arrangements and configurations for practicing the invention may be altered to other arrangements and configurations compatible with the invention.

Example(s)

Next, Examples will be described below. However, the invention is not limited to Examples.

Compounds used for manufacturing the organic EL device will be shown below.

[Formula 95]

HI

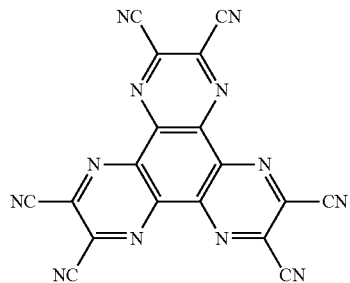

HT-1

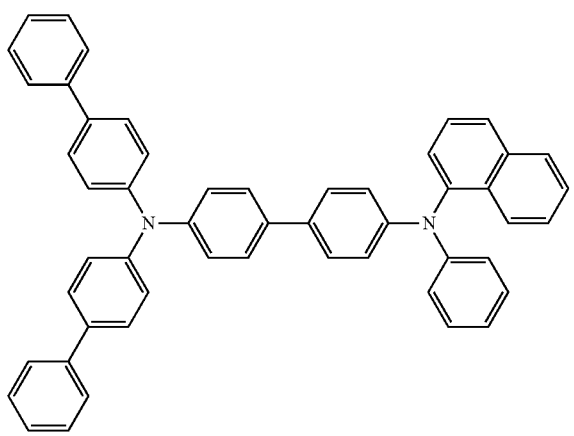

-continued

HT-2

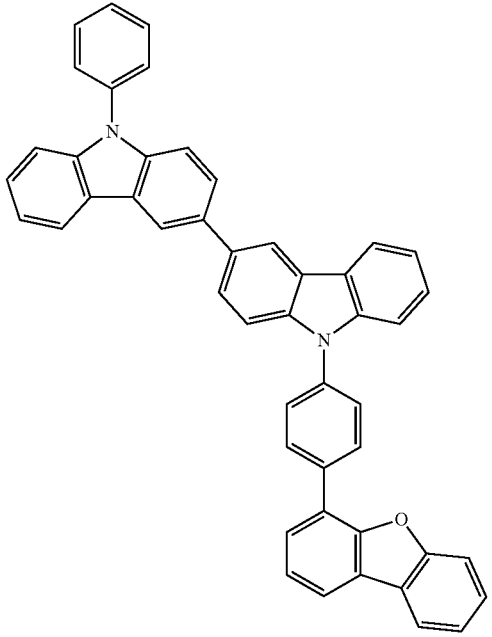

[Formula 96]

BH

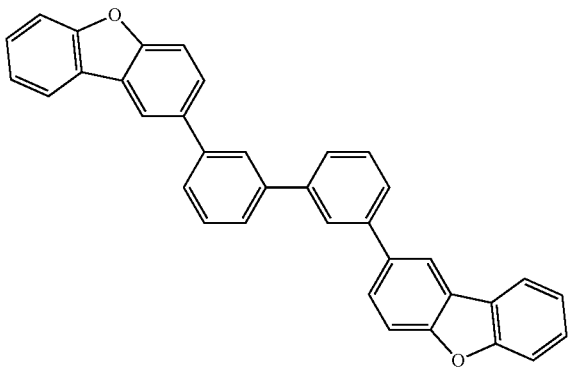

BD

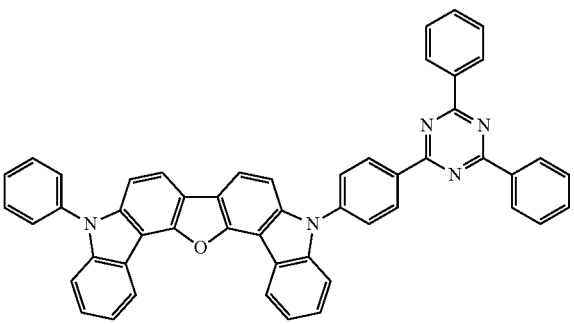

[Formula 97]

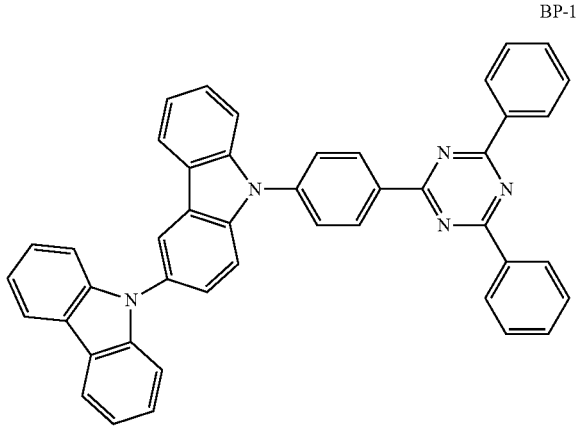

BP-1

BP-2

[Formula 98]

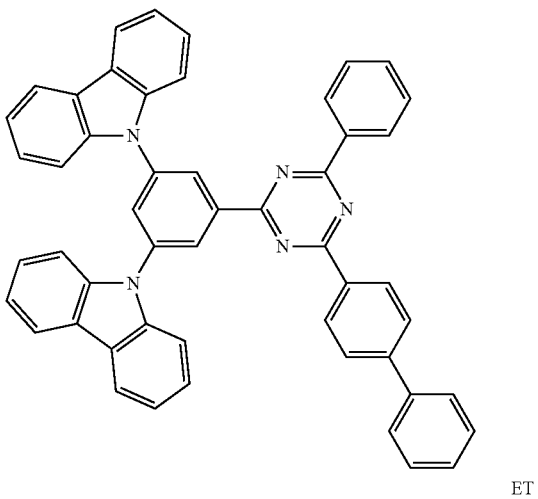

IIB-1

ET

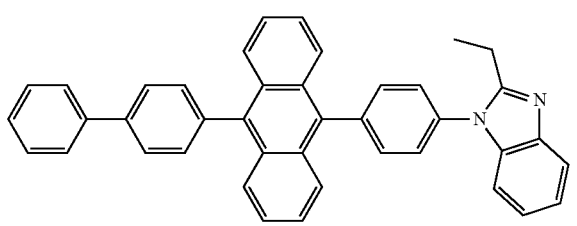

Evaluation of Compounds

Next, properties of the compounds used in Examples were measured. A measurement method and a calculation method are shown below.

Delayed Fluorescence Characteristics

Delayed fluorescence characteristics were checked by measuring transient photoluminescence (PL) using a device shown in FIG. 2. A sample was prepared by co-depositing the compounds BD and TH-2 on a quartz substrate at a ratio of the compound BD of 12 mass % to form a 100-nm-thick thin film. Prompt emission was observed immediately when the excited state was achieved by exciting the compound BD with a pulse beam (i.e., a beam emitted from a pulse laser) having a wavelength to be absorbed by the compound BD, and Delay emission was observed not immediately when the excited state was achieved but after the excited state was achieved. The delayed fluorescence in Examples means that the amount of Delay emission is 5% or more relative to the amount of Prompt emission. It was confirmed in the compound BD that the amount of Delay emission was 5% or more relative to the amount of Prompt emission. The amount of Prompt emission and the amount of Delay emission can be obtained in the same method as a method described in "Nature" vol. 492, pp. 234-238 (2012). A device used for calculating the amount of Prompt emission and the amount of Delay emission is not limited to the device described in FIG. 2 and Cited Literatures.

Energy Gap $T_{77K}$ at 77 [K]

$T_{77K}$ was measured as follows. Herein, the compounds BD and BH were measurement target compounds. The measurement target compounds were dissolved in EPA (diethylether:isopentane:ethanol=5:5:2 in volume ratio) at a concentration of 10 μmol/L, and the resulting solution was set in a quartz cell to provide a measurement sample. With respect to the measurement sample, a phosphorescent spectrum (ordinate axis: phosphorescent luminous intensity, abscissa axis: wavelength) was measured at a low temperature (77 [K]). A tangent was drawn to the rise of the phosphorescent spectrum on the short-wavelength side. An amount of energy calculated by the following conversion equation 1 based on a wavelength value $\lambda_{edge}$[nm] at an intersection of the tangent and the abscissa axis was defined as an energy gap $T_{77K}$ at 77 [K].

Conversion Equation 1: $T_{77K}[eV]=1239.85/\lambda_{edge}$

For phosphorescence measurement, a spectrophotofluorometer body F-4500 (manufactured by Hitachi High-Technologies Corporation) was used.

The tangent to the rise of the phosphorescence spectrum on the short-wavelength side was drawn as follows. While moving on a curve of the phosphorescence spectrum from the short-wavelength side to the maximum spectral value closest to the short-wavelength side among the maximum spectral values, a tangent was checked at each point on the curve toward the long-wavelength of the phosphorescence spectrum. An inclination of the tangent was increased as the curve rose (i.e., a value of the ordinate axis was increased). A tangent drawn at a point of the maximum inclination (i.e., a tangent at an inflection point) was defined as the tangent to the rise of the phosphorescence spectrum on the short-wavelength side.

The maximum with peak intensity being 15% or less of the maximum peak intensity of the spectrum was not included in the above-mentioned maximum closest to the short-wavelength side of the spectrum. The tangent drawn at a point of the maximum spectral value being the closest to the short-wavelength side and having the maximum inclination was defined as a tangent to the rise of the phosphorescence spectrum on the short-wavelength side.

$T_{77K}$ of the compound BD was 2.90 eV. $T_{77K}$ of the compound BH was 2.92 eV.

Manufacture and Evaluation of Organic EL Device

The organic EL device was manufactured and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was set to be 130-nm-thick.

After the glass substrate having the transparent electrode line was cleaned, the glass substrate was mounted on a substrate holder of a vacuum evaporation apparatus. Initially, a compound HI was vapor-deposited on a surface of the glass substrate where the transparent electrode line was provided in a manner to cover the transparent electrode, thereby forming a 5-nm-thick hole injecting layer.

Subsequently, the compound HT-1 was vapor-deposited on the hole injecting layer to form a 80-nm-thick first hole transporting layer on the HI film.

Next, the compound HT-2 was vapor-deposited on the first hole transporting layer to form a 15-nm-thick second hole transporting layer.

Further, on the second hole transporting layer, the compound BD (the first compound) and the compound BH (the second compound) were co-deposited to form a 12-nm-thick first organic layer. A concentration of the compound BD in the first organic layer was set at 50 mass %.

Next, the compound BP-1 was vapor-deposited on the first organic layer to form a 4-nm-thick bipolar layer.

Subsequently, on the bipolar layer, the compound BD (the first compound) and the compound BH (the second compound) were co-deposited to form a 13-nm-thick second organic layer. A concentration of the compound BD in the second organic layer was set at 50 mass %.

Next, the compound HB-1 was vapor-deposited on the second organic layer to form a 5-nm-thick blocking layer.

Subsequently, the compound ET was vapor-deposited on the blocking layer to form a 20-nm-thick electron transporting layer.

Next, lithium fluoride (LiF) was vapor-deposited on the electron transporting layer to form a 1-nm-thick electron injecting electrode (cathode).

A metal aluminum (Al) was then vapor-deposited on the electron injecting electrode to form an 80-nm-thick metal Al cathode.

A device arrangement of the organic EL device of Example 1 is roughly shown as follows.

ITO(130)/HI(5)/HT-1(80)/HT-2(15)/BH:BD (12, 50%)/BP-1 (4)/BH:BD (13, 50%)/HB-1(5)/ET(20)/LiF(1)/Al(80)

Numerals in parentheses represent a film thickness (unit: nm). The numerals represented by percentage in parentheses indicate a ratio (mass %) of the first compound in the first organic layer and the second organic layer.

Example 2

An organic EL device of Example 2 was manufactured in the same manner as the organic EL device of Example 1 except that a compound BP-2 was used in place of the compound BP-1 in the bipolar layer of Example 1.

A device arrangement of the organic EL device of Example 2 is roughly shown as follows.

ITO(130)/HI(5)/HT-1(80)/HT-2(15)/BH:BD (12, 50%)/BP-2 (4)/BH:BD (13, 50%)/HB-1(5)/ET(20)/LiF(1)/Al(80)

Comparative Example 1

An organic EL device of Comparative Example 1 was manufactured in the same manner as the organic EL device of Example 1 except that the film thickness of the first organic layer in Example 1 was changed to 25 nm, formation of the bipolar layer and the second organic layer was omitted, and the blocking layer was formed on the first organic layer.

A device arrangement of the organic EL device of Comparative Example 1 is roughly shown as follows.

ITO(130)/H1(5)/HT-1(80)/HT-2(15)/BH: BD (25, 50%)/11B-1(5)/ET(20)/LiF(1)/Al(80)

Evaluation of Organic EL Devices

The manufactured organic EL devices of Examples 1, 2 and Comparative Example 1 were evaluated as follows. The evaluation results are shown in Table 2.

Drive Voltage

Voltage was applied between the ITO transparent electrode and the metal Al cathode such that the current density was 0.10 mA/cm$^2$, 1.00 mA/cm$^2$ or 10 mA/cm$^2$, where voltage (unit: V) was measured.

Luminance and CIE1931 Chromaticity

Voltage was applied on each of the organic EL devices such that the current density was 0.10 mA/cm$^2$, 1.00 mA/cm$^2$ or 10 mA/cm$^2$, where luminance and CIE1931 chromaticity coordinates (x, y) were measured using a spectroradiometer CS-1000 (manufactured by Konica Minolta, Inc.).

Current Efficiency L/J and Power Efficiency η

Voltage was applied on each of the organic EL devices such that the current density was 0.10 mA/cm$^2$, 1.00 mA/cm$^2$ or 10 mA/cm$^2$, where spectral radiance spectra were measured using the above spectroradiometer. A current efficiency (unit: cd/A) and a power efficiency η (unit: 1 m/W) were calculated from the obtained spectral radiance spectra.

Main Peak Wavelength $\lambda_p$

A main peak wavelength $\lambda_p$ was calculated from the obtained spectral radiance spectra.

External Quantum Efficiency EQE

Voltage was applied on each of the organic EL devices such that the current density was 0.10 mA/cm$^2$, 1.00 mA/cm$^2$ or 10 mA/cm$^2$, where spectral radiance spectra were measured using the above spectroradiometer. The external quantum efficiency EQE (unit: %) was calculated from the obtained spectral radiance spectra, assuming that the spectra were provided under a Lambertian radiation.

TABLE 2

|  | Current Density [mA/cm$^2$] | Voltage [V] | Luminance [cd/m$^2$] | Chromaticity x | Chromaticity y | L/J [cd/A] | η [lm/W] | EQE [%] | λp [nm] |
|---|---|---|---|---|---|---|---|---|---|
| Example 1 | 0.10 | 2.84 | 61.8 | 0.252 | 0.492 | 61.82 | 68.41 | 22.62 | 497 |
|  | 1.00 | 3.17 | 593.2 | 0.249 | 0.487 | 59.32 | 58.88 | 21.85 | 497 |
|  | 10 | 3.79 | 4523.1 | 0.244 | 0.479 | 45.23 | 37.51 | 16.85 | 496 |
| Example 2 | 0.10 | 2.96 | 61.8 | 0.252 | 0.500 | 61.83 | 65.62 | 22.44 | 499 |
|  | 1.00 | 3.46 | 604.2 | 0.248 | 0.495 | 60.42 | 54.85 | 22.08 | 499 |
|  | 10 | 4.31 | 4570.5 | 0.242 | 0.486 | 45.71 | 33.34 | 16.95 | 496 |
| Comparative Example 1 | 0.10 | 2.90 | 55.5 | 0.247 | 0.493 | 55.49 | 60.17 | 20.40 | 498 |
|  | 1.00 | 3.30 | 540.3 | 0.244 | 0.489 | 54.03 | 51.40 | 19.97 | 497 |
|  | 10 | 3.99 | 4172.1 | 0.240 | 0.482 | 41.72 | 32.82 | 15.58 | 496 |

As shown in Table 2, the organic EL devices of Examples 1 and 2 having the bipolar layer improved luminous efficiency as compared with the organic EL device of Comparative Example 1.

Example 3

In the same manner as in Example 1, the compound HI was vapor-deposited on the glass substrate having an ITO transparent electrode (anode) to form a 5-nm thick hole injecting layer.

Next, the compound HT-1 was vapor-deposited on the hole injecting layer to form a 110-nm-thick first hole transporting layer on the HI film.

Subsequently, the compound HT-2 was vapor-deposited on the first hole transporting layer to form a 15-nm-thick second hole transporting layer.

Further, on the second hole transporting layer, the compound BD (the first compound) and the compound BH (the second compound) were co-deposited to form a 12-nm-thick first organic layer. A concentration of the compound BD in the first organic layer was set at 50 mass %.

Next, the compound BP-2 and a compound BD2 were vapor-deposited on the first organic layer to form a 4-nm-thick bipolar layer. A concentration of the compound BD2 contained in the bipolar layer was set at 1 mass %.

Subsequently, on the bipolar layer, the compound BD (the first compound), the compound BH (the second compound) and the compound BD2 (the fifth compound) were co-deposited to form a 13-nm-thick second organic layer. A concentration of the compound BD was set at 50 mass % and a concentration of the compound BD2 was set at 1 mass % in the second organic layer.

Next, the compound HB-1 was vapor-deposited on the second organic layer to form a 5-nm-thick blocking layer.

Subsequently, the compound ET was vapor-deposited on the blocking layer to form a 35-nm-thick electron transporting layer.

Next, lithium fluoride (LiF) was vapor-deposited on the electron transporting layer to form a 1-nm-thick electron injecting electrode (cathode).

A metal aluminum (Al) was then vapor-deposited on the electron injecting electrode to form an 80-nm-thick metal Al cathode.

A device arrangement of the organic EL device of Example 3 is roughly shown as follows.

ITO(130)/HI(5)/HT-1(110)/HT-2(15)/BH:BD (12, 50%)/BP-2:BD2 (4, 1%)/BH:BD:BD2 (13, 50%,1%)/HB-1(5)/ET (35)/LiF(1)/Al(80)

Numerals in parentheses represent a film thickness (unit: nm). The numerals represented by percentage in the parentheses indicate a ratio (mass %) of the compound BD in the first organic layer, a ratio (mass %) of the compound BD2 in the bipolar layer, and a ratio (mass %) of the compounds BD and BD2 in the second organic layer.

[Formula 99]

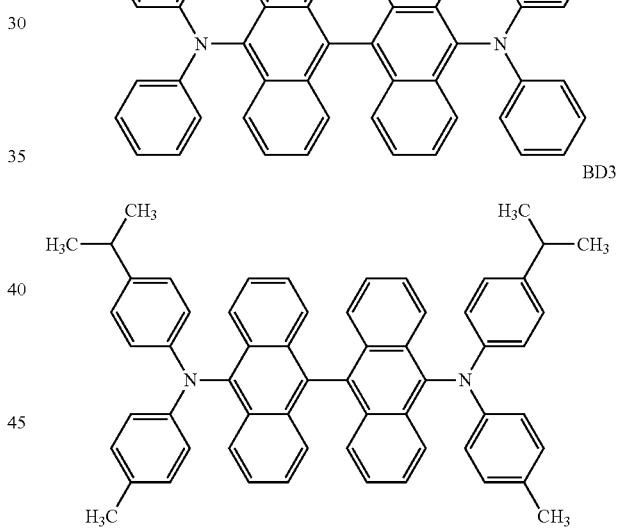

Example 4

An organic EL device of Example 4 was manufactured in the same manner as the organic EL device of Example 3 except that a compound BD3 was used in place of the compound BD2 in the bipolar layer and the second organic layer of Example 3.

A device arrangement of the organic EL device of Example 4 is roughly shown as follows.

ITO(130)/HT(5)/HT-1(110)/HT-2(15)/BH:BD (12, 50%)/BP-2:BD3 (4, 1%)/BH:BD:BD3 (13, 50%,1%)/HB-1(5)/ET (35)/LiF(1)/Al(80)

Numerals in parentheses represent a film thickness (unit: nm). The numerals represented by percentage in the parentheses indicate a ratio (mass %) of the compound BD in the first organic layer, a ratio (mass %) of the compound BD2 in the bipolar layer, and a ratio (mass %) of the compounds BD and BD2 in the second organic layer.

Comparative Example 2

An organic EL device of Comparative Example 2 was manufactured in the same manner as the organic EL device of Example 3 except that formation of the first organic layer and the bipolar layer was omitted, the film thickness of the second organic layer was changed to 25 nm, and the blocking layer was formed on the second organic layer.

A device arrangement of the organic EL device of Comparative Example 2 is roughly shown as follows.

ITO(130)/HT(5)/HT-1(110)/HT-2(15)/BH:BD:BD2 (25, 50%,1%)/HB-1(5)/ET(35)/LiF(1)/Al(80)

Evaluation of Organic EL Devices

The manufactured organic EL devices of Examples 3, 4 and Comparative Example 2 were evaluated in the same manner as described above. The evaluation results are shown in Table 3.

organic layer. A concentration of the compound YD in the first organic layer was set at 20 mass %.

Next, the compound BP-2 was vapor-deposited on the first organic layer to form a 5-nm-thick bipolar layer.

Subsequently, on the bipolar layer, a compound BH-2 (the first compound), a compound BH-3 (the second compound) and a compound BD4 (the fifth compound) were co-deposited to form a 20-nm-thick second organic layer. A concentration of the compound BH-2 was set at 50 mass % and a concentration of the compound BD4 was set at 1 mass % in the second organic layer.

Next, the compound BP-2 was vapor-deposited on the second organic layer to form a 5-nm-thick blocking layer.

Subsequently, the compound ET was vapor-deposited on the blocking layer to form a 35-nm-thick electron transporting layer.

Next, lithium fluoride (LiF) was vapor-deposited on the electron transporting layer to form a 1-nm-thick electron injecting electrode (cathode).

TABLE 3

|  | Current Density [mA/cm$^2$] | Voltage [V] | Luminance [cd/m$^2$] | Chromaticity x | Chromaticity y | L/J [cd/A] | η [lm/W] | EQE [%] | λp [nm] |
|---|---|---|---|---|---|---|---|---|---|
| Example 3 | 0.10 | 3.20 | 82.6 | 0.262 | 0.562 | 82.64 | 81.18 | 27.04 | 514 |
|  | 1.00 | 3.65 | 710.2 | 0.258 | 0.559 | 71.02 | 61.17 | 23.34 | 511 |
|  | 10 | 4.48 | 4951.4 | 0.253 | 0.555 | 49.51 | 34.71 | 16.40 | 511 |
| Example 4 | 0.10 | 3.27 | 82.7 | 0.263 | 0.562 | 82.71 | 79.39 | 27.01 | 514 |
|  | 1.00 | 3.73 | 725.1 | 0.260 | 0.560 | 72.51 | 61.00 | 23.77 | 513 |
|  | 10 | 4.58 | 5070.6 | 0.256 | 0.555 | 50.71 | 34.79 | 16.73 | 512 |
| Comparative Example 2 | 0.10 | 2.94 | 45.9 | 0.257 | 0.578 | 45.92 | 49.13 | 14.66 | 514 |
|  | 1.00 | 3.25 | 482.1 | 0.254 | 0.575 | 48.21 | 46.66 | 15.46 | 514 |
|  | 10 | 3.98 | 4266.9 | 0.250 | 0.572 | 42.67 | 33.70 | 13.75 | 512 |

As shown in Table 3, the organic EL devices of Examples 3 and 4 each having the bipolar layer and the fourth and fifth compounds improved luminous efficiency as compared with the organic EL device of Comparative Example 2.

Example 5

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was set to be 130-nm thick.

After the glass substrate having the transparent electrode line was cleaned, the glass substrate was mounted on a substrate holder of a vacuum evaporation apparatus. Initially, a compound HI-2 was vapor-deposited on a surface of the glass substrate where the transparent electrode line was provided in a manner to cover the transparent electrode, thereby forming a 10-nm thick hole injecting layer.

Subsequently, a compound HT-3 was vapor-deposited on the hole injecting layer to form a 10-nm-thick hole transporting layer.

Next, on the hole transporting layer, a compound YD (the first compound) and a compound YH (the second compound) were co-deposited to form a 20-nm-thick first A metal aluminum (Al) was then vapor-deposited on the electron injecting electrode to form an 80-nm-thick metal Al cathode.

A device arrangement of the organic EL device of Example 5 is roughly shown as follows.

ITO(130)/HI-2(10)/HT-3(10)/YH:YD (20, 20%)/BP-2 (5)/BH-3:BH-2:BD4 (20, 50%, 1%)/BP-2 (5)/ET(35)/LiF (1)/Al(80)

Numerals in parentheses represent a film thickness (unit: nm). The numerals represented by percentage in the parentheses indicate a ratio (mass %) of the first compound in the first organic layer and a ratio (mass %) of the first and fifth compounds in the second organic layer.

Comparative Example 3

An organic EL device of Comparative Example 3 was manufactured in the same manner as the organic EL device of Example 5 except that the film thickness of the first organic layer was changed to 25 nm and formation of the bipolar layer was omitted.

A device arrangement of the organic EL device of Comparative Example 3 is roughly shown as follows.

ITO(130)/HI-2(10)/HT-3(10)/YH:YD (25, 20%)/BH-3: BH-2:BD4 (20, 50%, 1%)/BP-2 (5)/ET(35)/LiF(1)/Al(80)

In Example 5 and Comparative Example 3, the following compounds were used in addition to the aforementioned compounds.

[Formula 100]

HI-2
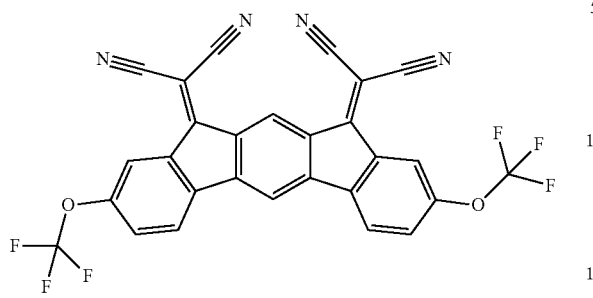

HT-3
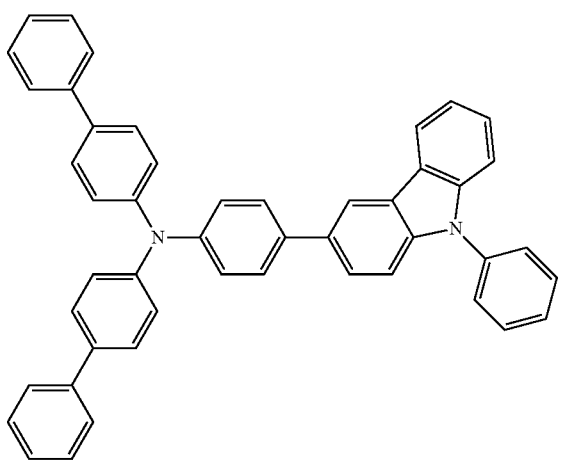

[Formula 101]

YH
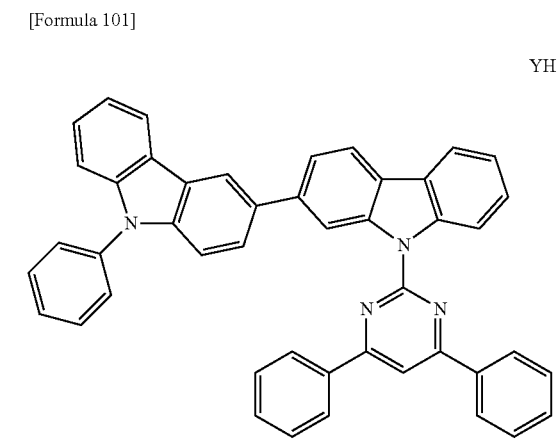

YD
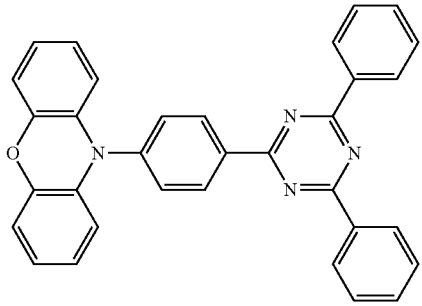

[Formula 102]

BH-2
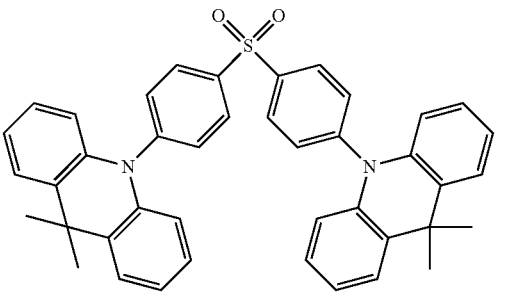

BH-3
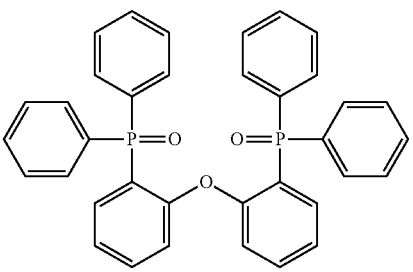

BD4
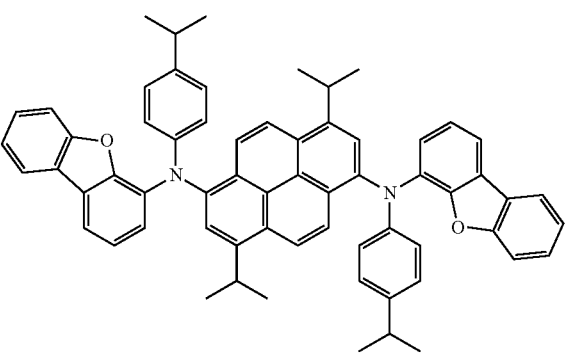

$T_{77K}$ of the compound YH was 2.74 eV. $T_{77K}$ of the compound YD was 2.56 eV.

Evaluation of Organic EL Devices

The manufactured organic EL devices of Example 5 and Comparative Example 3 were evaluated in the same manner as described above. The evaluation results are shown in Table 4. Evaluation items were the CIE1931 chromaticity, external quantum efficiency EQE, and main peak wavelength $\lambda_p$. At the measurement for the evaluation items, voltage was applied to the organic EL device so that the current density was 1.00 mA/cm². The external quantum efficiency EQE was represented by a ratio relative to the EQE value that was defined as 1.00 in Comparative Example 3.

TABLE 4

| | Current Density [mA/cm²] | Chromaticity x | Chromaticity y | EQE [a.u.] | $\lambda_p$ [nm] |
|---|---|---|---|---|---|
| Example 5 | 1.00 | 0.259 | 0.341 | 1.11 | 464 |
| Comparative Example 3 | 1.00 | 0.254 | 0.342 | 1.00 | 466 |

As shown in Table 4, the organic EL devices of Example 5 having the bipolar layer has an improved external quantum efficiency that is 1.11 times as much as the external quantum efficiency of the organic EL device of Comparative Example 3 having no bipolar layer. The organic EL device of Example 5 emitted a white light as shown by the value of chromaticity.

EXPLANATION OF CODE(S)

1 . . . organic EL device, 3 . . . anode, 4 . . . cathode, 6 . . . hole transporting layer, 7 . . . electron transporting layer, 11 . . . first organic layer, 12 . . . second organic layer, 13 . . . bipolar layer.

The invention claimed is:

1. An organic electroluminescence device comprising:
an anode;
a cathode;
a first organic emitting layer interposed between the anode and the cathode;
a second organic emitting layer interposed between the first organic emitting layer and the cathode; and
a bipolar layer interposed between the first organic emitting layer and the second organic emitting layer and having bipolar characteristics, wherein
at least one of the first organic emitting layer and the second organic emitting layer comprises a first compound and a second compound,
the first compound exhibits delayed fluorescence characteristics,
an energy gap $T_{77K}(M2)$ at 77[K] of the second compound is larger than an energy gap $T_{77K}(M1)$ at 77[K] of the first compound, and
the bipolar layer transfers both holes and electrons.

2. The organic electroluminescence device according to claim 1, wherein
the second organic emitting layer comprises the first compound.

3. The organic electroluminescence device according to claim 1, wherein
the first organic emitting layer comprises the first compound.

4. The organic electroluminescence device according to claim 1, wherein
each of the first organic emitting layer and the second organic emitting layer comprises the first compound.

5. The organic electroluminescence device according to claim 4, wherein
the first compound comprised in the first organic emitting layer comprises a structure different from a structure of the first compound comprised in the second organic emitting layer, and
a main peak wavelength $\lambda 1$ (unit: nm) of an emission spectrum of the first compound comprised in the first organic emitting layer and a main peak wavelength $\lambda 2$ (unit: nm) of an emission spectrum of the first compound comprised in the second organic emitting layer satisfy a relationship of Numerical Formula 1, $$|\lambda 1 - \lambda 2| \leq 150 \text{ nm} \quad \text{(Numerical Formula 1)}.$$

6. The organic electroluminescence device according to claim 4, wherein
the first compound comprised in the first organic emitting layer comprises a structure different from a structure of the first compound comprised in the second organic emitting layer, and
a main peak wavelength $\lambda 1$ (unit: nm) of an emission spectrum of the first compound comprised in the first organic emitting layer and a main peak wavelength 22 (unit: nm) of an emission spectrum of the first compound comprised in the second organic emitting layer satisfy a relationship of Numerical Formula 2, $$|\lambda 1 - \lambda 2| \geq 100 \text{ nm} \quad \text{(Numerical Formula 2)}.$$

7. The organic electroluminescence device according to claim 4, which emits a white light.

8. The organic electroluminescence device according to claim 1, wherein
one of the first organic emitting layer and the second organic emitting layer comprises the first compound and the second compound, and
the other of the first organic emitting layer and the second organic emitting layer comprises a third luminescent compound.

9. The organic electroluminescence device according to claim 8, wherein a main peak wavelength $\lambda 1$ (unit: nm) of an emission spectrum of the first compound and a main peak wavelength $\lambda 3$ (unit: nm) of an emission spectrum of the third compound satisfy a relationship of Numerical Formula 3, $$|\lambda 1 - \lambda 3| \leq 150 \text{ nm} \quad \text{(Numerical Formula 3)}.$$

10. The organic electroluminescence device according to claim 8, wherein a main peak wavelength $\lambda 1$ (unit: nm) of an emission spectrum of the first compound and a main peak wavelength $\lambda 3$ (unit: nm) of an emission spectrum of the third compound satisfy a relationship of Numerical Formula 4, $$|\lambda 1 - \lambda 3| \geq 100 \text{ nm} \quad \text{(Numerical Formula 4)}.$$

11. The organic electroluminescence device according to claim 8, which emits a white light.

12. The organic electroluminescence device according to claim 8, wherein
the third compound is a fluorescent compound or a phosphorescent compound.

13. The organic electroluminescence device according to claim 8, wherein
the third compound is a fluorescent compound.

14. The organic electroluminescence device according to claim 1, wherein
at least one of the first organic emitting layer and the second organic emitting layer comprises the first compound at a concentration in a range from 20 mass % to 80 mass %.

15. The organic electroluminescence device according to claim 1, wherein
the first organic emitting layer and the second organic emitting layer comprises no phosphorescent metal complex.

16. The organic electroluminescence device according to claim 1, wherein
the bipolar layer comprises a fourth compound represented by a formula (2), $$(Cz)_n\text{-}L_2\text{-}R_2 \quad (2)$$

where: Cz is represented by a formula (2a) or (2b) and a plurality of Cz are mutually the same or different;
n is an integer of 1 to 4;
$L_2$ is a single bond or a linking group and the linking group in $L_2$ is a group selected from the group consisting of a substituted or unsubstituted aromatic hydrocarbon group having 6 to 30 ring carbon atoms and a substituted or unsubstituted heterocyclic group having 5 to 30 ring atoms; and $R_2$ is represented by a formula (20),

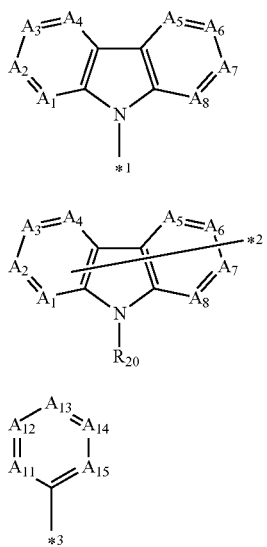

where in the formulae (2a) and (2b): *1 and *2 represent a bonding site to $A_1$, $A_2$, $A_3$, $A_4$, $A_5$, $A_6$, $A_7$ and $A_8$ each independently represent a nitrogen atom or $CR_{21}$;

$R_{21}$ represents a hydrogen atom or a substituent; when $R_{21}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group; a substituted phosphine oxide group; a halogeno group, a cyano group, a carbonyl group, and a carboxy group;

a plurality of $R_{21}$ are optionally mutually the same or different and, when at least two of the plurality of $R_{21}$ are substituents, the substituents $R_{21}$ are optionally bonded to each other to form a cyclic structure;

$R_{20}$ represents a group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, and a substituted silyl group; and a plurality of $R_{20}$ are optionally mutually the same or different, in the formula (20): *3 represents a bonding site to $L_2$;

$A_{11}$, $A_{12}$, $A_{13}$, $A_{14}$ and $A_{15}$ each independently represent a nitrogen atom or $CR_{22}$;

$R_{22}$ represents a hydrogen atom or a substituent; when $R_{22}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogeno group, a cyano group, a carbonyl group, and a carboxy group;

a plurality of $R_{22}$ are optionally mutually the same or different and, when at least two of the plurality of $R_{22}$ are substituents, the substituents $R_{22}$ are optionally bonded to each other to form a cyclic structure; and at least one of $A_{11}$ to $A_{15}$ is a nitrogen atom, or at least one of a plurality of $R_{22}$ is a cyano group when all of $A_{11}$ to $A_{15}$ are $CR_{22}$.

17. The organic electroluminescence device according to claim 16, wherein at least two of $A_{11}$, $A_{13}$ and $A_{15}$ are nitrogen atoms.

18. The organic electroluminescence device according to claim 16, wherein $A_{11}$, $A_{13}$ and $A_{15}$ are nitrogen atoms.

19. The organic electroluminescence device according to claim 16, wherein $A_{11}$ to $A_{15}$ are $CR_{22}$ and at least one of the plurality of $R_{22}$ is a cyano group.

20. The organic electroluminescence device according to claim 16, wherein n is 1 or 2.

21. The organic electroluminescence device according to claim 16, wherein at least one of $A_1$ to $A_8$ in the formula (2a) is $CR_{21}$, and at least one of $R_{21}$ is a heterocyclic group represented by a formula (2c) or (2d),

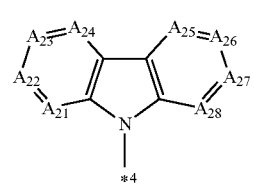

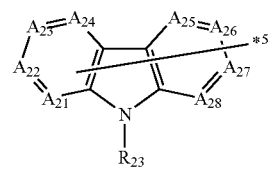

where: *4 and *5 represent a bonding site to $A_1$ to $A_8$ in the formula (2a);

$A_{21}$, $A_{22}$, $A_{23}$, $A_{24}$, $A_{25}$, $A_{26}$, $A_{27}$ and $A_{28}$ each independently represent a nitrogen atom or $CR_{24}$;

$R_{24}$ represents a hydrogen atom or a substituent;

when $R_{24}$ is a substituent, the substituent is selected from the group consisting of the examples of the substituent when $R_{21}$ is the substituent;

a plurality of $R_{24}$ are optionally mutually the same or different;

when at least two of a plurality of $R_{24}$ are substituents, the substituents $R_{24}$ are optionally bonded to each other to form a cyclic structure;

$R_{23}$ is selected from the group consisting of the examples of substituent listed for $R_{20}$; and a plurality of $R_{23}$ are optionally the same or different.

22. The organic electroluminescence device according to claim 1, wherein
at least one of the first organic emitting layer and the second organic emitting layer comprises the first compound, the second compound, and a fifth compound represented by a formula (3),

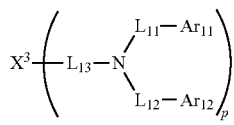
(3)

where: $X^3$ represents a substituted or unsubstituted fused aromatic hydrocarbon group having 10 to 40 ring carbon atoms;

$Ar_{11}$ and $Ar_{12}$ each independently represent a group selected from the group consisting of a substituted or unsubstituted aromatic hydrocarbon group having 6 to 40 ring carbon atoms, and a substituted or unsubstituted heterocyclic group having 5 to 30 ring atoms;

$L_{11}$ to $L_{13}$ each independently represent a single bond or a linking group;

when $L_{11}$ to $L_{13}$ are linking groups, the linking groups are selected from the group consisting of a divalent residue of a substituted or unsubstituted aromatic heterocyclic group having 6 to 30 ring atoms and a divalent residue of a substituted or unsubstituted heterocyclic group having 5 to 30 ring atoms; and p represents an integer of 1 to 4.

23. The organic electroluminescence device according to claim 16, wherein
the bipolar layer further comprises a fifth compound represented by a formula (3),

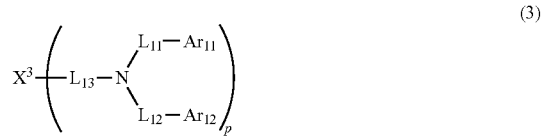
(3)

where: $X^3$ represents a substituted or unsubstituted fused aromatic hydrocarbon group having 10 to 40 ring carbon acorns;

$Ar_{11}$ and $Ar_{12}$ each independently represent a group selected from the group consisting of a substituted or unsubstituted aromatic hydrocarbon group having 6 to 40 ring carbon atoms, and a substituted or unsubstituted heterocyclic group having 5 to 30 ring atoms;

$L_{11}$ to $L_{13}$ each independently represent a single bond or a linking group;

when $L_{11}$ to $L_{13}$ are linking groups, the linking groups are selected from the group consisting of a divalent residue of a substituted or unsubstituted aromatic hydrocarbon group having 6 to 30 ring carbon atoms, and a divalent residue of a substituted or unsubstituted heterocyclic group having 5 to 30 ring atoms; and p represents an integer of 1 to 4.

24. The organic electroluminescence device according to claim 1, further comprising a hole transporting layer interposed between the anode and the first organic emitting layer.

25. The organic electroluminescence device according to claim 1, further comprising an electron transporting layer interposed between the cathode and the second organic emitting layer.

26. An electronic device comprising the organic electroluminescence device according to claim 1.

* * * * *

UNITED STATES PATENT AND TRADEMARK OFFICE
CERTIFICATE OF CORRECTION

PATENT NO. : 10,651,398 B2
APPLICATION NO. : 15/501712
DATED : May 12, 2020
INVENTOR(S) : Toshinari Ogiwara et al.

It is certified that error appears in the above-identified patent and that said Letters Patent is hereby corrected as shown below:

In the Claims

Column 220, Line 3, "22", should read -- $\lambda 2$ --

Column 221, Line 31, "to", should read -- to $L_2$; --

Column 224, Line 14, "acorns", should read -- atoms --

Signed and Sealed this
Twentieth Day of October, 2020

Andrei Iancu
*Director of the United States Patent and Trademark Office*